US009829796B2

(12) United States Patent
Takizawa et al.

(10) Patent No.: US 9,829,796 B2
(45) Date of Patent: Nov. 28, 2017

(54) PATTERN FORMATION METHOD, ACTIVE LIGHT-SENSITIVE OR RADIATION-SENSITIVE RESIN COMPOSITION, RESIST FILM, PRODUCTION METHOD FOR ELECTRONIC DEVICE USING SAME, AND ELECTRONIC DEVICE

(71) Applicant: FUJIFILM Corporation, Tokyo (JP)

(72) Inventors: Hiroo Takizawa, Shizuoka (JP); Takuya Tsuruta, Shizuoka (JP); Tomotaka Tsuchimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/011,863

(22) Filed: Feb. 1, 2016

(65) Prior Publication Data

US 2016/0147155 A1 May 26, 2016

Related U.S. Application Data

(63) Continuation of application No. PCT/JP2014/066448, filed on Jun. 20, 2014.

(30) Foreign Application Priority Data

Aug. 1, 2013 (JP) ................................ 2013-160616

(51) Int. Cl.

| | |
|---|---|
| ***G03F 7/32*** | (2006.01) |
| ***G03F 7/039*** | (2006.01) |
| ***G03F 7/038*** | (2006.01) |
| ***G03F 7/004*** | (2006.01) |
| ***G03F 7/20*** | (2006.01) |
| ***C08F 12/32*** | (2006.01) |
| ***C08F 12/22*** | (2006.01) |

(52) U.S. Cl.

CPC .............. *G03F 7/325* (2013.01); *C08F 12/22* (2013.01); *C08F 12/32* (2013.01); *G03F 7/0045* (2013.01); *G03F 7/0046* (2013.01); *G03F 7/038* (2013.01); *G03F 7/0382* (2013.01); *G03F 7/0388* (2013.01); *G03F 7/0392* (2013.01); *G03F 7/0397* (2013.01); *G03F 7/2004* (2013.01); *G03F 7/2059* (2013.01)

(58) Field of Classification Search

None

See application file for complete search history.

(56) References Cited

U.S. PATENT DOCUMENTS

| | | | | |
|---|---|---|---|---|
| 9,170,489 | B2 | 10/2015 | Takizawa et al. | |
| 2002/0061462 | A1 | 5/2002 | Uenishi | |
| 2010/0248143 | A1 | 9/2010 | Ito et al. | |
| 2011/0159433 | A1 | 6/2011 | Takahashi et al. | |
| 2011/0189609 | A1* | 8/2011 | Kawabata ............ | C07D 327/08 430/270.1 |
| 2011/0300485 | A1 | 12/2011 | Tsubaki et al. | |
| 2012/0077131 | A1 | 3/2012 | Enomoto et al. | |
| 2012/0308930 | A1 | 12/2012 | Hatakeyama et al. | |
| 2013/0029254 | A1 | 1/2013 | Tsuchimura et al. | |
| 2013/0101936 | A1 | 4/2013 | Taniguchi et al. | |
| 2014/0113236 | A1 | 4/2014 | Senzaki et al. | |
| 2014/0193749 | A1 | 7/2014 | Takizawa et al. | |
| 2014/0227642 | A1 | 8/2014 | Shirakawa et al. | |
| 2015/0118623 | A1* | 4/2015 | Tsuruta ..................... | C08F 8/02 430/286.1 |

FOREIGN PATENT DOCUMENTS

| | | | |
|---|---|---|---|
| JP | 2002-148806 | A | 5/2002 |
| JP | 2008-268935 | A | 11/2008 |
| JP | 2010-085971 | A | 4/2010 |
| JP | 2010-217884 | A | 9/2010 |
| JP | 2010-256856 | A | 11/2010 |
| JP | 2011-123469 | A | 6/2011 |
| JP | 2012-215826 | A | 11/2012 |
| JP | 2012-242556 | A | 12/2012 |
| JP | 2013-011866 | A | 1/2013 |
| JP | 2013-029554 | A | 2/2013 |
| JP | 2013-054253 | A | 3/2013 |
| JP | 2013-060537 | A | 4/2013 |
| JP | 2013-076991 | A | 4/2013 |
| JP | 2013-083937 | A | 5/2013 |
| JP | 2013-092590 | A | 5/2013 |
| JP | 2013-140336 | A | 7/2013 |
| KR | 10-2011-0023773 | A | 3/2011 |
| TW | 201314365 | A1 | 4/2013 |
| WO | 2012/169620 | A1 | 12/2012 |
| WO | WO 2013/129864 | A1 * | 9/2013 |

OTHER PUBLICATIONS

Google English translation for WO 2013/129864 A1 (2013).*

Preliminary Report (PCT/IB/373) dated Feb. 2, 2016, issued by the International Searching Authority in counterpart International Application No. PCT/JP2014/066448.

Translation of Written Opinion (PCT/ISA/237) dated Aug. 19, 2014, issued by the International Searching Authority in counterpart International Application No. PCT/JP2014/066448.

Search Report dated Aug. 19, 2014, issued by the International Searching Authority in counterpart International Application No. PCT/JP2014/066448 (PCT/ISA/210).

Written Opinion dated Aug. 19, 2014, issued by the International Searching Authority in counterpart International Application No. PCT/JP2014/066448 (PCT/ISA/237).

Office Action dated Oct. 25, 2016 issued by the Japanese Patent Office in counterpart Japanese Patent Application No. 2013-160616.

Office Action dated Feb. 17, 2017, issued by the Korean Intellectual Property Office in counterpart Korean Application No. 10-2016-7002776.

Notification of Reason for Refusal, dated Aug. 28, 2017, issued in corresponding KR Application No. 10-2016-7002776, 17 pages in English and Korean.

Office Action dated Sep. 6, 2017 in corresponding Taiwanese Application No. 103125994.

* cited by examiner

*Primary Examiner* — Sin Lee

(74) *Attorney, Agent, or Firm* — Sughrue Mion, PLLC

(57) ABSTRACT

There are provided A pattern formation method, including:

(1) forming a film using an active light-sensitive or radiation-sensitive resin composition;
(2) exposing the film to active light or radiation; and
(3) developing the exposed film using a developer including an organic solvent, wherein the active light-sensitive or radiation-sensitive resin composition contains a resin (A) having specific 3 repeating units.

54 Claims, No Drawings

PATTERN FORMATION METHOD, ACTIVE LIGHT-SENSITIVE OR RADIATION-SENSITIVE RESIN COMPOSITION, RESIST FILM, PRODUCTION METHOD FOR ELECTRONIC DEVICE USING SAME, AND ELECTRONIC DEVICE

CROSS REFERENCE TO RELATED APPLICATION

This is a continuation of International Application No. PCT/JP2014/066448 filed on Jun. 20, 2014, and claims priority from Japanese Patent Application No. 2013-160616 filed on Aug. 1, 2013, the entire disclosures of which are incorporated herein by reference.

BACKGROUND OF THE INVENTION

1. Field of the Invention

The present invention relates to a pattern formation method using a developer including an organic solvent, which is suitably used in an ultra microlithography process in producing an ultra LSI or a high-capacity microchip or other photofabrication processes, an active light-sensitive or radiation-sensitive resin composition, a resist film, a production method for an electronic device using these, and an electronic device. In more detail, the present invention relates to a pattern formation method using a developer including an organic solvent, which can be suitably used in fine processing of a semiconductor element using an electron beam or EUV light (wavelength: around 13 nm), an active light-sensitive or radiation-sensitive resin composition, a resist film, a production method for an electronic device using these, and an electronic device.

2. Description of the Related Art

In the related art, fine processing by lithography using a photoresist composition has been performed in the production process of semiconductor devices such as IC and LSI. In recent years, with higher integration of integrated circuits, ultra fine patterns have been required to be formed in a sub-micron region or a quarter-micron region. Accordingly, exposure wavelengths tend to be shortened, for example, from g-line to i-line, and to a KrF excimer laser light. Furthermore, at present, lithography using an electron beam, X-rays, or EUV light, in addition to the excimer laser light, is also being developed.

Lithography using an electron beam, X-rays, or EUV light is positioned as a next generation or next after next generation pattern forming technology, and a resist composition having high sensitivity and high-resolution is desired.

In particular, for shortening the wafer processing time, sensitivity improvement is a very important issue, but when trying to improve sensitivity, the pattern shape or the resolving power represented by the limit resolution line width decreases, and therefore, development of a resist composition which satisfies these properties at the same time has been strongly desired.

High sensitivity, and high resolution and a favorable pattern shape are in a trade-off relationship, and how to satisfy these at the same time is very important.

In general, there are two types of the active light-sensitive or radiation-sensitive resin composition, that is, a "positive type" in which a pattern is formed by solubilizing the exposed portion with respect to an alkali developer by exposure to radiation using a resin poorly soluble or insoluble in the alkali developer, and a "negative type" in which a pattern is formed by poorly solubilizing or insolubilizing the exposed portion with respect to an alkali developer by exposure to radiation using a resin soluble in the alkali developer.

As the active light-sensitive or radiation-sensitive resin composition suitable for a lithography process using an electron beam, X-rays, or EUV light, from the viewpoint of high sensitivity, a chemical amplification positive resist composition using mainly an acid catalytic reaction has been considered, and a chemical amplification positive resist composition consisting of a phenolic resin (hereinafter, abbreviated as a phenolic acid decomposable resin) which is insoluble or poorly soluble in an alkali developer, and has properties of becoming soluble by the action of an acid, as a main component, and an acid generator is effectively used.

On the other hand, in the production of a semiconductor element or the like, formation of patterns having various shapes such as a line, a trench, and a hole is required. To meet the requirement for formation of patterns having various shapes, development of not only a positive type active light-sensitive or radiation-sensitive resin composition but also a negative type active light-sensitive or radiation-sensitive resin composition has also been performed (for example, refer to JP2002-148806A and JP2008-268935A).

In formation of an ultra fine pattern, reduction in resolving power decrease and further improvement of the pattern shape have been demanded.

To solve this problem, the use of a resin having a photoacid generator on the polymer main chain or the side chain has been studied (JP2010-85971A and JP2010-256856A). In addition, a method of developing an acid decomposable resin using a developer other than an alkali developer (refer to JP2010-217884A and JP2011-123469A) and a method of developing an acid decomposable resin having an oxirane ring or an oxetane ring or an acid decomposable resin having a substructure of an N-methylol system using a developer other than an alkali developer (refer to JP2013-11866A and JP2012-242556A) have also been proposed.

SUMMARY OF THE INVENTION

However, with miniaturization of patterns in recent years, in an ultra fine region (for example, a region having a line width of 50 nm or less), a pattern formation method which satisfies high sensitivity, high resolution, and film loss reduction performance at the same time to a very high level has been required, and there was still room for improvement in the pattern formation methods in the related art.

Objects of the present invention are to solve the problems in performance improvement techniques in fine processing of a semiconductor element using active light or radiation, and to provide a pattern formation method which satisfies high sensitivity, high resolution (high resolving power, and the like), high roughness performance, film loss reduction performance, high exposure latitude, and high dry etching resistance at the same time to a very high level in an ultra fine region (for example, a region having a line width of 50 nm or less), an active light-sensitive or radiation-sensitive resin composition, a resist film, a production method for an electronic device using these, and an electronic device.

It was found that the above problems are achieved by the following configurations.

[1]

A pattern formation method including (1) forming a film using an active light-sensitive or radiation-sensitive resin composition, (2) exposing the film to active light or radiation and (3) developing the exposed film using a developer including an organic solvent, in which the active light-sensitive or radiation-sensitive resin composition contains a resin (A) having a repeating unit represented by General Formula (I), a repeating unit represented by any one of General Formulas (II) to (IV), and a repeating unit represented by General Formula (V).

(I)

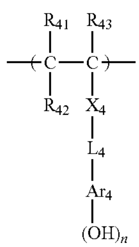

In General Formula (I), each of $R_{41}$, $R_{42}$, and $R_{43}$ independently represents a hydrogen atom, an alkyl group, a halogen atom, a cyano group, or an alkoxycarbonyl group. Here, $R_{42}$ may be bonded to $Ar_4$ to form a ring, and $R_{42}$ in this case represents a single bond or an alkylene group. $X_4$ represents a single bond, —COO—, or —$CONR_{44}$—, and, in the case of forming a ring with $R_{42}$, represents a trivalent connecting group. $R_{44}$ represents a hydrogen atom or an alkyl group. $L_4$ represents a single bond or an alkylene group. $Ar_4$ represents an (n+1) valent aromatic ring group, and, in the case of being bonded to $R_{42}$ to form a ring, represents an (n+2) valent aromatic ring group. n represents an integer of 1 to 4.

(II)

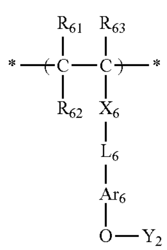

(III)

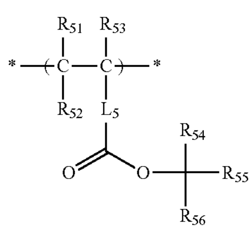

(IV)

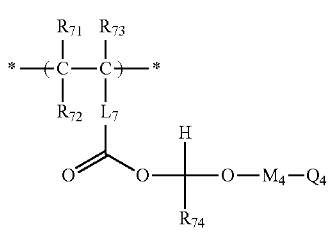

In Formula (II), each of $R_{61}$, $R_{62}$, and $R_{63}$ independently represents a hydrogen atom, an alkyl group, a cycloalkyl group, a halogen atom, a cyano group, or an alkoxycarbonyl group. Here, $R_{62}$ may be bonded to $Ar_6$ to form a ring, and $R_{62}$ in this case represents a single bond or an alkylene group. $X_6$ represents a single bond, —COO—, or —$CONR_{64}$—. $R_{64}$ represents a hydrogen atom or an alkyl group. $L_6$ represents a single bond or an alkylene group. $Ar_6$ represents a divalent aromatic ring group, and, in the case of being bonded to $R_{62}$ to form a ring, represents a trivalent aromatic ring group. $Y_2$ represents a group leaving due to the action of an acid.

In Formula (III), each of $R_{51}$, $R_{52}$, and $R_{53}$ independently represents a hydrogen atom, an alkyl group, a cycloalkyl group, a halogen atom, a cyano group, or an alkoxycarbonyl group. $R_{52}$ may be bonded to $L_4$ to form a ring, and $R_{52}$ in this case represents an alkylene group. $L_5$ represents a single bond or a divalent connecting group, and in the case of being bonded to $R_{52}$ to form a ring, represents a trivalent connecting group. $R_{54}$ represents an alkyl group, and each of $R_{55}$ and $R_{56}$ independently represents a hydrogen atom, an alkyl group, a cycloalkyl group, an aryl group, or an aralkyl group. $R^{55}$ to $R^{56}$ may be bonded to each other to form a ring. However, $R_{55}$ and $R_{56}$ do not represent a hydrogen atom at the same time in any case.

In Formula (IV), each of $R_{71}$, $R_{72}$, and $R_{73}$ independently represents a hydrogen atom, an alkyl group, a cycloalkyl group, a halogen atom, a cyano group, or an alkoxycarbonyl group. $R_{72}$ may be bonded to $L_4$ to form a ring, and $R_{72}$ in this case represents an alkylene group. $L_7$ represents a single bond or a divalent connecting group, and in the case of forming a ring with $R_{72}$, represents a trivalent connecting group. $R_{74}$ represents a hydrogen atom, an alkyl group, a cycloalkyl group, an aryl group, an aralkyl group, an alkoxy group, an acyl group, or a heterocyclic group. $M_4$ represents a single bond or a divalent connecting group. $Q_4$ represents an alkyl group, a cycloalkyl group, an aryl group, or a heterocyclic group. At least two of $Q_4$, $M_4$, and $R_{74}$ may be bonded to each other to form a ring.

(V)

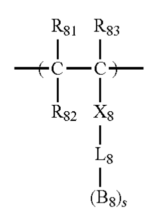

In Formula (V), each of $R_{81}$, $R_{82}$, and $R_{83}$ independently represents a hydrogen atom, an alkyl group, a cycloalkyl group, a halogen atom, a cyano group, or an alkoxycarbonyl group. Here, $R_{82}$ may be bonded to $L_8$ to form a ring, and $R_{82}$ in this case represents a single bond or an alkylene group. $X_8$ represents a single bond or a divalent connecting group. $L_8$ represents a single bond or an (s+1) valent connecting group, and in the case of being bonded to $R_{82}$ to form a ring, represents a trivalent connecting group. s represents an integer of 1 to 5. Here, in a case where $L_8$ is a single bond, s is 1. $B_8$ represents a group containing a cross-linking group.

[2]

The pattern formation method according to [1], in which the cross-linking group included in $B_8$ in General Formula (V) is a hydroxymethyl group, an alkoxymethyl group, an oxirane ring, or an oxetane ring.

[3]

The pattern formation method according to [1], in which $B_8$ in General Formula (V) is a group which has a phenol structure, a urea structure, or a melamine structure, having a hydroxymethyl group or an alkoxymethyl group.

[4]

The pattern formation method according to [3], in which $B_8$ in General Formula (V) is a group which has a phenol structure having a hydroxymethyl group or an alkoxymethyl group (here, the hydroxymethyl group is not directly bonded to a nitrogen atom, and the alkoxymethyl group is not directly bonded to a nitrogen atom).

[5]

The pattern formation method according to any one of [1] to [4], in which the content of the repeating unit represented by General Formula (V) is 1 mol % to 20 mol % with respect to the entirety of repeating units in the resin (A).

[6]

The pattern formation method according to any one of [1] to [5], in which the resin (A) has the repeating unit represented by General Formula (II), and the repeating unit represented by General Formula (II) is a repeating unit represented by General Formula (II').

(II')

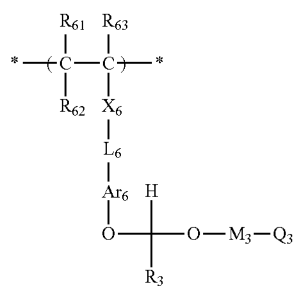

In General Formula (II'), $R_{61}$, $R_{62}$, $R_{63}$, $X_6$, $L_6$, and $Ar_6$ have the same meaning as those in General Formula (II), respectively. $R_3$ represents a hydrogen atom, an alkyl group, a cycloalkyl group, an aryl group, an aralkyl group, an alkoxy group, an acyl group, or a heterocyclic group. $M_3$ represents a single bond or a divalent connecting group. $Q_3$ represents an alkyl group, a cycloalkyl group, an aryl group, or a heterocyclic group. At least two of $Q_3$, $M_3$, and $R_3$ may be bonded to each other to form a ring.

[7]

The pattern formation method according to [6], in which $R_3$ in General Formula (II') is a group having 2 or more carbon atoms.

[8]

The pattern formation method according to [7], in which $R_3$ in General Formula (II') is a group represented by the following General Formula (II-2).

(II-2)

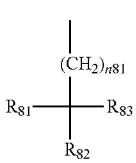

In General Formula (II-2), each of $R_{81}$, $R_{82}$, and $R_{83}$ independently represents an alkyl group, an alkenyl group, a cycloalkyl group, or an aryl group. n81 represents 0 or 1. At least two of $R_{81}$ to $R_{83}$ may be connected to each other to form a ring.

[9]

The pattern formation method according to any one of [1] to [5], in which the resin (A) has the repeating unit represented by General Formula (III), and the repeating unit represented by General Formula (III) is a repeating unit represented by General Formula (III-1).

(III-1)

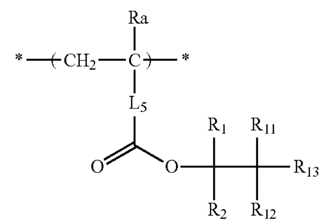

In General Formula (III-1), each of $R_1$ and $R_2$ independently represents an alkyl group, each of $R_{11}$ and $R_{12}$ independently represents an alkyl group, and $R_{13}$ represents a hydrogen atom or an alkyl group. $R_{11}$ and $R_{12}$ may be connected to each other to form a ring, and $R_{11}$ and $R_{13}$ may be connected to each other to form a ring. Ra represents a hydrogen atom, an alkyl group, a cyano group, or a halogen atom, and $L_5$ represents a single bond or a divalent connecting group.

[10]

The pattern formation method according to [9], in which $R_{11}$ and $R_{12}$ in General Formula (III-1) are connected to each other to form a ring.

[11]

The pattern formation method according to [9] or [10], in which any one of $R_1$ and $R_2$ in General Formula (III-1) is an alkyl group having 2 to 10 carbon atoms.

[12]

The pattern formation method according to [11], in which both $R_1$ and $R_2$ in General Formula (III-1) are ethyl groups.

[13]

The pattern formation method according to any one of [1] to [12], in which the bond between $X_4$ and $L_4$ in General Formula (I) is a single bond.

[14]

The pattern formation method according to any one of [1] to [13], in which the content of the repeating unit represented by General Formula (I) is 10 mol % to 40 mol % with respect to the entirety of repeating units in the resin (A).

[15]

The pattern formation method according to any one of [1] to [14], in which the active light-sensitive or radiation-sensitive resin composition further includes a compound (B) that generates an acid by active light or radiation.

[16]

The pattern formation method according to [15], in which the compound (B) that generates an acid by active light or radiation is a compound that generates an acid having a volume of 240 Angstrom$^3$ or greater.

[17]

The pattern formation method according to any one of [1] to [16], in which an electron beam or extreme ultraviolet rays are used as the active light or the radiation.

[18]

An active light-sensitive or radiation-sensitive resin composition which is supplied to the pattern formation method according to any one of [1] to [17].

[19]

A resist film which is formed of the active light-sensitive or radiation-sensitive resin composition according to [18].

[20]

A production method for an electronic device including the pattern formation method according to any one of [1] to [17].

[21]

An electronic device produced by the production method for an electronic device according to [20].

According to the present invention, a pattern formation method which satisfies high sensitivity, high resolution (high resolving power, and the like), high roughness performance, film loss reduction performance, high exposure latitude, and high dry etching resistance at the same time to a very high level in an ultra fine region (for example, a region having a line width of 50 nm or less), an active light-sensitive or radiation-sensitive resin composition, a resist film, a production method for an electronic device using these, and an electronic device can be provided.

DESCRIPTION OF THE PREFERRED EMBODIMENTS

Hereinafter, embodiments of the present invention will be described in detail.

Regarding the description of a group (atomic group) in the present specification, when the description does not indicate whether a group is substituted or unsubstituted, the description includes both the group having a substituent and the group not having a substituent. For example, "alkyl group" includes not only an alkyl group (an unsubstituted alkyl group) which does not have a substituent, but also an alkyl group (a substituted alkyl group) which has a substituent.

The term "active light" or "radiation" in the present specification refers to, for example, a bright line spectrum of a mercury lamp, far-ultraviolet rays represented by an excimer laser, extreme ultraviolet rays (EUV light), X-rays, an electron beam (EB), and the like. The light in the present invention refers to active light or radiation In addition, the term "exposure" in the present specification includes not only the exposure performed using a mercury lamp, far-ultraviolet rays represented by an excimer laser, extreme ultraviolet rays, X-rays, or EUV light, but also drawing performed using a particle beam such as an electron beam, an ion beam, or the like, unless otherwise specified.

A pattern formation method of the present invention includes (1) forming a film using an active light-sensitive or radiation-sensitive resin composition, (2) exposing the film to active light or radiation, and (3) developing the exposed film using a developer (hereinafter, as necessary, referred to as "organic-based developer") including an organic solvent.

Furthermore, the active light-sensitive or radiation-sensitive resin composition contains a resin (A) having a repeating unit represented by General Formula (I) described below, a repeating unit represented by any one of General Formulas (II) to (IV) described below, and a repeating unit represented by General Formula (V) described below.

Examples of the active light or the radiation include infrared light, visible light, ultraviolet light, far-ultraviolet light, X-rays, and an electron beam. The active light or the radiation, for example, more preferably has a wavelength of 250 nm or less, in particular, 220 nm or less. Examples of the active light or the radiation include a KrF excimer laser (248 nm), an ArF excimer laser (193 nm), an $F_2$ excimer laser (157 nm), X-rays, and an electron beam. Preferable examples of the active light or the radiation include a KrF excimer laser, an ArF excimer laser, an electron beam, X-rays, and extreme ultraviolet rays (EUV light). An electron beam or extreme ultraviolet rays are more preferable.

According to the pattern formation method of the present invention, a pattern formation method which satisfies high sensitivity, high resolution (high resolving power, and the like), high roughness performance, film loss reduction performance, high exposure latitude, and high dry etching resistance at the same time to a very high level in an ultra fine region (for example, a region having a line width of 50 nm or less), an active light-sensitive or radiation-sensitive resin composition, a resist film, a production method for an electronic device using these, and an electronic device can be provided. In particular, in a case where the active light or the radiation is an electron beam, X-rays, or EUV light, the effects are significant. The reason for this is not clear, however, it is thought to be as follows.

In the pattern formation method of the present invention, when a resin (A) has the repeating unit represented by General Formula (I) described below, that is, an aromatic ring such as a phenolic hydroxyl group, in an exposed portion, secondary electrons are sufficiently emitted. In addition, when the repeating unit represented by any one of General Formulas (II) to (IV) is used, the activation energy for generating a polar group by being decomposed due to the action of an acid can be reduced. It is thought that for these factors, in the exposed portion, the reaction in which the resin produces a polar group and the crosslinking reaction by a cross-linking group as $B_8$ in the repeating unit represented by General Formula (V) proceed efficiently, and thus, sensitivity becomes high.

In addition, for EUV exposure, out of band light (leaked light generated in a region of ultraviolet light having a wavelength of 100 nm to 400 nm) deteriorates the surface roughness of a resist film, and as a result, reduction in resolution or deterioration of film loss due to a bridge pattern or disconnection of a pattern is likely to be caused. However, it thought that the aromatic ring functions as an internal filter by absorbing the out of band light, and due to this, resolution and film loss reduction performance become excellent.

For example, it is expected that an extremely fine pattern (for example, pattern having a region with a line width of 50 nm or less) should be able to be favorably formed by a pattern formation method in which exposure is performed by an electron beam or extreme ultraviolet rays.

However, for example, in a case where a line and space pattern having a line width of 50 nm or less and a ratio between the line width and the space width of 1:1 is formed, stronger capillary force is likely to be generated in the fine space formed at the time of development. Therefore, when a developer is discharged from the space, the capillary force is applied to the side wall of the pattern having a fine line width. In a case where a positive pattern is formed by an alkali developer, the affinity between the pattern having a resin as a main component and the alkali developer tends to be decreased, and thus, the capillary force applied to the side wall of the pattern is increased, and collapse of the pattern is likely to occur. On the other hand, in a case where a negative pattern is formed by an organic-based developer, as in the present invention, the affinity between the pattern having a resin as a main component and the organic-based developer tends to be increased, and the contact angle of the developer on the pattern side wall is increased, and thus the capillary force can be reduced. As a result, it is thought that pattern collapse is prevented, and high resolution can be achieved (marginal resolving power is excellent).

In the exposed portion, the degree of solubility with respect to an organic-based developer is decreased not only due to production of a polar group by the repeating units represented by General Formulas (II) to (IV), and the degree of solibility with respect to an organic-based developer is decreased but also due to a process of the crosslinking reaction by the cross-linking group as $B_8$ in the repeating unit represented by General Formula (V). The repeating unit represented by any one of General Formulas (II) to (IV) is a repeating unit of which the affinity for an organic-based developer is greatly decreased (that is, a repeating unit having a high contrast of the affinity for an organic-based developer before and after the generation of a polar group), in a case where the affinity thereof for an organic-based developer is high and a polar group is generated by being decomposed due to the action of an acid. It is thought that for these factors, the film loss reduction performance is improved, and the dissolution contrast between the exposed portion and the unexposed portion with respect to an organic-based developer is improved, and as a result, the resolution and the roughness performance are further improved.

In the exposed portion, curing for forming a film is performed by the above-described crosslinking reaction. Thus, it is thought that for these factors, dry etching resistance is improved, and the acid generated in the exposed portion is less likely to diffuse to the unexposed portion, and thus, the exposure latitude is improved. It is thought that the resolution is improved since collapse of a pattern is less likely to occur.

Furthermore, a phenolic hydroxyl group in the repeating unit represented by General Formula (I) represented by hydroxystyrene is likely to react with the cross-linking group as $B_8$ in the repeating unit represented by General Formula (V), and thus, improvement of the dry etching resistance, improvement of the exposure latitude, and improvement of the resolution can be more significantly achieved.

Hereinafter, the pattern formation method of the present invention will be described in detail.

<Pattern Formation Method>

The pattern formation method according to the present invention includes (1) forming a film (resist film) using the composition described in Step (1), (2) exposing the film to an active light or radiation, and (3) developing the exposed film using an organic-based developer. This method preferably further includes (4) rinsing the developed film using a rinse liquid, for the reason of superior effects of the present invention.

In addition, the pattern formation method according to the present invention is typically a negative type pattern formation method.

The present invention also relates to the resist film formed by using the composition.

After film formation, before an exposure step, a prebake (PB) step is also preferably included. In addition, after an exposure step and before a developing step, a post exposure bake (PEB) step is also preferably included.

Both the PB step and the PEB step are preferably performed at a heating temperature of 40° C. to 130° C., more preferably at a heating temperature of 50° C. to 120° C., and still more preferably at a heating temperature of 60° C. to 110° C. In particular, in a case where the PEB step is performed at a low temperature of 60° C. to 90° C., exposure latitude (EL) and resolving power can be significantly improved.

In addition, the heating time is preferably 30 seconds to 300 seconds, more preferably 30 seconds to 180 seconds, and still more preferably 30 seconds to 90 seconds.

In the pattern formation method according to the present invention, a step of forming a film formed of a composition on a substrate, a step of exposing the film, a heating step, and a developing step can be performed by methods generally known in the art.

The light source used in the above-described exposure is preferably extreme ultraviolet rays (EUV light) or an electron beam (EB).

When the film formed of the resist composition according to the present invention is irradiated with active light or radiation, exposure (immersion exposure) may be performed in a state of being filled with liquid (immersion medium) having a higher refractive index than the air between a film and a lens. Thus, the resolution can be increased. Although the immersion medium used is not particularly limited as long as it is liquid having a higher refractive index than air, pure water is preferable.

Regarding the immersion liquid used when liquid immersion exposure is performed, the description in paragraphs "0059" and "0060" of JP2013-76991A can be referred to, and the contents thereof are incorporated in the present specification.

An immersion liquid poorly soluble film (hereinafter, also referred to as "topcoat") may be provided between the film formed of the composition of the present invention and the immersion liquid such that the film does not come into contact with the immersion liquid. Functions required for the topcoat are coating suitability to the upper layer portion of a composition film and immersion liquid poor solubility. The topcoat is preferably a topcoat which is not mixed with the composition film, and can be uniformly applied to the upper layer of the composition film.

Regarding the topcoat, the description in paragraphs "0061" and "0062" of JP2013-76991A can be referred to, and the contents thereof are incorporated in the present specification.

When EUV exposure or EB exposure is performed, for the purpose of suppression of outgassing, suppression of blob defects, prevention of perpendicularity deterioration due to reverse taper shape improvement, prevention of LWR deterioration due to surface roughness, and the like, a topcoat layer may be formed on the upper layer of a resist film formed of the active light-sensitive or radiation-sensitive resin composition of the present invention. The topcoat composition used in formation of a topcoat layer will be described below.

The solvent of the topcoat composition in the present invention is preferably water or an organic solvent. Water or an alcohol-based solvent is more preferable.

In a case where the solvent is an organic solvent, the solvent is preferably a solvent which does not dissolve a resist film. As a solvent capable of being used, an alcohol-based solvent, a fluorine-based solvent, or a hydrocarbon-based solvent is preferably used, and an alcohol-based solvent which is fluorine-based is more preferably used. As the alcohol-based solvent, a primary alcohol is preferable, and a primary alcohol having 4 to 8 carbon atoms is more preferable, form the viewpoint of coating properties. Although a linear, a branched, or a cyclic alcohol can be used as a primary alcohol having 4 to 8 carbon atoms, a linear or a branched alcohol is preferable. Specific examples thereof include 1-butanol, 1-hexanol, 1-pentanol, and 3-methyl-1-butanol.

In a case where the solvent of the topcoat composition in the present invention is water or an alcohol-based solvent, the solvent preferably contains a water-soluble resin. It is considered that the uniformity of solubility in a developer can be enhanced when the solvent contains a water-soluble resin. Examples of the preferable water-soluble resin include polyacrylic acid, polymethacrylic acid, polyhydroxystyrene, polyvinyl pyrrolidone, polyvinyl alcohol, polyvinyl ether, polyvinyl acetal, polyacrylic imide, polyethylene glycol, polyethylene oxide, polyethylene imine, polyester polyol, polyether polyol, and polysaccharides. Polyacrylic acid, polymethacrylic acid, polyhydroxystyrene, polyvinyl pyrrolidone, or polyvinyl alcohol is particularly preferable. Moreover, the water-soluble resin is not limited only to a homopolymer, and may be a copolymer. For example, the water-soluble resin may be a copolymer which has a monomer corresponding to the repeating unit of the homopolymer described above and another monomer unit. Specifically, an acrylic acid-methacrylic acid copolymer or an acrylic acid-hydroxystyrene copolymer can also be used in the present invention.

In addition, as the resin for the topcoat composition, a resin having an acid group described in JP2009-134177A or JP2009-91798A can also be preferably used.

Although the weight average molecular weight of the water-soluble resin is not particularly limited, the weight average molecular weight is preferably 2000 to 100000, more preferably 5000 to 500000, and particularly preferably 10000 to 100000. Here, the weight average molecular weight of a resin is a molecular weight in terms of polystyrene measured by using GPC (carrier: THF or N-methyl-2-pyrrolidone (NMP)).

Although the pH of the topcoat composition is not particularly limited, the pH is preferably 0 to 10, more preferably 0 to 8, and particularly preferably 1 to 7.

In a case where the solvent of the topcoat composition is an organic solvent, the topcoat composition may contain a hydrophobic resin as the hydrophobic resin (E) to be described in the section of the active light-sensitive or radiation-sensitive resin composition. As the hydrophobic resin, the hydrophobic resin described in JP2008-209889A is also preferably used.

The concentration of the resin in the topcoat composition is preferably 0.1% by mass to 10% by mass, more preferably 0.2% by mass to 5% by mass, and particularly preferably 0.3% by mass to 3% by mass.

The topcoat material may include components other than a resin, and the proportion of the resin in the solid content of the topcoat composition is preferably 80% by mass to 100% by mass, more preferably 90% by mass to 100% by mass, and particularly preferably 95% by mass to 100% by mass.

The solid content concentration of the topcoat composition in the present invention is preferably 0.1 to 10, more preferably 0.2% by mass to 6% by mass, and particularly preferably 0.3% by mass to 5% by mass. When the solid content concentration is within the above range, the topcoat composition can be uniformly applied to a resist film.

Examples of components other than resins capable of being added to the topcoat material include a surfactant, a photoacid generator, and a basic compound. Specific examples of the photoacid generator and the basic compound include the same compounds as compounds that generate an acid by irradiation with active light or radiation and the basic compounds described above.

In a case where a surfactant is used, the amount of the surfactant used is preferably 0.0001% by mass to 2% by mass, and more preferably 0.001% by mass to 1% by mass, with respect to the total amount of the topcoat composition.

When a surfactant is added to the topcoat composition, coating properties in a case of being coated with the topcoat composition can be improved. Examples of the surfactant include nonionic, anionic, cationic, and amphoteric surfactants.

As the nonionic surfactant, Plufarac series manufactured by BASF Corp., ELEBASE series, FINESURF series, or BLAUNON series, manufactured by Aoki Oil Industrial Co., Ltd., Adeka Pluronic P-103 manufactured by Adeka Corporation, EMULGEN series, AMIET series, AMINON PK-02S, EMANON CH-25, or LHEODOL series, manufactured by Kao Chemical Co., SURFLON S-141 manufactured by AGC SEIMI CHEMICAL CO., LTD., NOIGEN series manufactured by Dai-ichi Kogyo Seiyaku Co., Ltd., NEWKALGEN series manufactured by TAKEMOTO OIL & FAT Co., Ltd., DYNOL 604, EnviroGem AD01, OLFINE EXP series, and Surfynol series, manufactured by Nissin Chemical Industry Co., Ltd., FTERGENT 300 manufactured by Ryoko Chemical Co., Ltd., or the like can be used.

As the anionic surfactant, EMAL 20T or POIZ 532A manufactured by Kao Chemical Co., Phosphanol ML-200 manufactured by Toho Chemical Industry Co., Ltd., EMULSOGEN series manufactured by Clariant Japan KK, SURFLON 5-111N or SURFLON S-211 manufactured by AGC SEIMI CHEMICAL CO., LTD., PLYSURF series manufactured by Dai-ichi Kogyo Seiyaku Co., Ltd., PIONIN Series manufactured by TAKEMOTO OIL & FAT Co., Ltd., OLFINE PD-201 or Olfine PD-202 manufactured by Nissin Chemical Industry Co., Ltd., AKYPO RLM45 or ECT-3 manufactured by Nihon Surfactant Kogyo K.K., LIPON manufactured by Lion Corporation, or the like can be used.

As the cationic surfactant, ACETAMIN 24, ACETAMIN 86 manufactured by Kao Chemical Co., or the like can be used.

As the amphoteric surfactant, SURFLON S-131 (manufactured by AGC SEIMI CHEMICAL CO., LTD.), ENADICOL C-40H or Lipomin LA (manufactured by Kao Chemical Co., Ltd.), or the like can be used.

In addition, there surfactants can also be used in combination.

In the pattern formation method of the present invention, a resist film can be formed on a substrate by using the active light-sensitive or radiation-sensitive resin composition, and a topcoat layer can be formed on the resist film using the topcoat composition described above. The film thickness of the resist film is preferably 10 nm to 100 nm, and the film thickness of the topcoat layer is preferably 10 nm to 200 nm, more preferably 20 nm to 100 nm, and particularly preferably 40 nm to 80 nm.

As a method of coating the substrate with the active light-sensitive or radiation-sensitive resin composition, spin coating is preferable, and the rotation speed thereof is preferably 1000 rpm to 3000 rpm.

For example, a resist film is formed by applying the active light-sensitive or radiation-sensitive resin composition to a substrate (example: silicon/silicon dioxide coating) which is used in production of precision integrated circuit elements by using a suitable coating method such as a spinner or a coater and drying the resultant product. Moreover, a known antireflection film can also be applied in advance. In addition, the resist film is preferably dried before formation of a topcoat layer.

Next, a topcoat layer can be formed by applying a topcoat composition to the obtained resist film by the same means as that in the resist film forming method and by drying the resultant product.

Development is performed by irradiating a resist film having a topcoat layer on the upper layer with an electron beam (EB), X-rays, or EUV light typically through a mask and by, preferably, baking (heating) the resultant product. Thus, an excellent pattern can be obtained.

Moreover, the performance required for the topcoat and the method of use thereof are explained in Chapter 7 in "Process and Ingredient of Immersion Lithography" published by CMC Publishing Co., Ltd.

When the top coat is peeled off after exposure, a developer may be used, or a separate peeling agent may be used. As the peeling agent, a solvent which hardly penetrates into a film is preferable. From the viewpoint of being capable of performing a peeling step simultaneously with a developing treatment step of a film, the topcoat can be preferably peeled off with a developer.

The substrate on which a film is formed, in the present invention, is not particularly limited. As the substrate, a substrate which is generally used in a step of producing a semiconductor such as IC, a step of producing a circuit board for liquid crystal or a thermal head, or a lithography step of photofabrication can be used. Examples of such a substrate include inorganic substrates such as silicon, SiN, and $SiO_2$, and coated inorganic substrates such as SOG. As necessary, an organic antireflection film may be formed between a film and a substrate.

Examples of the organic-based developer include developers which include a polar solvent such as a ketone-based solvent, an ester-based solvent, an alcohol-based solvent, an amide-based solvent, or an ether-based solvent, or include a hydrocarbon-based solvent. In addition, mixed solvents thereof may be used.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methyl cyclohexanone, phenyl acetone, methyl ethyl ketone, methyl isobutyl ketone, methyl amyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, amyl acetate, isoamyl acetate, n-pentyl acetate, propylene glycol monomethyl ether acetate, propylene glycol monoethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl propionate, methyl 3-methoxypropionate (MMP), ethyl propionate, ethyl 3-ethoxypropionate (EEP), and propyl propionate. In particular, an acetic acid alkyl ester such as methyl acetate, butyl acetate, ethyl acetate, isopropyl acetate, or amyl acetate, or a propionic acid alkyl ester such as methyl propionate, ethyl propionate, or propyl propionate is preferable.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol, and n-decanol; glycols such as ethylene glycol, diethylene glycol, and triethylene glycol; and glycol ethers such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol.

Examples of the ether-based solvent include dioxane and tetrahydrofuran, in addition to glycol ethers described above.

Examples of the amide-based solvent include N-methyl-2-pyrrolidone, N,N-dimethyl acetamide, N,N-dimethyl formamide, hexamethylphosphoric triamide, and 1,3-dimethyl-2-imidazolidinone.

Examples of the hydrocarbon-based solvent include aromatic hydrocarbon-based solvents such as toluene, xylene, and anisole, and aliphatic hydrocarbon-based solvents such as pentane, hexane, octane, and decane.

The above solvents may be used in combination of two or more types thereof. In addition, within a range capable of exhibiting sufficient performance, the above solvents may be used in combination with a solvent other than the above solvents and/or water. Here, the water content of the entirety of the developer is preferably less than 10% by mass, and the developer more preferably does not contains water substantially. That is, the developer is preferably a developer formed of substantially only an organic solvent. Even in this case, the developer can include a surfactant described below. In addition, in this case, the developer may include inevitable impurities derived from the atmosphere.

The amount of the organic solvent used with respect to the developer is preferably 80% by mass to 100% by mass, more preferably 90% by mass to 100% by mass, and still more preferably 95% by mass to 100% by mass, with respect to the total amount of the developer.

In particular, the organic solvent included in the developer is preferably at least one selected from a ketone-based solvent, an ester-based solvent, an alcohol-based solvent, amide-based solvent, and an ether-based solvent.

The vapor pressure of the organic-based developer is preferably 5 kPa or lower, more preferably 3 kPa or lower, and particularly preferably 2 kPa or lower at 20° C. When the vapor pressure of the developer is 5 kPa or lower, evaporation of the developer on the substrate or in a development cup is suppressed, the temperature uniformity in the wafer surface is improved, and as a result, the dimensional uniformity in the wafer surface is improved.

Specific examples of the developer having a vapor pressure of 5 kPa or lower include ketone-based solvents such as 1-octanone, 2-octanone, 1-nonanone, 2-nonanone, 4-heptanone, 2-hexanone, diisobutyl ketone, cyclohexanone, methyl cyclohexanone, phenyl acetone, and methyl isobutyl ketone; ester-based solvents such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate, and propyl lactate; alcohol-based solvents such as n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol, and n-decanol; glycol-based solvents such as ethylene glycol, diethylene glycol, and triethylene glycol; glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxy methyl butanol; ether-based solvents such as tetrahydrofuran; amide-based solvents such as N-methyl-2-pyrrolidone, N,N-dimethyl acetamide, and N,N-dimethyl formamide; aromatic hydrocarbon-based solvents such as toluene and xylene; and aliphatic hydrocarbon-based solvents such as octane and decane.

Specific examples of the developer having a vapor pressure of 2 kPa or lower include ketone-based solvents such as 1-octanone, 2-octanone, 1-nonanone, 2-nonanone, 4-heptanone, 2-hexanone, diisobutyl ketone, cyclohexanone, methyl cyclohexanone, and phenyl acetone; ester-based solvents such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate, and propyl lactate; alcohol-based solvents such as n-butyl alcohol, sec-butyl alcohol, tert-butyl alcohol, isobutyl alcohol, n-hexyl alcohol, 4-methyl-2-pentanol, n-heptyl alcohol, n-octyl alcohol, and n-decanol; glycol-based solvents such as ethylene glycol, diethylene glycol, and triethylene glycol; glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxy methyl butanol; amide-based solvents such as N-methyl-2-pyrrolidone, N,N-dimethyl acetamide, and N,N-dimethyl formamide; aromatic hydrocarbon-based solvents such as xylene; and aliphatic hydrocarbon-based solvents such as octane and decane.

A suitable amount of a surfactant can be added to the developer, as necessary.

The surfactant is not particularly limited, and for example, an ionic or nonionic fluorine-based surfactant and/or a silicon-based surfactant can be used. Examples of the fluorine-based surfactant and/or the silicon-based surfactant include surfactants described in JP1987-36663A (JP-S62-36663A), JP1986-226746A (JP-S61-226746A), JP1986-226745A (JP-61-226745A), JP1987-170950A (JP-62-170950A), JP1988-34540A (JP-63-34540A), JP1995-230165A (JP-H7-230165A), JP1996-62834A (JP-H8-62834A), JP1997-54432A (JP-H9-54432A), and JP1997-5988A (JP-H9-5988A), and the specifications of U.S. Pat. Nos. 5,405,720A, 5,360,692A, 5,529,881A, 5,296,330A, 5,436,098A, 5,576,143A, 5,294,511A, and 5,824,451A. The surfactant is preferably nonionic. As the nonionic surfactant, a fluorine-based surfactant or a silicon-based surfactant is more preferably used.

The amount of the surfactant used is typical 0.001% by mass to 5% by mass, preferably 0.005% by mass to 2% by mass, and more preferably 0.01% by mass to 0.5% by mass, with respect to the total amount of developer.

As described, in particular, in paragraphs "0032" to "0063" of JP2013-11833A, a basic compound can also be included in the organic-based developer. In addition, as the basic compound, a basic compound (N) described below which may be contained in the active light-sensitive or radiation-sensitive resin composition can also be exemplified.

Examples of the developing method include a method in which a substrate is dipped in a bath filled with a developer for a predetermined period of time (dipping method), a method in which developing is performed by placing a developer on the substrate surface by surface tension and by holding stationary for a predetermined period of time (puddle method), a method in which a developer is sprayed onto a substrate surface (spray method), a method in which a substrate is spun at a constant rate, and a developer discharge nozzle is then scanned across the substrate at a constant rate while a developer is discharged continuously on the substrate from the nozzle (dynamic dispensing method).

The above-described various developing methods include a step of discharging a developer toward a resist film from a developing nozzle of a developing device, the discharge pressure (flow rate per unit area of a developer to be discharged) of a developer to be discharged is preferably 2 mL/sec/mm$^2$ or less, more preferably 1.5 mL/sec/mm$^2$ or less, and still more preferably 1 mL/sec/mm$^2$ or less. Although the lower limit of the flow rate is not particularly limited, in consideration of throughput, 0.2 mL/sec/mm$^2$ or greater is preferable.

When the discharge pressure of a developer to be discharged is within the above range, the defects of the pattern resulting from a resist residue after development can be significantly reduced.

Details of the mechanism are not clear, however, it is considered that this is probably because, when the discharge pressure is within the above range, the pressure applied to the resist film by the developer decreases, or unexpected scraping or collapsing of the composition film and/or the pattern is suppressed.

Moreover, the discharge pressure (mL/sec/mm$^2$) of a developer is a value at the developing nozzle exit in the developing device.

Examples of the method of adjusting the discharge pressure of a developer include a method of adjusting the discharge pressure using a pump and a method of adjusting the pressure by supply from a pressure tank.

In addition, after a step of performing development, while replacing with another solvent, a step of stopping the development may be performed.

The pattern formation method according to the present invention preferably further includes a rinsing step (step of washing a film using a rinse liquid including an organic solvent) after a developing step.

The rinse liquid used in the rinsing step is not particularly limited as long as it does not dissolve the pattern after development, and a solution including a general organic solvent can be used.

Examples of the rinse liquid include a rinse liquid including at least one type of organic solvent selected from a hydrocarbon-based solvent, a ketone-based solvent, an ester-based solvent, an alcohol-based solvent, an amide-based solvent, and an ether-based solvent. The rinse liquid more preferably includes at least one type of organic solvent selected from a ketone-based solvent, an ester-based solvent, an alcohol-based solvent, or an amide-based solvent, and still more preferably includes an alcohol-based solvent or an ether-based solvent.

The rinse liquid more preferably includes a monohydric alcohol, and more preferably includes a monohydric alcohol having 5 or more carbon atoms.

These monohydric alcohols may be linear, branched, or cyclic. Examples of these monohydric alcohols include 1-butanol, 2-butanol, 3-methyl-1-butanol, tert-butyl alcohol, 1-pentanol, 2-pentanol, 1-hexanol, 4-methyl-2-pentanol (methylisobutylcarbinol), 1-heptanol, 1-octanol, 2-hexanol, cyclopentanol, 2-heptanol, 2-octanol, 3-hexanol, 3-heptanol, 3-octanol, and 4-octanol. Examples of the monohydric alcohol having 5 or more carbon atoms include 1-hexanol, 2-hexanol, 4-methyl-2-pentanol, 1-pentanol, and 3-methyl-1-butanol.

Respective components described above may be used in combination of two or more types thereof, and may be used in combination with an organic solvent other than the components described above.

The water content of the rinse liquid is preferably 10% by mass or less, preferably 5% by mass or less, and still more preferably 3% by mass or less. That is, the amount of an organic solvent used with respect to the rinse liquid is preferably 90% by mass to 100% by mass, more preferably 95% by mass to 100% by mass, and still more preferably 97% by mass to 100%, with respect to the total amount of the rinse liquid. When the water content of the rinse liquid is less than 10% by mass, more favorable development characteristics are obtained.

The vapor pressure of the rinse liquid is preferably 0.05 kPa to 5 kPa, more preferably 0.1 kPa to 5 kPa, and still more preferably 0.12 kPa to 3 kPa, at 20° C. When the vapor pressure of the rinse liquid is 0.05 kPa to 5 kPa, the temperature uniformity in the wafer surface is improved, swelling due to penetration of the rinse liquid is suppressed, and the dimensional uniformity in the wafer surface is improved.

Moreover, a suitable amount of a surfactant may be added to the rinse liquid.

In the rinsing step, the developed wafer is washed with the above-described rinse liquid. The method of washing treatment is not particularly limited, and examples thereof include a method in which a rinse liquid is discharged continuously onto a substrate while the substrate is spun at a constant rate (spin coating method), a method in which a substrate is dipped in a bath filled with a rinse liquid for a predetermined period of time (dipping method), and a method in which a rinse liquid is sprayed onto a substrate surface (spray method). Among these, it is preferable that after a washing treatment is performed by the spin coating method, and then, a rinse liquid is removed from the substrate by rotating the substrate at a rotation speed of 2000 rpm to 4000 rpm.

The pattern formation method of the present invention can further include a step (alkali development step) of forming a resist pattern by performing development using an alkali aqueous solution. Thus, a finer pattern can be formed.

In the present invention, a portion having weak exposure intensity is removed in an organic solvent development step, and a portion having strong exposure intensity is also removed by performing the alkali development step. Since pattern formation is performed without dissolving only a region having intermediate exposure intensity by the multiple development process performing development multiple times in this manner, a finer pattern than usual can be formed (the same mechanism as that in paragraph "0077" of JP2008-292975A).

Although the alkali development can be performed either before or after a step of developing using a developer including an organic solvent, the alkali development is more preferably performed before the organic solvent development step.

Although the type of alkali developer is not particularly limited, typical, an aqueous solution of tetramethylammonium hydroxide is used. A suitable amount of an alcohol and/or a surfactant may be added to the alkali developer.

The alkali concentration of the alkali developer is typically 0.1% by mass to 20% by mass. The pH of the alkali developer is typically 10.0 to 15.0. As the alkali developer, 2.38% by mass tetramethylammonium hydroxide aqueous solution is particularly preferably used.

In a case where a rinse treatment is performed after development using an alkali developer, as the rinse liquid, pure water is typically used. A suitable amount of a surfactant may be added to the rinse liquid.

In addition, the present invention also relates to a production method for an electronic device including the pattern formation method of the present invention described above and an electronic device produced by the production method.

The electronic device of the present invention is suitably mounted on electrical and electronic equipment (home electric appliances, OA and media-related equipment, optical equipment, communication equipment, or the like).

<Active Light-Sensitive or Radiation-Sensitive Resin Composition>

The active light-sensitive or radiation-sensitive resin composition capable of being used in the present invention will be described below.

The active light-sensitive or radiation-sensitive resin composition according to the present invention is used in negative type development (development in which, when exposed, solubility is decreased with respect to a developer, the exposed portion remains as a pattern, and the unexposed portion us removed). That is, the active light-sensitive or radiation-sensitive resin composition according to the present invention can be used as an active light-sensitive or radiation-sensitive resin composition for organic solvent development used in development using a developer including an organic solvent. Here, "for organic solvent development" means an application to be subjected to a step of developing using a developer including at least an organic solvent.

Thus, the present invention also relates to the active light-sensitive or radiation-sensitive resin composition which is provided to the pattern formation method according to the present invention described above.

The active light-sensitive or radiation-sensitive resin composition of the present invention is typically a resist composition, and a negative resist composition (that is, resist composition for organic solvent development) is preferable since particularly significant effects can be obtained. The composition according to the present invention is typically a chemical amplification resist composition.

The composition used in the present invention contains the resin (A) having the repeating unit represented by General Formula (I), the repeating unit represented by any one of General Formulas (II) to (IV), and the repeating unit represented by General Formula (V).

Furthermore, the composition used in the present invention preferably includes the compound (B) that generates an acid by active light or radiation, a basic compound (D), and a solvent, and may further include at least one of a hydrophobic resin (E), a surfactant (F), and other additives (G).

Hereinafter, these respective components will be described in the above-described order.

Resin (A) having Repeating Unit represented by General Formula (I), Repeating Unit represented by any one of General Formulas (II) to (IV), and Repeating Unit represented by General Formula (V)

The resin (A) has the repeating unit represented by the following General Formula (I). Here, the repeating unit represented by General Formula (I) corresponds to a repeating unit having a phenolic hydroxyl group.

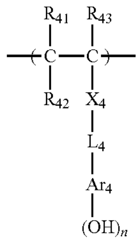

(I)

In General Formula (I), each of $R_{41}$, $R_{42}$, and $R_{43}$ independently represents a hydrogen atom, an alkyl group, a halogen atom, a cyano group, or an alkoxycarbonyl group. Here, $R_{42}$ may be bonded to $Ar_4$ to form a ring, and $R_{42}$ in this case represents a single bond or an alkylene group. $X_4$ represents a single bond, —COO—, or —$CONR_{44}$—, and, in the case of forming a ring with $R_{42}$, represents a trivalent connecting group. $R_{44}$ represents a hydrogen atom or an alkyl group. $L_4$ represents a single bond or an alkylene group. $Ar_4$ represents an (n+1) valent aromatic ring group, and, in the case of being bonded to $R_{42}$ to form a ring, represents an (n+2) valent aromatic ring group. n represents an integer of 1 to 4.

Specific examples of an alkyl group, a halogen atom, or an alkoxycarbonyl group, represented by each of $R_{41}$, $R_{42}$, and $R_{43}$ in Formula (I), or substituents which these groups can have are the same as those described for each group represented by $R_{51}$, $R_{52}$, and $R_{53}$ in General Formula (III) described below.

$Ar_4$ represents an (n+1) valent aromatic ring group. The bivalent aromatic ring group in a case where n is 1 may have a substituent, and preferable examples thereof include arylene groups having 6 to 18 carbon atoms such as a phenylene group, a tolylene group, a naphthylene group, and an anthracenylene group, and aromatic ring groups including a hetero ring, such as thiophene, furan, pyrrole, benzothiophene, benzofuran, benzopyrrole, triazine, imidazole, benzimidazole, triazole, thiadiazole, and thiazole.

Suitable specific examples of the (n+1) valent aromatic ring group in a case where n is an integer of 2 or greater can include a group obtained by excluding arbitrary (n−1) hydrogen atoms from a specific example described above of the divalent aromatic ring group.

The (n+1) valent aromatic ring group may further have a substituent.

Examples of the substituent which the alkyl group, the alkoxycarbonyl group, the alkylene group, or the (n+1) valent aromatic ring group described above can have include alkoxy groups such as an alkyl group, a methoxy group, an ethoxy group, a hydroxyethoxy group, a propoxy group, a hydroxypropoxy group, and a butoxy group, and aryl groups such as a phenyl group, represented by each of $R_{51}$ to $R_{53}$ in General Formula (III) described below.

Examples of the alkyl group represented by $R_{44}$ in —$CONR_{44}$— ($R_{44}$ represents a hydrogen atom or an alkyl group) represented by $X_4$ include the same as the alkyl group represented by each of $R_{41}$ to $R_{43}$.

$X_4$ is preferably a single bond, —COO—, or —CONH—, and more preferably a single bond or —COO—.

Examples of the alkylene group in $L_4$ include an alkylene group having 1 to 8 carbon atoms such as a methylene group, an ethylene group, a propylene group, a butylene group, a hexylene group, or an octylene group, which preferably may have a substituent.

$Ar_4$ is more preferably an aromatic ring group having 6 to 18 carbon atoms which may have a substituent, and particularly preferably a benzene ring group, a naphthalene ring group, or a biphenylene ring group.

The repeating unit represented by Formula (I) preferably has a hydroxystyrene structure. That is, $Ar_4$ is preferably a benzene ring group.

In General Formula (I), each of $X_4$ and $L_4$ is preferably a single bond.

Specific examples of the repeating unit represented by General Formula (I) will be described below, but the present invention is not limited thereto. In the formula, a represents 1 or 2.

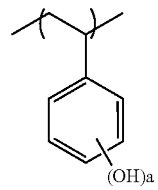

(B-1)

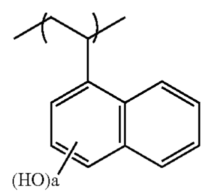

(B-2)

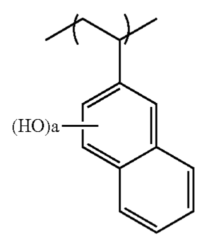

(B-3)

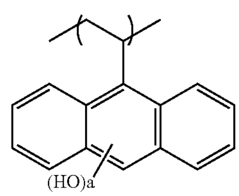

(B-4)

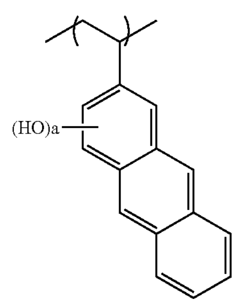

(B-5)

-continued
(B-6)
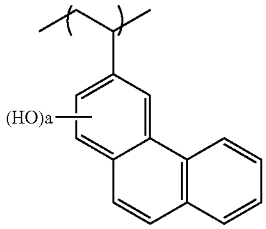
(B-7)
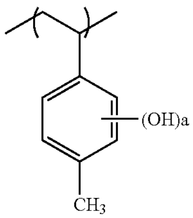
(B-8)
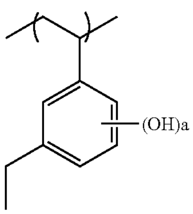
(B-9)
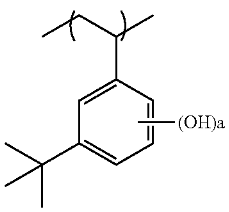
(B-10)
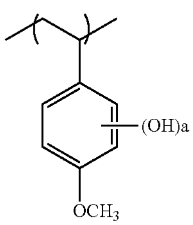
(B-11)
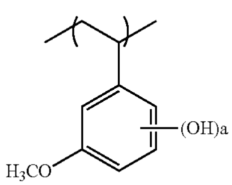
(B-12)
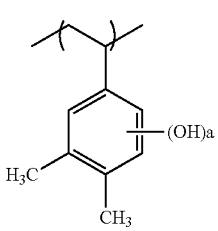
-continued
(B-13)
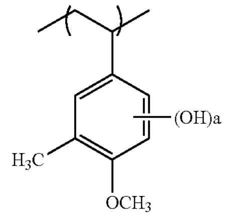
(B-14)
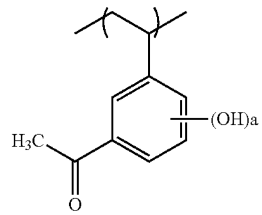
(B-15)
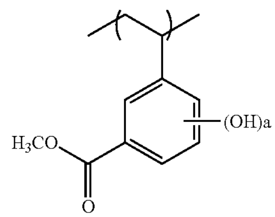
(B-16)
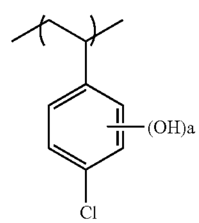
(B-17)
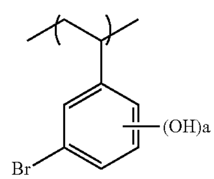
(B-18)
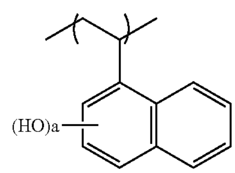
(B-19)
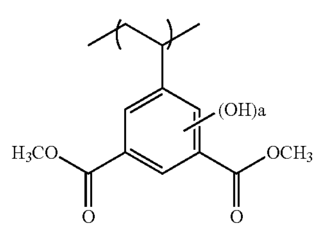

-continued (B-20)

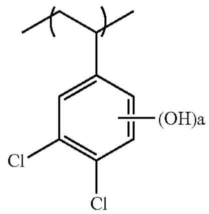

(B-21)

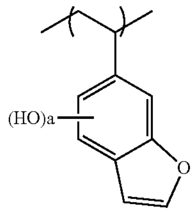

(B-22)

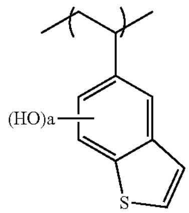

(B-23)

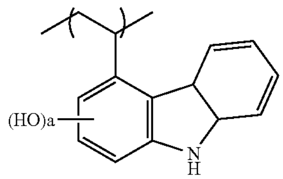

(B-24)

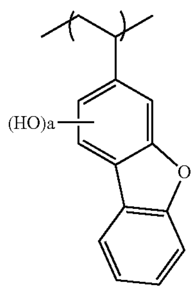

(B-25)

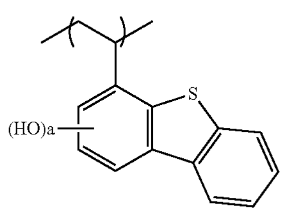

(B-26)

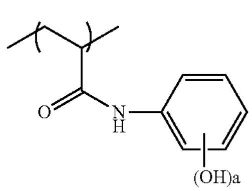

-continued (B-27)

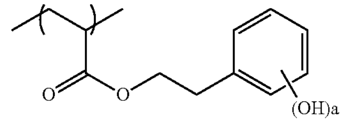

(B-28)

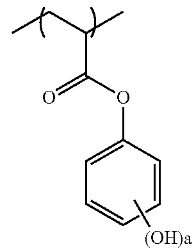

(B-29)

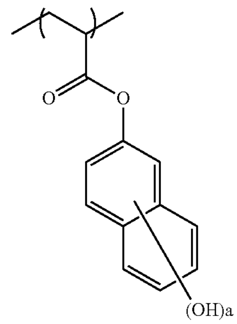

(B-30)

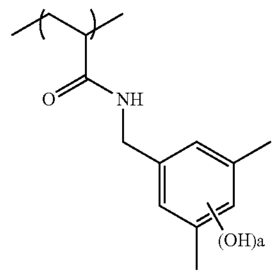

The resin (A) may include two or more types of repeating unit (I).

The content of the repeating unit (I) in the resin (A) is preferably large from the viewpoint of enhancing the sensitivity by the increase in the secondary electron generation amount at the time of the exposure described above, and the content should not be so great from the viewpoint of ensuring the contrast by increasing the amount of the repeating unit represented by any one of General Formulas (II) to (IV) as a repeating unit having an acid-decomposable group. For this reason, the content of the repeating unit (F) in the resin (A) is preferably 5 mol % to 80 mol %, more preferably 10 mol % to 75 mol %, still more preferably 10 mol % to 40 mol %, and particularly preferably 20 mol % to 40 mol %, with respect to the entirety of repeating units in the resin (A).

The resin (A) has the repeating unit represented by any one of the following General Formulas (II) to (IV). Here, the repeating unit represented by any one of General Formulas (II) to (IV) corresponds to a repeating unit having a group (acid-decomposable group) which generates a polar group by being decomposed due to the action of an acid. That is, the repeating unit represented by General Formula (II) generates a group represented by —$Ar_6OH$ as a polar group by being decomposed due to the action of an acid, and the repeating unit represented by General Formula (III) or (IV) generates a carboxylic acid group as a polar group by being decomposed due to the action of an acid.

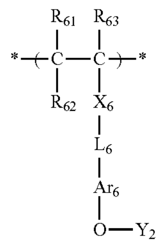

(II)

In General Formula (II), each of $R_{61}$, $R_{62}$, and $R_{63}$ independently represents a hydrogen atom, an alkyl group, a cycloalkyl group, a halogen atom, a cyano group, or an alkoxycarbonyl group. Here, $R_{62}$ may be bonded to $Ar_6$ to form a ring, and $R_{62}$ in this case represents a single bond or an alkylene group.

$X_6$ represents a single bond, —COO—, or —$CONR_{64}$—. $R_{64}$ represents a hydrogen atom or an alkyl group.

$L_6$ represents a single bond or an alkylene group.

$Ar_6$ represents a divalent aromatic ring group, and, in the case of being bonded to $R_{62}$ to form a ring, represents a trivalent aromatic ring group.

$Y_2$ represents a group leaving due to the action of an acid.

General Formula (II) will be described in more detail.

$R_{61}$ to $R_{63}$ in General Formula (II) have the same meaning as $R_{51}$, $R_{52}$, and $R_{53}$ in General Formula (III) described below, respectively, and the preferable ranges thereof are also the same.

In a case where $R_{62}$ represents an alkylene group, examples of the alkylene group include an alkylene group having 1 to 8 carbon atoms such as a methylene group, an ethylene group, a propylene group, a butylene group, a hexylene group, and an octylene group, which preferably may have a substituent.

Examples of the alkyl group represented by $R_{64}$ in —$CONR_{64}$— ($R_{64}$ represents a hydrogen atom or an alkyl group) represented by $X_6$ include the same as the alkyl group represented by each of $R_{61}$ to $R_{63}$.

$X_6$ is preferably a single bond, —COO—, or —CONH—, and more preferably a single bond or —COO—.

Examples of the alkylene group in $L_6$ include an alkylene group having 1 to 8 carbon atoms such as a methylene group, an ethylene group, a propylene group, a butylene group, a hexylene group, or an octylene group, which preferably may have a substituent. A ring formed by bonding of $R_{62}$ and $L_6$ is particularly preferably a 5- or 6-membered ring.

$Ar_6$ represents a divalent aromatic ring group. The divalent aromatic ring group may have a substituent, and preferable examples thereof include an arylene group having 6 to 18 carbon atoms such as a phenylene group, a tolylene group, and a naphthylene group, and divalent aromatic ring groups including a hetero ring, such as thiophene, furan, pyrrole, benzothiophene, benzofuran, benzopyrrole, triazine, imidazole, benzimidazole, triazole, thiadiazole, or thiazole.

$Ar_6$ may have a plurality of substituents, and in this case, the plurality of substituents may be bonded to each other to form a ring.

Examples of the substituent which the alkyl group, the cycloalkyl group, the alkoxycarbonyl group, the alkylene group, or the divalent aromatic ring group described above can have include the same specific examples as those of the substituent which each group represented by $R_{51}$ to $R_{53}$ in General Formula (III) described below can have.

$Y_2$ represents a group leaving due to the action of an acid.

Examples of $Y_2$ which is a group leaving due to the action of an acid can include —$C(R_{36})(R_{37})(R_{38})$, —C(=O)—O—$C(R_{36})(R_{37})(R_{38})$, —$C(R_{01})(R_{02})(OR_{39})$, —$C(R_{01})(R_{02})$—C(=O)—O—$C(R_{36})(R_{37})(R_{38})$, and —$CH(R_{36})(Ar)$.

In the formula, each of $R_{36}$ to $R_{39}$ independently represents an alkyl group, a cycloalkyl group, an aryl group, a group obtained by combining an alkylene group and an aryl group, or an alkenyl group. $R_{36}$ and $R_{37}$ may be bonded to each other to form a ring.

Each of $R_{01}$ and $R_{02}$ independently represents a hydrogen atom, an alkyl group, a cycloalkyl group, an aryl group, a group obtained by combining an alkylene group and an aryl group, or an alkenyl group.

Ar represents an aryl group.

The alkyl group represented by each of $R_{36}$ to $R_{39}$, $R_{01}$, and $R_{02}$ may be linear or branched, and is preferably an alkyl group having 1 to 8 carbon atoms, and examples thereof include a methyl group, an ethyl group, a propyl group, an n-butyl group, a sec-butyl group, a hexyl group, and an octyl group.

The cycloalkyl group represented by each of $R_{36}$ to $R_{39}$, $R_{01}$, and $R_{02}$ may be monocyclic or polycyclic. The monocyclic type is preferably a cycloalkyl group having 3 to 10 carbon atoms, and examples thereof can include a cyclopropyl group, a cyclobutyl group, a cyclopentyl group, a cyclohexyl group, and a cyclooctyl group. The polycyclic type is preferably a cycloalkyl group having 6 to 20 carbon atoms, and examples thereof can include an adamantyl group, a norbornyl group, an isobornyl group, a camphanyl group, a dicyclopentyl group, an α-pinene group, a tricyclodecanyl group, a tetracyclododecyl group, and an androstanyl group. Moreover, some of the carbon atoms in a cycloalkyl group may be substituted with a heteroatom such as an oxygen atom.

The aryl group represented by each of $R_{36}$ to $R_{39}$, $R_{01}$, $R_{02}$, and Ar is preferably an aryl group having 6 to 10 carbon atoms, and examples thereof include aryl groups such as a phenyl group, a naphthyl group, and an anthryl group, and divalent aromatic ring groups including a hetero ring, such as thiophene, furan, pyrrole, benzothiophene, benzofuran, benzopyrrole, triazine, imidazole, benzimidazole, triazole, thiadiazole, and thiazole.

A group obtained by combining an alkylene group and an aryl group represented by each of $R_{36}$ to $R_{39}$, $R_{01}$, and $R_{02}$ is preferably an aralkyl group having 7 to 12 carbon atoms, and examples thereof can include a benzyl group, a phenethyl group, and naphthylmethyl group.

The alkenyl group represented by each of $R_{36}$ to $R_{39}$, $R_{01}$, and $R_{02}$ is preferably an alkenyl group having 2 to 8 carbon atoms, and examples thereof can include a vinyl group, an allyl group, a butenyl group, and a cyclohexenyl group.

A ring formed by bonding of $R_{36}$ and $R_{37}$ to each other may be monocyclic or polycyclic. The monocyclic type preferably has a cycloalkyl structure having 3 to 10 carbon atoms, and examples thereof can include a cyclopropane structure, a cyclobutane structure, a cyclopentane structure, a cyclohexane structure, a cycloheptane structure, and a cyclooctane structure. The polycyclic type preferably has a cycloalkyl structure having 6 to 20 carbon atoms, and examples thereof can include an adamantane structure, a norbornane structure, a dicyclopentane structure, a tricyclodecane structure, and a tetracyclododecane structure. Moreover, some of the carbon atoms in a cycloalkyl structure may be substituted with a heteroatom such as an oxygen atom.

Each of the groups described above represented by each of $R_{36}$ to $R_{39}$, $R_{01}$, $R_{02}$, and Ar may have a substituent, and examples of the substituent can include an alkyl group, a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group, and the substituent preferably has 8 or less carbon atoms.

$Y_2$ which is a group leaving due to the action of an acid more preferably has the structure represented by the following General Formula (VI-A).

(VI-A)

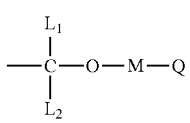

Here, each of $L_1$ and $L_2$ independently represents a hydrogen atom, an alkyl group, a cycloalkyl group, an aryl group, or a group obtained by combining an alkylene group and an aryl group.

M represents a single bond or a divalent connecting group.

Q represents an alkyl group, a cycloalkyl group which may include a heteroatom, an aryl group which may include a heteroatom, an amino group, an ammonium group, a mercapto group, a cyano group, or an aldehyde group.

At least two of Q, M, and $L_1$ may be bonded to each other to form a ring (preferably, 5- or 6-membered ring).

The alkyl group represented by $L_1$ or $L_2$ is, for example, an alkyl group having 1 to 8 carbon atoms, and specifically, preferable examples thereof can include a methyl group, an ethyl group, a propyl group, an n-butyl group, a sec-butyl group, a hexyl group, and an octyl group.

The cycloalkyl group represented by $L_1$ or $L_2$ is, for example, a cycloalkyl group having 3 to 15 carbon atoms, and specifically, preferable examples thereof can include a cyclopentyl group, a cyclohexyl group, a norbornyl group, and an adamantyl group.

The aryl group represented by $L_1$ or $L_2$ is, for example, an aryl group having 6 to 15 carbon atoms, and specifically, preferable examples thereof can include a phenyl group, a tolyl group, a naphthyl group, and an anthryl group.

A group obtained by combining an alkylene group and an aryl group represented by $L_1$ or $L_2$ has, for example, 6 to 20 carbon atoms, and examples thereof include aralkyl groups such as a benzyl group and a phenethyl group.

Examples of the divalent connecting group represented by M include alkylene groups (for example, a methylene group, an ethylene group, a propylene group, a butylene group, a hexylene group, and an octylene group), cycloalkylene groups (for example, a cyclopentylene group, a cyclohexylene group, and an adamantylene group), alkenylene groups (for example, an ethylene group, a propenylene group, and a butenylene group), divalent aromatic ring groups (for example, a phenylene group, a tolylene group, and a naphthylene group), —S—, —O—, —CO—, —$SO_2$—, —$N(R_0)$—, and divalent connecting groups obtained by combining a plurality of these. $R_0$ is a hydrogen atom or an alkyl group (which is, for example, an alkyl group having 1 to 8 carbon atoms, and specifically, a methyl group, an ethyl group, a propyl group, an n-butyl group, a sec-butyl group, a hexyl group, or an octyl group).

The alkyl group represented by Q is the same as each group represented by $L_1$ or $L_2$ described above.

In the cycloalkyl group which may include a heteroatom and the aryl group which may include a heteroatom, represented by Q, examples of an aliphatic hydrocarbon ring group which does not include a heteroatom or an aryl group which does not include a heteroatom include the cycloalkyl group and the aryl group represented by $L_1$ or $L_2$ described above, and each of the cycloalkyl group and the aryl group preferably has 3 to 15 carbon atoms.

Examples of the cycloalkyl group including a heteroatom and the aryl group including a heteroatom include a group having a heterocyclic structure such as thiirane, cyclothiolane, thiophene, furan, pyrrole, benzothiophene, benzofuran, benzopyrrole, triazine, imidazole, benzimidazole, triazole, thiadiazole, thiazole, or pyrrolidone, and the cycloalkyl group and the aryl group are not limited thereto as long as, in general, the groups have a structure (a ring formed by carbon and a heteroatom or a ring formed by heteroatoms) called a hetero ring.

As a ring formed by bonding of at least two of Q, M, and $L_1$ to each other, a case where at least two of Q, M, and $L_1$ are bonded to each other to form, for example, a propylene group or a butylene group, and as a result, a 5- or 6-membered ring containing an oxygen atom is formed is exemplified.

Each of the groups represented by $L_1$, $L_2$, M, and Q in General Formula (VI-A) may have a substituent, and examples thereof include a substituent described as a substituent which each of $R_{36}$ to $R_{39}$, $R_{01}$, $R_{02}$, and Ar described above may have, and the substituent preferably has 8 or less carbon atoms.

The group represented by -M-Q is preferably a group which is conFIG.ured of 1 to 30 carbon atoms.

The repeating unit represented by General Formula (II) is preferably the repeating unit represented by the following General Formula (II').

(II')

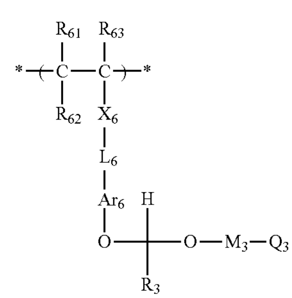

In General Formula (II'), $R_{61}$, $R_{62}$, $R_{63}$, $X_6$, $L_6$, and $Ar_6$ have the same meaning as those in General Formula (II), respectively.

$R_3$ represents a hydrogen atom, an alkyl group, a cycloalkyl group, an aryl group, an aralkyl group, an alkoxy group, an acyl group, or a heterocyclic group.

$M_3$ represents a single bond or a divalent connecting group.

$Q_3$ represents an alkyl group, a cycloalkyl group, an aryl group, or a heterocyclic group.

At least two of $Q_3$, $M_3$, and $R_3$ may be bonded to each other to form a ring.

Specific examples and preferable examples of $R_{61}$, $R_{62}$, $R_{63}$, $X_6$, and $L_6$ are the same as examples of $R_{61}$, $R_{62}$, $R_{63}$, $X_6$, and $L_6$ in General Formula (II).

Specific examples of the divalent aromatic group represented by $Ar_6$ are the same as examples of $Ar_6$ in General Formula (II), and the divalent aromatic group represented by $Ar_6$ is more preferably a phenylene group or a naphthylene group, and still more preferably a phenylene group.

$Ar_6$ may have a substituent, and examples of a substituent which $Ar_6$ can include the same substituents as substituents which $Ar_6$ in General Formula (II) can have.

The alkyl group or the cycloalkyl group represented by $R_3$ has the same meaning as the alkyl group or the cycloalkyl group represented by each of $R_{36}$ to $R_{39}$, $R_{01}$, and $R_{02}$ described above.

The aryl group represented by $R_3$ has the same meaning as the aryl group represented by each of $R_{36}$ to $R_{39}$, $R_{01}$, and $R_{02}$ described above, and the preferable range thereof is also the same.

The aralkyl group represented by $R_3$ is preferably an aralkyl group having 7 to 12 carbon atoms, and examples thereof can include a benzyl group, a phenethyl group, and a naphthylmethyl group.

The alkyl group portion in the alkoxy group represented by $R_3$ is the same as the alkyl group represented by each of $R_{36}$ to $R_{39}$, $R_{01}$, and $R_{02}$ described above, and the preferable range thereof is also the same.

Examples of the acyl group represented by $R_3$ include an aliphatic acyl group having 1 to 10 carbon atoms such as a formyl group, an acetyl group, a propionyl group, a butyryl group, an isobutyryl group, a valeryl group, a pivaloyl group, a benzoyl group, or a naphthoyl group, and the acyl group is preferably an acetyl group or a benzoyl group.

Examples of the heterocyclic group represented by $R_3$ include the cycloalkyl group including a heteroatom and the aryl group including a heteroatom, described above, and the heterocyclic group is preferably a pyridine ring group or a pyran ring group.

$R_3$ is preferably a linear or branched alkyl group (specifically, a methyl group, an ethyl group, a propyl group, an i-propyl group, an n-butyl group, a sec-butyl group, a tert-butyl group, a neopentyl group, a hexyl group, a 2-ethylhexyl group, or an octyl group) having 1 to 8 carbon atoms, a cycloalkyl group (specifically, a cyclopentyl group, a cyclohexyl group, a norbornyl group, or an adamantyl group) having 3 to 15 carbon atoms, or a group having 2 or more carbon atoms. $R_3$ is more preferably an ethyl group, an i-propyl group, a sec-butyl group, a tert-butyl group, a neopentyl group, a cyclohexyl group, an adamantyl group, a cyclohexyl methyl group, or an adamantane methyl group, and still more preferably a tert-butyl group, a sec-butyl group, a neopentyl group, a cyclohexyl methyl group, or an adamantane methyl group.

The above-described alkyl group, cycloalkyl group, aryl group, aralkyl group, alkoxy group, acyl group, and heterocyclic group may further have a substituent, and examples of substituents which the alkyl group, the cycloalkyl group, the aryl group, the aralkyl group, the alkoxy group, the acyl group, and the heterocyclic group can have include a substituent described as a substituent which each of $R_{36}$ to $R_{39}$, $R_{01}$, $R_{02}$, and Ar described above may have.

The divalent connecting group represented by $M_3$ has the same meaning as M in the structure represented by General Formula (VI-A), and the preferable range thereof is also the same. $M_3$ may have a substituent, and examples of substituents which $M_3$ can have include the same substituents as substituents which M in the group represented by General Formula (VI-A) can have.

The alkyl group, the cycloalkyl group, and the aryl group represented by $Q_3$ have the same meaning as those represented by Q in the structure represented by General Formula (VI-A), and the preferable ranges thereof are also the same.

Examples of the heterocyclic group represented by $Q_3$ include the cycloalkyl group including a heteroatom and the aryl group including a heteroatom, represented by Q in the structure represented by General Formula (VI-A), and the preferable ranges thereof are also the same.

$Q_3$ may have a substituent, and examples of substituents which $Q_3$ can have include the same substituents as substituents which Q in the group represented by General Formula (VI-A) can have.

A ring formed by bonding of at least two of $Q_3$, $M_3$, and $R_3$ to each other has the same meaning as a ring formed by bonding of at least two of Q, M, and $L_1$ to each other in General Formula (VI-A), and the preferable range thereof is also the same.

$R_3$ in General Formula (II') is preferably a group having 2 or more carbon atoms, and is more preferably a group represented by the following General Formula (II-2).

(II-2)

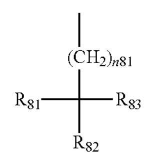

In General Formula (II-2), each of $R_{81}$, $R_{82}$, and $R_{83}$ independently represents an alkyl group, an alkenyl group, a cycloalkyl group, or an aryl group. n81 represents 0 or 1.

At least two of $R_{81}$ to $R_{83}$ may be connected to each other to form a ring.

The alkyl group represented by each of $R_{81}$ to $R_{83}$ may be linear or branched, and is preferably an alkyl group having 1 to 8 carbon atoms.

The alkenyl group represented by each of $R_{81}$ to $R_{83}$ may be linear or branched, and is preferably an alkenyl group having 1 to 8 carbon atoms.

Examples of the cycloalkyl groups represented by $R_{81}$ to $R_{83}$ include the same groups as those described as the cycloalkyl group represented by $R_{36}$ to $R_{39}$, $R_{01}$, or $R_{02}$ described above.

Examples of the aryl groups represented by $R_{81}$ to $R_{83}$ include the same groups as those described as the aryl group represented by $R_{36}$ to $R_{39}$, $R_{01}$, or $R_{02}$ described above.

Each of $R_{81}$ to $R_{83}$ is preferably an alkyl group, and more preferably a methyl group.

A ring which at least two of $R_{81}$ to $R_{83}$ can form is preferably a cyclopentyl group, a cyclohexyl group, a norbornyl group, or an adamantyl group.

Specific examples of the repeating unit represented by General Formula (II) will be described below, but the present invention is not limited thereto.

-continued
(VI-1)
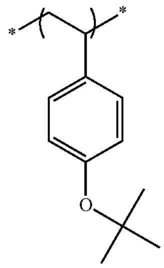
(VI-2)
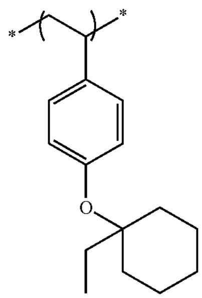
(VI-3)
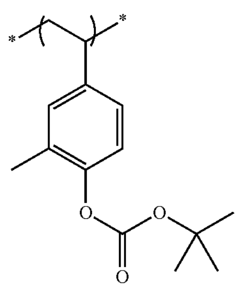
(VI-4)
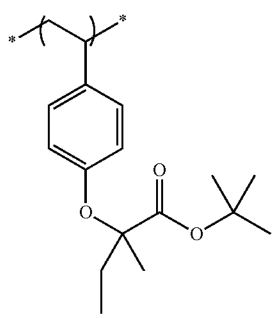
(VI-5)
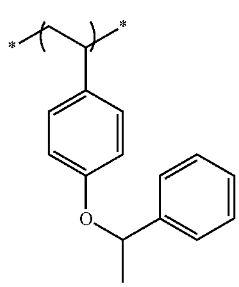
(VI-6)
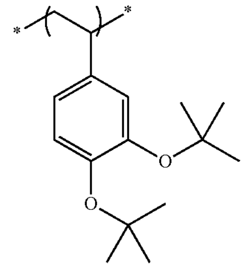
(VI-7)
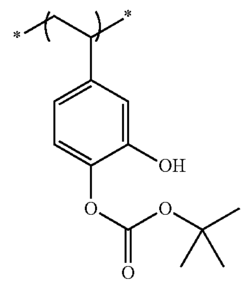
(VI-8)
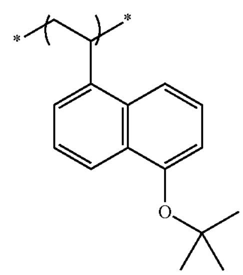
(VI-9)
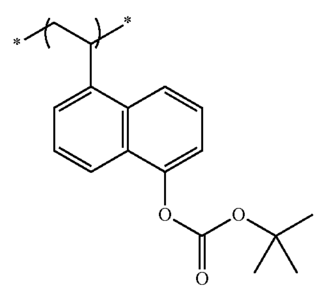
(VI-10)
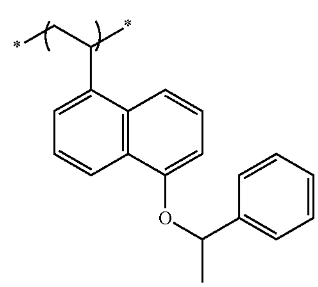

-continued
(VI-11)
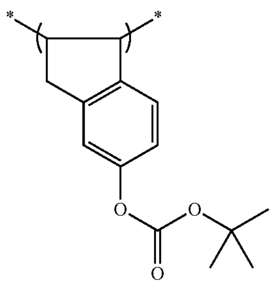
(VI-12)
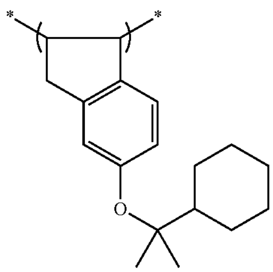
(VI-13)
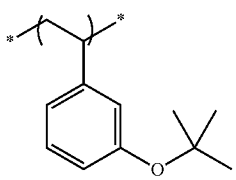
(VI-14)
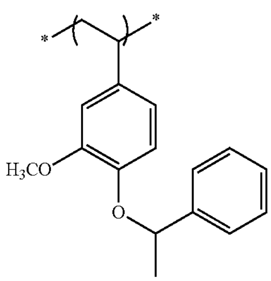
(VI-15)
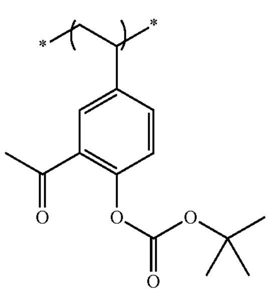
(VI-16)
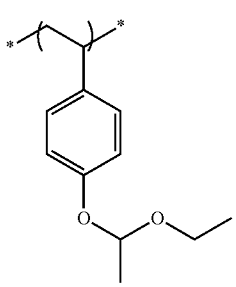
-continued
(VI-17)
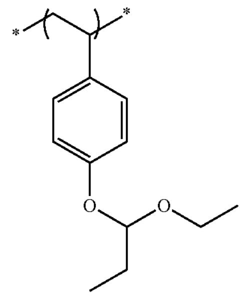
(VI-18)
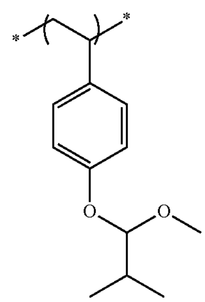
(VI-19)
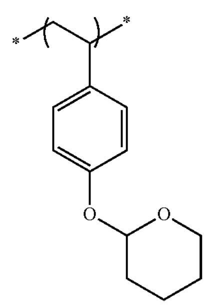
(VI-20)
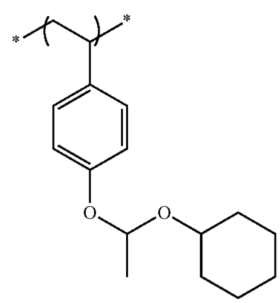
(VI-21)
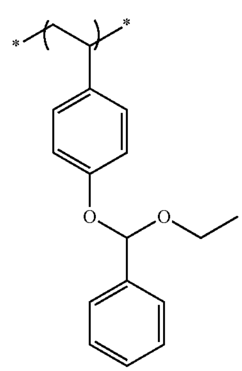

-continued
(VI-22)
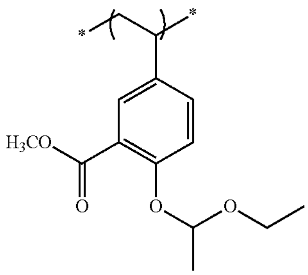
(VI-23)
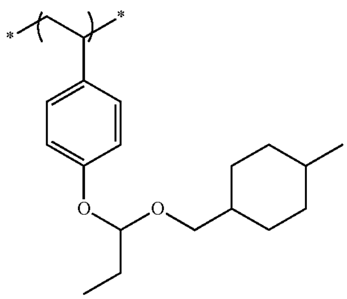
(VI-24)
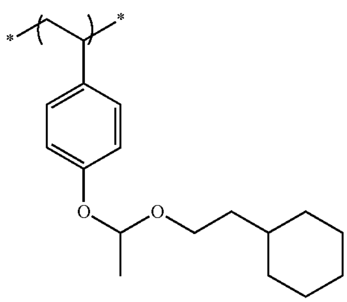
(VI-25)
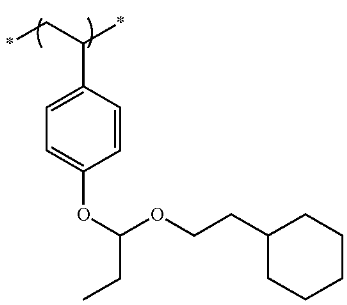
(VI-26)
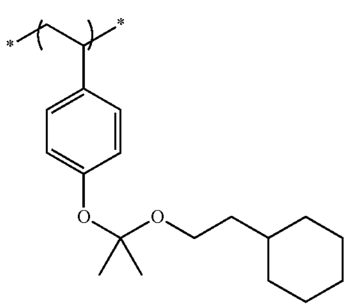
-continued
(VI-27)
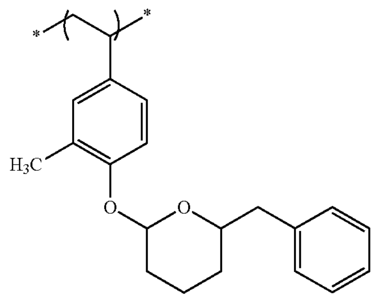
(VI-28)
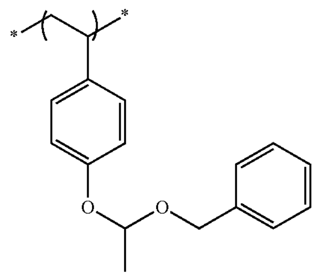
(VI-29)
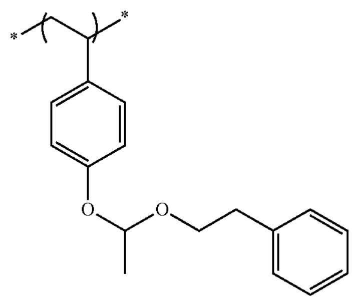
(VI-30)
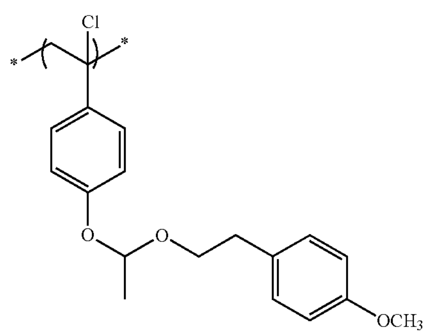
(VI-31)
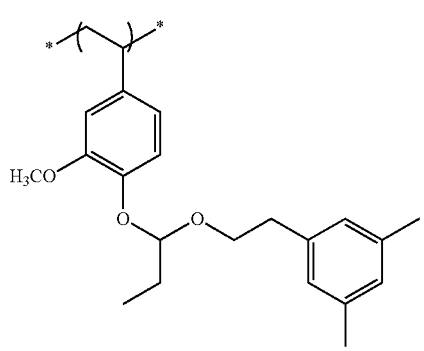

-continued
(VI-32)
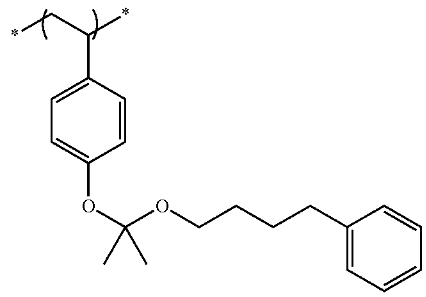
(VI-33)
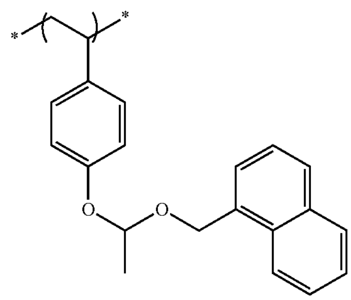
(VI-34)
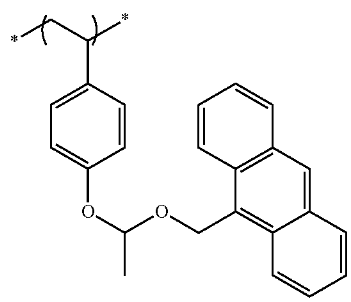
(VI-35)
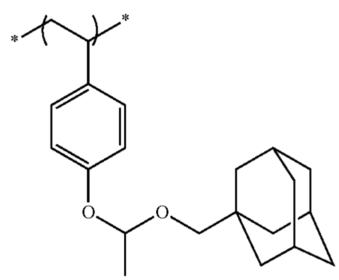
(VI-36)
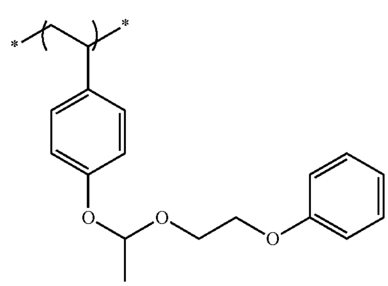
-continued
(VI-37)
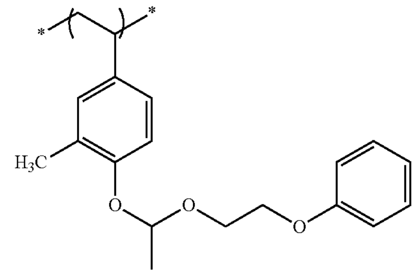
(VI-38)
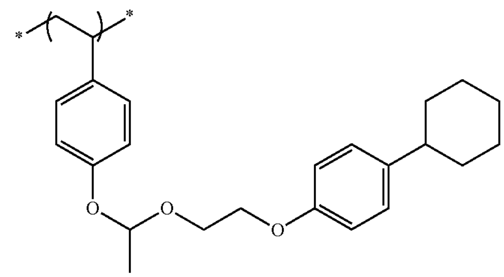
(VI-39)
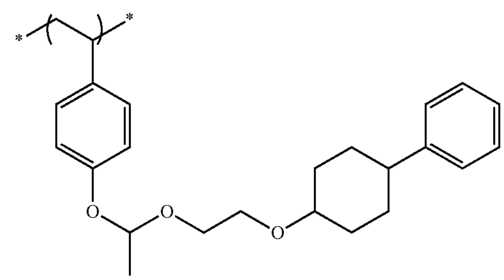
(VI-40)
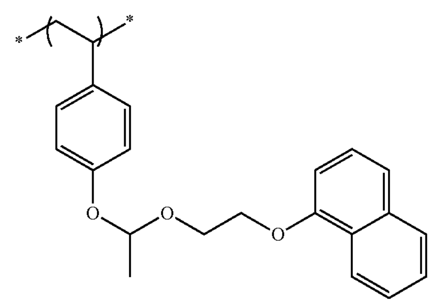
(VI-41)
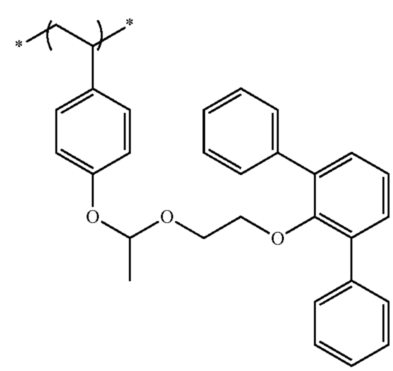

-continued
(VI-42)
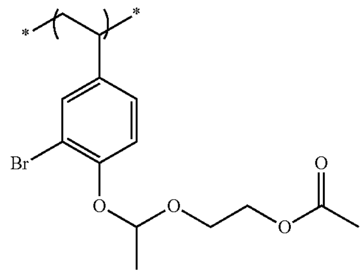
(VI-43)
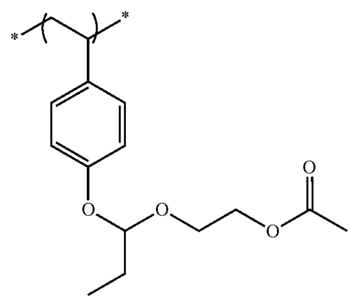
(VI-44)
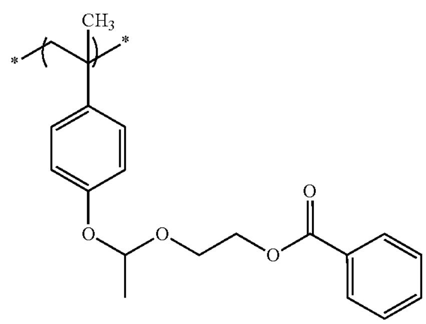
(VI-45)
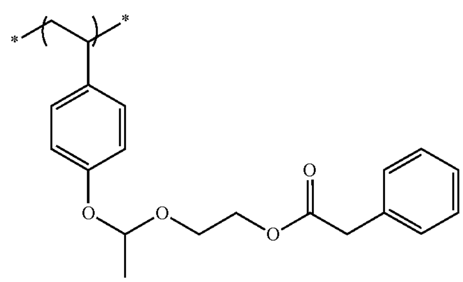
(VI-46)
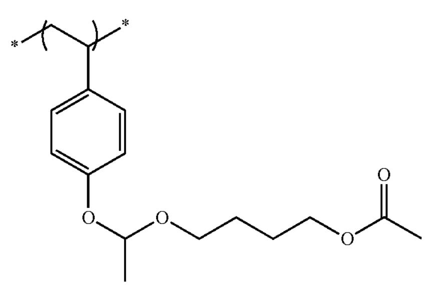
-continued
(VI-47)
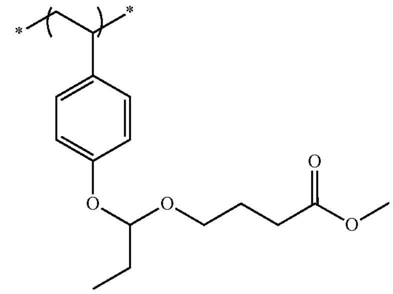
(VI-48)
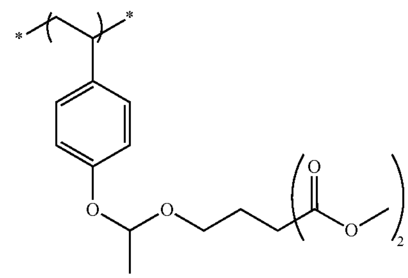
(VI-49)
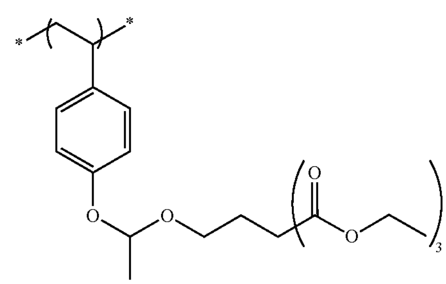
(VI-50)
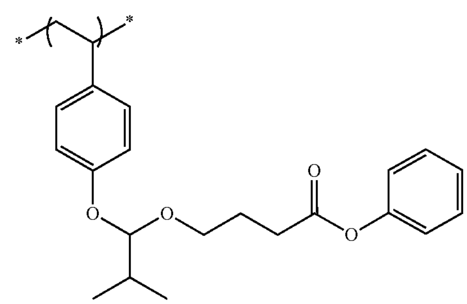
(VI-51)
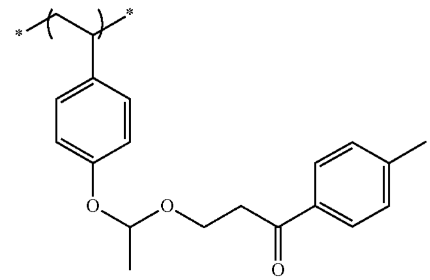

-continued
(VI-52)
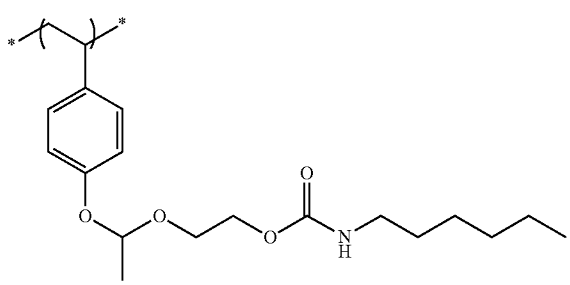
(VI-53)
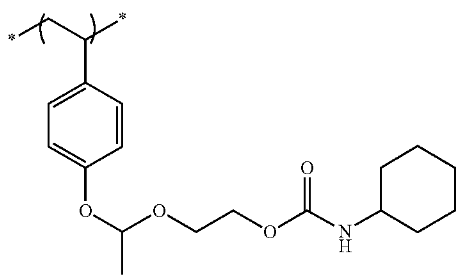
(VI-54)
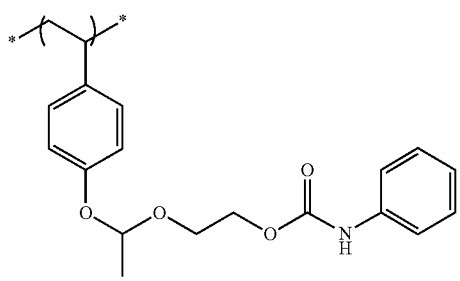
(VI-55)
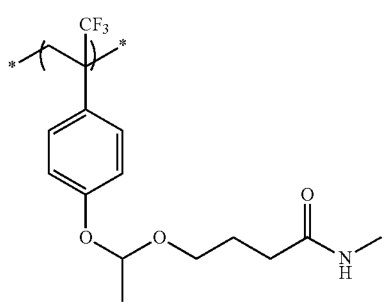
(VI-56)
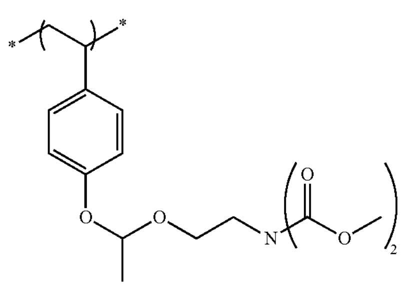
-continued
(VI-57)
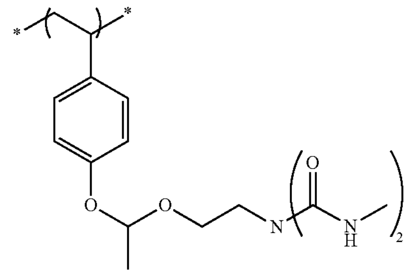
(VI-58)
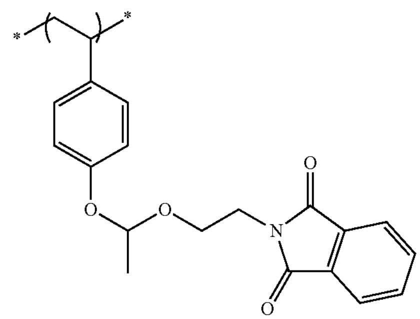
(VI-59)
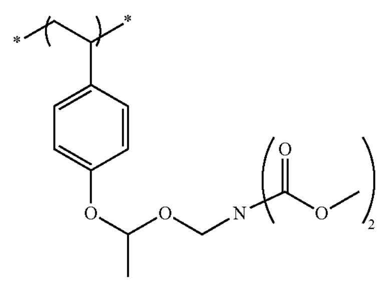
(VI-60)
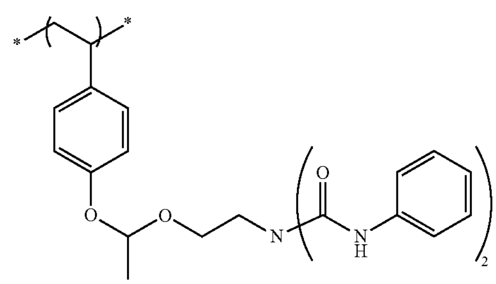
(VI-61)
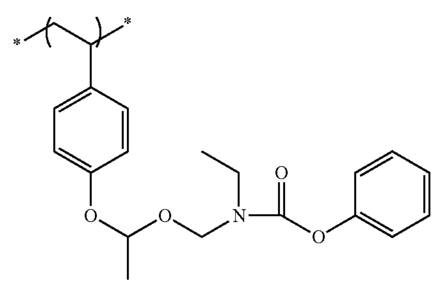

-continued
(VI-62)
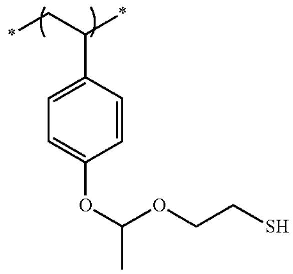
(VI-63)
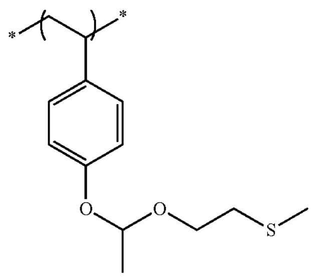
(VI-64)
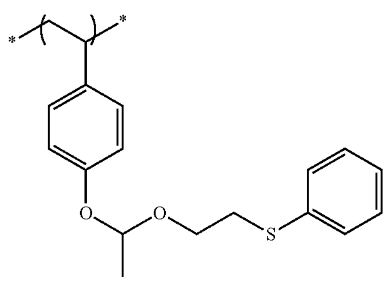
(VI-65)
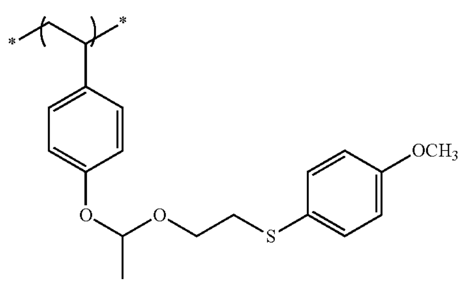
(VI-66)
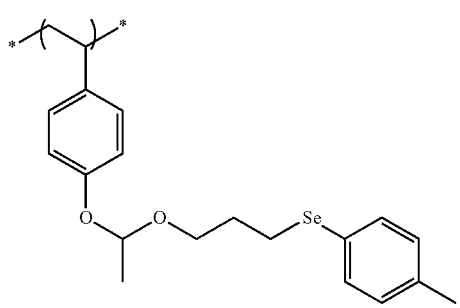
-continued
(VI-67)
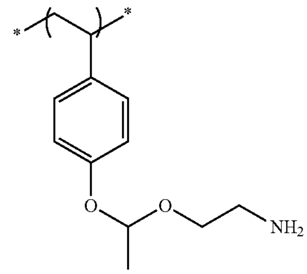
(VI-68)
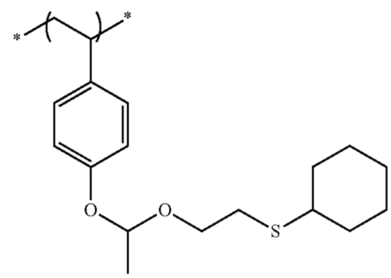
(VI-69)
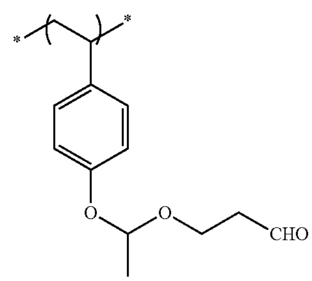
(VI-70)
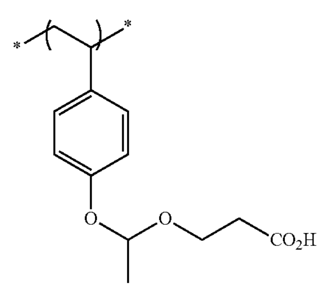
(VI-71)
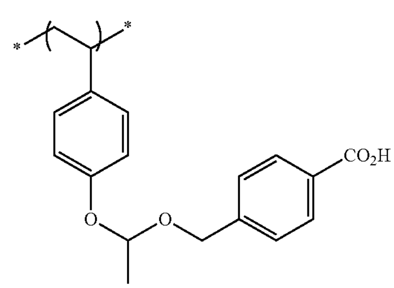

(VI-72)
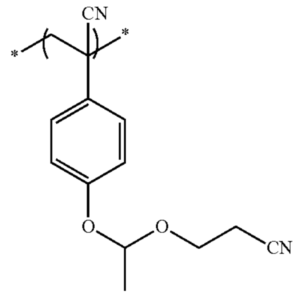
(VI-73)
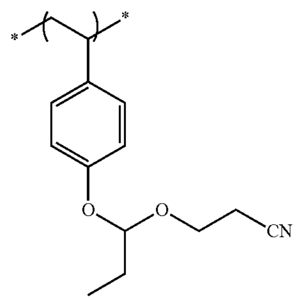
(VI-74)
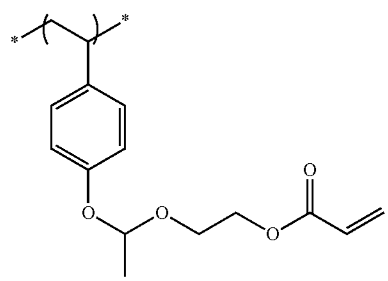
(VI-75)
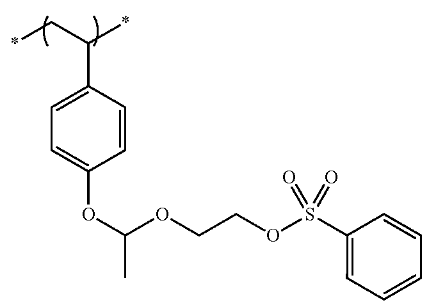
(VI-76)
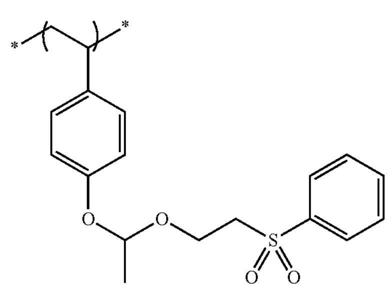
(VI-77)
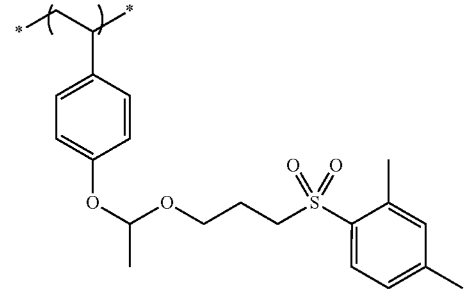
(VI-78)
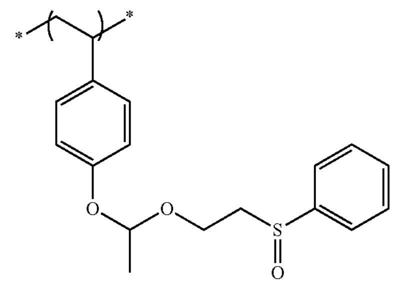
(VI-79)
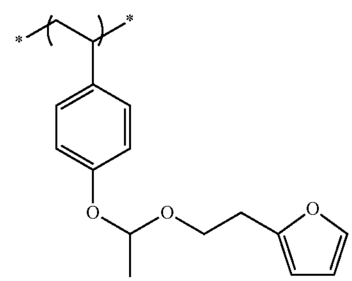
(VI-80)
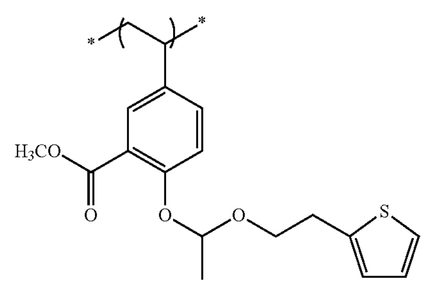
(VI-81)
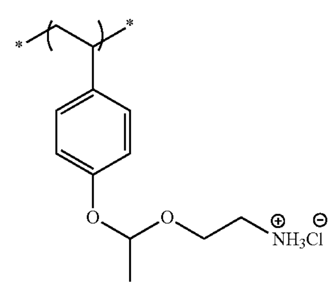
(VI-82)
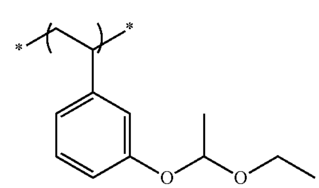

-continued
(VI-83)
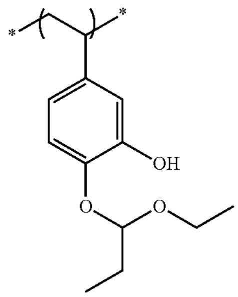
(VI-84)
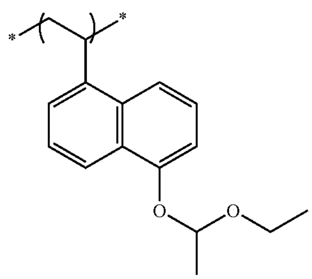
(VI-85)
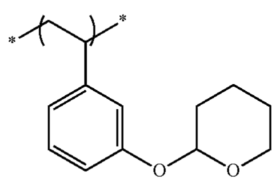
(VI-86)
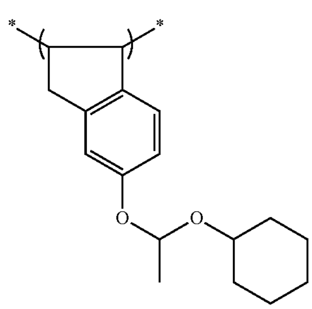
(VI-87)
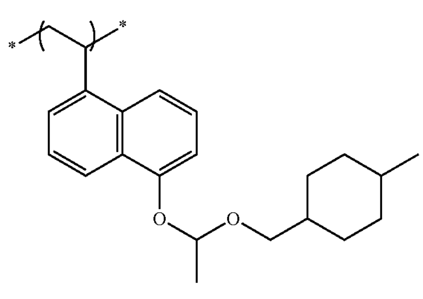
(VI-88)
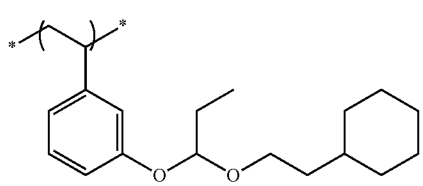
-continued
(VI-89)
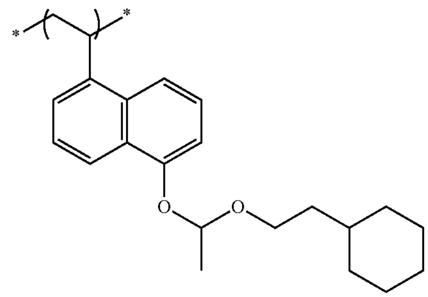
(VI-90)
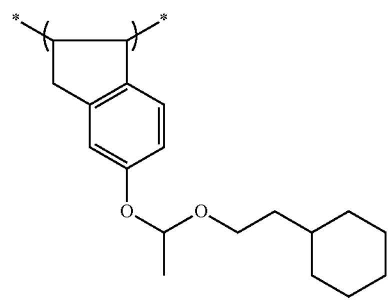
(VI-91)
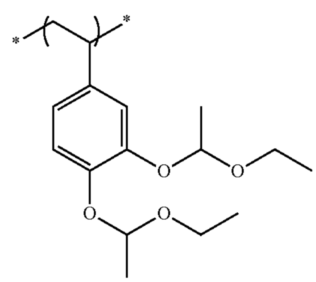
(VI-92)
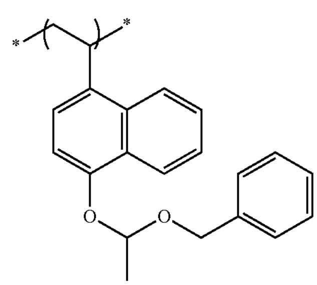
(VI-93)
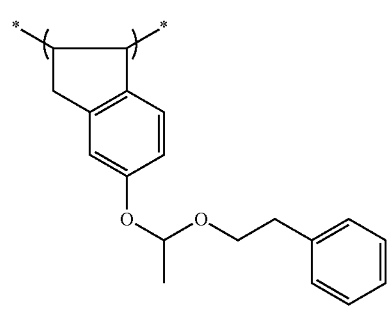

-continued
(VI-94)
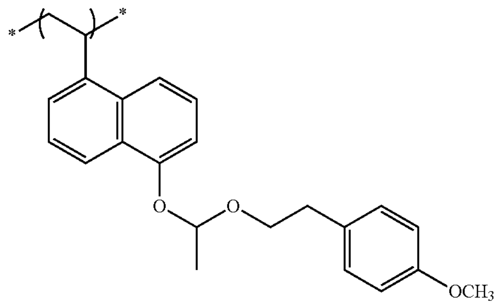
(VI-95)
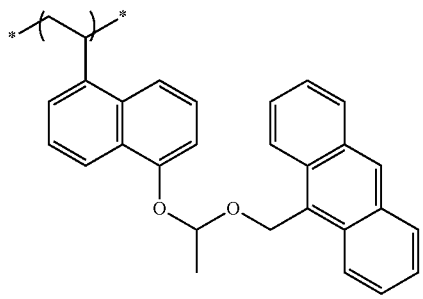
(VI-96)
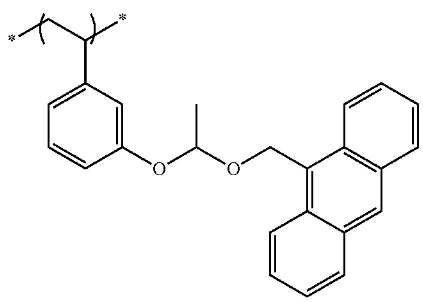
(VI-97)
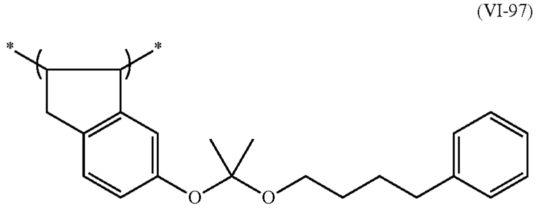
(VI-98)
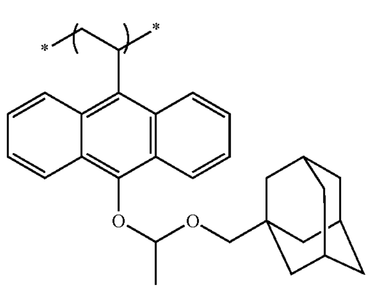
-continued
(VI-99)
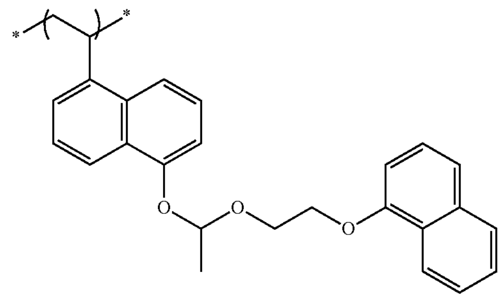
(VI-100)
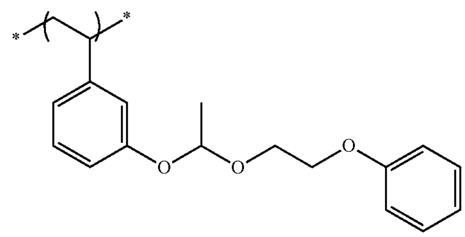
(VI-101)
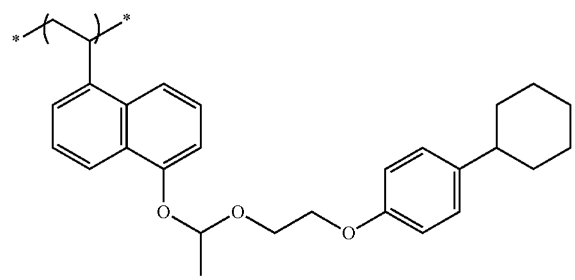
(VI-102)
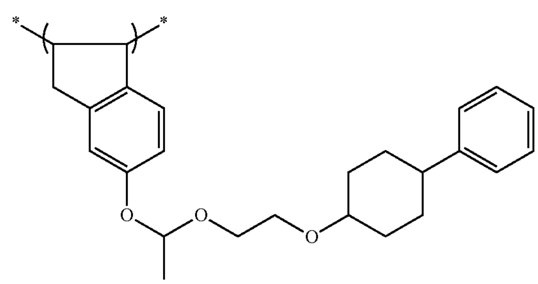
(VI-103)
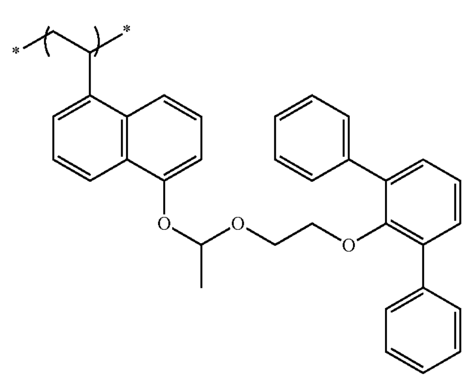

(VI-104)
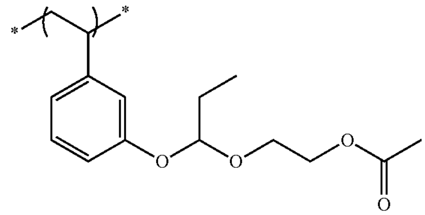
(VI-105)
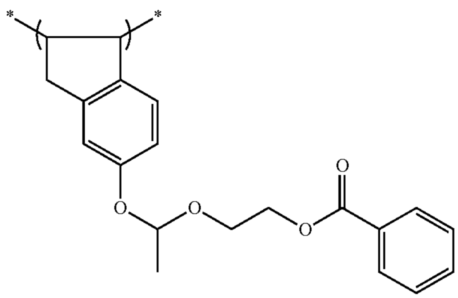
(VI-106)
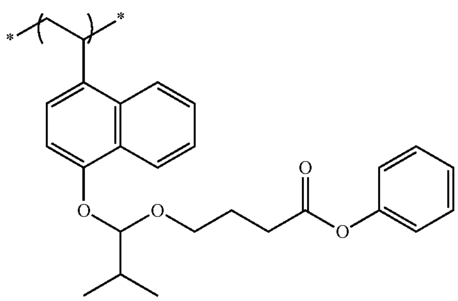
(VI-107)
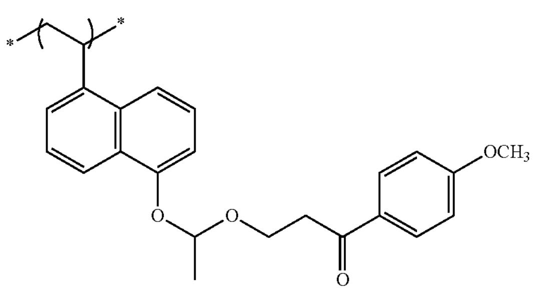
(VI-108)
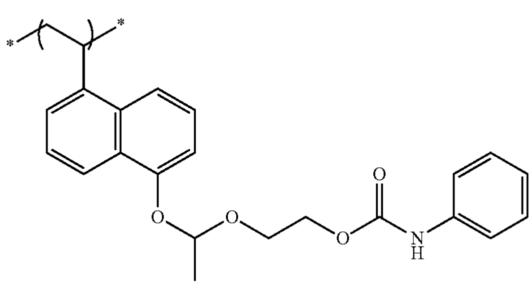
(VI-109)
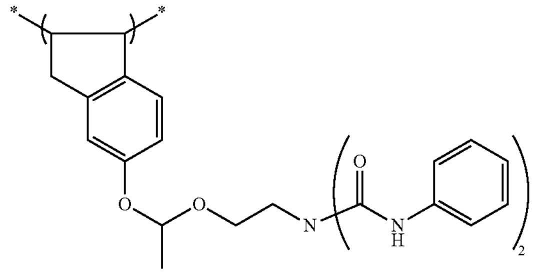
(VI-110)
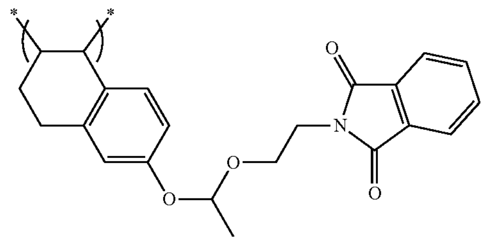
(VI-111)
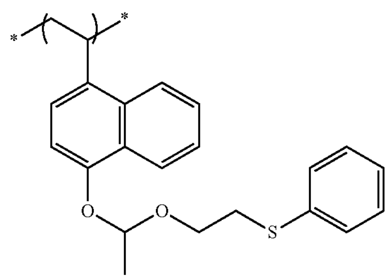
(VI-112)
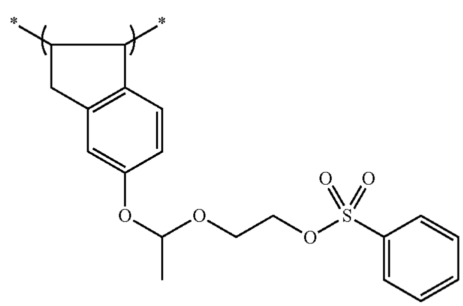
(VI-113)
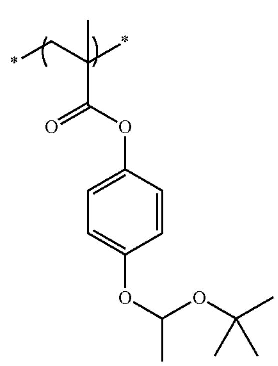

-continued
(VI-114)
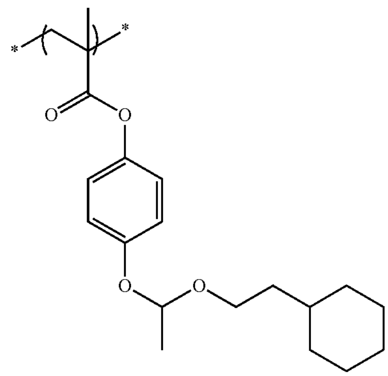
(VI-115)
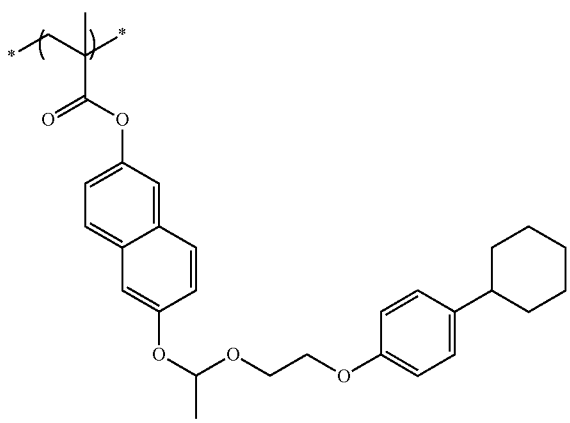
(VI-116)
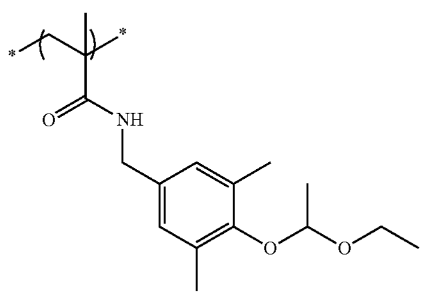
(V-117)
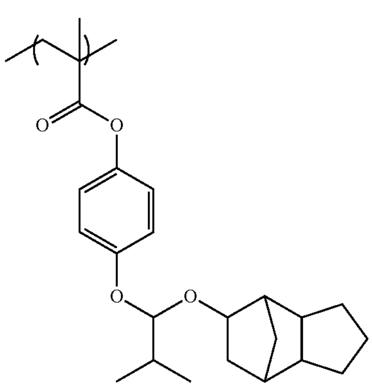
-continued
(V-118)
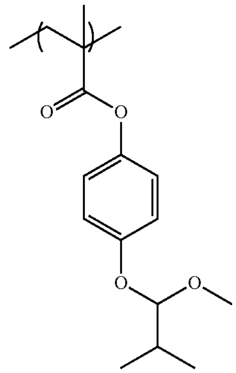
(V-119)
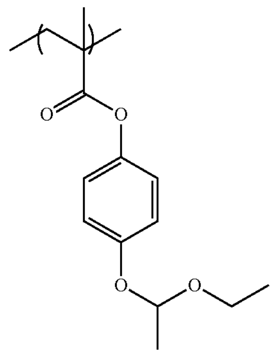
(V-120)
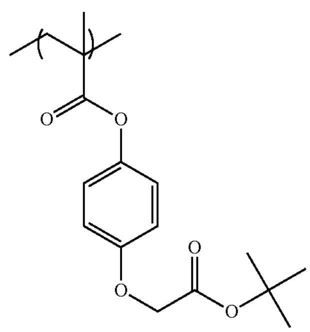
(V-121)
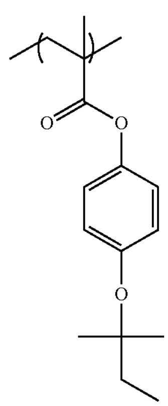

-continued
(V-122)
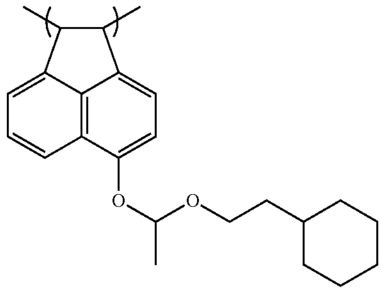
(V-123)
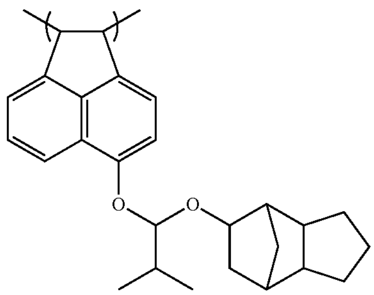
(V-124)
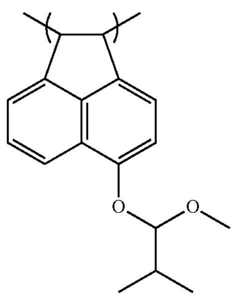
(V-125)
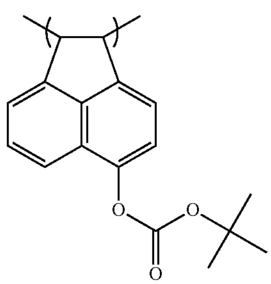
(V-126)
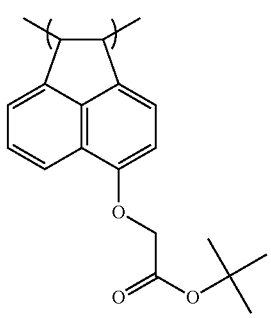
-continued
(V-127)
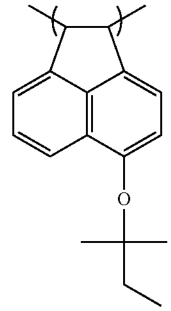
(V-128)
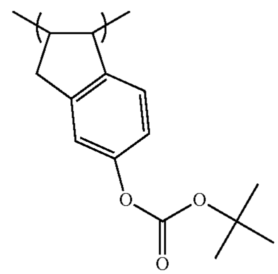
(V-129)
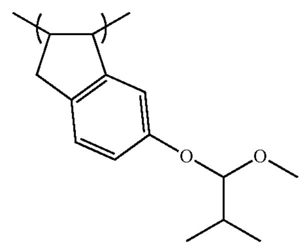
(V-130)
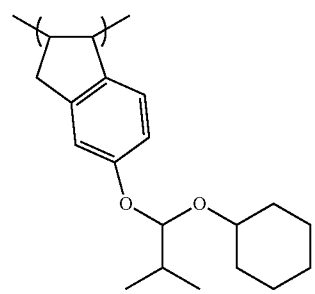
(V-131)
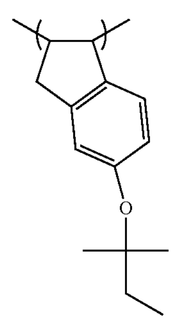

-continued
(V-132)
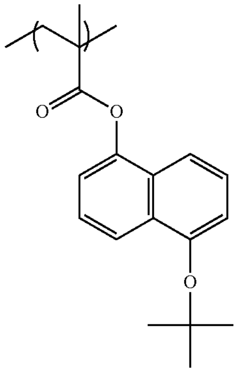
(V-133)
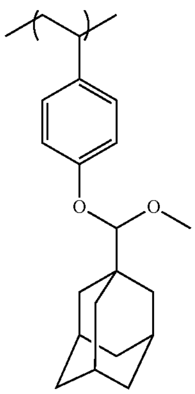
(V-134)
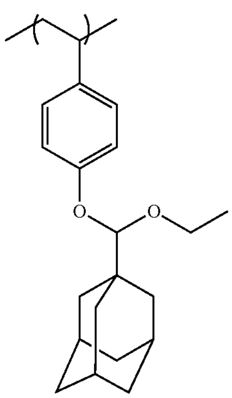
(V-135)
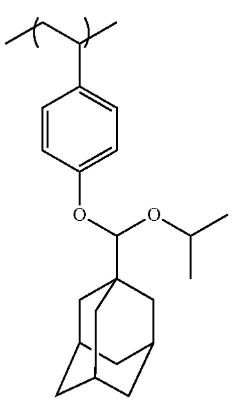
-continued
(V-136)
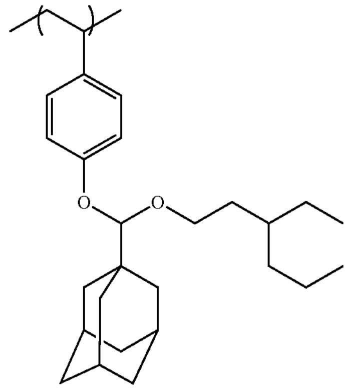
(V-137)
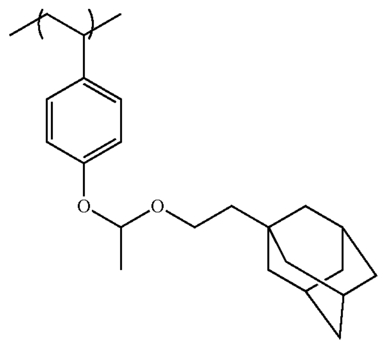
(V-138)
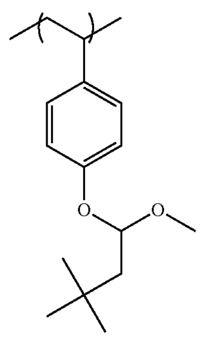
(V-139)
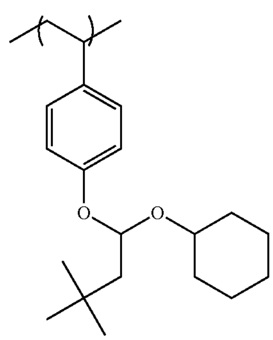

-continued
(V-140)
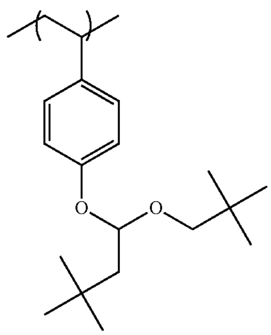
(V-141)
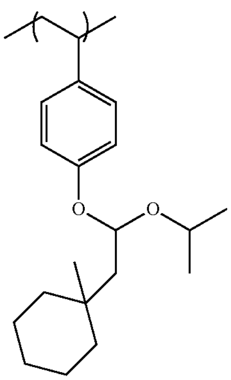
(V-142)
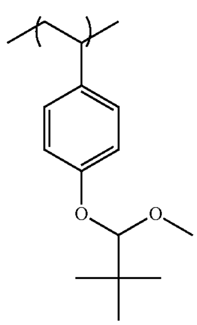
(V-143)
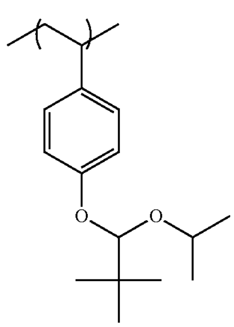
-continued
(V-144)
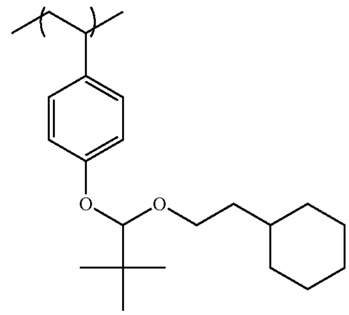
(V-145)
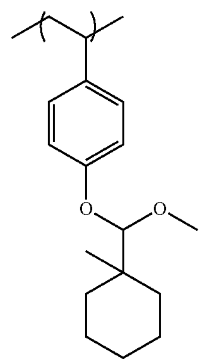
(V-146)
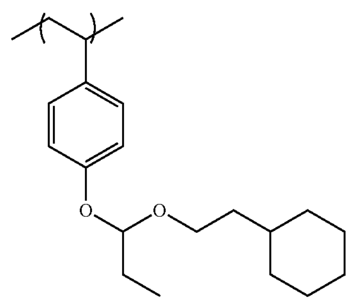
(V-147)
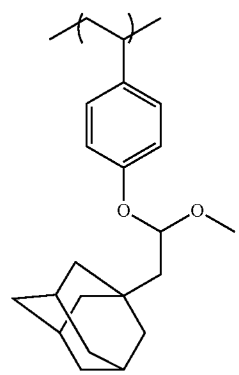
(V-148)
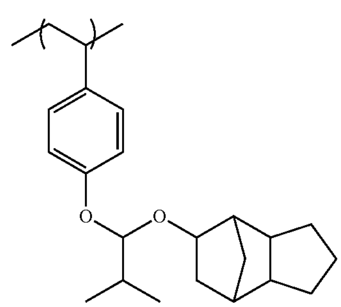

-continued (V-149)

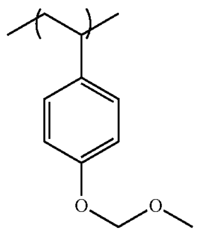

(V-150)

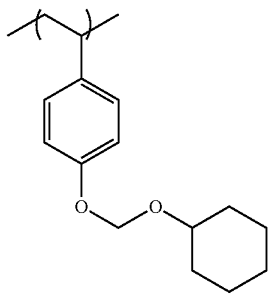

(V-151)

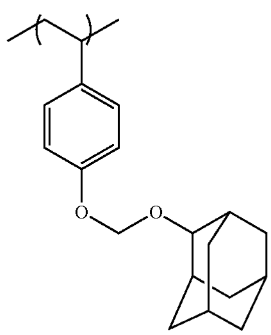

(V-152)

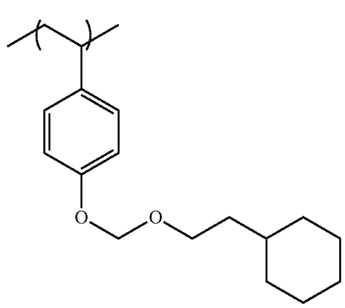

-continued (V-153)

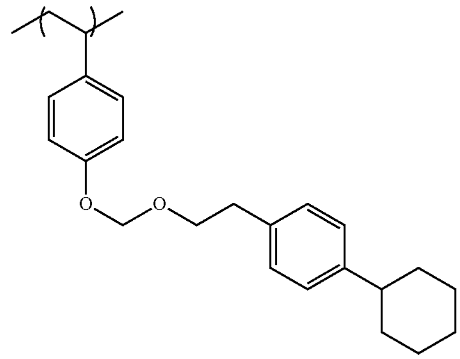

(V-154)

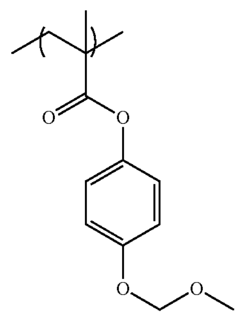

(V-155)

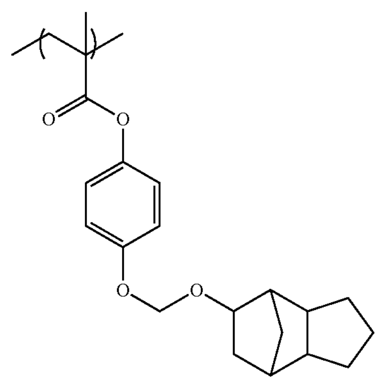

(III)

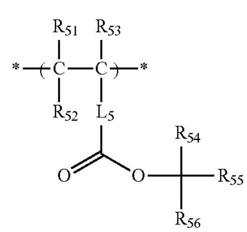

In General Formula (III), each of $R_{51}$, $R_{52}$, and $R_{53}$ independently represents a hydrogen atom, an alkyl group, a cycloalkyl group, a halogen atom, a cyano group, or an alkoxycarbonyl group. $R_{52}$ may be bonded to $L_5$ to form a ring, and $R_{52}$ in this case represents an alkylene group.

$L_5$ represents a single bond or a divalent connecting group, and in the case of being bonded to $R_{52}$ to form a ring, represents a trivalent connecting group.

$R_{54}$ represents an alkyl group, and each of $R_{55}$ and $R_{56}$ independently represents a hydrogen atom, an alkyl group, a cycloalkyl group, an aryl group, or an aralkyl group. $R_{55}$ to $R_{56}$ may be bonded to each other to form a ring. However, $R_{55}$ and $R_{56}$ do not represent a hydrogen atom at the same time in any case.

General Formula (III) will be described in more detail.

Preferable examples of the alkyl group represented by each of $R_{51}$ to $R_{53}$ in General Formula (III) include an alkyl group having 20 or less carbon atoms such as a methyl group, an ethyl group, a propyl group, an isopropyl group, an n-butyl group, a sec-butyl group, a hexyl group, a 2-ethylhexyl group, an octyl group, or a dodecyl group, which may have a substituent, and an alkyl group having 8 or less carbon atoms is more preferable, and an alkyl group having 3 or less carbon atoms is particularly preferable.

The alkyl group included in an alkoxycarbonyl group is preferably the same alkyl group as that represented by each of $R_{51}$ to $R_{53}$ described above.

The cycloalkyl group may be monocyclic or polycyclic. Preferable examples include a monocyclic cycloalkyl group having 3 to 10 carbon atoms, such as a cyclopropyl group, a cyclopentyl group, or a cyclohexyl group, which may have a substituent.

Examples of the halogen atom include a fluorine atom, a chlorine atom, a bromine atom and an iodine atom, and a fluorine atom is particularly preferable.

Examples of the preferable substituent in each group described above can include an alkyl group, a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group, and nitro group, and the subsituent preferably has 8 or less carbon atoms.

In a case where $R_{52}$ represents an alkylene group and is bonded to $L_5$ to form a ring, preferable examples of the alkylene group include alkylene groups having 1 to 8 carbon atoms such as a methylene group, an ethylene group, a propylene group, a butylene group, a hexylene group, and an octylene group. The alkylene more preferably has 1 to 4 carbon atoms, and particularly preferably has 1 or 2 carbon atoms. A ring formed by bonding of $R_{52}$ and $L_5$ is particularly preferably a 5- or 6-membered ring.

As $R_{51}$ and $R_{53}$ in Formula (III), a hydrogen atom, an alkyl group, or a halogen atom is more preferable, and a hydrogen atom, a methyl group, an ethyl group, a trifluoromethyl group ($—CF_3$), a hydroxymethyl group ($—CH_2—OH$), a chloromethyl group ($—CH_2—Cl$), or a fluorine atom (—F) is particularly preferable. As $R_{52}$, a hydrogen atom, an alkyl group, a halogen atom, or an alkylene group (which is bonded to $L_5$ to form a ring) is more preferable, and a hydrogen atom, a methyl group, an ethyl group, a trifluoromethyl group ($—CF_3$), a hydroxymethyl group ($—CH_2—OH$), a chloromethyl group ($—CH_2—Cl$), a fluorine atom (—F), a methylene group (which is bonded to $L_5$ to form a ring), or an ethylene group (which is bonded to $L_5$ to form a ring) is particularly preferable.

Examples of the divalent connecting group represented by $L_5$ include an alkylene group, a divalent aromatic ring group, $—COO-L_{11}-$, $—O-L_{11}-$, and a group formed by combining two or more thereof. Here, $L_{11}$ represents an alkylene group, a cycloalkylene group, a divalent aromatic ring group, or a group obtained by combining an alkylene group and a divalent aromatic ring group.

Examples of the alkylene group represented by $L_5$ or $L_{11}$ include alkylene groups having 1 to 8 carbon atoms such as a methylene group, an ethylene group, a propylene group, a butylene group, a hexylene group, and an octylene group, and an alkylene group having 1 to 5 carbon atoms is preferable, an alkylene group having 1 to 4 carbon atoms is more preferable, and an alkylene group having 1 or 2 carbon atoms is particularly preferable.

As the cycloalkylene group represented by $L_{11}$, a cycloalkylene group having 3 to 20 carbon atoms is preferable, and examples thereof include a cyclopropylene group, a cyclobutylene group, a cyclopentylene group, a cyclohexylene group, a cycloheptylene group, a cyclooctylene group, a norbornylene group, and an adamantylene group.

In the cycloalkylene group represented by $L_{11}$, carbon atoms conFIG.uring the ring (carbon atoms which contribute to ring formation) may be carbonyl carbons, may be heteroatoms such as oxygen atoms, or may form a lactone ring containing an ester bond.

As the divalent aromatic ring group represented by $L_5$ or $L_{11}$, a phenylene group such as a 1,4-phenylene group, a 1,3-phenylene group, or a 1,2-phenylene group, or a 1,4-naphthylene group is preferable, and a 1,4-phenylene group is more preferable.

$L_{11}$ is preferably an alkylene group having 1 to 5 carbon atoms, and more preferably a methylene group or a propylene group.

$L_5$ is preferably a single bond, a group represented by $—COO-L_{11}-$, or a divalent aromatic ring group, more preferably a single bond or a group represented by $—COO-L_{11}-$ (here, $L_{11}$ represents a norbornyl group or an adamantyl group), and particularly preferably a single bond.

Preferable and specific examples of the divalent connecting group represented by $L_5$ are shown below, but the present invention is not limited thereto.

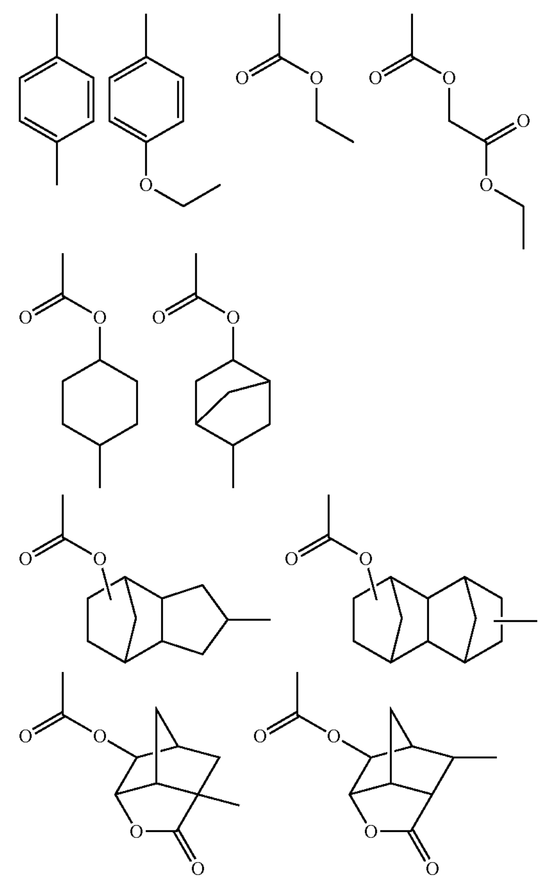

In a case where $L_5$ forms a ring by bonding to $R_{52}$, suitable examples of the trivalent connecting group represented by $L_5$ can include a group obtained by excluding one arbitrary hydrogen atom from a specific example described above of the divalent connecting group represented by $L_5$.

The alkyl group represented by each of $R_{54}$ to $R_{56}$ is preferably an alkyl group having 1 to 20 carbon atoms, more preferably an alkyl group having 1 to 10 carbon atoms, and particularly preferably an alkyl group having 1 to 4 carbon atoms such as a methyl group, an ethyl group, an n-propyl group, an isopropyl group, an n-butyl group, an isobutyl group, or a t-butyl group.

The cycloalkyl group represented by $R_{55}$ or $R_{56}$ is preferably a cycloalkyl group having 3 to 20 carbon atoms, may be a cycloalkyl group which is monocyclic, such as a cyclopentyl group or a cyclohexyl group, and may be a cycloalkyl group which is polycyclic, such as a norbornyl group, an adamantyl group, a tetratricyclodecanyl group, or a tetracyclododecanyl group.

A ring formed by bonding of $R_{55}$ and $R_{56}$ to each other is preferably a ring having 3 to 20 carbon atoms, may be a monocyclic ring such as a cyclopentyl group or a cyclohexyl group, and may be a polycyclic ring such as a norbornyl group, an adamantyl group, a tetratricyclodecanyl group, or a tetracyclododecanyl group. In a case where $R_{55}$ and $R_{56}$ are bonded to each other to form a ring, $R_{54}$ is preferably an alkyl group having 1 to 3 carbon atoms, and a methyl group or an ethyl group is more preferable.

The aryl group represented by $R_{55}$ or $R_{56}$ preferably has 6 to 20 carbon atoms, and may be monocyclic or polycyclic, or may have a substituent. Examples thereof include a phenyl group, a 1-naphthyl group, a 2-naphthyl group, a 4-methylphenyl group, and a 4-methoxyphenyl group. In a case where any one of $R_{55}$ and $R_{56}$ is a hydrogen atom, the other is preferably an aryl group.

The aralkyl group represented by $R_{55}$ or $R_{56}$ may be monocyclic or polycyclic, or may have a substituent. The aralkyl group preferably has 7 to 21 carbon atoms, and examples thereof include a benzyl group and a 1-naphthylmethyl group.

As the synthetic method of a monomer corresponding to the repeating unit represented by General Formula (III), a general synthetic method of a polymerizable group-containing ester can be applied, but the method is not be particularly limited.

Specific examples of the repeating unit represented by General Formula (III) will be described below, but the present invention is not limited thereto.

In the specific examples, each of Rx and Xa1 represents a hydrogen atom, $CH_3$, $CF_3$, or $CH_2OH$. Each of Rxa and Rxb independently represents an alkyl group having 1 to 4 carbon atoms, an aryl group having 6 to 18 carbon atoms, or an aralkyl group having 7 to 19 carbon atoms. Z represents a substituent. p represents 0 or a positive integer, and p is preferably 0 to 2, and more preferably 0 or 1. When a plurality of Z's are present, Z's may be the same as or different from each other. As Z, from the viewpoint of increasing dissolution contrast with respect to a developer including an organic solvent before and after acid decomposition, a group consisting of only hydrogen and carbon atoms is suitably exemplified, and for example, a linear or branched alkyl group or cycloalkyl group is preferable.

1

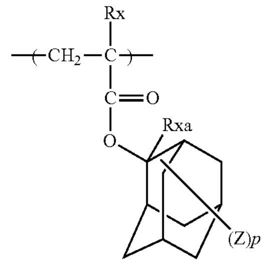

2

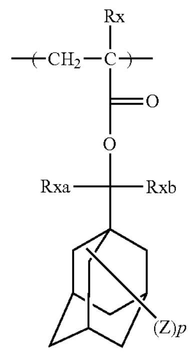

3

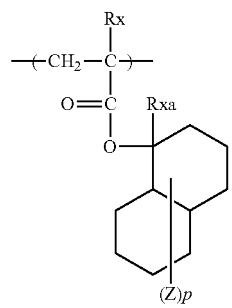

4

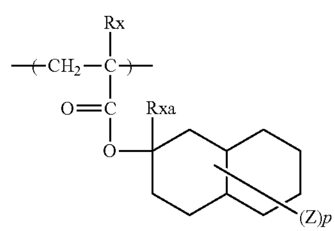

5

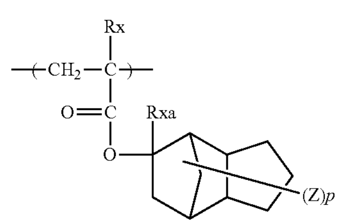

6

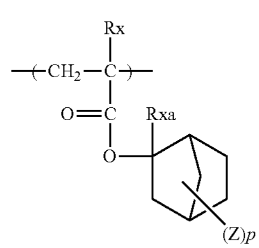

-continued
7
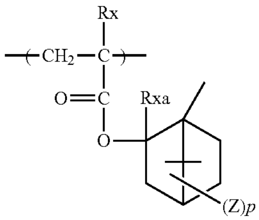
8
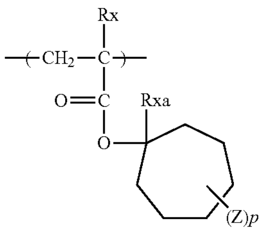
9
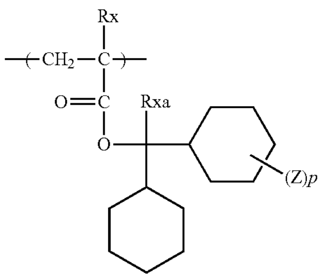
10
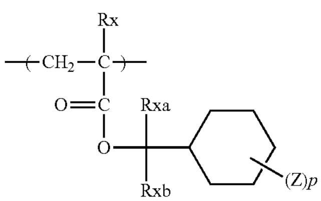
11
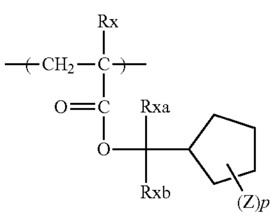
12
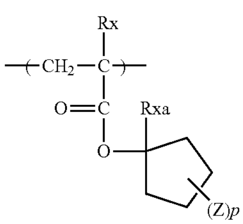
13
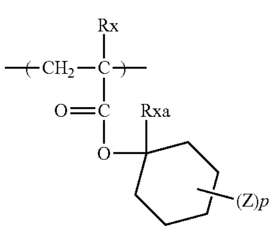
-continued
14
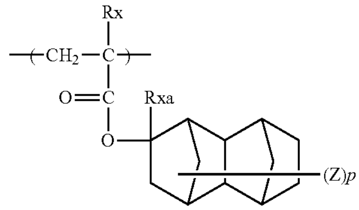
15
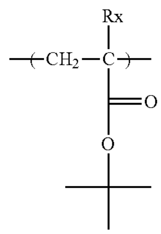
16
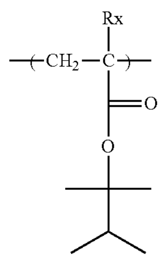
17
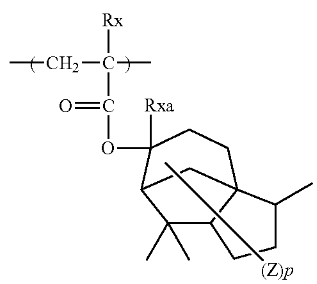
18
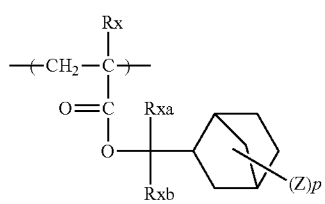
19
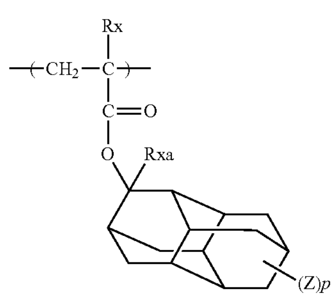

-continued
20
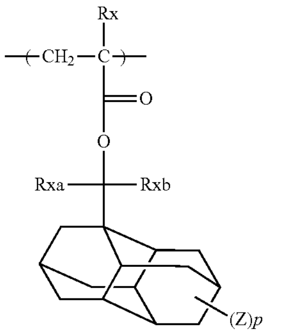
21
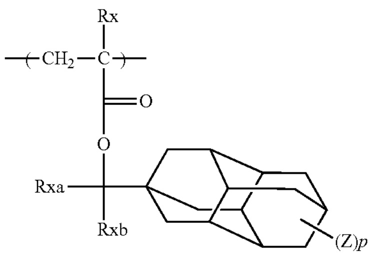
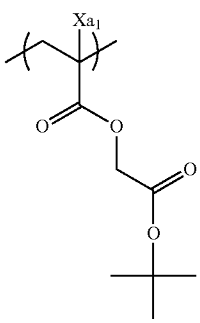
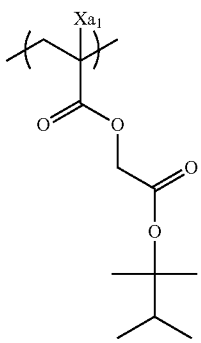
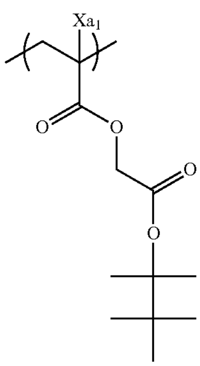
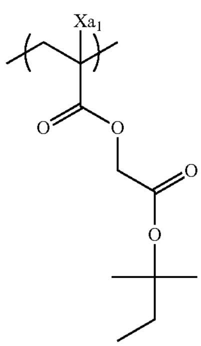
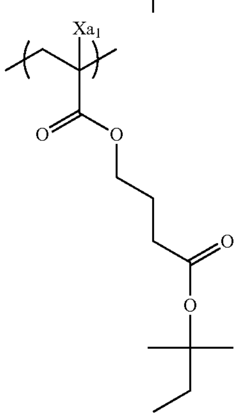
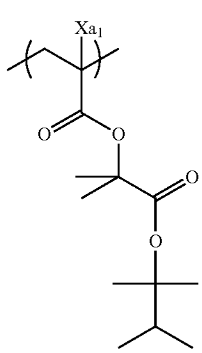
-continued
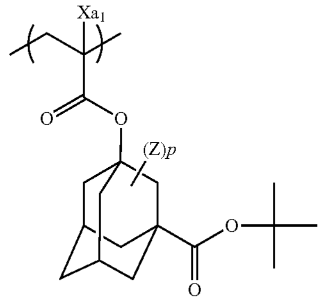
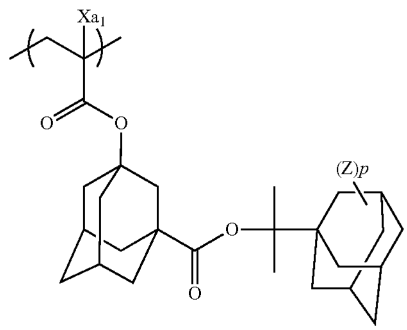
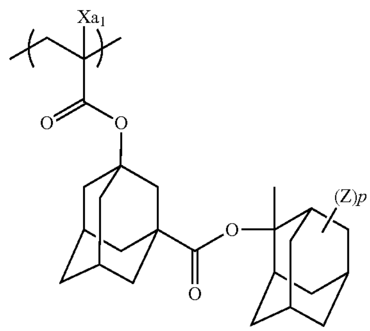
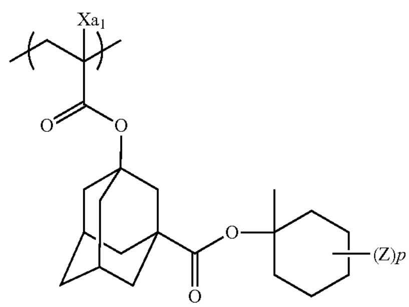
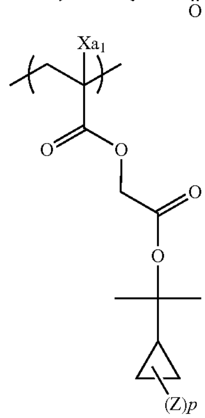
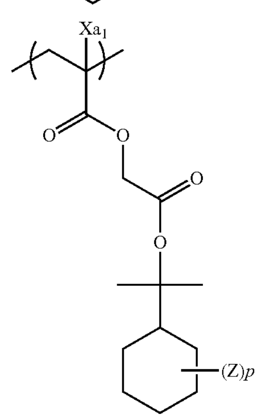

-continued
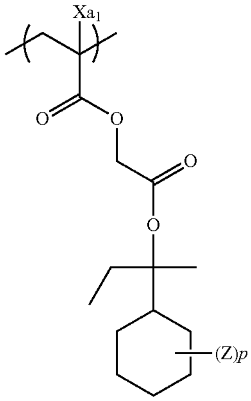
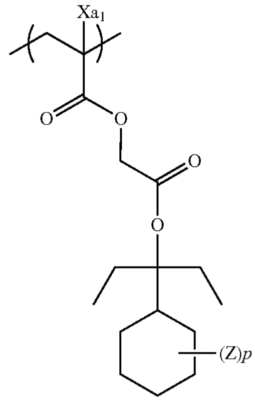
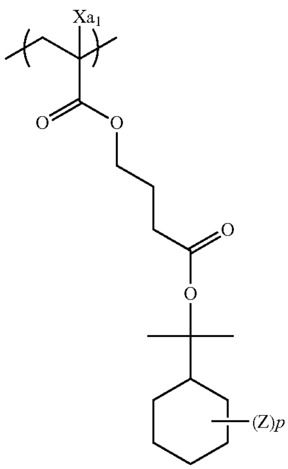
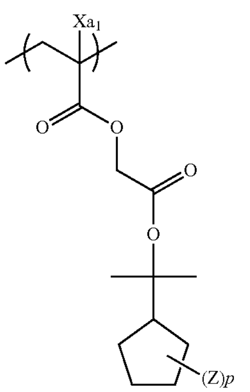
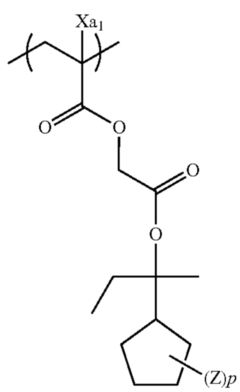
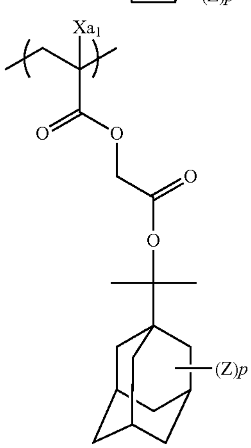
-continued
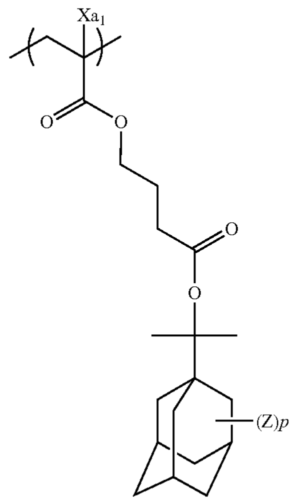
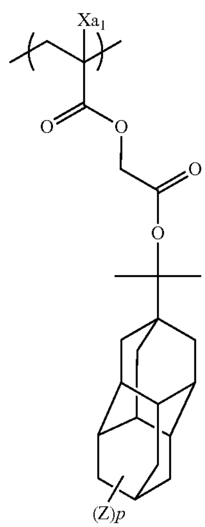
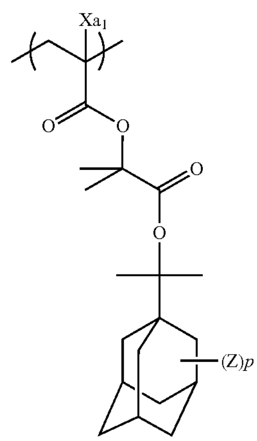
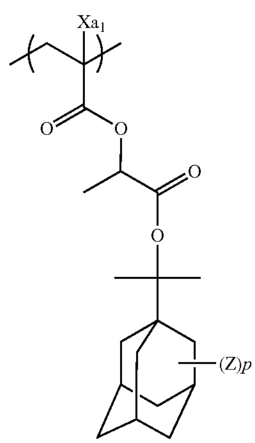
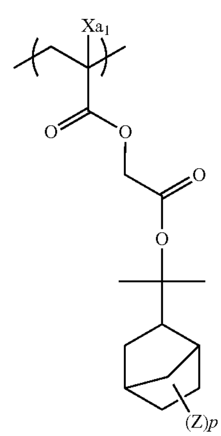

-continued
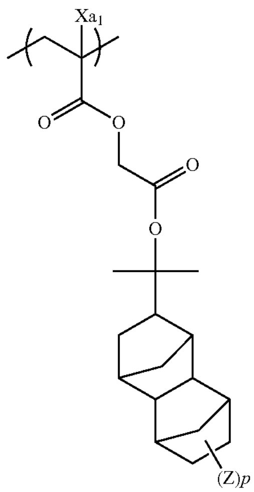
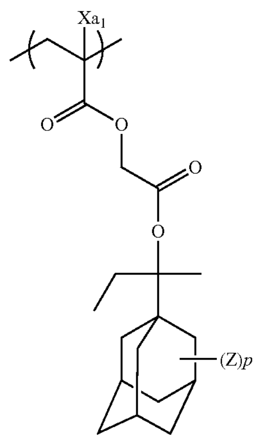
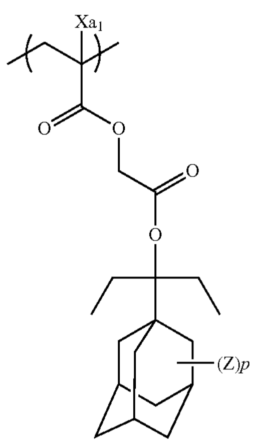
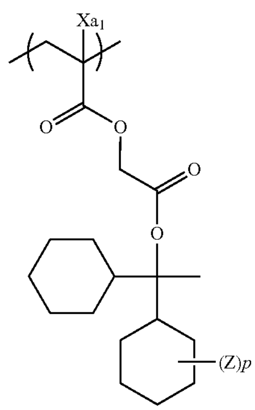
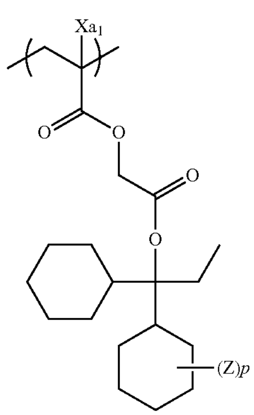
-continued
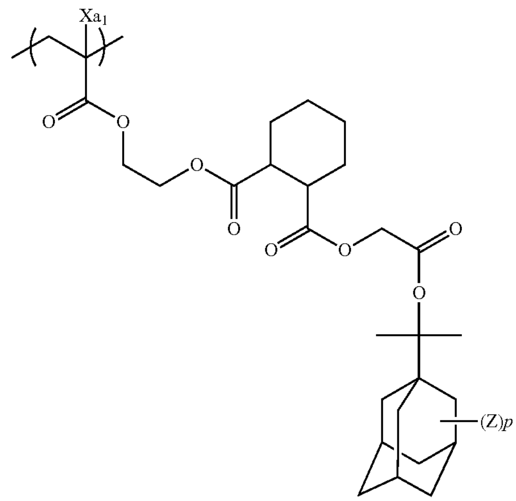
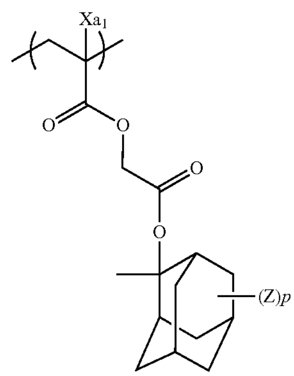
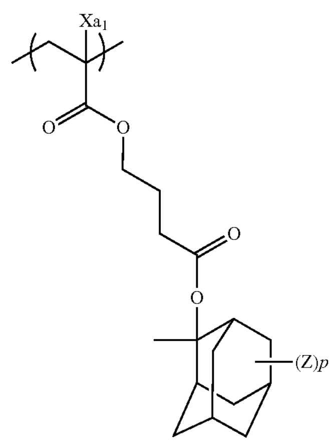
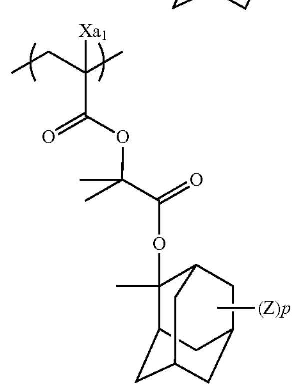

-continued
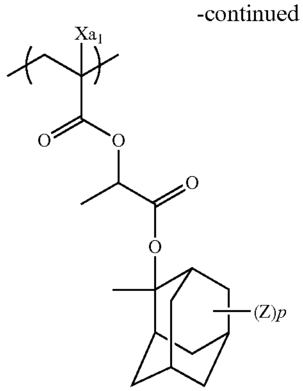
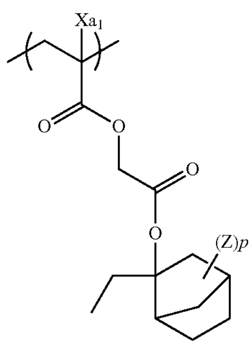
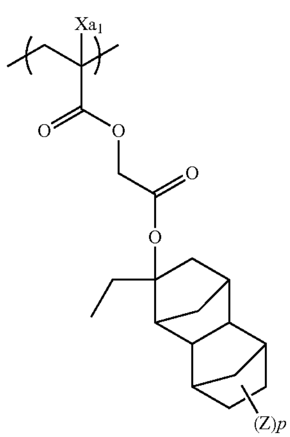
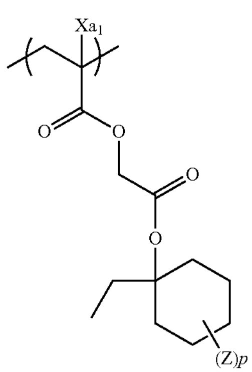
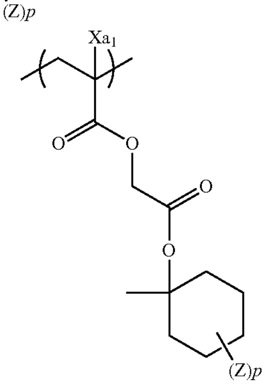
-continued
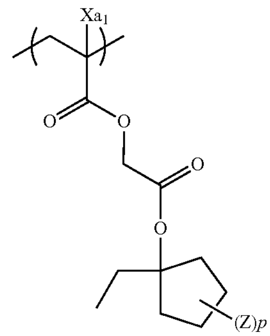
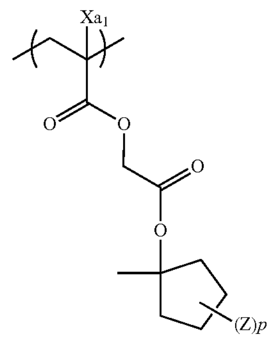
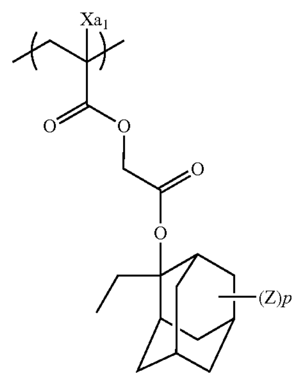
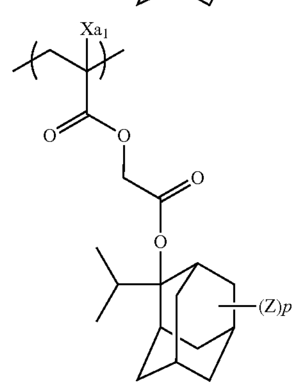
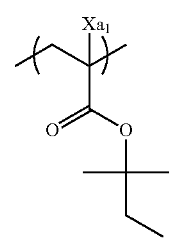
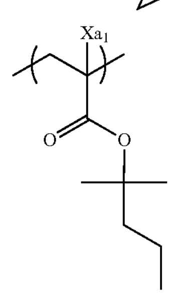
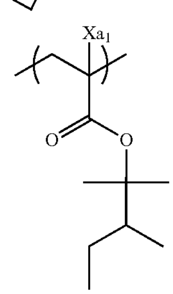
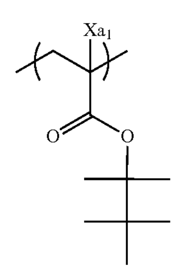

-continued
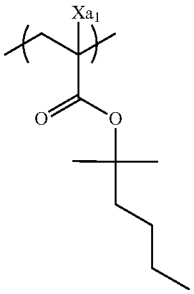
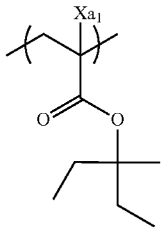
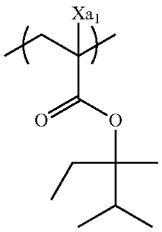
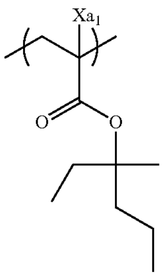
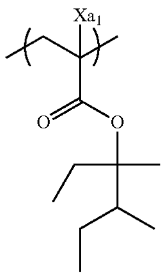
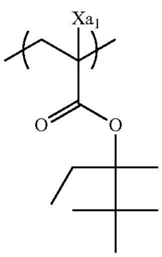
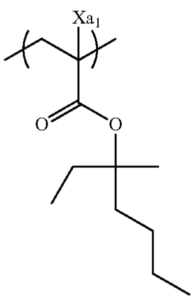
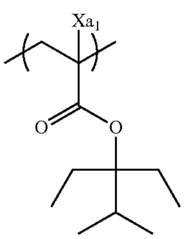
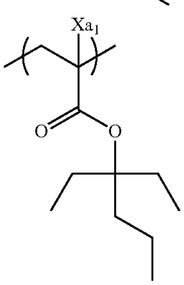
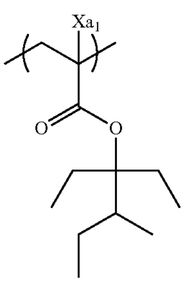
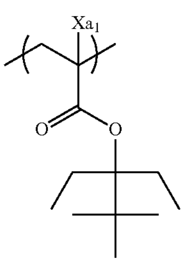
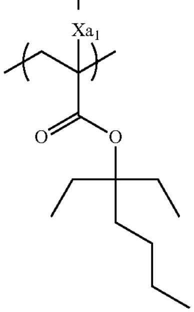
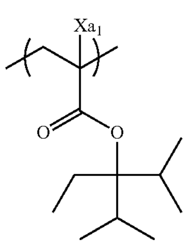
-continued
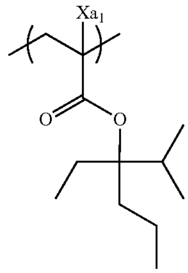
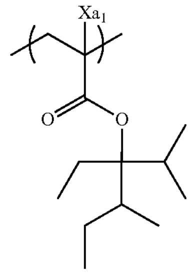
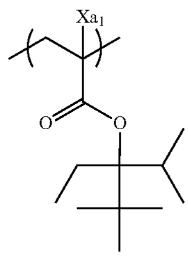
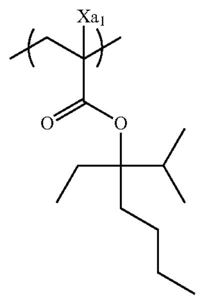
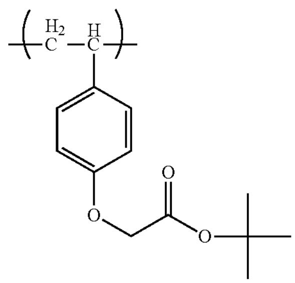
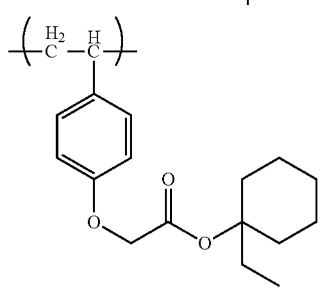
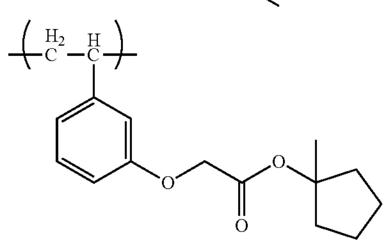
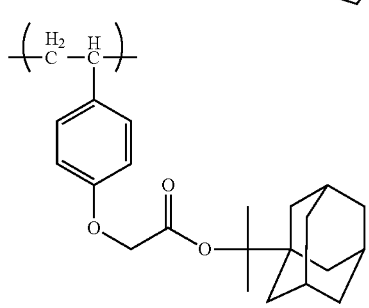

-continued
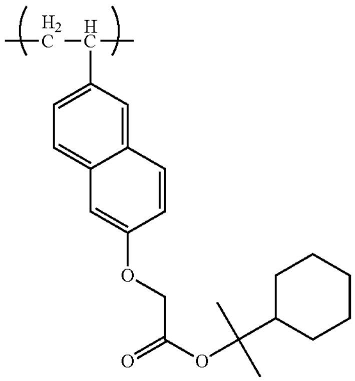
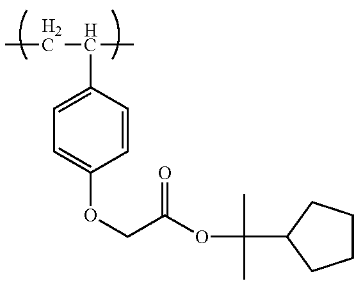
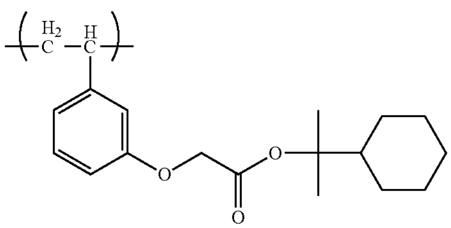
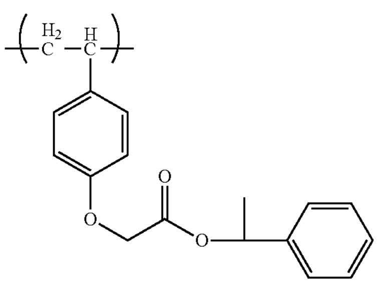
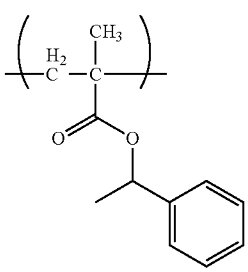
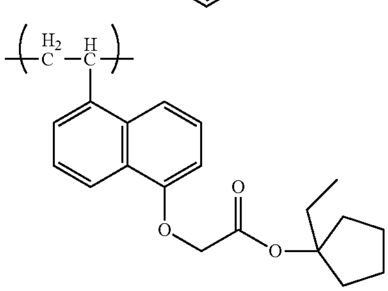
-continued
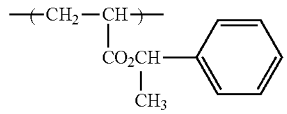
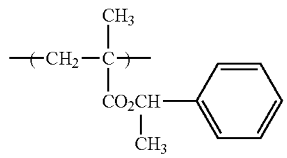
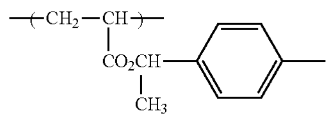
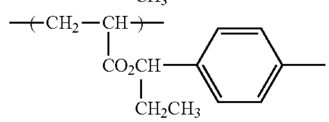
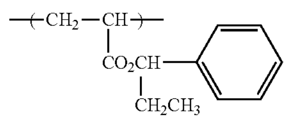
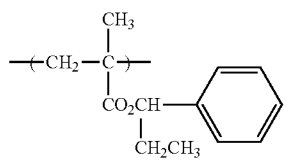
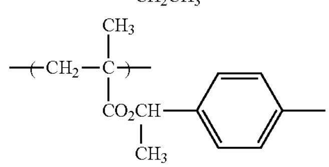
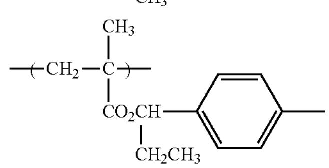
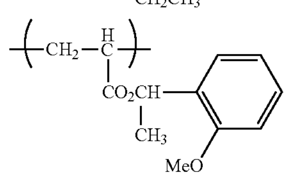
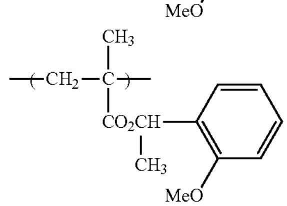
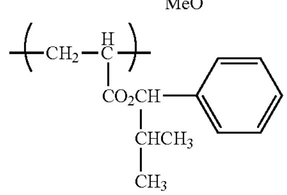

-continued
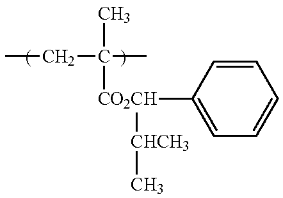
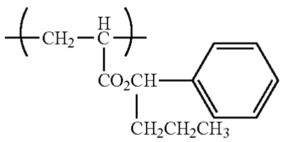
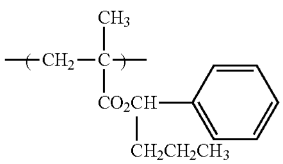
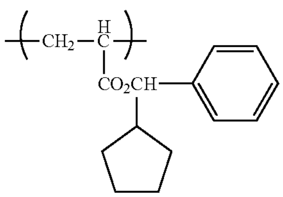
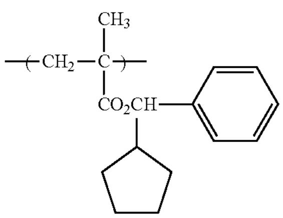
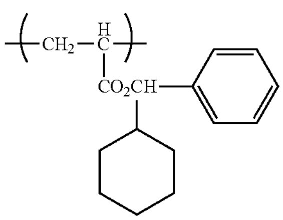
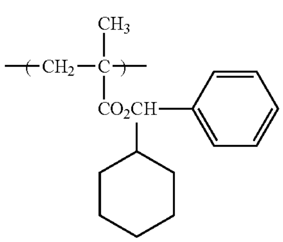
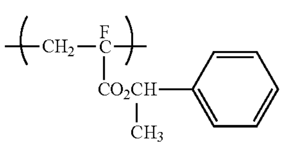
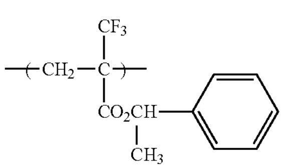
-continued
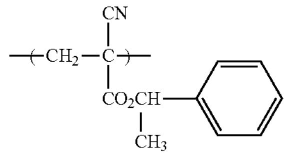
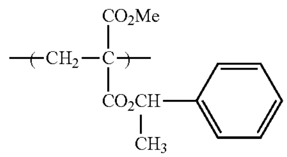
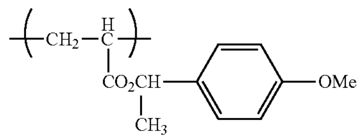
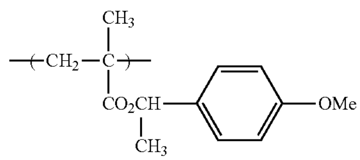
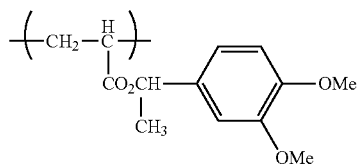
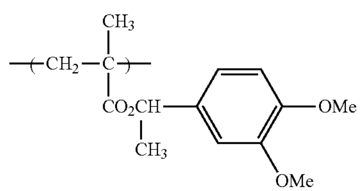
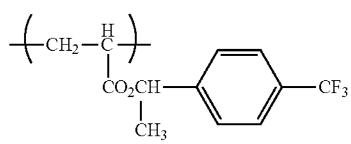
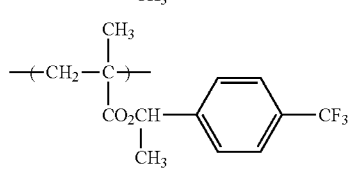
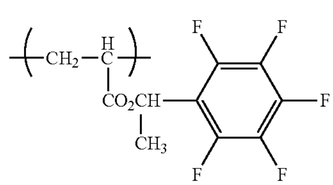
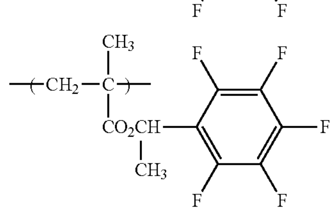

-continued
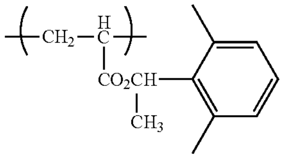
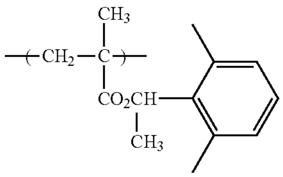
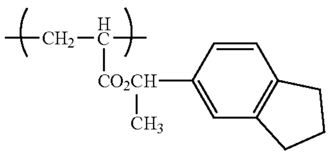
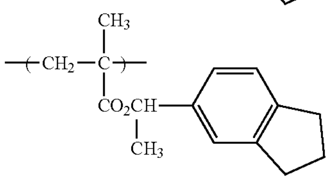
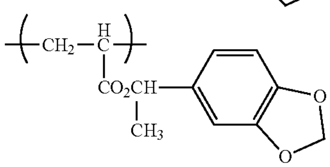
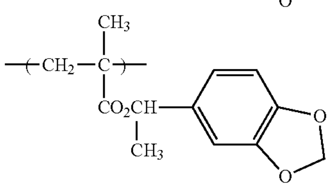
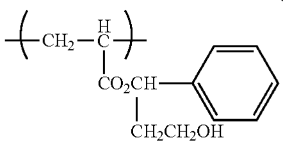
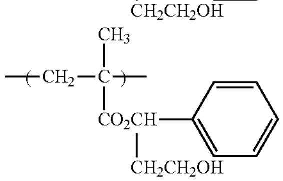
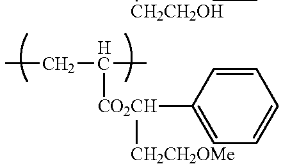
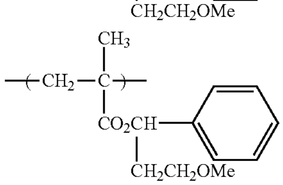
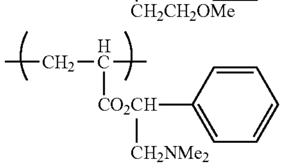
-continued
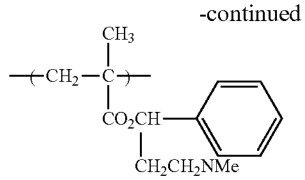
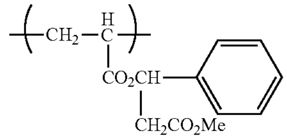
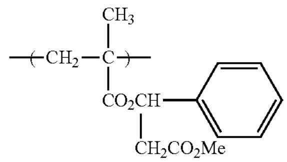
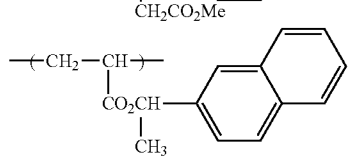
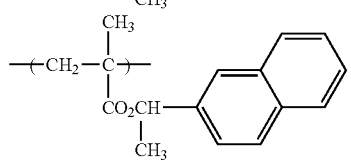
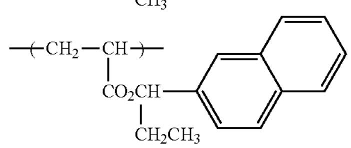
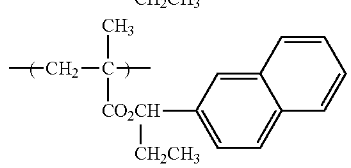
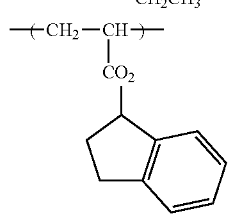
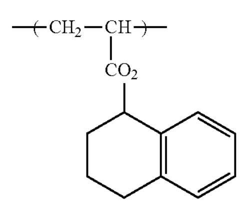
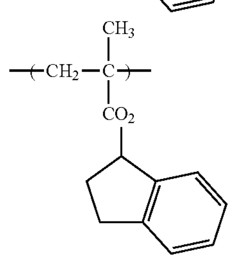
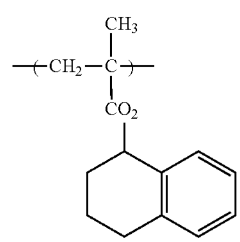
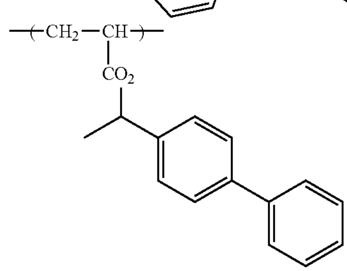

-continued
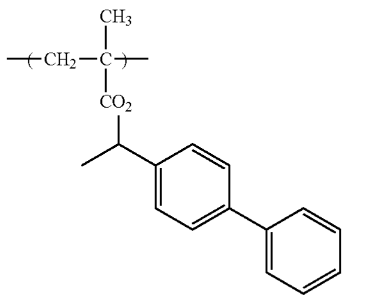
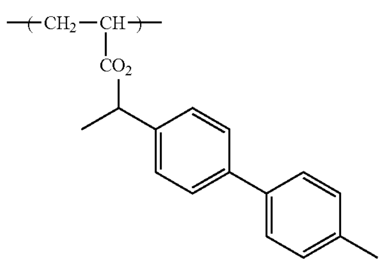
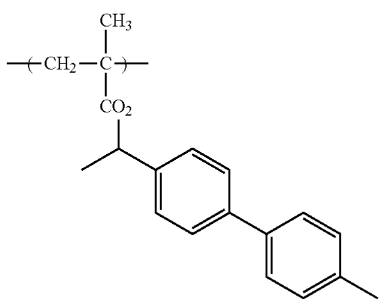
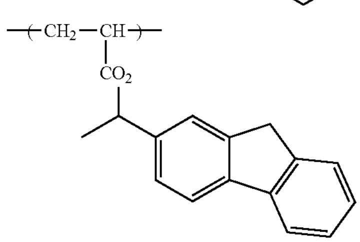
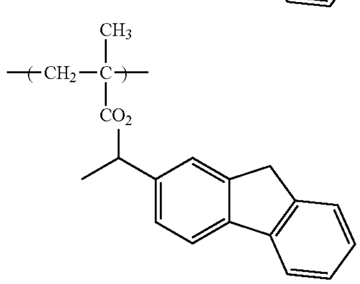
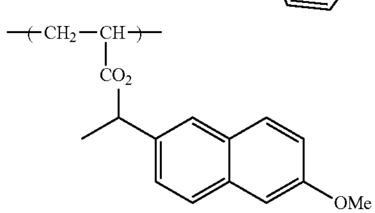
-continued
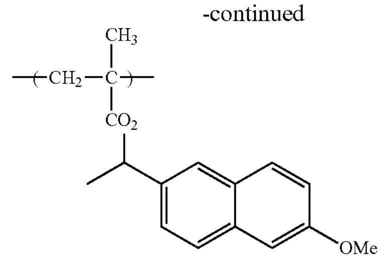
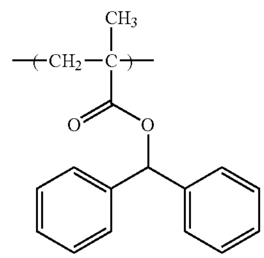
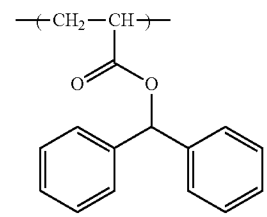
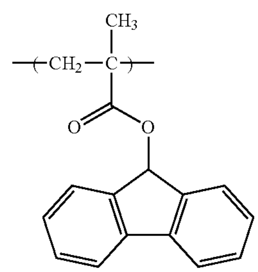
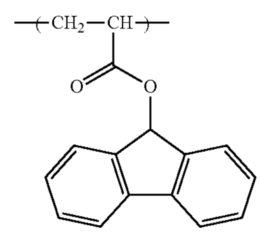
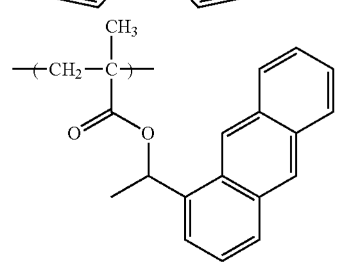
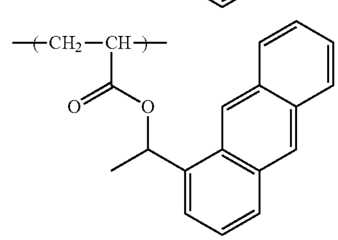
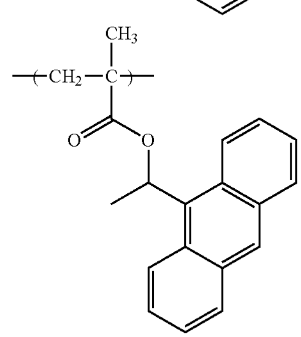

-continued

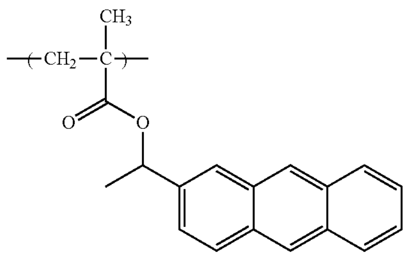

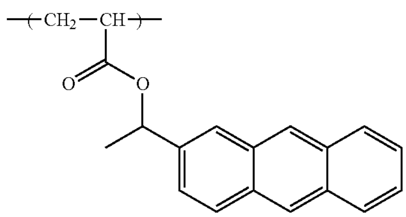

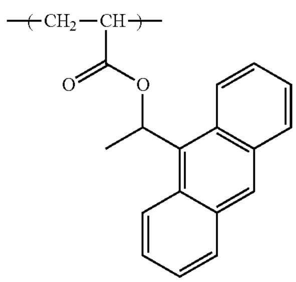

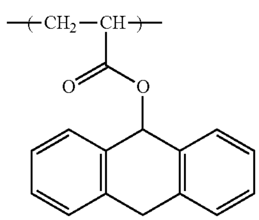

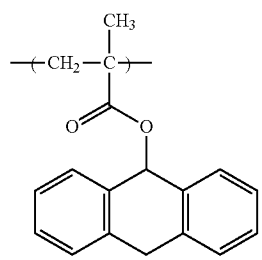

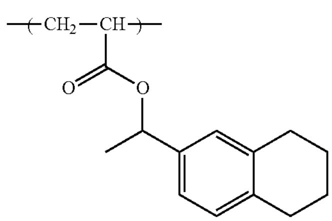

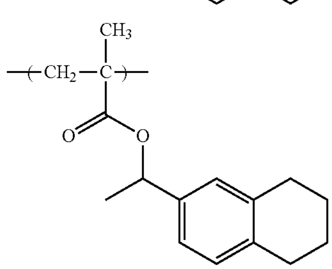

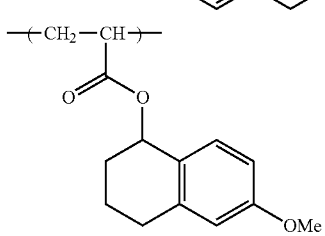

-continued

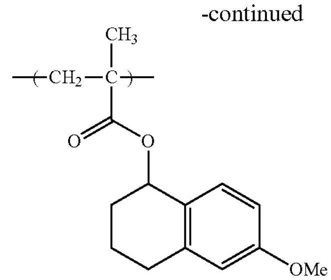

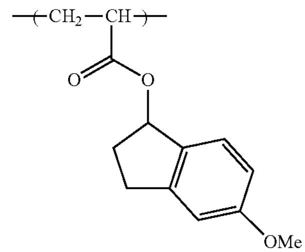

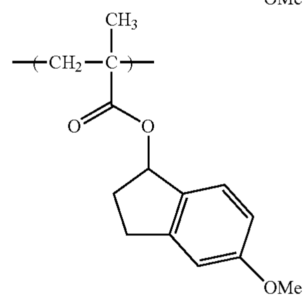

The repeating unit represented by General Formula (III) is preferably the repeating unit represented by the following General Formula (III-1), for the reason of superior effects of the present invention.

(III-1)

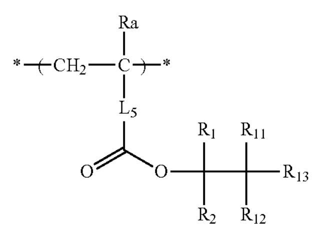

In General Formula (III-1), each of $R_1$ and $R_2$ independently represents an alkyl group, each of $R_{11}$ and $R_{12}$ independently represents an alkyl group, and $R_{13}$ represents a hydrogen atom or an alkyl group. $R_{11}$ and $R_{12}$ may be connected to each other to form a ring, and $R_{11}$ and $R_{13}$ may be connected to each other to form a ring.

Ra represents a hydrogen atom, an alkyl group, a cyano group, or a halogen atom, and $L_5$ represents a single bond or a divalent connecting group.

In General Formula (III-1), the alkyl group represented by each of $R_1$, $R_2$, and $R_{11}$ to $R_{13}$ is preferably an alkyl group having 1 to 10 carbon atoms, and examples thereof include a methyl group, an ethyl group, a propyl group, an isopropyl group, an n-butyl group, a sec-butyl group, a t-butyl group, a neopentyl group, a hexyl group, a 2-ethylhexyl group, an octyl group, and a dodecyl group.

The alkyl group represented by $R_1$ or $R_2$ is more preferably an alkyl group having 2 to 10 carbon atoms from the viewpoint of reliably achieving effects of the present invention.

At least one of $R_1$ or $R_2$ is preferably an alkyl group having 2 to 10 carbon atoms, both of $R_1$ and $R_2$ are more preferably alkyl groups having 2 to 10 carbon atoms, and both of $R_1$ and $R_2$ are still more preferably ethyl groups.

The alkyl group represented by $R_{11}$ or $R_{12}$ is more preferably an alkyl group having 1 to 4 carbon atoms, still more preferably a methyl group or an ethyl group, and particularly preferably a methyl group.

$R_{13}$ is more preferably a hydrogen atom or a methyl group.

$R_{11}$ and $R_{12}$ are particularly preferably connected to each other to form a ring, and $R_{11}$ and $R_{13}$ may be connected to each other to form a ring.

The ring formed by connection of $R_{11}$ and $R_{12}$ to each other is preferably a 3- to 8-membered ring, and more preferably a 5- or 6-membered ring.

The ring formed by connection of $R_{11}$ and $R_{13}$ to each other is preferably a 3- to 8-membered ring, and more preferably a 5- or 6-membered ring.

The time when $R_{11}$ and $R_{13}$ are connected to each other to form a ring is preferably the time when $R_{11}$ and $R_{12}$ are connected to each other to form a ring.

The ring formed by connection of $R_{11}$ and $R_{12}$ (or $R_{11}$ and $R_{13}$) to each other is more preferably an alicyclic group described below as X in General Formula (1-1).

The rings formed by connection of alkyl groups represented by $R_1$, $R_2$, $R_{11}$ to $R_{13}$, or $R_{11}$ and $R_{12}$ (or $R_{11}$ and $R_{13}$) may further have substituents.

Examples of the substiuents which the rings formed by connection of alkyl groups represented by $R_1$, $R_2$, $R_{11}$ to $R_{13}$, or $R_{11}$ and $R_{12}$ (or $R_{11}$ and $R_{13}$) can further have include a cycloalkyl group, an aryl group, an amino group, a hydroxy group, a carboxy group, a halogen atom, an alkoxy group, an aralkyloxy group, a thioether group, an acyl group, an acyloxy group, an alkoxycarbonyl group, a cyano group, and a nitro group. The substiuents may be bonded to each other to form a ring, and examples of the ring when the substiuents are bonded to each other to form a ring include a cycloalkyl group having 3 to 10 carbon atoms and a phenyl group.

The alkyl group represented by Ra may have a substituent, and is preferably an alkyl group having 1 to 4 carbon atoms.

Preferable examples of the substituent which the alkyl group represented by Ra may have include a hydroxyl group and a halogen atom.

Examples of the halogen atom represented by Ra include a fluorine atom, a chlorine atom, a bromine atom, and an iodine atom.

Ra is preferably a hydrogen atom, a methyl group, a hydroxymethyl group, or a perfluoroalkyl group having 1 to 4 carbon atoms (for example, a trifluoromethyl group), and a methyl group is particularly preferable from the viewpoint of raising the glass transition point (Tg) of the resin (A) and improving resolving power and a space width roughness.

Here, in a case where $L_5$ is a phenylene group, Ra is preferably also a hydrogen atom.

Specific examples and preferable examples of $L_5$ include the same as those described as $L_5$ in General Formula (III).

To achieve a higher contrast (high γ value), high resolution, high film loss reduction performance, and high sensitivity, the repeating unit represented by General Formula (III-1) is preferably the repeating unit represented by the following General Formula (III-2).

(III-2)

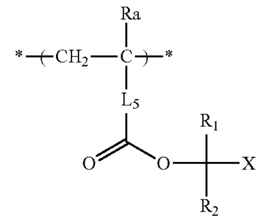

In General Formula (III-2), X represents an alicyclic group.

$R_1$, $R_2$, Ra, and $L_5$ have the same meaning as $R_1$, $R_2$, Ra, and $L_5$ in General Formula (III-1), respectively, and $R_1$, $R_2$, Ra, and $L_5$ in the specific examples and the preferable examples have the same meaning as $R_1$, $R_2$, Ra, and $L_5$ in General Formula (III-1), respectively.

The alicyclic group represented by X may be monocyclic, polycyclic, or bridged, and preferably represents an alicyclic group having 3 to 25 carbon atoms.

In addition, the alicyclic group may have a substituent, and examples of the substituent include the same substiuents as those described above as the substiuents which the rings formed by connection of alkyl groups represented by $R_1$, $R_2$, $R_{11}$ to $R_{13}$, or $R_{11}$ and $R_{12}$ (or $R_{11}$ and $R_{13}$) can further have and alkyl groups (a methyl group, an ethyl group, a propyl group, a butyl group, a perfluoroalkyl group (for example, a trifluoromethyl group), and the like).

X preferably represents an alicyclic group having 3 to 25 carbon atoms, more preferably represents an alicyclic group having 5 to 20 carbon atoms, and particularly preferably a cycloalkyl group having 5 to 15 carbon atoms.

In addition, X is preferably an alicyclic group having a 3- to 8-membered ring or a fused ring group thereof, and more preferably 5- or 6-membered ring or a fused ring group thereof.

Examples of the structure of the alicyclic group represented by X are shown below.

(1)

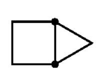

(2)

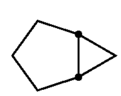

(3)

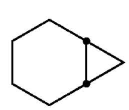

(4)

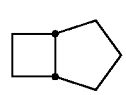

(5)

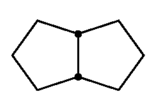

-continued
(6)
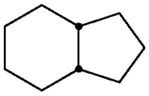
(7)
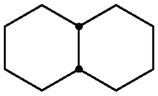
(8)
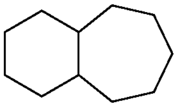
(9)
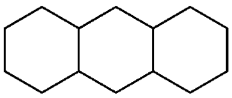
(10)
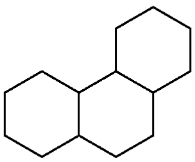
(11)
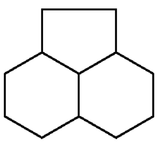
(12)
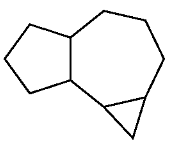
(13)
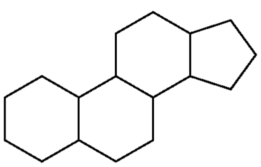
(14)
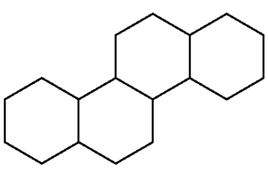
(15)
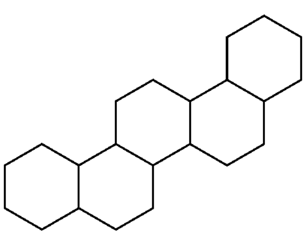
(16)
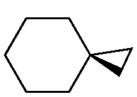
-continued
(17)
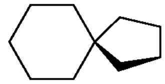
(18)
(19)
(20)
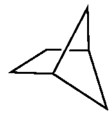
(21)
(22)
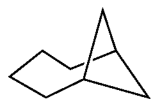
(23)
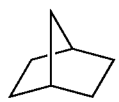
(24)
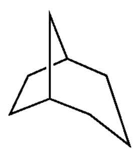
(25)
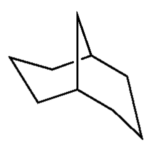
(26)
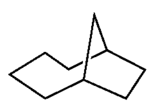
(27)
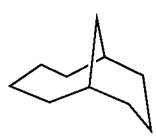
(28)
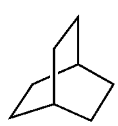
(29)
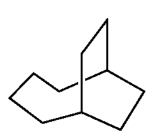

-continued

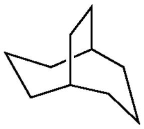

(30)

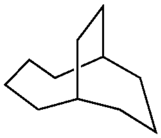

(31)

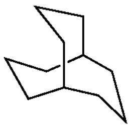

(32)

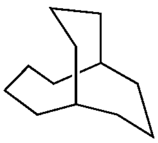

(33)

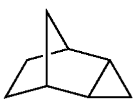

(34)

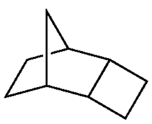

(35)

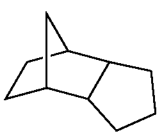

(36)

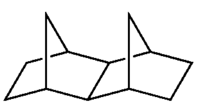

(37)

(38)

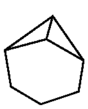

(39)

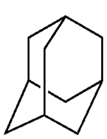

(40)

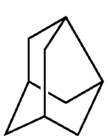

(41)

-continued

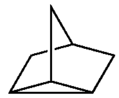

(42)

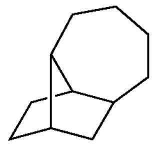

(43)

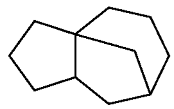

(44)

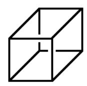

(45)

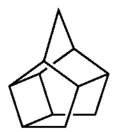

(46)

(47)

(48)

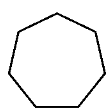

(49)

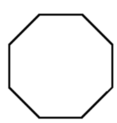

(50)

Preferable examples of the alicyclic group can include an adamantyl group, a noradamantyl group, a decalin residue, a tricyclodecanyl group, a tetracyclododecanyl group, a norbornyl group, a cedrol group, a cyclopentyl group, a cyclohexyl group, cycloheptyl group, a cyclooctyl group, a cyclodecanyl group, and a cyclododecanyl group. The alicyclic group is more preferably a cyclohexyl group, a cyclopentyl group, an adamantyl group, or a norbornyl group, still more preferably a cyclohexyl group or a cyclopentyl group, and particularly preferably a cyclohexyl group.

Specific examples of the repeating unit represented by General Formula (III-1) or (III-2) are shown below, but the present invention is not limited thereto.

-continued
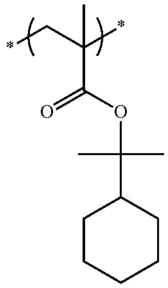
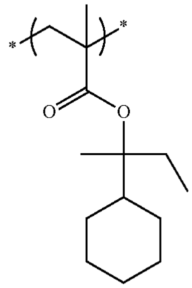
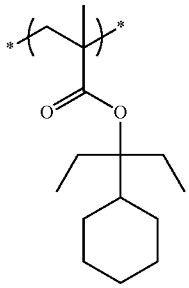
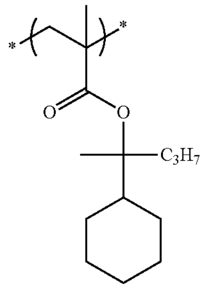
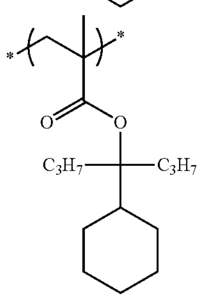
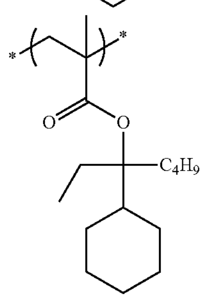
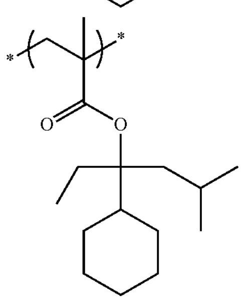
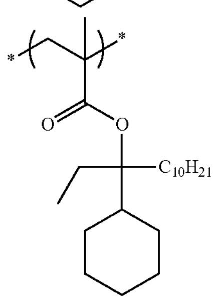
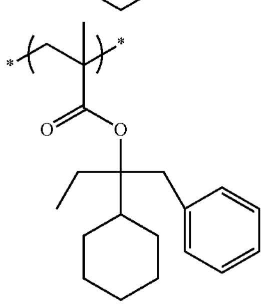
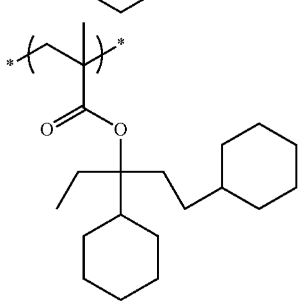
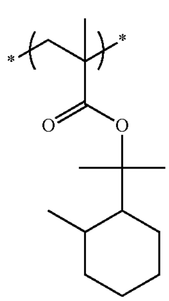
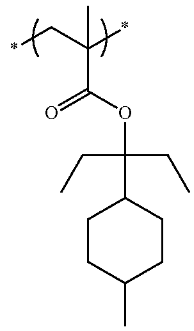
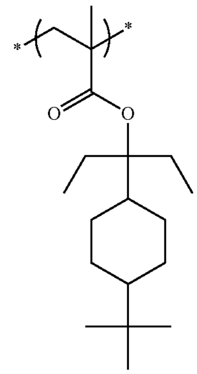
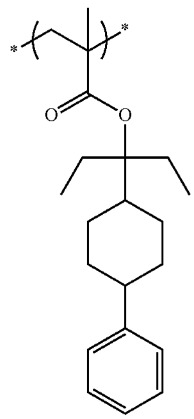
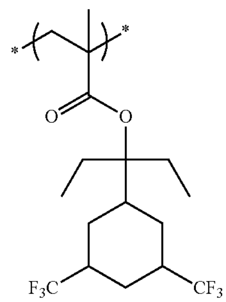
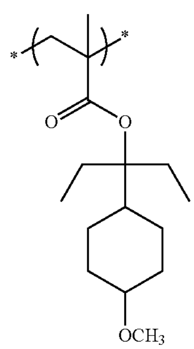
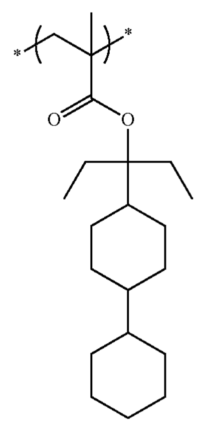
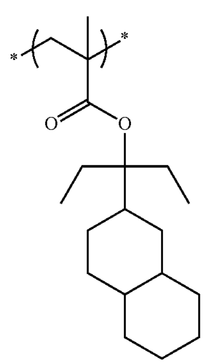
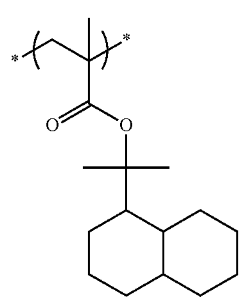

-continued
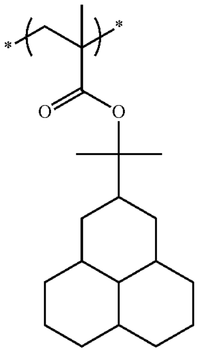
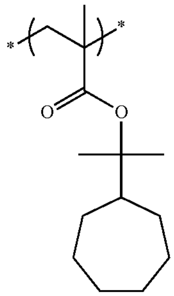
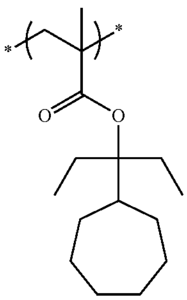
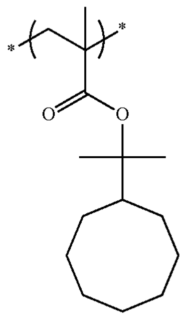
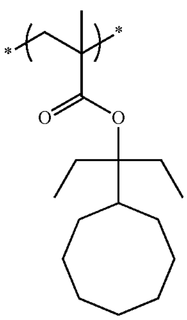
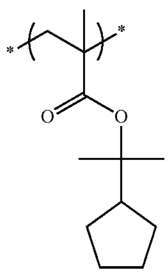
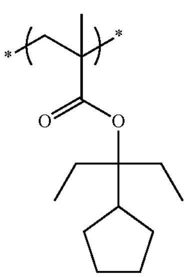
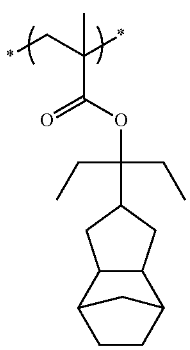
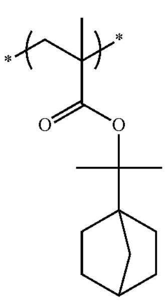
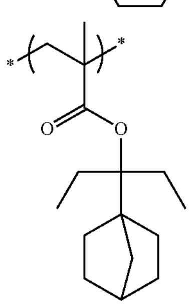
-continued
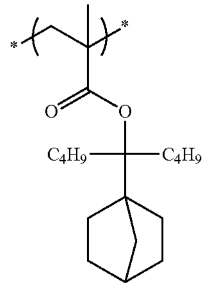
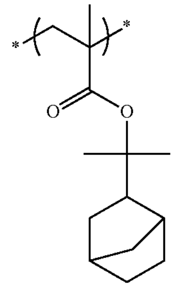
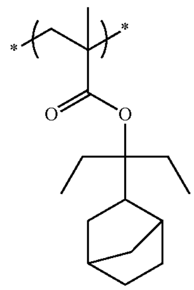
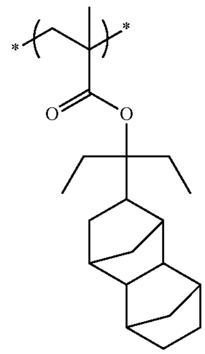
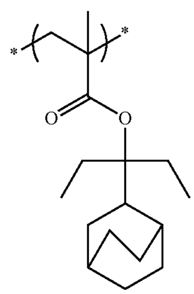
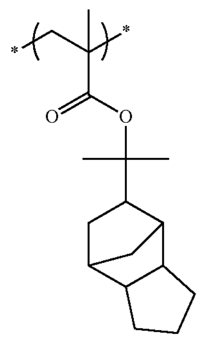
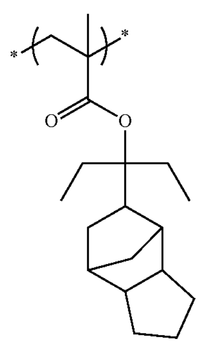
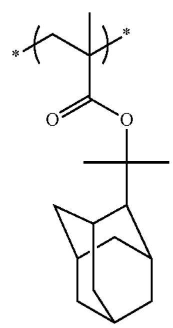
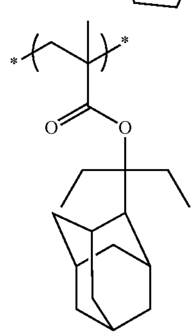
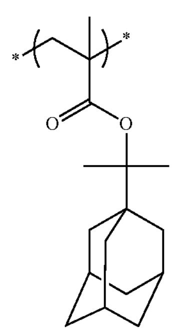

-continued
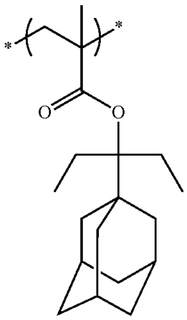
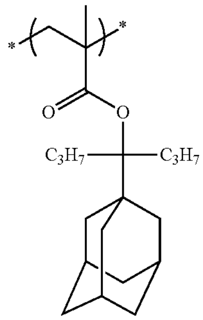
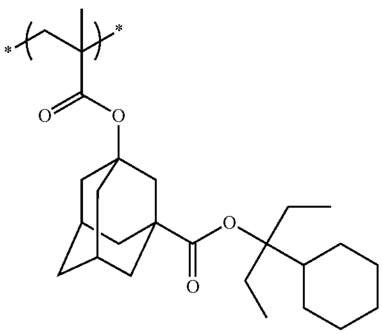
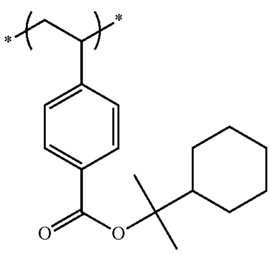
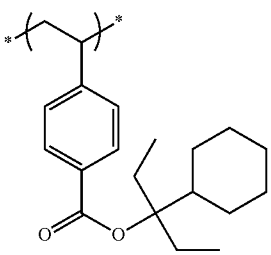
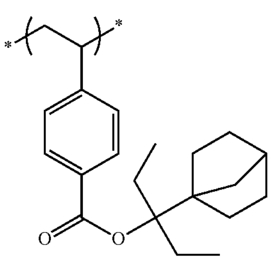
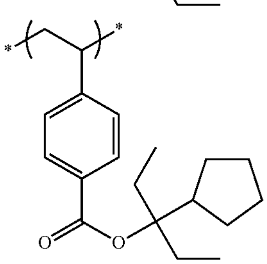
-continued
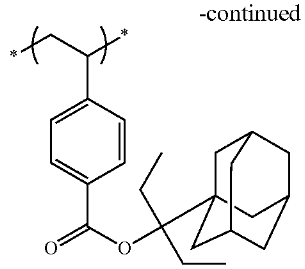
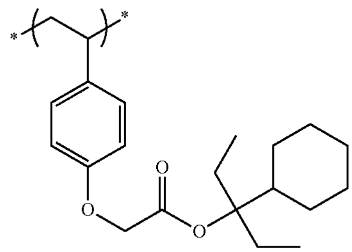
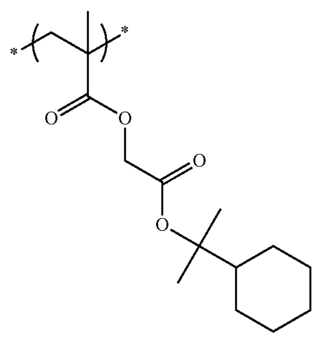
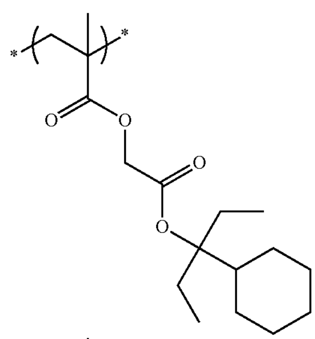
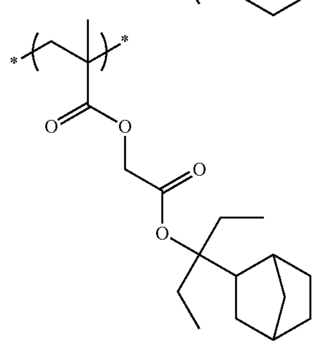

-continued
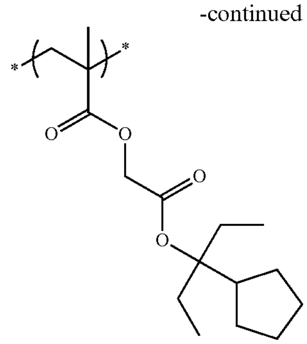
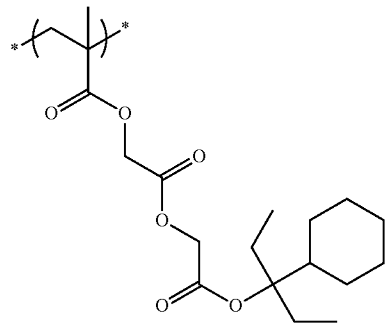
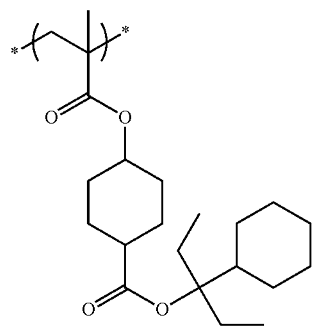
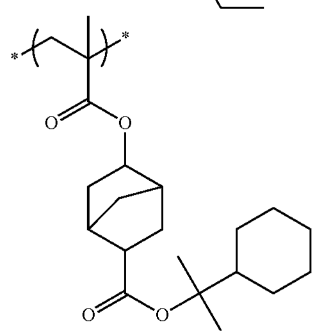
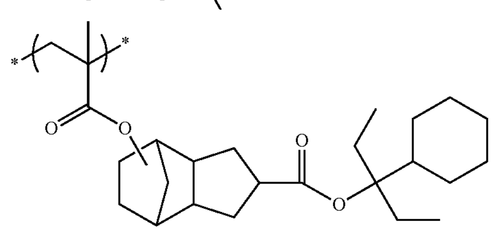
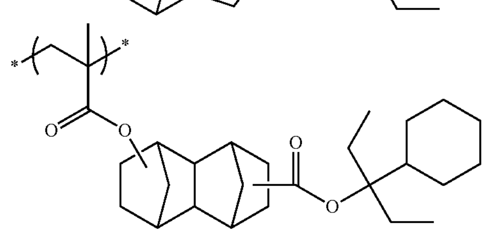
-continued
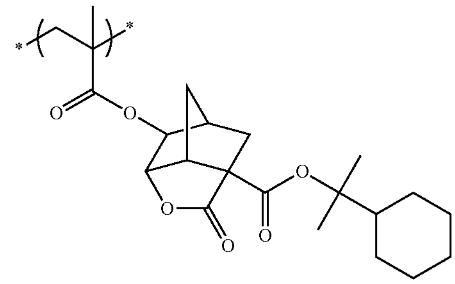
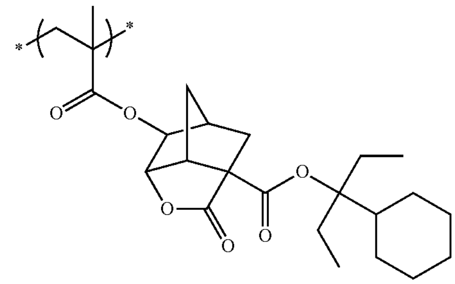
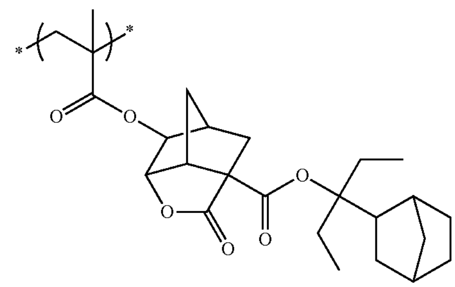
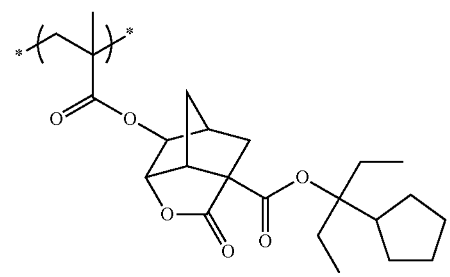
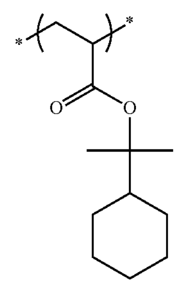
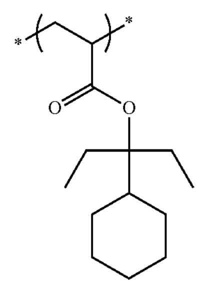
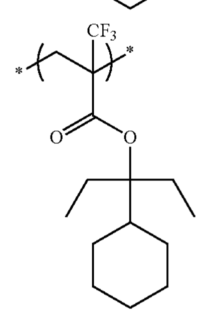
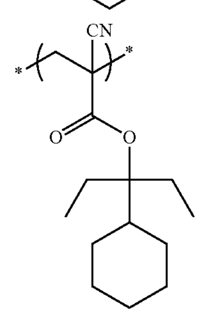

-continued

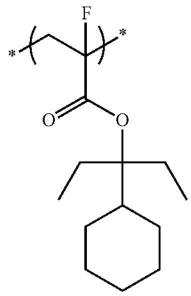

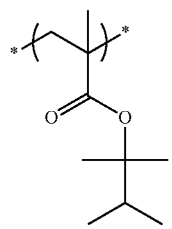

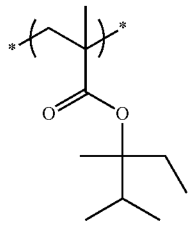

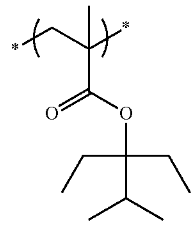

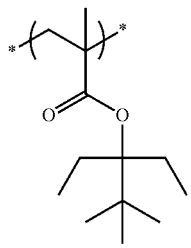

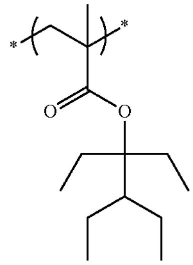

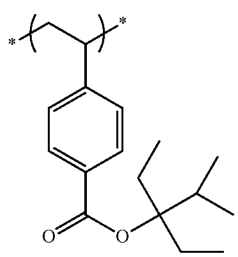

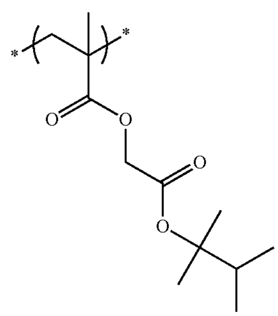

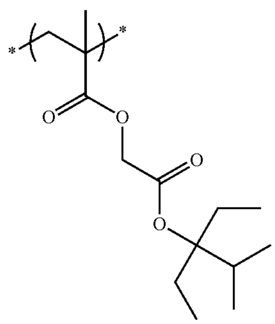

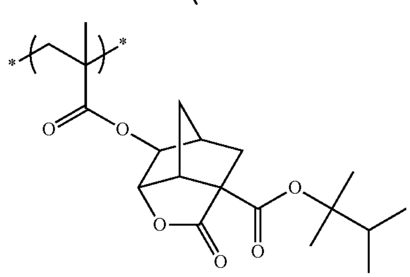

-continued

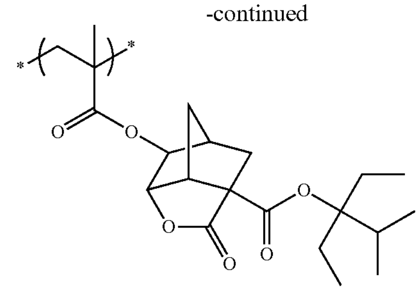

(IV)

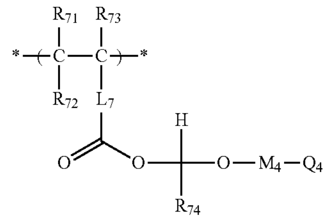

In General Formula (IV), each of $R_{71}$, $R_{72}$, and $R_{73}$ independently represents a hydrogen atom, an alkyl group, a cycloalkyl group, a halogen atom, a cyano group, or an alkoxycarbonyl group. $R_{72}$ may be bonded to $L_7$ to form a ring, and $R_{72}$ in this case represents an alkylene group.

$L_7$ represents a single bond or a divalent connecting group, and in the case of forming a ring with $R_{72}$, represents a trivalent connecting group.

$R_{74}$ represents a hydrogen atom, an alkyl group, a cycloalkyl group, an aryl group, an aralkyl group, an alkoxy group, an acyl group, or a heterocyclic group.

$M_4$ represents a single bond or a divalent connecting group.

$Q_4$ represents an alkyl group, a cycloalkyl group, an aryl group, or a heterocyclic group.

At least two of $Q_4$, $M_4$, and $R_{74}$ may be bonded to each other to form a ring.

Specific examples and preferable examples of respective groups represented by $L_{71}$, $L_{72}$, and $L_{73}$ include the same as those described as $L_{51}$, $L_{52}$, and $L_{53}$ in General Formula (III).

Specific examples and preferable examples of the divalent connecting group represented by $L_7$ include the same as those described as $L_5$ in General Formula (III).

$R_{74}$ has the same meaning as $R_3$ in General Formula (II'), and the preferable range thereof is also the same.

Specific examples and preferable examples of $M_4$ include the same as those described as $M_3$ in General Formula (II').

Specific examples and preferable examples of $Q_4$ include the same as those described as $Q_3$ in General Formula (II'). Specific examples and preferable examples of a ring formed by bonding of at least two of $Q_4$, $M_4$, and $R_{74}$ to each other include the same as those described as a ring formed by bonding of at least two of $Q_3$, $M_3$, and $R_3$ to each other.

Specific examples of the repeating unit represented by General Formula (IV) will be described below, but the present invention is not limited thereto.

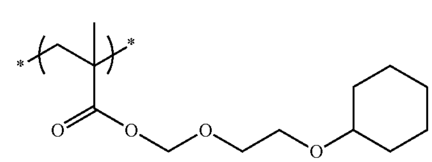

-continued
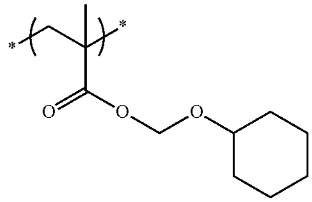
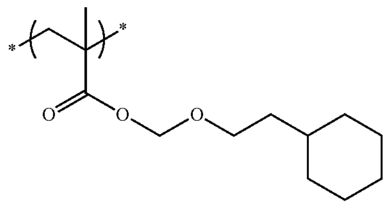
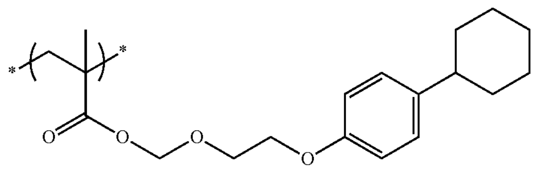
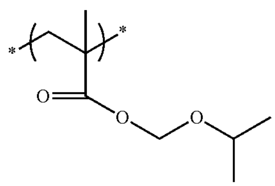
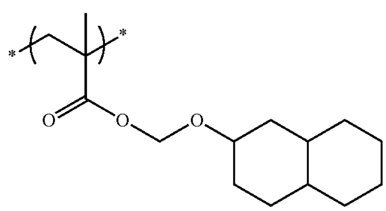
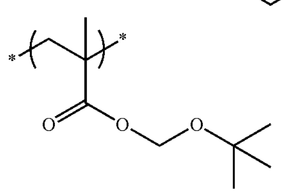
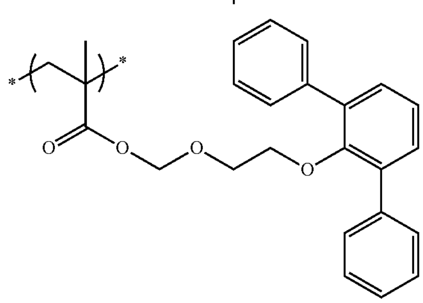
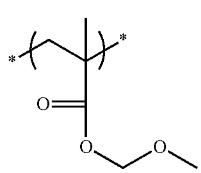
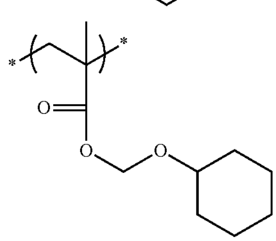
-continued
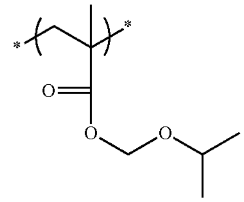
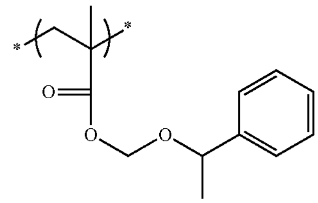
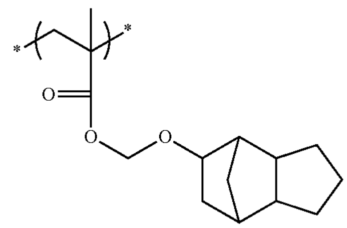
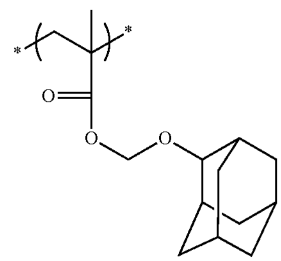
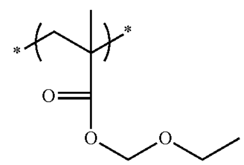
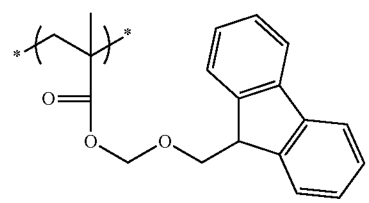
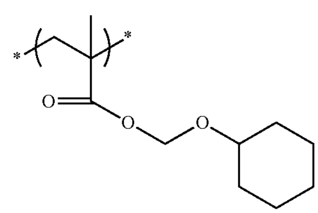
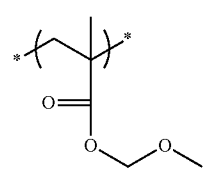
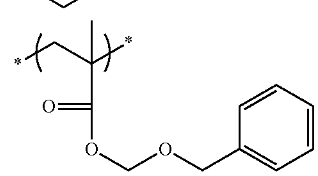
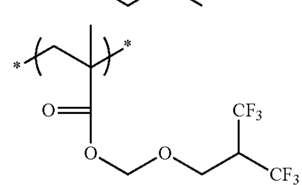

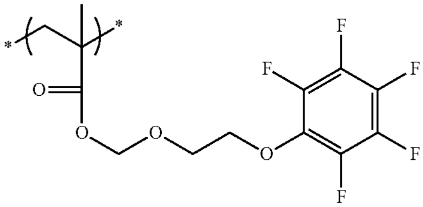
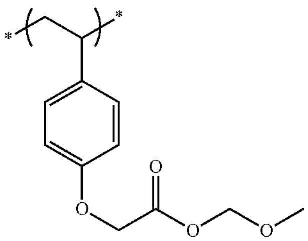
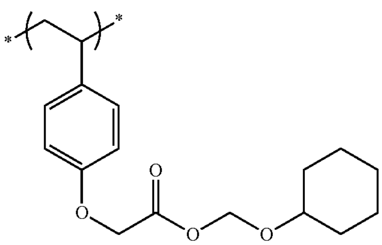
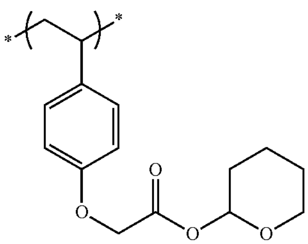
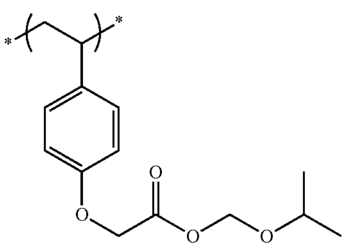
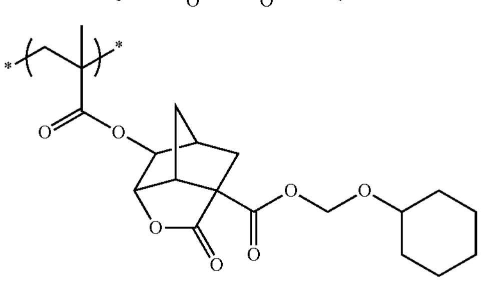
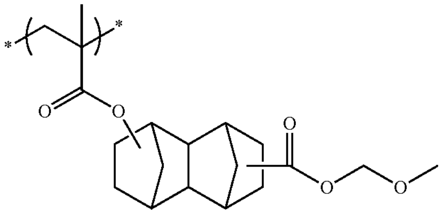
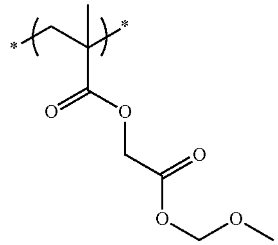
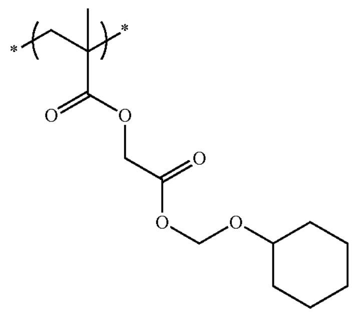
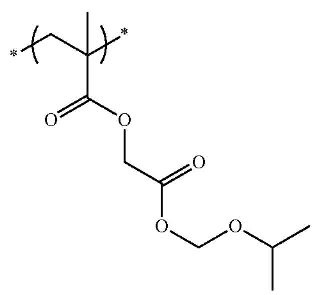
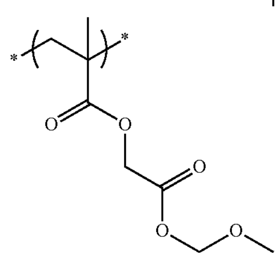
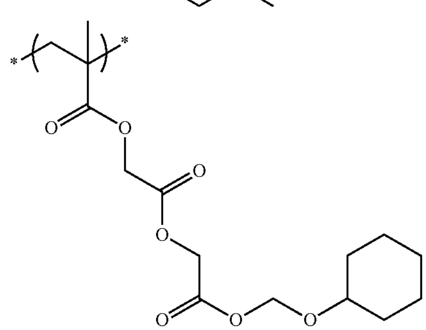
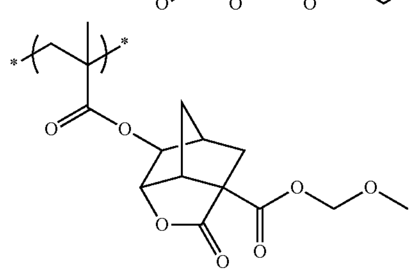

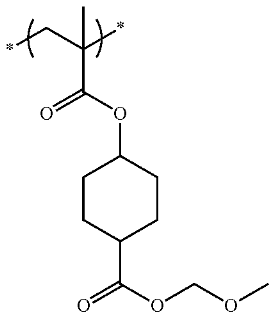
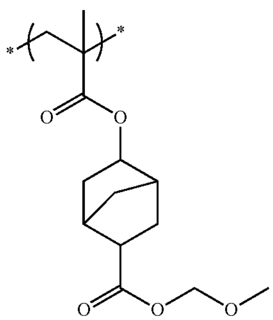
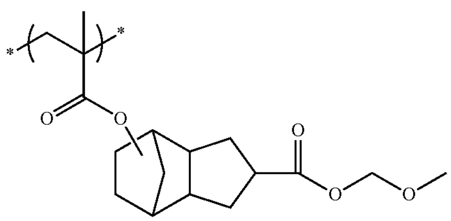
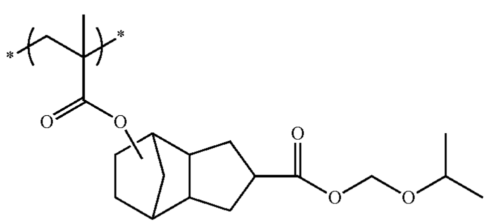
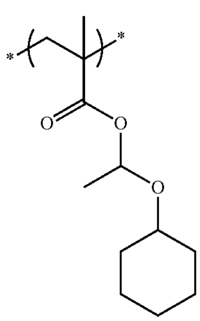
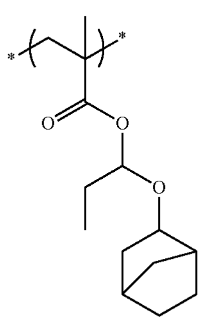
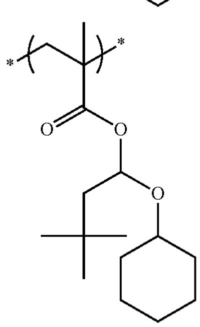
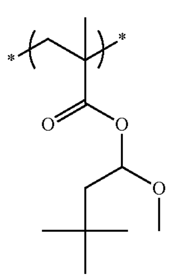
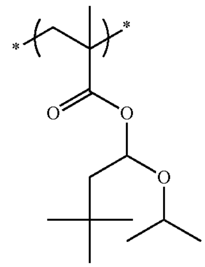
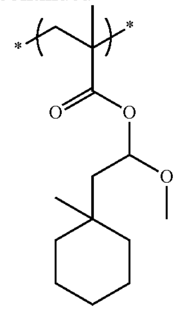
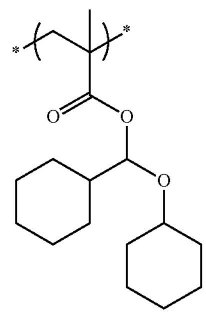
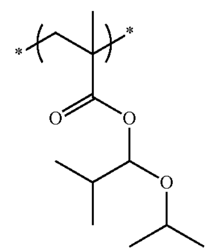
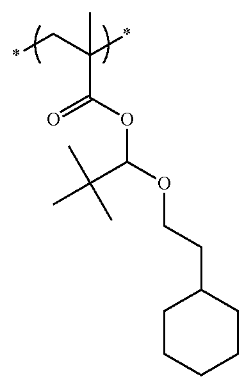
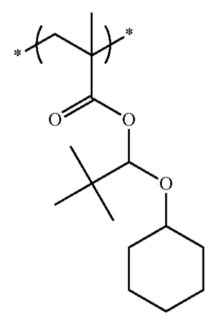
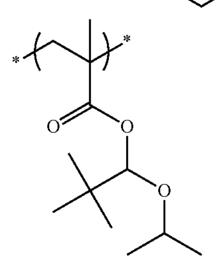
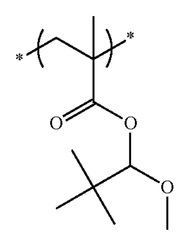
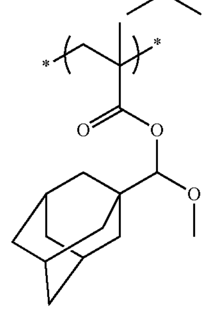
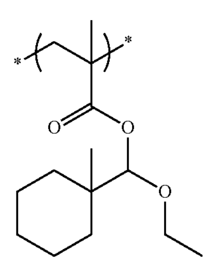

-continued

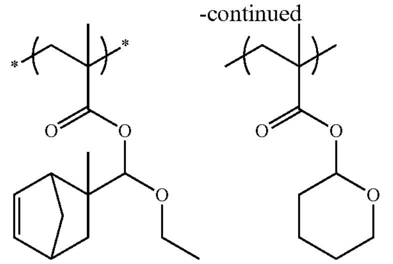

As the repeating unit represented by any one of General Formulas (II) to (IV), one type thereof may be used or two or more types thereof may be used in combination.

The content (in the case of containing plural types, the total) of the repeating unit represented by any one of General Formulas (II) to (IV) in the resin (A) is preferably 5 mol % to 80 mol %, more preferably 5 mol % to 75 mol %, and still more preferably 10 mol % to 70 mol %, with respect to the entirety of repeating units in the resin (A).

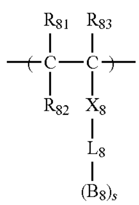

(V)

In Formula (V), each of $R_{81}$, $R_{82}$, and $R_{83}$ independently represents a hydrogen atom, an alkyl group, a cycloalkyl group, a halogen atom, a cyano group, or an alkoxycarbonyl group. Here, $R_{82}$ may be bonded to $L_8$ to form a ring, and $R_{82}$ in this case represents a single bond or an alkylene group. $X_8$ represents a single bond or a divalent connecting group. $L_8$ represents a single bond or an (s+1) valent connecting group, and in the case of being bonded to $R_{82}$ to form a ring, represents an (s+2) valent connecting group. s represents an integer of 1 to 5. Here, in a case where $L_8$ is a single bond, s is 1. $B_8$ represents a group containing a cross-linking group.

Specific examples of an alkyl group, a cycloalkyl group, a halogen atom, or an alkoxycarbonyl group, represented by each of $R_{81}$, $R_{82}$, and $R_{83}$ in Formula (V), or substituents which these groups can have are the same as those described for each group represented by $R_{51}$, $R_{52}$, and $R_{53}$ in General Formula (III).

Examples of the divalent connecting group represented by $X_8$ include a monocyclic or polycyclic aromatic ring having 6 to 18 carbon atoms, —C(═O)—, —O—C(═O)—, —$CH_2$—O—C(═O)—, a thiocarbonyl group, a linear or branched alkylene group (which preferably has 1 to 10 carbon atoms, and more preferably has 1 to 6 carbon atoms), a linear or branched alkenylene group (which preferably has 2 to 10 carbon atoms, and more preferably has 2 to 6 carbon atoms), a cycloalkylene group (which preferably has 3 to 10 carbon atoms, and more preferably has 3 to 6 carbon atoms), a sulfonyl group, —O—, —NH—, —S—, a cyclic lactone structure, and a divalent connecting group obtained by combining these (which preferably has 1 to 50 carbon atoms in total, more preferably has 1 to 30 carbon atoms in total, and still more preferably has 1 to 20 carbon atoms in total).

Preferable examples of the aromatic ring of $X_8$ can include aromatic hydrocarbon rings which may have a substituent having 6 to 18 carbon atoms, such as a benzene ring, a naphthalene ring, an anthracene ring, a fluorene ring, and a phenanthrene ring, and aromatic ring heterorings including a heteroring, such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, a thiazole ring. Among these, a benzene ring or a naphthalene ring is preferable from the viewpoint of resolution, and a benzene ring is most preferable.

The divalent connecting group represented by $X_8$ may have a substituent, and examples of the substituent include the same as those described below as a substituent which a monovalent substituent represented by Y in the repeating unit represented by General Formula (1) described below has.

Specific examples and preferable examples of the divalent connecting group represented by $L_8$ in a case where s is 1 include the same as those described as $L_5$ in General Formula (III).

Suitable specific examples of the (s+1) valent connecting group represented by $L_8$ in a case where s is 2 or greater can include a group obtained by excluding an arbitrary (s−1) hydrogen atoms from the specific examples described above of the divalent connecting group.

s is preferably an integer of 1 to 3, and more preferably 1 or 2.

Examples of the cross-linking group included in $B_8$ can include a methylol group, an oxirane ring, an oxetane ring group, and an ethylenically unsaturated group, and the cross-linking group is preferably a methylol group, an oxirane ring, or an oxetane ring group.

Here, the "methylol group" is a group represented by the following General Formula (M), and in an aspect of the present invention, is preferably a hydroxymethyl group or an alkoxymethyl group.

In addition, from the viewpoint of further improving effects of the present invention, it is preferable that the methylol group is not directly bonded to a nitrogen atom (that is, the methylol group does not correspond to a methylol group in a substructure of an N-methylol system described below), it is more preferable that the methylol group is a hydroxymethyl group which is not directly bonded to a nitrogen atom or an alkoxymethyl group which is not directly bonded to a nitrogen atom, and it is still more preferable that the methylol group is an alkoxymethyl group which is not directly bonded to a nitrogen atom.

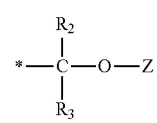

(M)

In the formula, $R_2$, $R_3$, and Z have the same meaning as those in General Formula (1) described below, respectively.

The group containing the cross-linking group as $B_8$ is preferably a group which has a phenol structure, a urea structure, or a melamine structure, having a hydroxymethyl group or an alkoxymethyl group, and more preferably a group which has a phenol structure having a hydroxymethyl group or an alkoxymethyl group. It is preferable that the hydroxymethyl group is not directly bonded to a nitrogen atom, and the alkoxymethyl group is not directly bonded to a nitrogen atom.

In a case where the cross-linking group included in $B_8$ is a methylol group, the resin (A) preferably has a repeating unit (Q) represented by the following General Formula (1) as the repeating unit represented by General Formula (V).

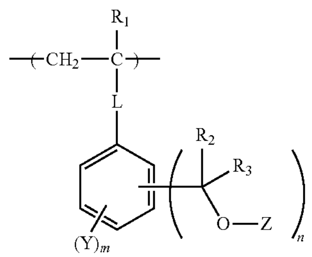

(1)

In General Formula (1), $R^1$ represents a hydrogen atom, a methyl group, or a halogen atom.

Each of $R_2$ and $R_3$ represents a hydrogen atom, an alkyl group, or a cycloalkyl group.

L represents a divalent connecting group or single bond.

Y represents a substituent excluding a methylol group.

Z represents a hydrogen atom or a substituent.

m represents an integer of 0 to 4.

n represents an integer of 1 to 5.

m+n is 5 or less.

In a case where m is 2 or greater, a plurality of Y's may be the same as or may be different from each other.

In a case where n is 2 or greater, a plurality of $R_2$'s, $R_3$'s, and Z may be the same as or may be different from each other.

Two or more of Y, $R_2$, $R_3$, and Z may be bonded to each other to form a ring structure. Here, "two or more of Y, $R_2$, $R_3$, and Z are bonded to each other to form a ring structure" means that, in a case where a plurality of groups represented by the same symbol are present, groups represented by the same symbol may be bonded to each other to form a ring structure, or groups represented by the different symbols may be bonded to each other to form a ring structure.

The methyl group represented by $R_1$ may have a substituent, and examples of the substituent include halogen atoms such as a fluorine atom, a chlorine atom, a bromine atom, and an iodine atom, a hydroxyl group, and an isopropyl group. Examples of the methyl group which may have a substituent can include a methyl group, a trifluoromethyl group, and a hydroxymethyl group. Examples of the halogen atom represented by $R_1$ include fluorine, chlorine, bromine, and iodine.

$R_1$ is preferably a hydrogen atom or a methyl group.

Examples of the alkyl group represented by $R_2$ or $R_3$ can include a linear or branched alkyl group having 1 to 10 carbon atoms, and examples of the cycloalkyl group can include a cycloalkyl group having 3 to 10 carbon atoms. Specifically, a hydrogen atom, a methyl group, a cyclohexyl group, and a t-butyl group are exemplified. The alkyl group and the cycloalkyl group here may have may have a substituent. Examples of the substituent include the same as those described below as a substituent which a monovalent substituent represented by Y has.

Specific examples and preferable examples of the divalent connecting group represented by L include the same as those described as a divalent connecting group, as $X_8$ in General Formula (V).

The divalent connecting group represented by L may have a substituent, and examples of the substituent include the same as those described below as a substituent which a monovalent substituent represented by Y has.

Examples of the monovalent substituent represented by Y include an alkyl group (which may be linear or branched, and preferably has 1 to 12 carbon atoms), an alkenyl group (which preferably has 2 to 12 carbon atoms), an alkynyl group (which preferably has 2 to 12 carbon atoms), a cycloalkyl group (which may be a monocycle or a polycycle, and preferably has 3 to 12 carbon atoms), an aryl group (which preferably has 6 to 18 carbon atoms), a hydroxy group, an alkoxy group, an ester group, an amide group, a urethane group, a ureido group, a thioether group, a sulfonamide group, a halogen atom, a haloalkyl group, and a sulfonic acid ester group. Preferable examples thereof include an alkyl group, a cycloalkyl group, a halogen atom, a haloalkyl group, a hydroxy group, an alkoxy group, an aryloxy group, an ester group, and an aryl group, and more preferable examples thereof include an alkyl group, a halogen atom, a hydroxy group, and an alkoxy group.

The monovalent substituent represented by Y may further have a substituent, and examples of the substituent include a hydroxyl group, a halogen atom (for example, a fluorine atom), an alkyl group, a cycloalkyl group, an alkoxy group, a carboxyl group, an alkoxycarbonyl group, an aryl group, an alkoxyalkyl group, and a group obtained by combining these, and the substituent preferably has 8 or less carbon atoms.

In addition, when m is 2 or greater, a plurality of Y's may be bonded to each other to form a ring structure through a single bond or a connecting group. Examples of the connecting group in this case include an ether bond, a thioether bond, an ester bond, an amide bond, a carbonyl group, and an alkylene group.

Examples of the halogen atom include the same as those exemplified as $R_1$.

Examples of the haloalkyl group include an alkyl group and a cycloalkyl group, having 1 to 12 carbon atoms, in which at least one or more hydrogen atoms have been substituted with a fluorine atom (fluorine atoms), a chlorine atom (chlorine atoms), a bromine atom (bromine atoms), or an iodine atom (iodine atoms). Specific examples thereof include a fluoromethyl group, a trifluoromethyl group, a pentafluoroethyl group, a heptafluoropropyl, and an undecafluorocyclohexylmethyl group.

Examples of the monovalent substituent represented by Z include an alkyl group (which may be linear or branched, and preferably has 1 to 12 carbon atoms), an alkenyl group (which preferably has 2 to 12 carbon atoms), an alkynyl group (which preferably has 2 to 12 carbon atoms), a cycloalkyl group (which preferably has 3 to 8 carbon atoms), an aryl group (which may be a monocycle or a polycycle, and preferably has 6 to 18 carbon atoms), a haloalkyl group, an alkanoyl group, an alkoxycarbonyl group, an aryloxycarbonyl group, an alkylsulfonyl group, an arylsulfonyloxy group, an alkylsulfonyl group, an arylsulfonyl group, a cyano group, an alkylthio group, an arylthio group, an alkoxyalkyl group, and a heterocyclic group. Preferable examples thereof include a hydrogen atom, an alkyl group, a cycloalkyl group, an alkanoyl group, an alkenyl group, a haloalkyl group, and an alkoxyalkyl group.

Preferable examples of the haloalkyl group include the same as those exemplified as Y in General Formula (1).

As the alkanoyl group, an alkanoyl group having 2 to 20 carbon atoms is preferable, and examples thereof include an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

As the alkoxycarbonyl group, an alkoxycarbonyl group having 2 to 20 carbon atoms is preferable, and examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

As the aryloxycarbonyl group, aryloxycarbonyl groups having 7 to 30 carbon atoms are exemplified, and examples thereof include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

As the alkylsulfonyloxy group, an alkylsulfonyloxy group having 1 to 20 carbon atoms is preferable, and examples thereof include a methylsulfonyloxy group, an ethylsulfonyl group, a propylsulfonyl group, an isopropylsulfonyloxy group, a butylsulfonyloxy group, a hexylsulfonyloxy group, a cyclohexylsulfonyl group, an octylsulfonyloxy group, a 2-ethylhexylsulfonyloxy group, a decanoylsulfonyloxy group, a dodecanoylsulfonyloxy group, an octadecanoylsulfonyloxy group, a cyanomethylsulfonyloxy group, a methoxymethylsulfonyloxy group, and a perfluoroalkylsulfonyloxy group.

As the arylsulfonyloxy group, an arylsulfonyloxy group having 6 to 30 carbon atoms is preferable, and examples thereof include a phenylsulfonyloxy group, a 1-naphthylsulfonyloxy group, a 2-naphthylsulfonyloxy group, a 2-chlorophenylsulfonyloxy group, a 2-methylphenylsulfonyloxy group, a 2-methoxyphenylsulfonyloxy group, a 2-butoxyphenylsulfonyl group, a 3-chlorophenylsulfonyloxy group, a 3-trifluoromethylphenylsulfonyloxy group, a 3-cyanophenylsulfonyl group, a 3-nitrophenylsulfonyloxy group, a 4-fluorophenylsulfonyloxy group, a 4-cyanophenylsulfonyloxy group, a 4-methoxyphenylsulfonyloxy group, a 4-methylsulfanylphenylsulfonyloxy group, a 4-phenylsulfanylphenylsulfonyloxy group, and a 4-dimethylaminophenylsulfonyloxy group.

As the alkylsulfonyl group, an alkylsulfonyl group having 1 to 20 carbon atoms is preferable, and examples thereof include a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanoylsulfonyl group, a dodecanoylsulfonyl group, an octadecanoylsulfonyl group, a cyanomethylsulfonyl group, a methmethylsulfonyl group, and a perfluoroalkylsulfonyl group.

As the arylsulfonyl group, an arylsulfonyl group having 6 to 30 carbon atoms is preferable, and examples thereof include a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, and a 4-dimethylaminophenylsulfonyl group.

As the alkylthio group, an alkylthio group having 1 to 30 carbon atoms is exemplified, and examples thereof include a methylthio group, an ethylthio group, a propylthio group, an n-butylthio group, a trifluoromethylthio group, a hexylthio group, a t-butylthio group, a 2-ethylhexylthio group, a cyclohexylthio group, a decylthio group, and a dodecylthio group.

As the arylthio group, an arylthio group having 6 to 30 carbon atoms is exemplified, and examples thereof include a phenylthio group, 1-naphthylthio group, 2-naphthylthio group, a tolylthio group, a methoxyphenylthio group, a naphthylthio group, a chlorophenylthio group, a trifluoromethylphenylthio group, a cyanophenylthio group, and a nitrophenylthio group.

Preferable examples of the heterocyclic group include an aromatic or aliphatic heterocyclic group including a nitrogen atom, an oxygen atom, a sulfur atom, or a phosphorus atom. Examples of the heterocyclic group include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a tetrahydropyrimidinyl group, a tetrahydro-2-pyrimidinonyl group, a triazinyl group, a morpholinyl group, and a thioxantholyl group.

n preferably represents an integer of 1 to 4, more preferably an integer of 2 to 4, particularly preferably an integer of 2 or 3. m is preferably 0 or 1.

In addition, the repeating unit (Q) represented by General Formula (1) is preferably represented by the following General Formula (2) or (3).

(2)

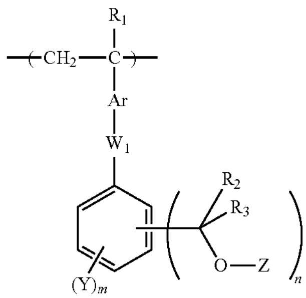

(3)

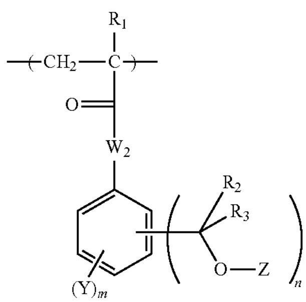

In General Formula (2) or (3), $R_1$, $R_2$, $R_3$, Y, Z, m, and n have the same meaning as those in General Formula (1), respectively.

Ar represents an aromatic ring group.

Each of $W_1$ and $W_2$ represents a divalent connecting group or a single bond.

Specific examples of $R_1$, $R_2$, $R_3$, Y, Z, m, and n include the same as those described in General Formula (1), respectively, and the preferable range thereof is also the same.

Specific examples of the aromatic ring represented by Ar include the same as the specific examples in a case where L in General Formula (1) is an aromatic ring, and the preferable range thereof is also the same.

Examples of the divalent connecting group represented by $W_1$ or $W_2$ include a monocyclic or polycyclic aromatic hydrocarbon ring which may have a substituent, having 6 to 18 carbon atoms, —C(═O)—, —O—C(═O)—, —$CH_2$—O—C(═O)—, a thiocarbonyl group, a linear or branched alkylene group (which preferably has 1 to 10 carbon atoms, and more preferably has 1 to 6 carbon atoms), a linear or branched alkenylene group (which preferably has 2 to 10 carbon atoms, and more preferably has 2 to 6 carbon atoms), a cycloalkylene group (which preferably has 3 to 10 carbon atoms, and more preferably has 5 to 10 carbon atoms), a sulfonyl group, —O—, —NH—, —S—, a cyclic lactone structure, and a divalent connecting group obtained by combining these.

In addition, the repeating unit (Q) represented by General Formula (1) is more preferably represented by the following General Formula (2') or (3').

(2')

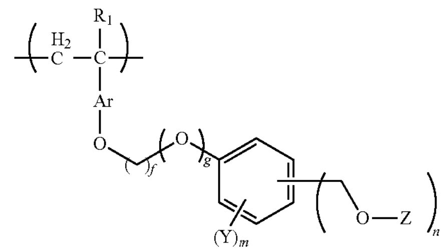

(3')

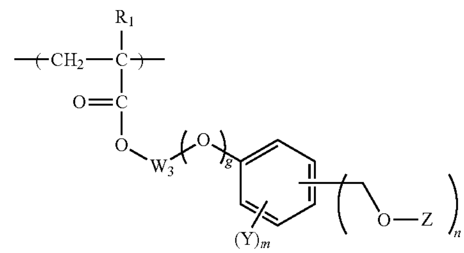

Each of $R_1$, Y, Z, m, and n in General Formulas (2') and (3') has the same meaning as each group in General Formula (1), and the specific examples and the preferable range thereof are also the same. Ar in General Formula (2') has the same meaning as that in General Formula (2), and the preferable range thereof is also the same.

In General Formula (3'), $W_3$ represents a divalent connecting group. Examples of the divalent connecting group represented by $W_3$ include a monocyclic or polycyclic aromatic hydrocarbon ring which may have a substituent, having 6 to 18 carbon atoms, —C(═O)—, a linear or branched alkylene group (which preferably has 1 to 10 carbon atoms, and more preferably has 1 to 6 carbon atoms), a cycloalkylene group (which preferably has 3 to 10 carbon atoms, and more preferably has 5 to 10 carbon atoms), —O—, a cyclic lactone structure, and a divalent connecting group obtained by combining these.

In General Formula (2'), f is an integer of 0 to 6. f is preferably an integer of 0 to 3, and more preferably 1 to 3.

In General Formulas (2') and (3'), g is 0 or 1.

In addition, General Formula (2') is particularly preferably represented by any one of the following General Formulas (1-a) to (1-c). The repeating unit (Q) is particularly preferably a repeating unit represented by any one of the following General Formulas (1-a) to (1-c) or a repeating unit represented by General Formula (3').

(1-a)

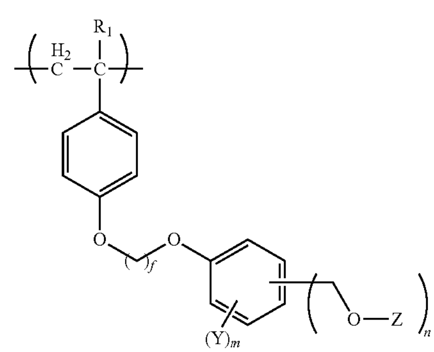

-continued (1-b)

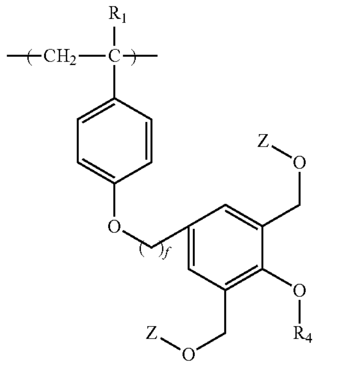

(1-c)

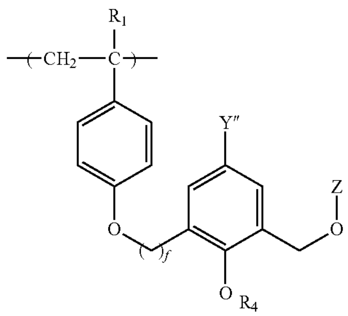

Each of $R_1$, Y, and Z in General Formulas (1-a) to (1-c) has the same meaning as each group in General Formula (1), and the specific examples and the preferable range thereof are also the same.

In General Formulas (1-b) and (1-c), Y" represents a hydrogen atom or a monovalent substituent. Examples of the monovalent substituent include the same monovalent substituents as those represented by Y described above. Here, Y" may be a methylol group.

$R_4$ represents a hydrogen atom or a monovalent substituent. Specific examples of the monovalent substituent include the same as those in a case where Z in General Formula (1) is a monovalent substituent.

f represents an integer of 1 to 6. The preferable range thereof is the same as that described in General Formula (2').

m is 0 or 1, and n represents an integer of 1 to 3.

In General Formulas (1-b) and (1-c), examples of $R_4$ include a hydrogen atom, an alkyl group (which may be linear or branched, and preferably has 1 to 12 carbon atoms), an alkenyl group (which preferably has 2 to 12 carbon atoms), an alkynyl group (which preferably has 2 to 12 carbon atoms), a cycloalkyl group (which preferably has 3 to 8 carbon atoms), an aryl group (which may be a monocycle or a polycycle, and preferably has 6 to 18 carbon atoms), a haloalkyl group, an alkanoyl group, an alkoxycarbonyl group, an aryloxycarbonyl group, an alkylsulfonyloxy group, an arylsulfonyloxy group, an alkylsulfonyl group, an arylsulfonyl group, a cyano group, an alkylthio group, an arylthio group, and a heterocyclic group. Preferable examples thereof include a hydrogen atom, an alkyl group, a cycloalkyl group, and an alkanoyl group.

Specific examples of a haloalkyl group, an alkanoyl group, an alkoxycarbonyl group, an aryloxycarbonyl group, an alkylsulfonyloxy group, an arylsulfonyloxy group, an alkylsulfonyl group, an arylsulfonyl group, a cyano group, an alkylthio group, an arylthio group, and a heterocyclic group include the same as Y in General Formula (1), and the preferable range thereof is also the same.

Specific examples of the repeating unit (Q) include the following structures.

(Q-1)

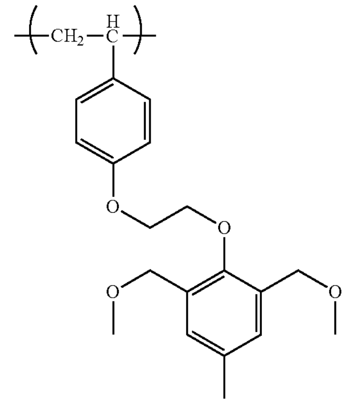

(Q-2)

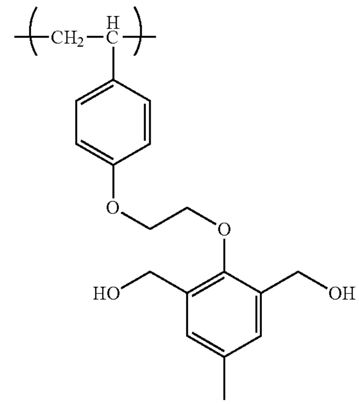

(Q-3)

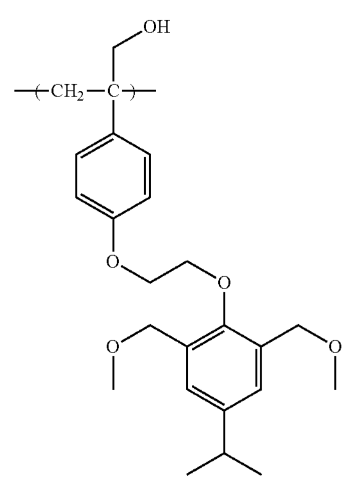

-continued
(Q-4)
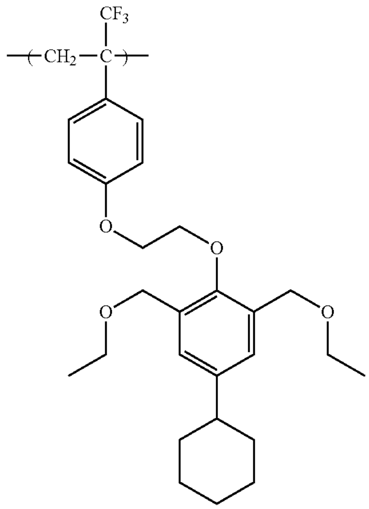
(Q-5)
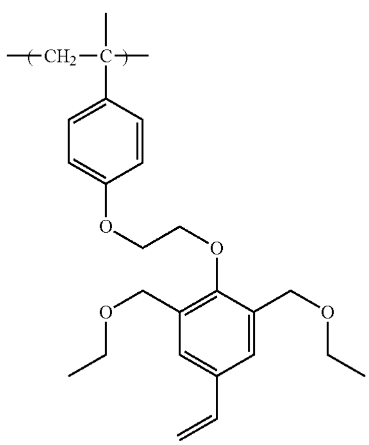
(Q-6)
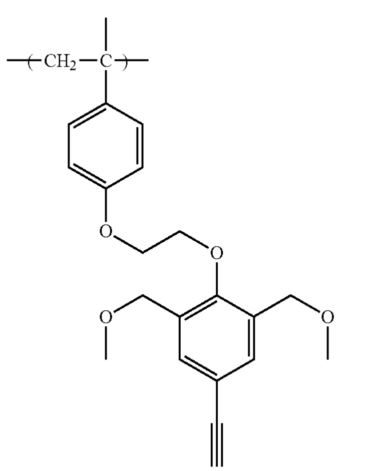
-continued
(Q-7)
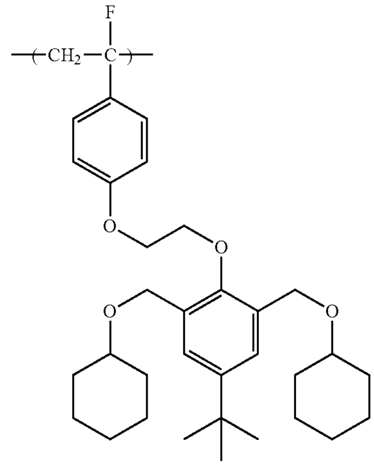
(Q-8)
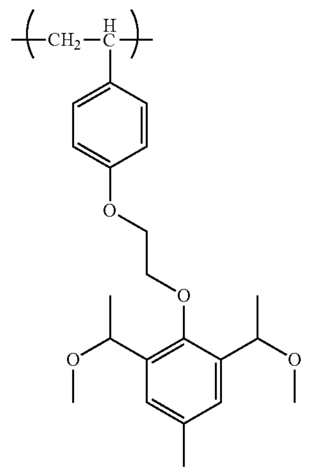
(Q-9)
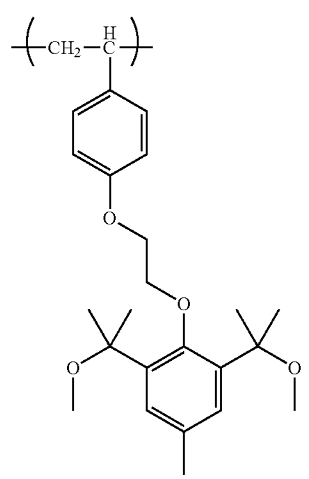

-continued
(Q-10)
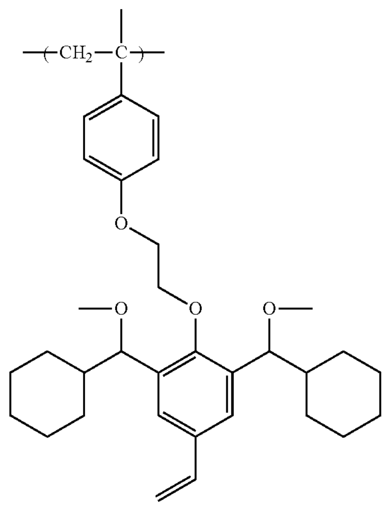
(Q-11)
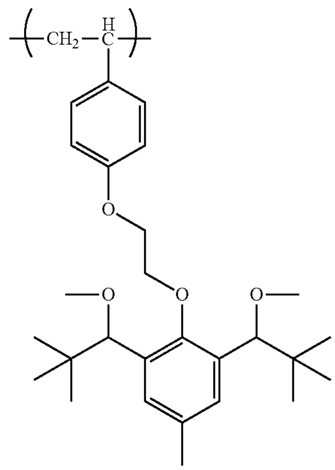
(Q-12)
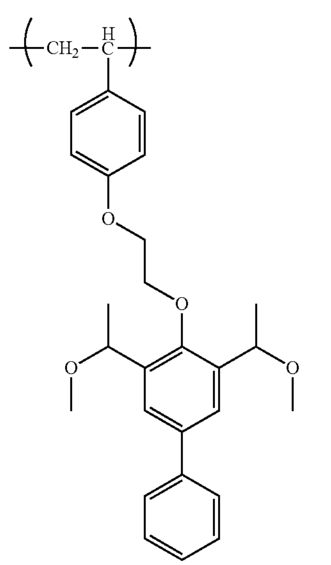
-continued
(Q-13)
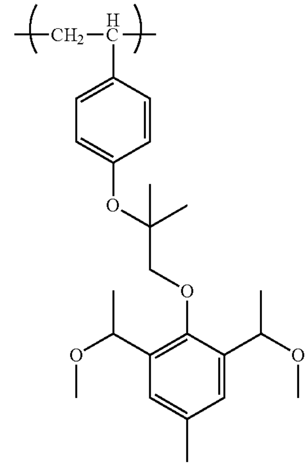
(Q-14)
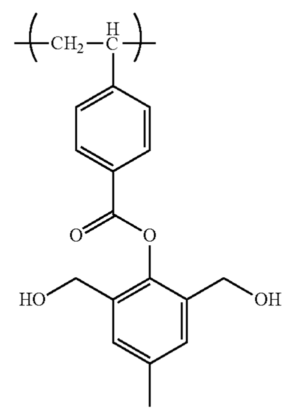
(Q-15)
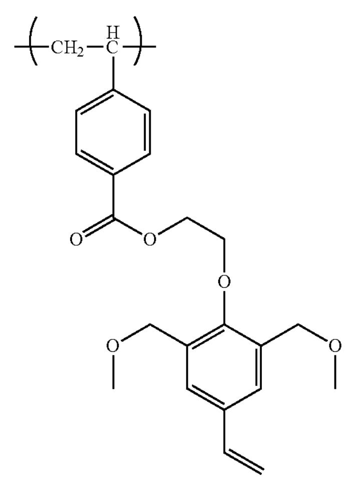

-continued
(Q-16)
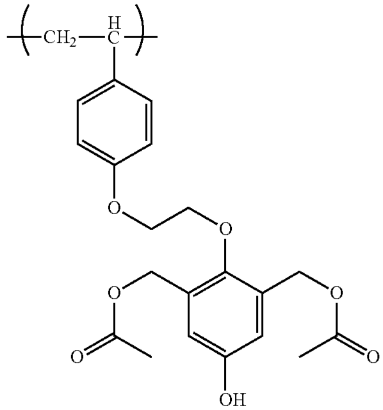
(Q-17)
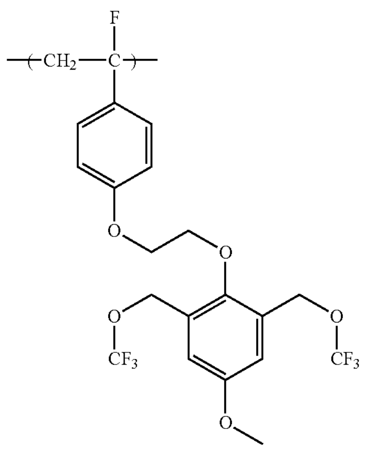
(Q-18)
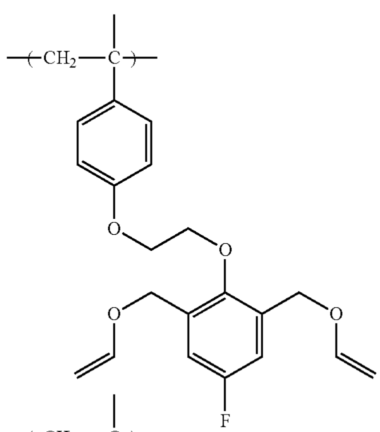
(Q-19)
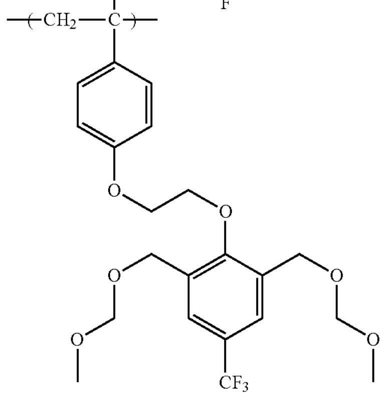
-continued
(Q-20)
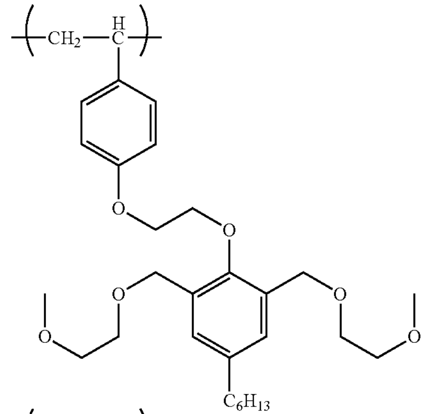
(Q-21)
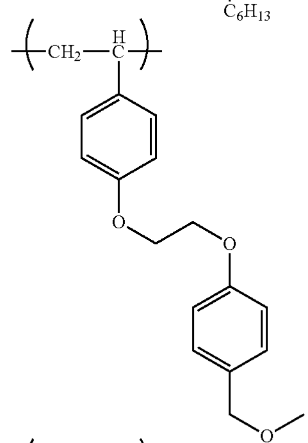
(Q-22)
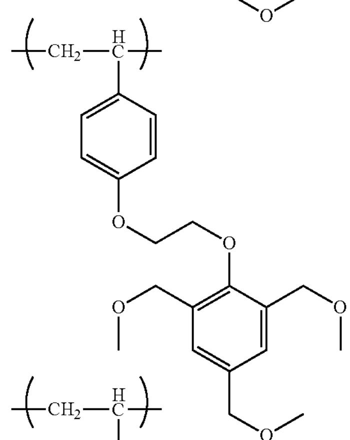
(Q-23)
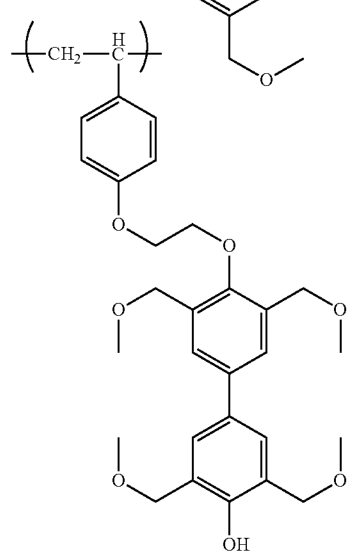

-continued
(Q-24)
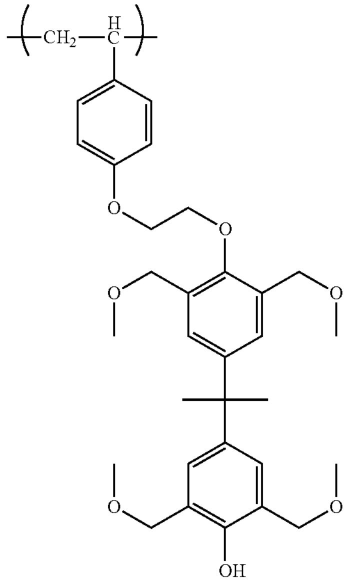
(Q-25)
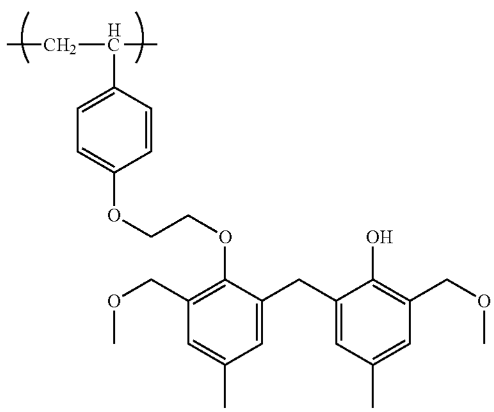
(Q-26)
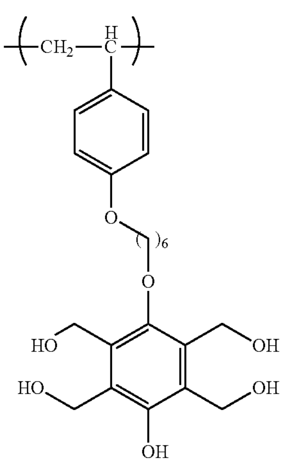
-continued
(Q-27)
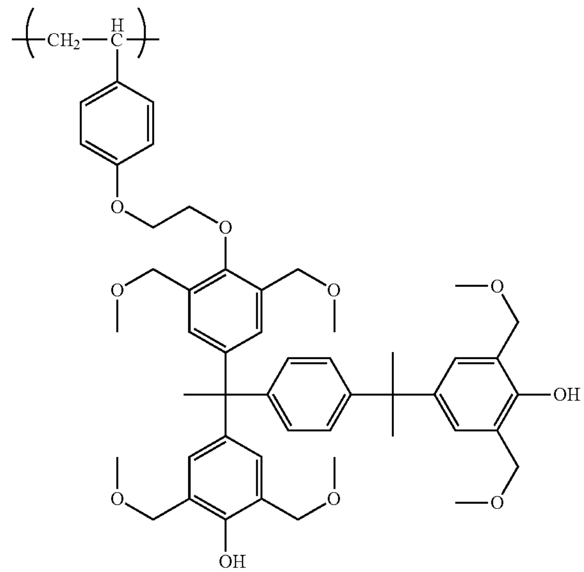
(Q-28)
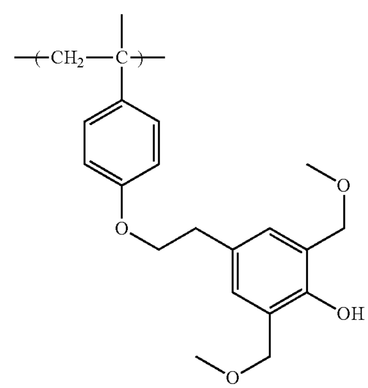
(Q-29)
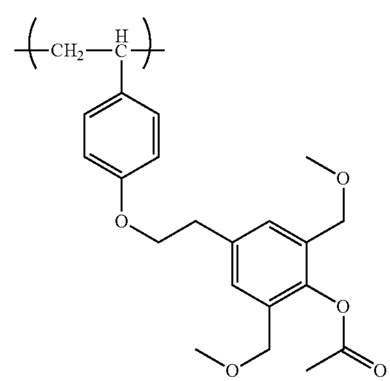

-continued
(Q-30)
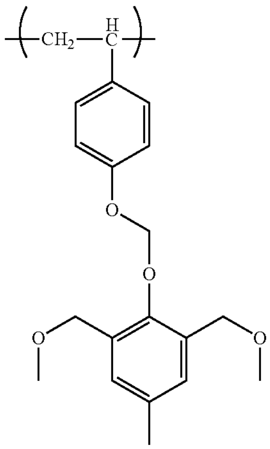
(Q-31)
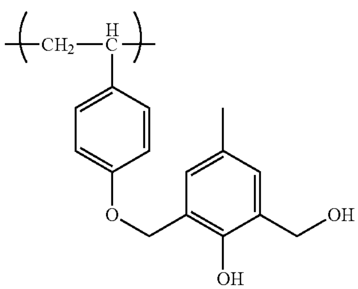
(Q-32)
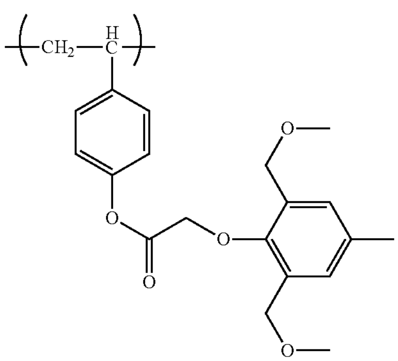
(Q-33)
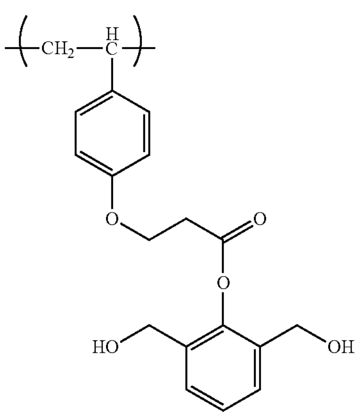
-continued
(Q-34)
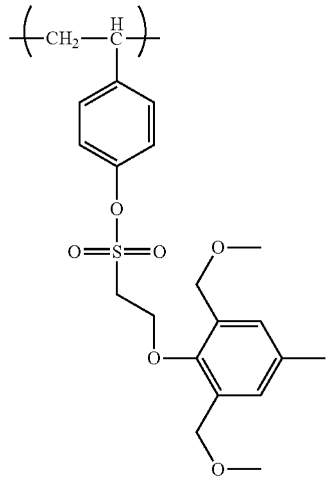
(Q-35)
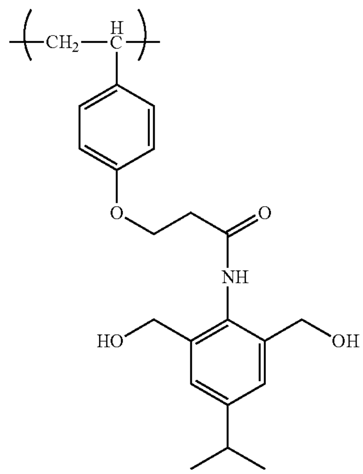
(Q-36)
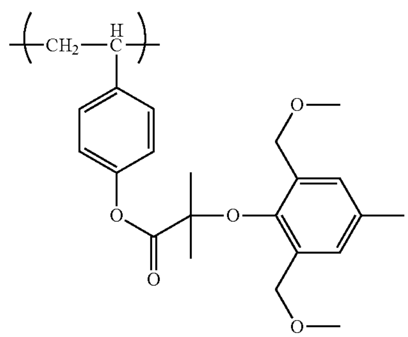

-continued
(Q-37)
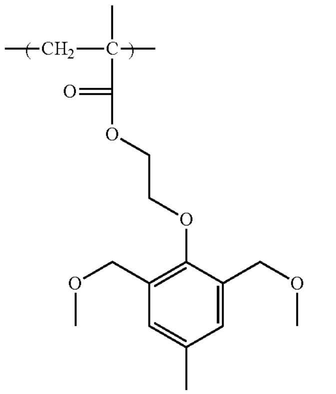
(Q-38)
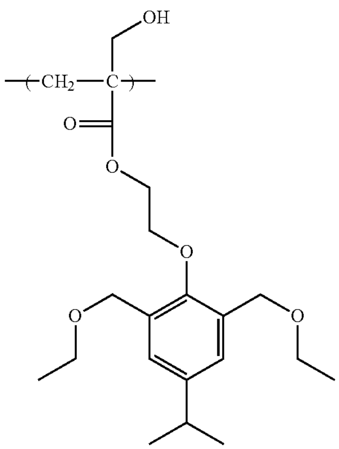
(Q-39)
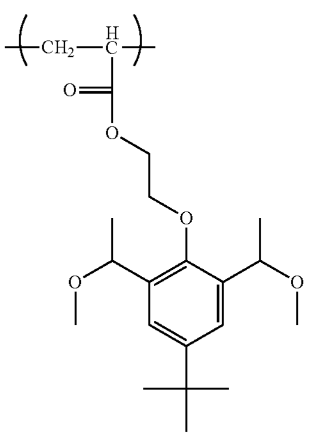
(Q-40)
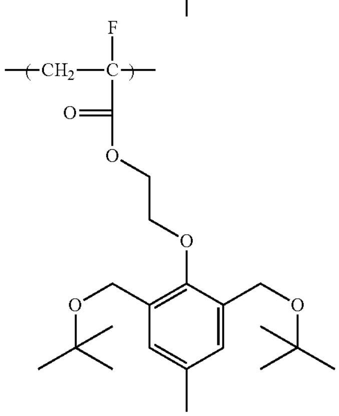
-continued
(Q-41)
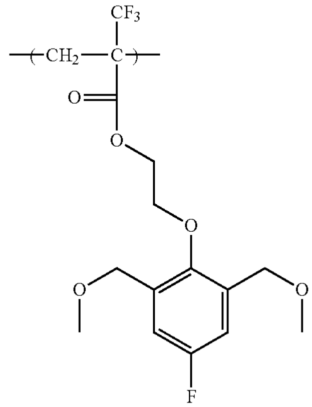
(Q-42)
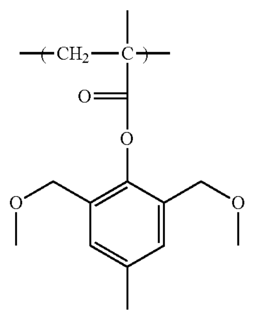
(Q-43)
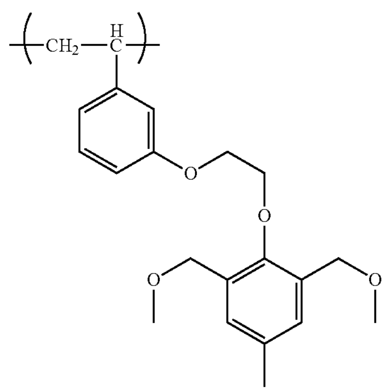
(Q-44)
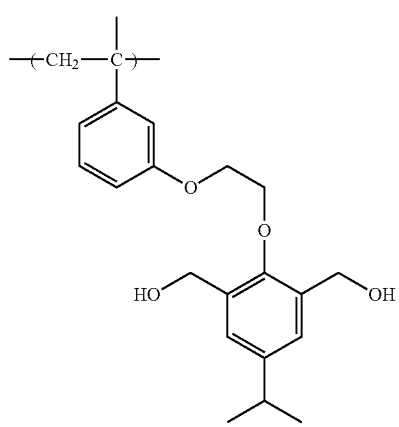

-continued
(Q-45)
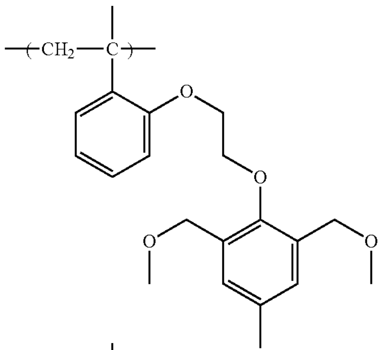
(Q-46)
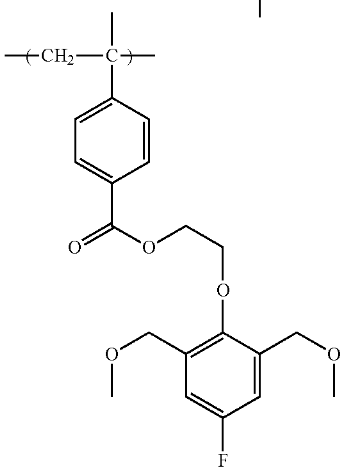
(Q-47)
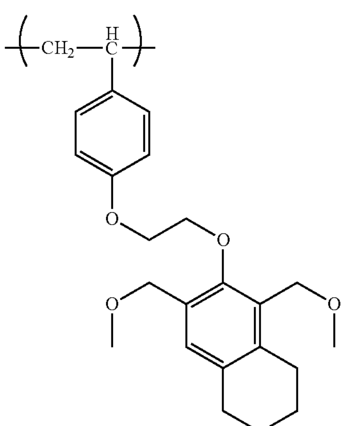
(Q-48)
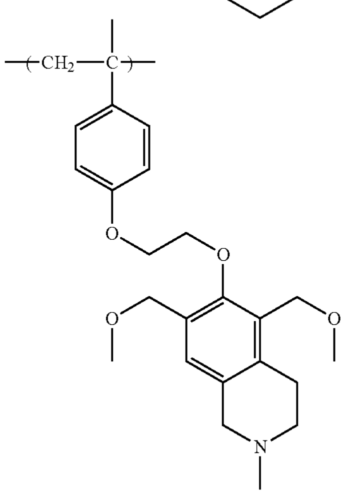
-continued
(Q-49)
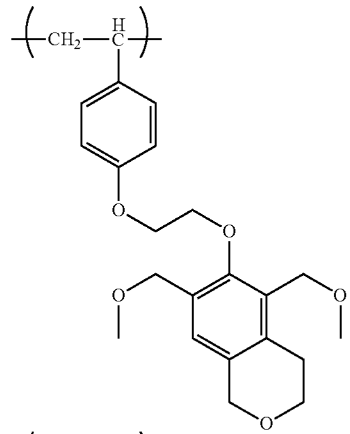
(Q-50)
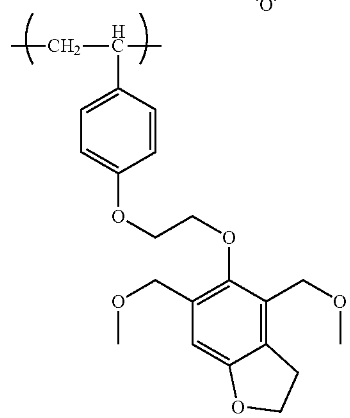
(Q-51)
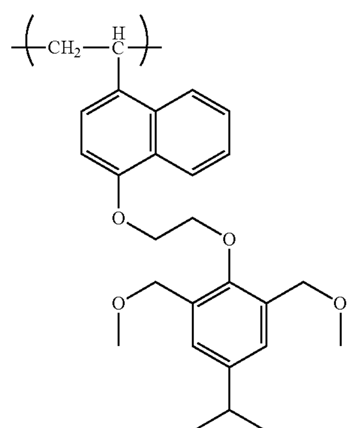
(Q-52)
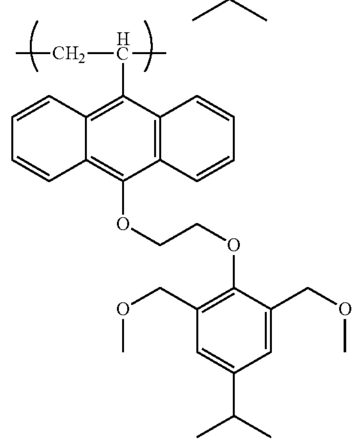

(Q-53)
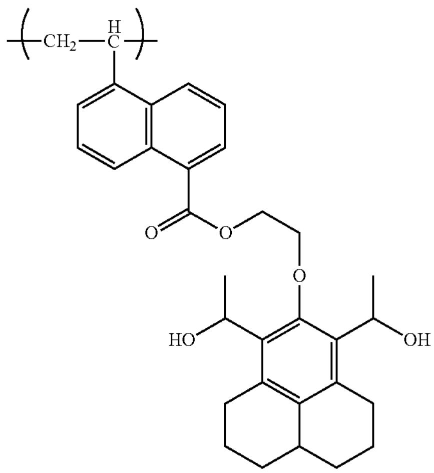
(Q-54)
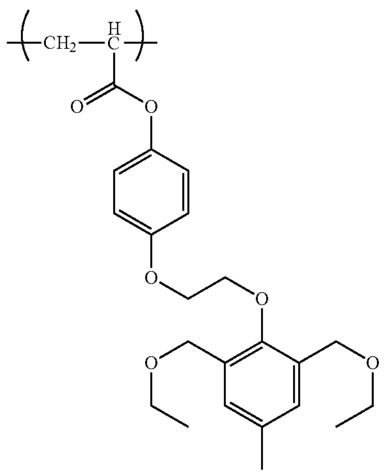
(Q-55)
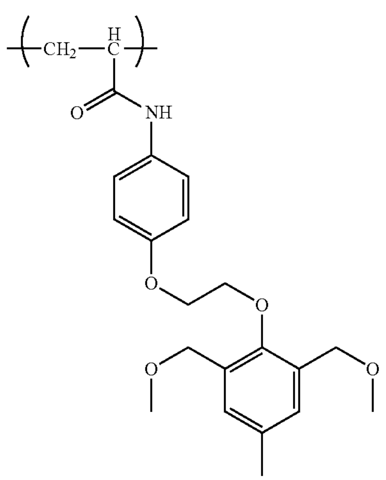
(Q-56)
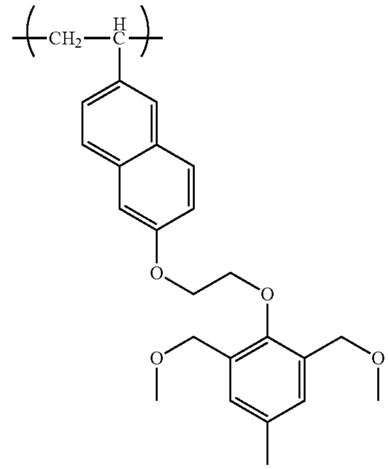
(Q-57)
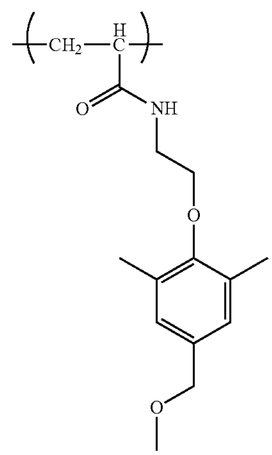
(Q-58)
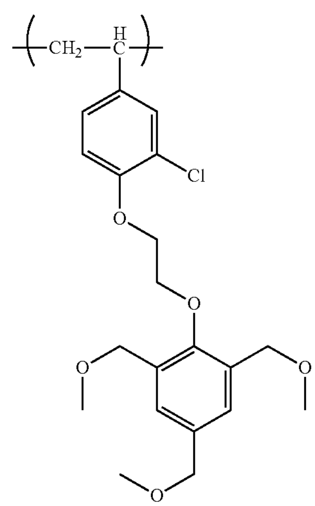

-continued
(Q-59)
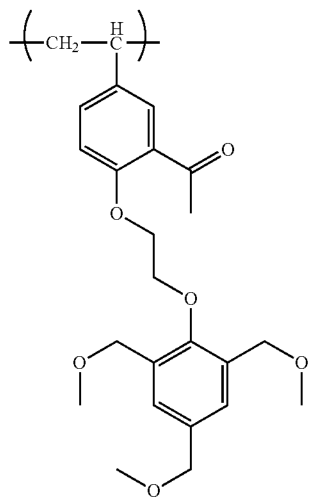
(Q-60)
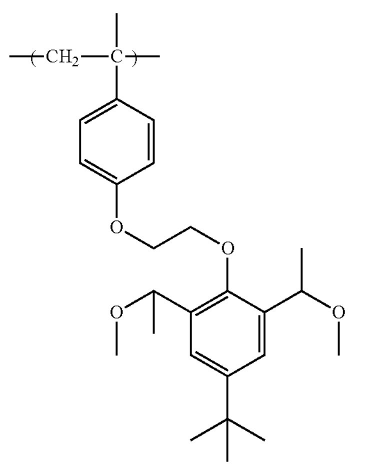
(Q-61)
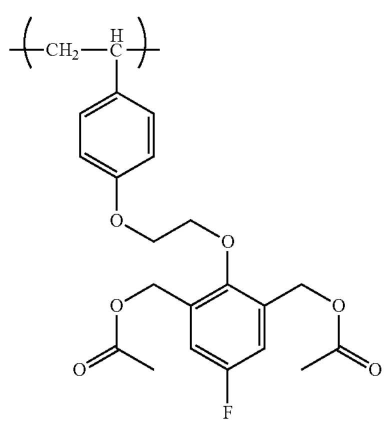
-continued
(Q-62)
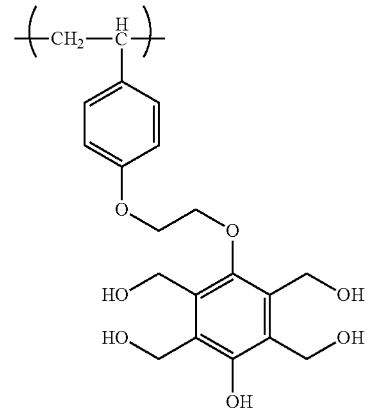
(Q-63)
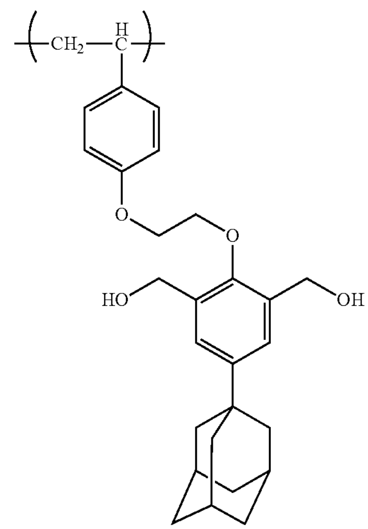
(Q-64)
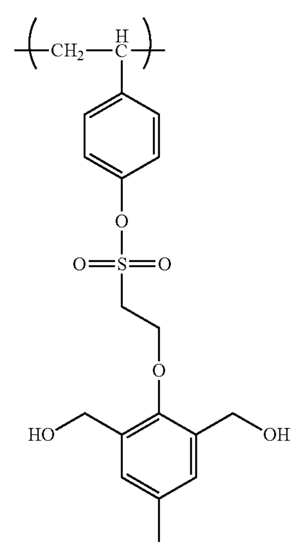

-continued
(Q-65)
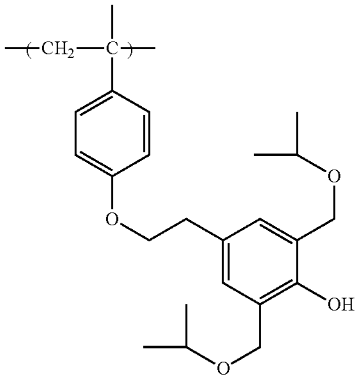
(Q-66)
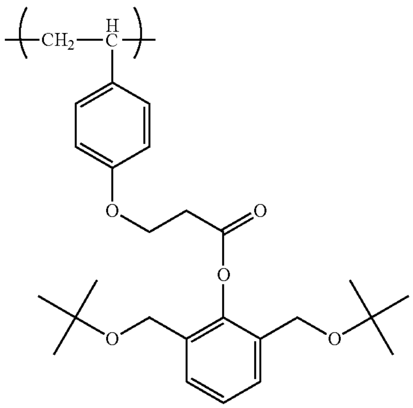
(Q-67)
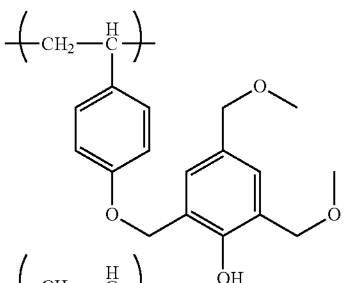
(Q-68)
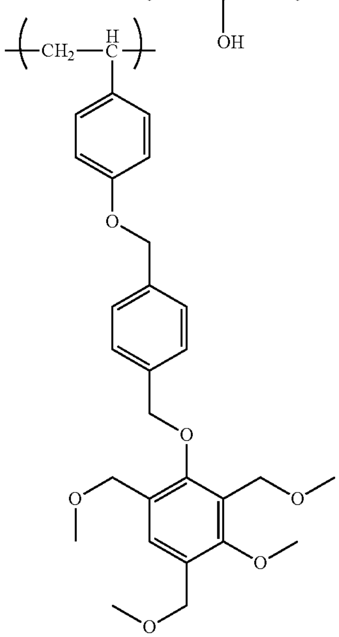
-continued
(Q-69)
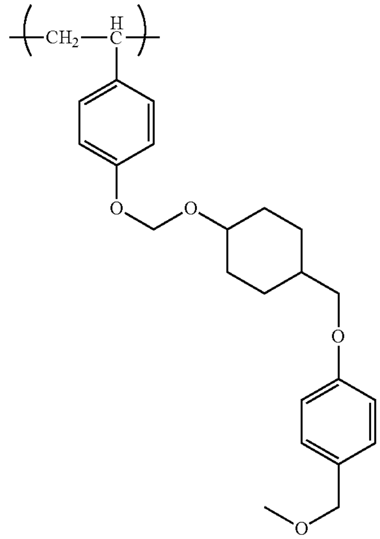
(Q-70)
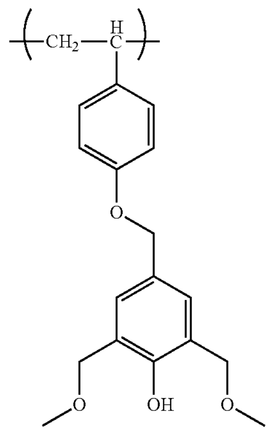
(Q-71)
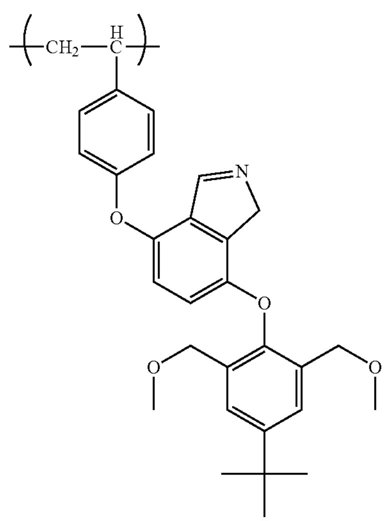

-continued
(Q-72)
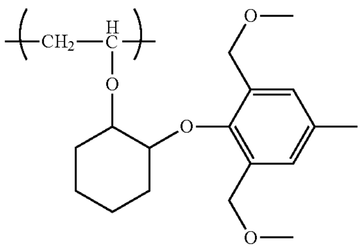
(Q-73)
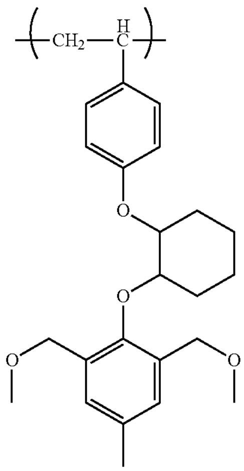
(Q-74)
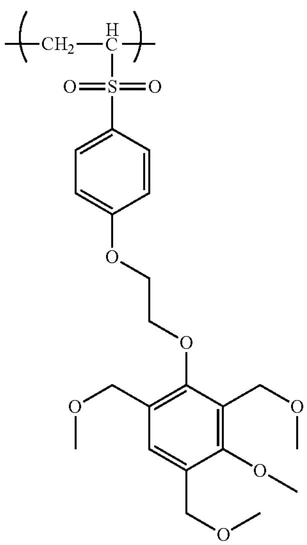
(Q-75)
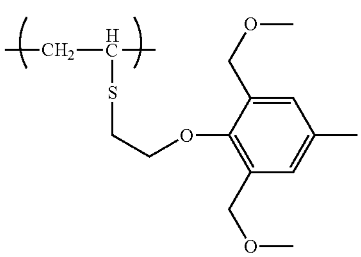
-continued
(Q-76)
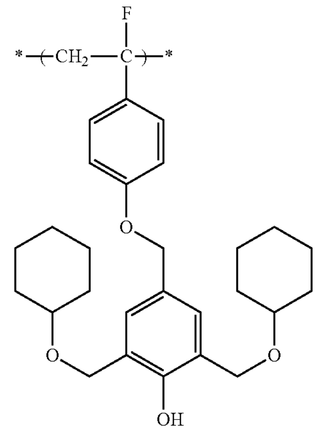
(Q-77)
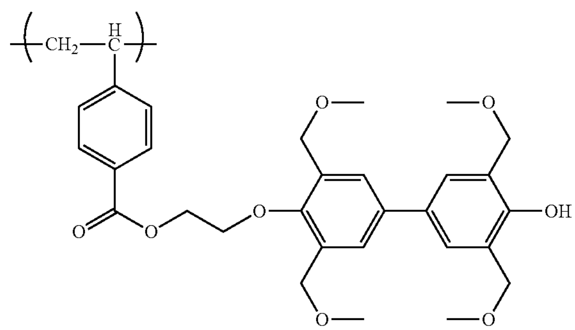
(Q-78)
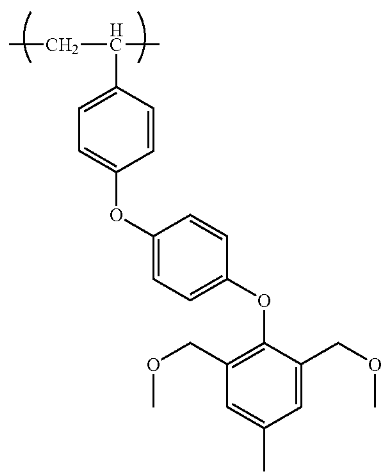
(Q-79)
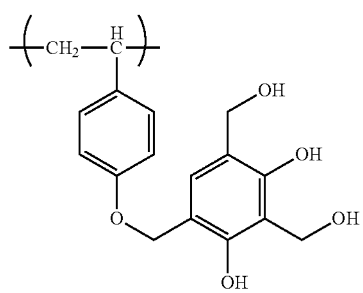

-continued
(Q-80)
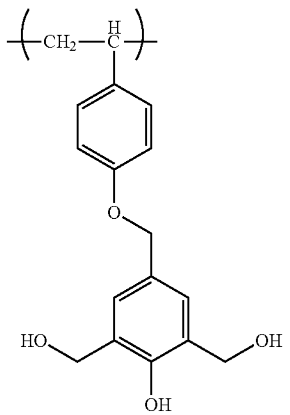
(Q-81)
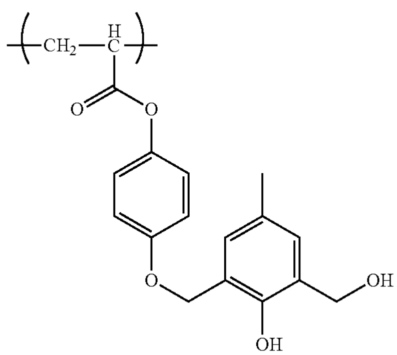
(Q-76)
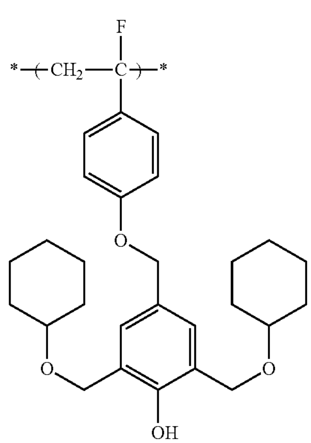
(Q-77)
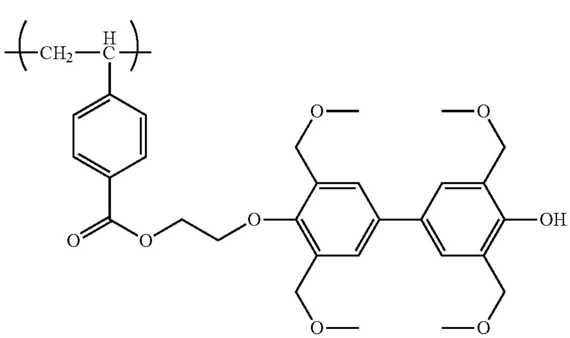
-continued
(Q-78)
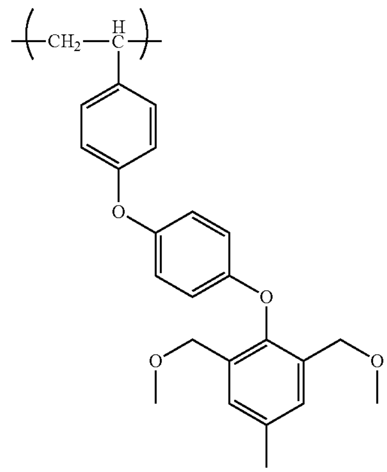
(Q-79)
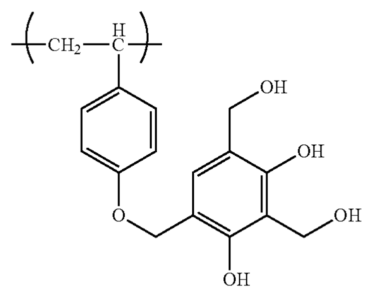
(Q-80)
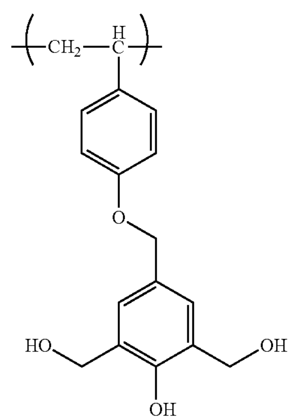
(Q-81)
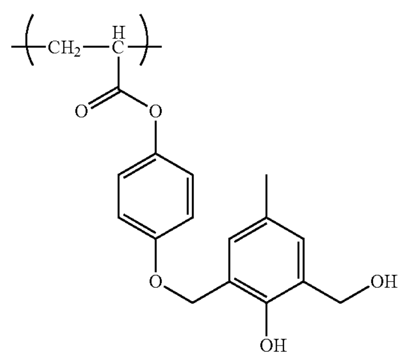

-continued
(Q-89)
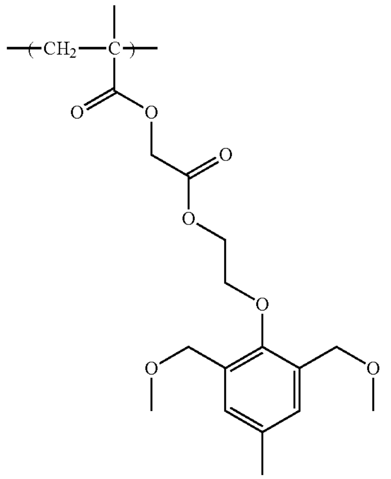
(Q-90)
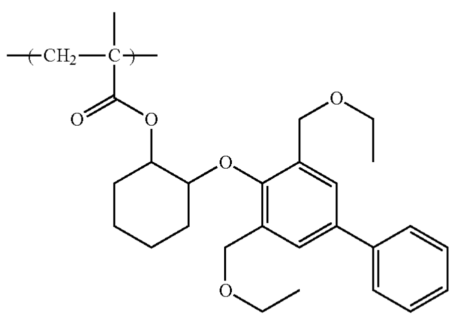
(Q-91)
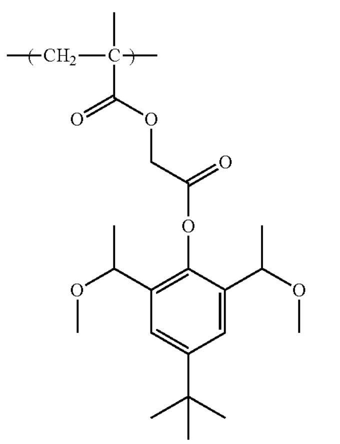
(Q-92)
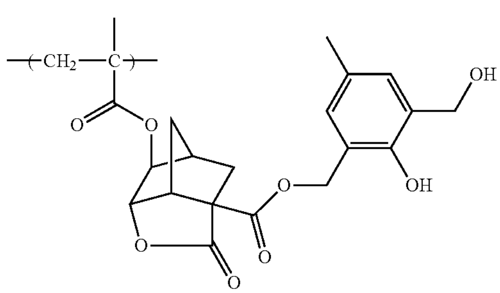
-continued
(Q-93)
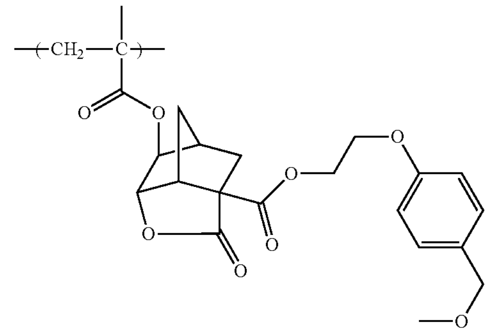
(Q-94)
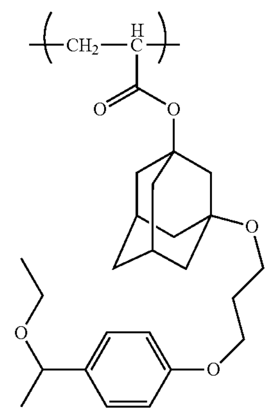
(Q-95)
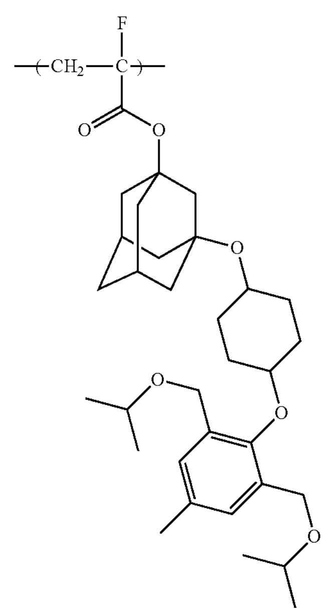

-continued
(Q-96)
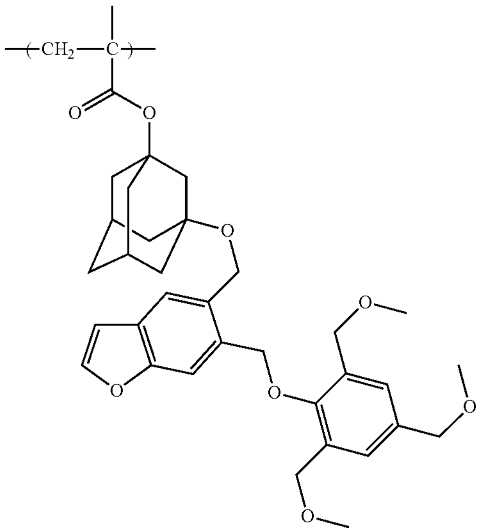
(Q-97)
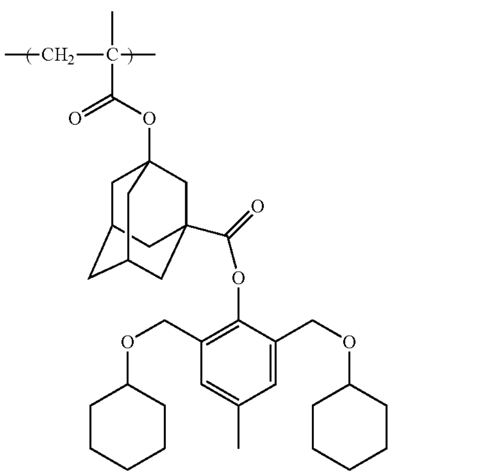
(Q-98)
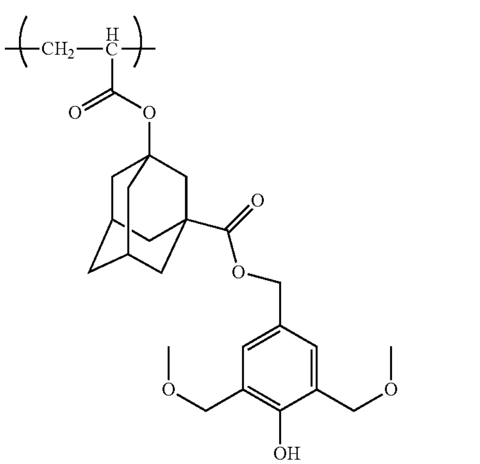
-continued
(Q-99)
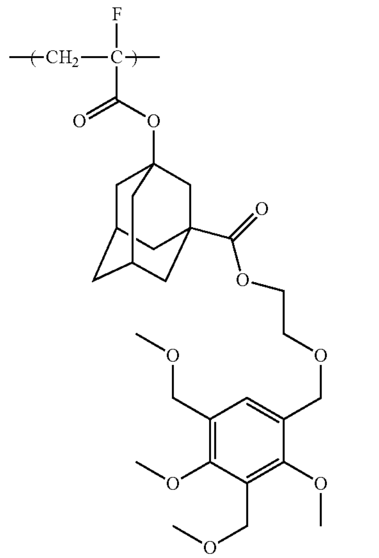
(Q-100)
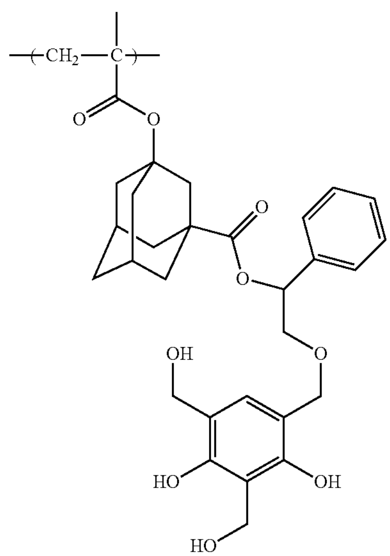
(Q-101)
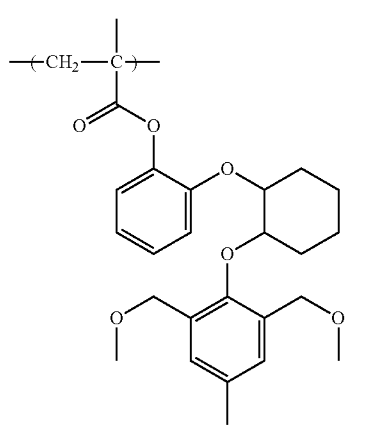

-continued
(Q-102)
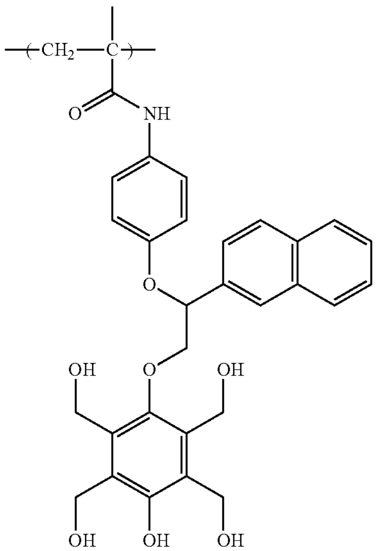
(Q-103)
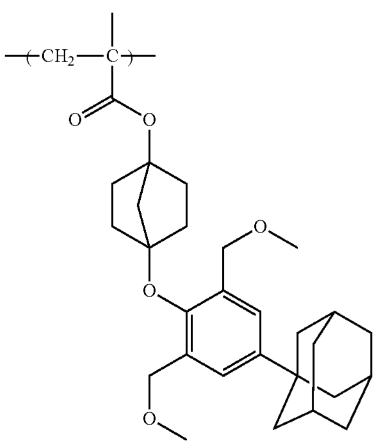
(Q-104)
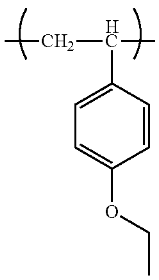
-continued
(Q-105)
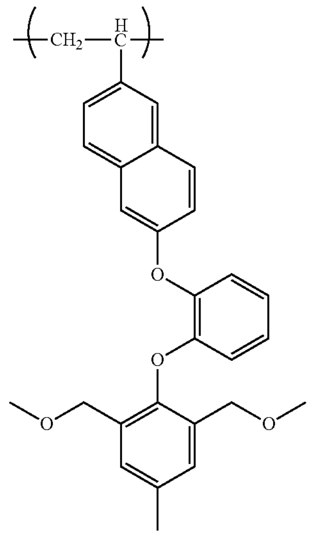
(A-106)
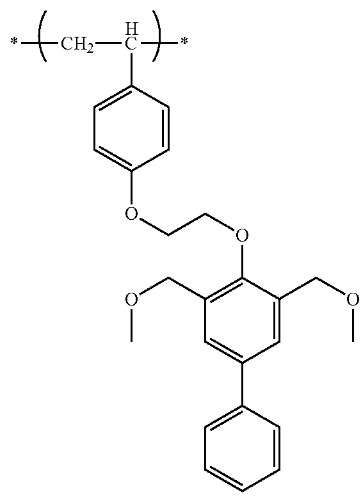
(A-107)
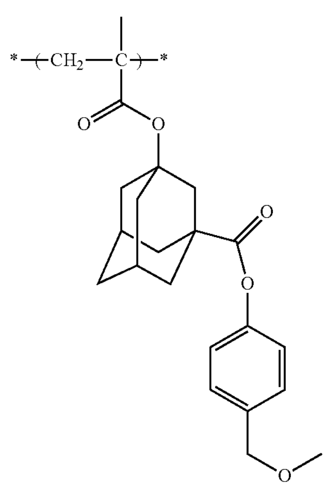

-continued (A-108)

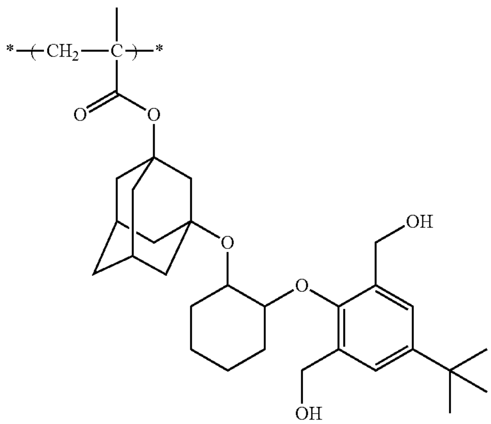

(A-109)

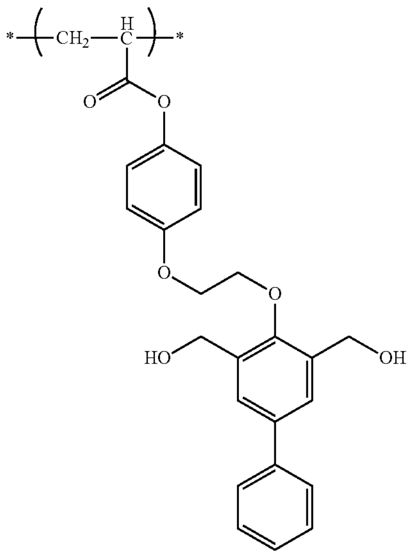

(A-110)

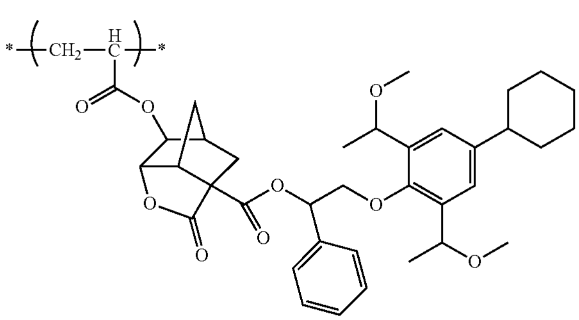

-continued (A-111)

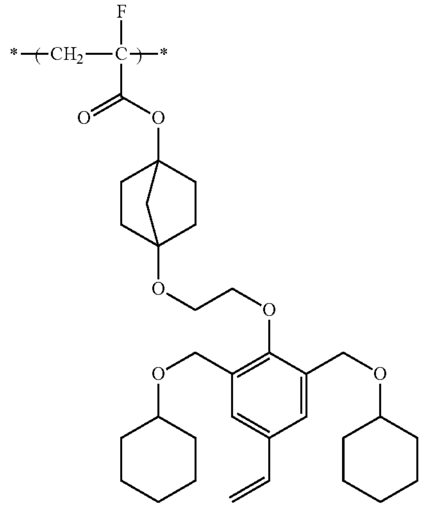

In addition, the repeating unit represented by General Formula (V) may be a repeating unit (A) in which $B_8$ has a substructure of an N-methylol system, as a repeating unit in which the cross-linking group included in $B_8$ is a methylol group, and, in this case, a repeating unit in which $B_8$ has two or more substructures of an N-methylol system is more preferable.

Here, the substructure of an N-methylol system refers to a methylol group which is covalently bonded to a nitrogen atom. Thus, "has two or more substructures of an N-methylol system" includes not only a form in which two or more methylol-based groups are covalently bonded to different nitrogen atoms but also a case where two or more methylol-based groups are covalently bonded to the same nitrogen atom.

The substructure of an N-methylol system, for example, refers to a substructure represented by the following General Formula (L-1).

(L-1)

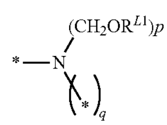

In the General Formula (L-1), $R^{L1}$ represents a hydrogen atom, an alkyl group, or a cycloalkyl group. p represents 1 or 2. q represents an integer represented by (2-p). * represents a bonding site with other atoms constituting the repeating unit (A).

The alkyl group represented by $R^{L1}$ may be any one of a linear alkyl group or a branched alkyl group, and examples thereof include an alkyl group having 1 to 20 carbon atoms (for example, a methyl group, an ethyl group, a propyl group, an isopropyl group, a butyl group, an isobutyl group, a t-butyl group, an n-pentyl group, an n-hexyl group, an n-octyl group, and an n-dodecyl group). An alkyl group having 1 to 8 carbon atoms is preferable, an alkyl group having 1 to 6 carbon atoms is more preferable, and an alkyl group having 1 to 4 carbon atoms is particularly preferable.

The cycloalkyl group represented by $R^{L1}$ may be any one of a monocyclic type or a polycyclic type, and examples thereof include a cycloalkyl group having 3 to 17 carbon atoms (for example, a cyclopentyl group, a cyclohexyl group, a norbornanyl group, and an adamantyl group). A cycloalkyl group having 5 to 12 carbon atoms is preferable, a cycloalkyl group having 5 to 10 carbon atoms is more preferable, and a cycloalkyl group having 5 or 6 carbon atoms is particularly preferable.

As $R^{L1}$ in General Formula (L-1), a hydrogen atom or an alkyl group having 1 to 8 carbon atoms is preferable, a hydrogen atom or an alkyl group having 1 to 6 carbon atoms is more preferable, and a hydrogen atom or an alkyl group having 1 to 4 carbon atoms is particularly preferable.

The repeating unit (A) is preferably a repeating unit represented by the following General Formula (L-2).

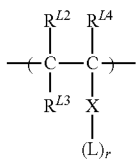

(L-2)

In General Formula (L-2), each of $R^{L2}$, $R^{L3}$, and $R^{L4}$ independently represents a hydrogen atom, an alkyl group, a cycloalkyl group, a halogen atom, a cyano group, or an alkoxycarbonyl group. Each of X's represents independently a single bond, a linear or branched hydrocarbon group, a cyclic hydrocarbon group which may contain a heteroatom as a ring member, —O—, —S—, —CO—, —$SO_2$—, —NR— (R is a hydrogen atom, an alkyl group, or a group represented by —$CH_2OR^{L1}$), or an (r+1) valent group selected from the group consisting of groups obtained by combination of these. Moreover, $R^{L1}$ in a group represented by —$CH_2OR^{L1}$ has the same meaning as $R^{L1}$ in General Formula (L-1).

L represents a monovalent organic group including the substructure represented by General Formula (L-1).

r is an integer of 1 to 5. Here, in a case where X is a single bond, r is 1.

Specific examples and preferable examples of the alkyl group represented by $R^{L2}$, $R^{L3}$, or $R^{L4}$ include the same as those described in the alkyl group represented by $R^{L1}$.

Specific examples and preferable examples of the cycloalkyl group represented by $R^{L2}$, $R^{L3}$, or $R^{L4}$ include the same as the specific examples of the cycloalkyl group represented by $R^{L1}$.

Examples of the halogen atom represented by $R^{L2}$, $R^{L3}$, or $R^{L4}$ can include a fluorine atom, a chlorine atom, a bromine atom, and an iodine atom, and a fluorine atom is more preferable.

Specific examples and preferable examples of the alkyl portion of the alkoxycarbonyl group represented by $R^{L2}$, $R^{L3}$, or $R^{L4}$ include the same as those described in the alkyl group represented by $R^{L1}$.

Each of $R^{L2}$ and $R^{L3}$ is preferably independently a hydrogen atom or an alkyl group, and more preferably independently a hydrogen atom.

$R^{L4}$ is preferably a hydrogen atom, an alkyl group, or a halogen atom, and more preferably a hydrogen atom or an alkyl group.

The linear or branched hydrocarbon group is preferably a linear or branched hydrocarbon group having 1 to 5 carbon atoms, and more preferably a linear or branched hydrocarbon group having 1 to 3 carbon atoms.

The cyclic hydrocarbon group which may contain a heteroatom as a ring member may be an aromatic ring group, or may be a nonaromatic ring group.

The aromatic ring in the aromatic ring group preferably has 3 to 12 carbon atoms, and more specific examples thereof can include a benzene ring, a naphthalene ring, a furan ring, a pyrrole ring, a thiophene ring, a pyrazole ring, an oxazole ring, a thiazole ring, a pyridine ring, a pyrazine ring, a pyrimidine ring, and a triazine ring.

The nonaromatic ring in the nonaromatic ring group preferably has 4 to 12 carbon atoms, and more specific examples thereof can include a cyclopentane ring, a cyclohexane ring, and tetrahydrofuran ring.

L is not particularly limited as long as it is a monovalent organic group including the substructure represented by General Formula (L-1), and is preferably the substructure itself represented by General Formula (L-1). In this case, and in a case where p is 1 (that is, q is 1) in General Formula (L-1), two bonding sites in the substructure represented by General Formula (L-1) may be in a case where only one bonding site is bonded to X, or in a case where one bonding site is bonded to X and the other bonding site is bonded to X through a connecting group (for example, an alkylene group, a carbonyl group, —O—, —S—, —CO—, —$SO_2$—, or a group obtained by combination thereof) to form a ring, but, in a case where only one bonding site is bonded to X, the other bonding site (*) is preferably bonded to a hydrogen atom or a monovalent organic group (for example, an alkyl group, a cycloalkyl group, a halogen atom, a cyano group, —O—, —S—, —CO—, —$SO_2$—, or a group obtained by combination thereof).

r is preferably an integer of 1 to 3, and more preferably 1 or 2.

The repeating unit represented by General Formula (L-2) is preferably a repeating unit represented by the following General Formula (L-3).

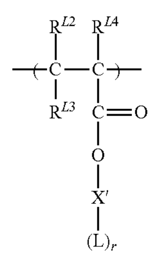

(L-3)

$R^{L2}$, $R^{L3}$, $R^{L4}$, L, and r in General Formula (L-3) have the same meaning as $R^{L2}$, $R^{L3}$, $R^{L4}$, L, and r in General Formula (L-2), respectively, and the preferable examples thereof are also the same. Here, in a case where X' is a single bond, r is 1.

X' has the same meaning as X in General Formula (L-2).

Hereinafter, specific examples of the repeating unit (A) will be described, but the present invention is not limited thereto. In the following specific examples, R' represents a hydrogen atom, an alkyl group, a cyano group, or a halogen atom.

-continued
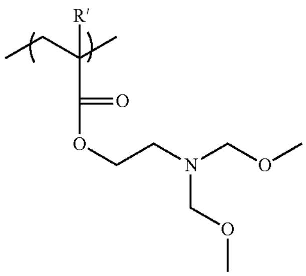
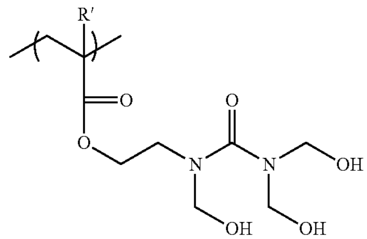
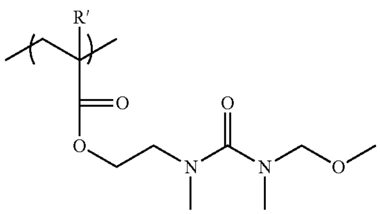
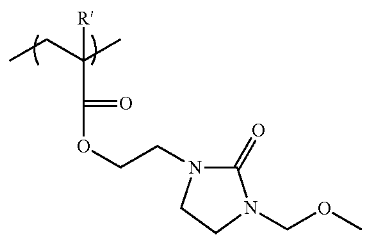
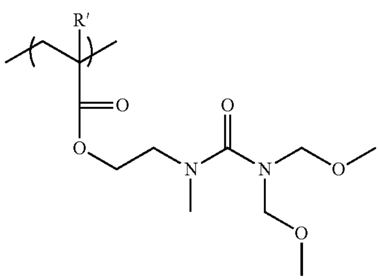
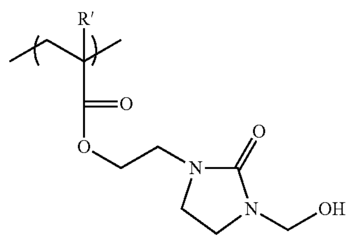
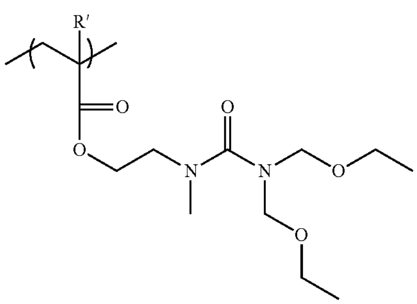
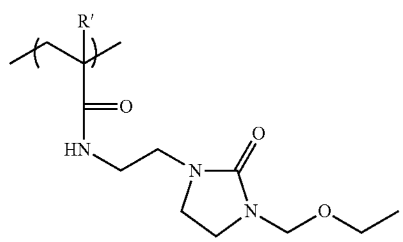
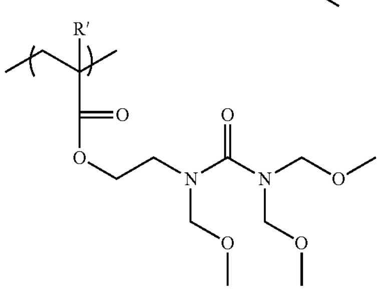
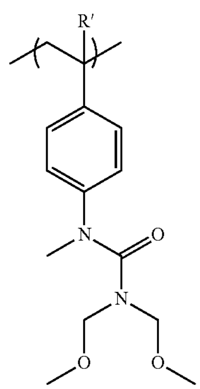
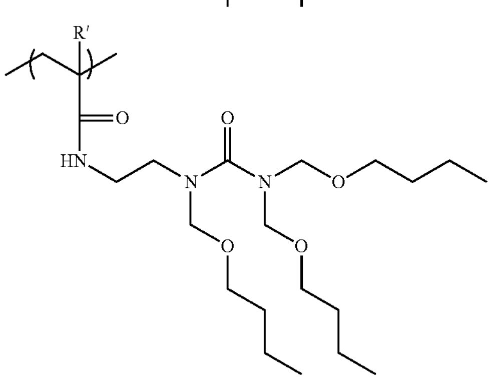
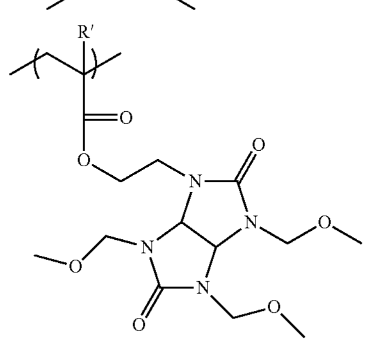

-continued

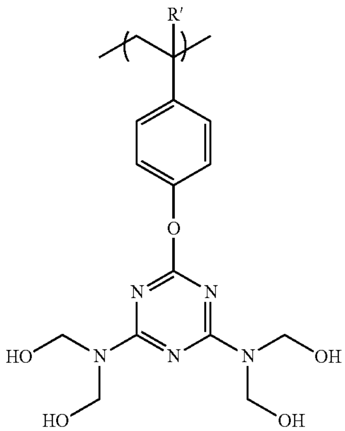

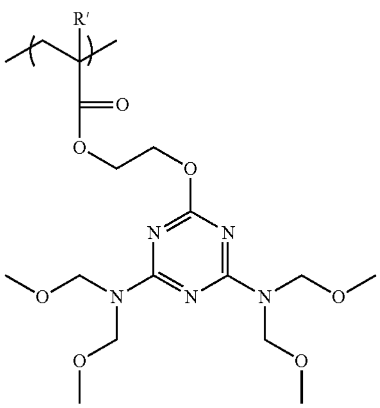

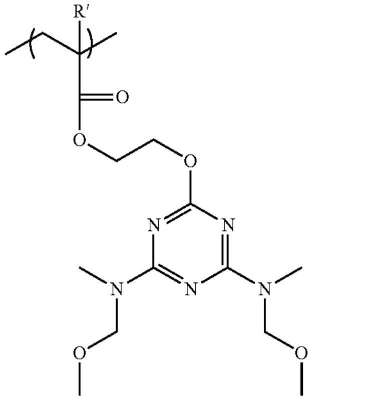

-continued

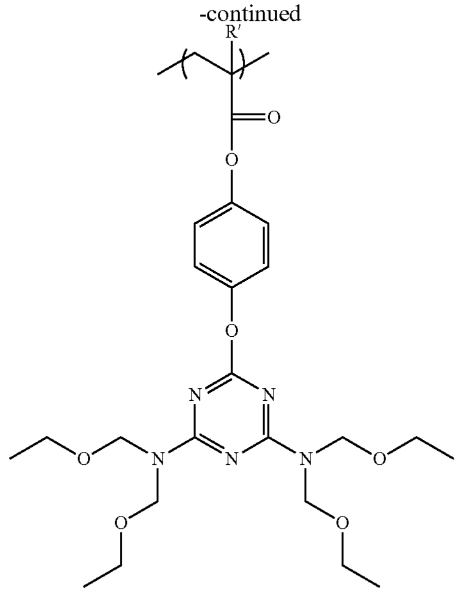

In a case where the cross-linking group included in $B_8$ is an oxirane ring or an oxetane ring, the resin (A) may have a repeating unit (T) represented by the following General Formula (T) as the repeating unit represented by General Formula (V).

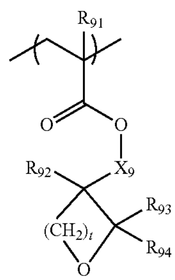

(T)

In General Formula (T), $R_{91}$ represents a hydrogen atom, an alkyl group, a cycloalkyl group, a halogen atom, a cyano group, or an alkoxycarbonyl group.

$X_9$ represents a single bond or a divalent connecting group. $X_9$ may be bonded to $R_{92}$ or $R_{93}$ to form a ring, and $X_9$ in this case represents a trivalent connecting group.

Each of $R_{92}$ to $R_{94}$ independently represents a hydrogen atom, an alkyl group, or a cycloalkyl group.

t is 0 or 1.

Specific examples and preferable examples of the divalent connecting group represented by $X_9$ include the same as those described as a divalent connecting group, as $R_8$ in General Formula (V).

The alkyl group represented by each of $R_{92}$ to $R_{94}$ may be linear or branched, and is preferably an alkyl group having 1 to 6 carbon atoms.

The cycloalkyl group represented by each of $R_{92}$ to $R_{94}$ is preferably a cycloalkyl group having 3 to 6 carbon atoms.

Specific examples of the repeating unit (T) represented by the following General Formula (T) include repeating units exemplified below. In addition, the repeating units described in paragraphs "0058" and "0059" of JP2013-11866A can also be exemplified, and the contents thereof are incorporated in the present specification.

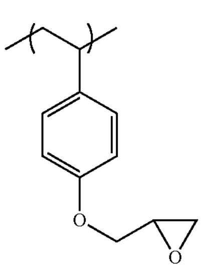
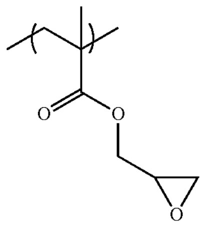
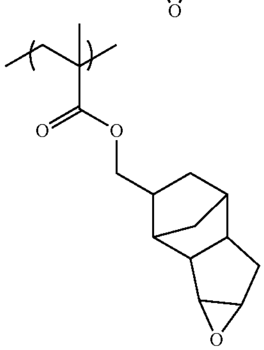
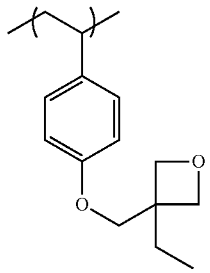
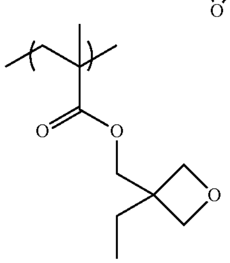
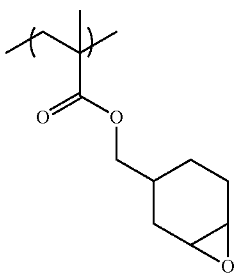

The repeating units represented by General Formula (V) may be used alone, or two or more types thereof may be used in combination.

The content of the repeating unit represented by General Formula (V) is preferably 1 mol % to 50 mol %, more preferably 5 mol % to 50 mol %, still more preferably 10 mol % to 40 mol %, and most preferably 10 mol % to 20 mol %, with respect to the entirety of repeating units included in the resin (A) from the viewpoint of cross-linking efficiency and developability.

In one embodiment of the present invention, the content of the repeating unit represented by General Formula (V) is preferably 1 mol % to 20 mol % with respect to the entirety of repeating units in the resin (A).

Repeating Unit (c) having Polar Group other than Repeating Unit Represented by General Formula (I)

The resin (A) preferably includes a repeating unit (c) having a polar group other than the repeating unit represented by General Formula (I). When the resin (A) includes the repeating unit (c), for example, the sensitivity of a composition including the resin can be improved. The repeating unit (c) is preferably a non-acid-decomposable repeating unit (that is, a repeating unit which does not include an acid-decomposable group).

Regarding "polar group" which can be included in the repeating unit (c) and the repeating unit having the polar group, the description in paragraphs "0149" to "0157" of JP2013-76991A can be referred to, and the contents thereof are incorporated in the present specification.

In a case where the repeating unit (c) has an alcoholic hydroxy group or a cyano group as a polar group, as one aspect of a preferable repeating unit, a repeating unit having an alicyclic hydrocarbon structure substituted with a hydroxyl group or a cyano group is exemplified. At this time, an acid-decomposable group is not preferably included. As the alicyclic hydrocarbon structure in the alicyclic hydrocarbon structure substituted with a hydroxyl group or a cyano group, an adamantyl group, a diamantyl group, or a norbornane group is preferable. As a preferable alicyclic hydrocarbon structure substituted with a hydroxyl group or a cyano group, the substructures represented by the following General Formulas (VIIa) to (VIIc) are preferable. Thus, adhesion to substrate and developer affinity are improved.

(VIIa)

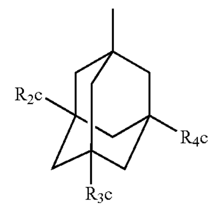

(VIIb)

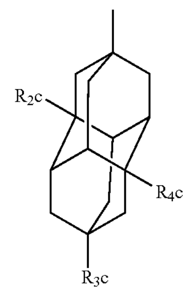

(VIIc)

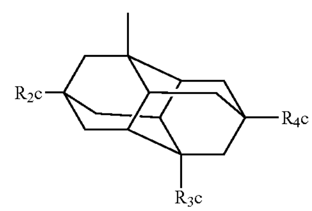

In General Formulas (VIIa) to (VIIc), each of $R_2c$ to $R_4c$ independently represents a hydrogen atom, a hydroxyl group, or a cyano group. Here, at least one of $R_2c$ to $R_4c$ is a hydroxyl group. Preferably, one or two of $R_2c$ to $R_4c$ are hydroxyl groups, and the other is a hydrogen atom. In General Formula (VIIa), more preferably, two of $R_2c$ to $R_4c$ are hydroxyl groups, and the other is a hydrogen atom.

As a repeating unit having a substructure represented by each of General Formulas (VIIa) to (VIIc), the repeating units represented by the following General Formulas (AIIa) to (AIIc) can be exemplified.

(AIIa)

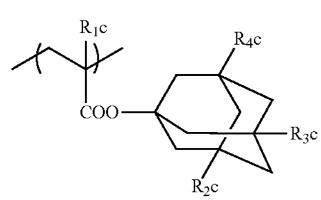

-continued (AIIb)

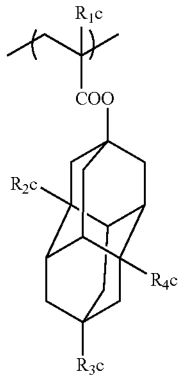

(AIIc)

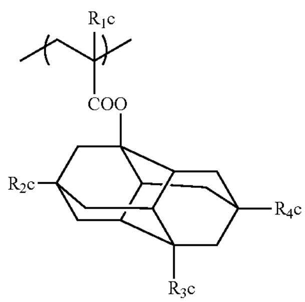

In General Formulas (AIIa) to (AIIc), $R_1c$ represents a hydrogen atom, a methyl group, a trifluoromethyl group, or a hydroxymethyl group.

$R_2c$ to $R_4c$ have the same meaning as $R_2c$ to $R_4c$ in General Formulas (VIIa) to (VIIc), respectively.

Although the resin (A) may contain or may not contain a repeating unit having a hydroxyl group or a cyano group, in a case where the resin (A) contains the repeating unit, the content of the repeating unit having a hydroxyl group or a cyano group is preferably 1 mol % to 60 mol %, more preferably 3 mol % to 50 mol %, and still more preferably 5 mol % to 40 mol %, with respect to the entirety of repeating units in the resin (A).

Specific examples of the repeating unit having a hydroxyl group or a cyano group are described below, but the present invention is not limited thereto.

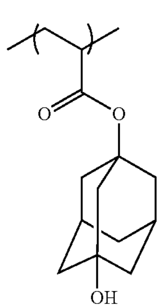

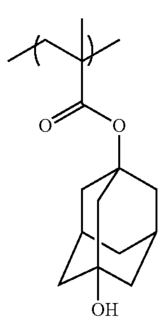

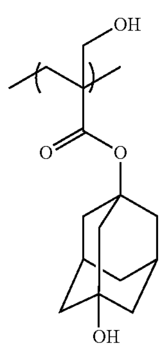

-continued

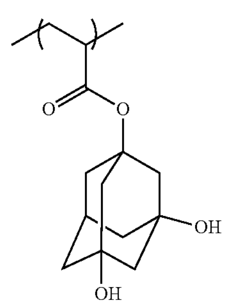

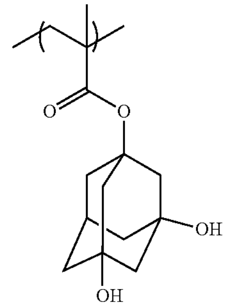

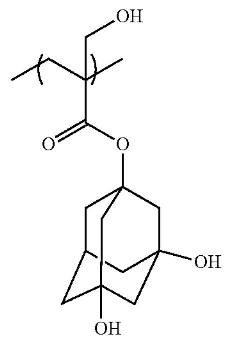

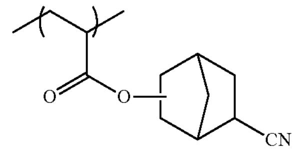

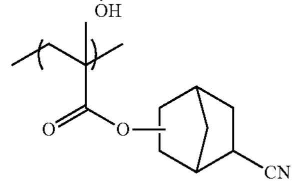

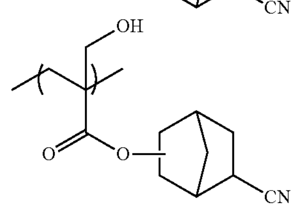

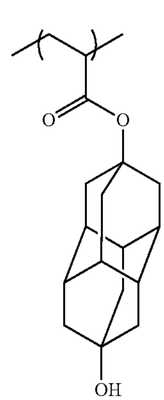

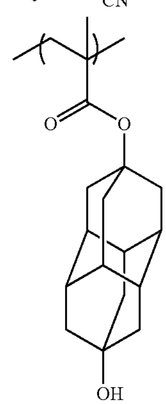

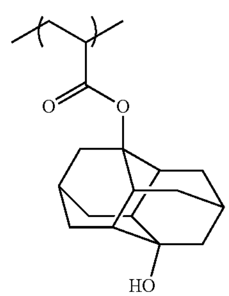

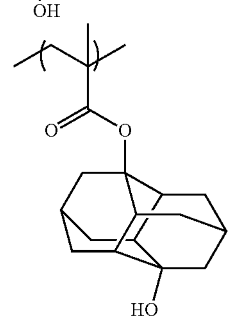

The repeating unit (c) may be a repeating unit having a lactone structure as a polar group.

As the repeating unit having a lactone structure, the repeating unit represented by the following General Formula (AII) is more preferable.

(AII)

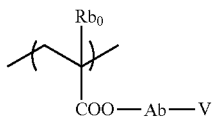

In General Formula (AII), $Rb_0$ represents a hydrogen atom, a halogen atom, or an alkyl group (preferably has 1 to 4 carbon atoms) which may have a substituent.

Preferable examples of the substituent which the alkyl group represented by $Rb_0$ may have include a hydroxyl group and a halogen atom. Examples of the halogen atom represented by $Rb_0$ include a fluorine atom, a chlorine atom, a bromine atom, and an iodine atom. $Rb_0$ is preferably a hydrogen atom, a methyl group, a hydroxymethyl group, or a trifluoromethyl group, and particularly preferably a hydrogen atom or a methyl group.

Ab represents a single bond, an alkylene group, a divalent connecting group having a monocyclic or polycyclic cycloalkyl structure, an ether bond, an ester bond, a carbonyl group, or a divalent connecting group obtained by combining these. Ab is preferably a single bond or a divalent connecting group represented by $-Ab_1-CO_2-$.

$Ab_1$ is a linear or branched alkylene group or a monocyclic or polycycliccy cloalkylene group, and preferably a methylene group, an ethylene group, a cyclohexylene group, an adamantylene group, or a norbornylene group.

V represents a group having a lactone structure.

As the group having a lactone structure, any group can be used as long as the group has a lactone structure, but the group preferably has a 5- to 7-membered ring lactone structure. It is preferable that another ring structure be condensed with the 5- to 7-membered lactone structure while forming a bicyclo structure or a spiro structure. The group more preferably has a repeating unit having a lactone structure represented by any one of the following General Formulas (LC1-1) to (LC1-17). In addition, the lactone structure may be directly bonded to the main structure. A preferable structure is (LC1-1), (LC1-4), (LC1-5), (LC1-6), (LC1-8), (LC1-13), or (LC1-14).

LC1-1

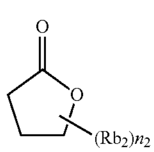

LC1-2

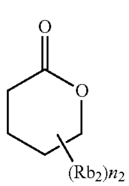

-continued

LC1-3

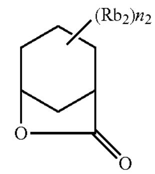

LC1-4

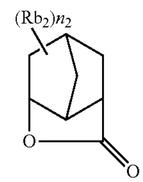

LC1-5

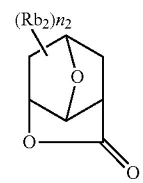

LC1-6

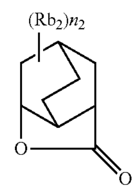

LC1-7

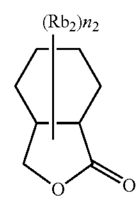

LC1-8

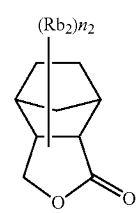

LC1-9

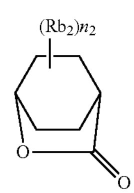

LC1-10

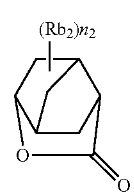

-continued

LC1-11

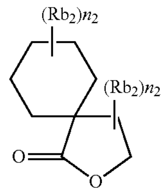

LC1-12

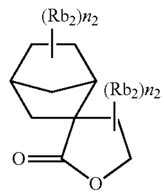

LC1-13

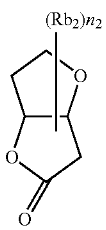

LC1-14

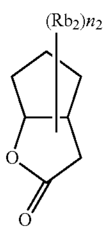

LC1-15

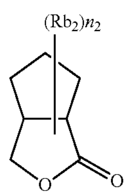

LC1-16

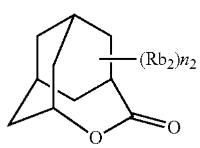

LC1-17

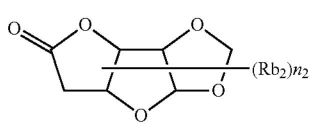

The lactone structure portion may or may not have a substituent ($Rb_2$). Preferable examples of the substituent (Rb) include an alkyl group having 1 to 8 carbon atoms, a monovalent cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. The substituent ($Rb_2$) is more preferably an alkyl group having 1 to 4 carbon atoms, a cyano group, or an acid-decomposable group. $n_2$ represents an integer of 0 to 4. When $n_2$ is 2 or greater, plural substituents ($Rb_2$) present in a molecule may be the same as or different from each other, and plural substituents ($Rb_2$) present in a molecule may be bonded to each other to form a ring.

The repeating unit having a lactone group typically has optical isomers, and any optical isomer may be used. In addition, one type of optical isomer may be used alone, or two or more types of optical isomers may be used in combination. In a case where one type of optical isomer is mainly used, the optical purity (ee) is preferably 90% or greater, and more preferably 95% or greater.

The resin (A) may contain or may not contain a repeating unit having a lactone structure, and in a case where the resin (A) contains the repeating unit having a lactone structure, the content of the repeating unit in the resin (A) is preferably within a range of 1 mol % to 70 mol %, more preferably within a range of 3 mol % to 65 mol %, and still more preferably within a range of 5 mol % to 60 mol %, with respect to the entirety of repeating units.

Specific examples of the repeating unit having a lactone structure in the resin (A) are shown below, but the present invention is not limited thereto. In the formula, Rx represents H, $CH_3$, $CH_2OH$, or $CF_3$.

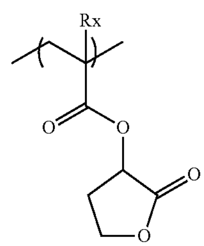

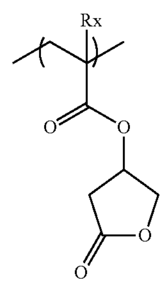

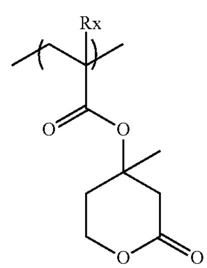

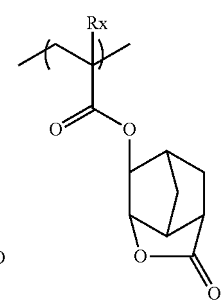

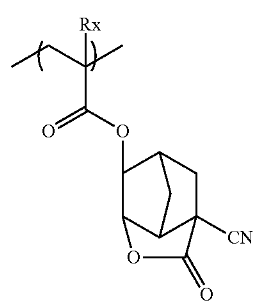

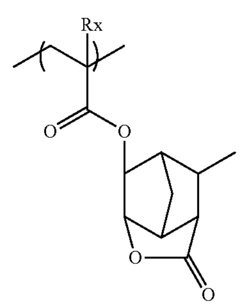

-continued

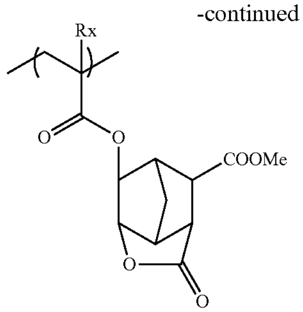

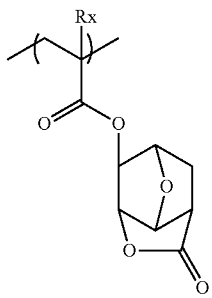

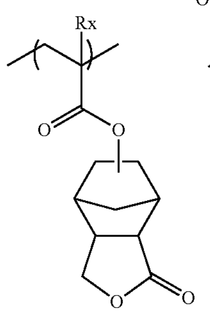

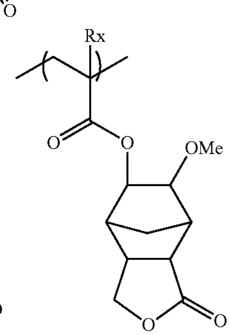

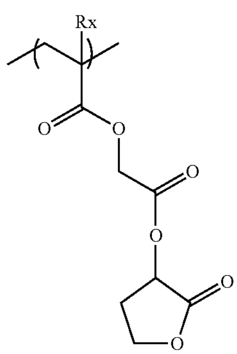

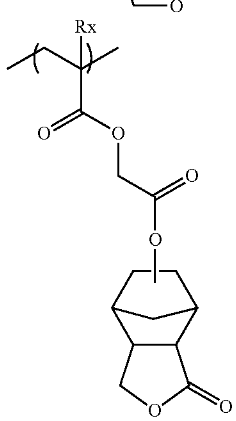

-continued

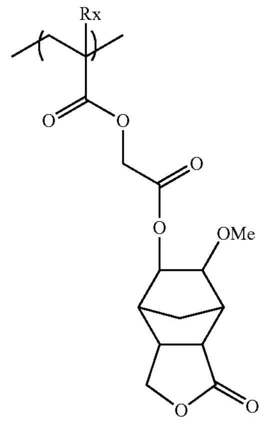

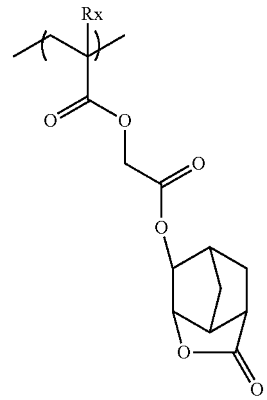

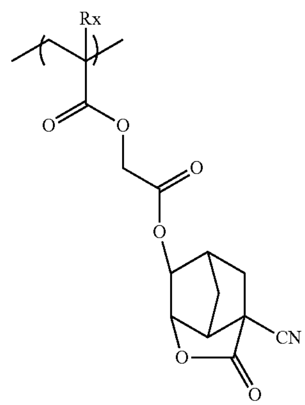

As a sultone group which the resin (A) has, the following General Formula (SL-1) or (SL-2) is preferable. $Rb_2$ and $n_2$ in the formula have the same meaning as those in General Formulas (LC1-1) to (LC1-17), respectively.

SL1-1

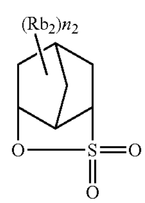

SL1-2

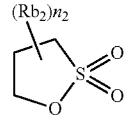

As the repeating unit including a sultone group which the resin (A) has, a repeating unit formed by substituting the lactone group in the repeating unit having an lactone group described above with a sultone group is preferable.

The repeating unit (c) may be a repeating unit having a cyclic carbonic acid ester structure as a polar group.

The repeating unit having a cyclic carbonic acid ester structure is preferably the repeating unit represented by the following General Formula (A-1).

(A-1)

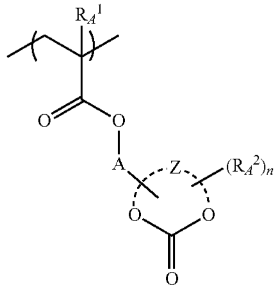

In General Formula (A-1), $R_A^1$ represents a hydrogen atom or an alkyl group.

In a case where $R_A^2$ is 2 or greater, each of $R_A^2$'s independently represents a substituent.

A represents a single bond or a divalent connecting group.

Z represents an atomic group which forms a monocyclic or polycyclic structure together with a group represented by —O—C(═O)—O— in the formula.

n represents an integer of 0 or greater.

General Formula (A-1) will be described in detail.

The alkyl group represented by $R_A^1$ may have a substituent such as a fluorine atom. $R_A^1$ is preferably a hydrogen atom, a methyl group, or a trifluoromethyl group, and more preferably a methyl group.

The substituent represented by $R_A^2$, for example, is an alkyl group, a cycloalkyl group, a hydroxyl group, an alkoxy group, an amino group, or an alkoxycarbonylamino group. As the substituent, an alkyl group having 1 to 5 carbon atoms is preferable, and examples thereof can include a linear alkyl group having 1 to 5 carbon atoms; and a branched alkyl group having 3 to 5 carbon atoms. The alkyl group may have a substituent such as a hydroxyl group.

n is an integer of 0 or greater, which represents the number of substituents. For example, n is preferably 0 to 4, and more preferably 0.

Examples of the divalent connecting group represented by A include an alkylene group, a cycloalkylene group, an ester bond, an amide bond, an ether bond, a urethane bond, a urea bond, and combinations thereof. As the alkylene, an alkylene group having 1 to 10 carbon atoms is preferable, and an alkylene group having 1 to 5 carbon atoms is more preferable.

In an aspect of the present invention, A is preferably a single bond or an alkylene group.

As a monocycle including —OC(═O)—O—, represented by Z, a 5- to 7-membered ring having $n_A$ of 2 to 4, in the cyclic carbonic acid ester represented by the following General Formula (a), is exemplified, and a 5-membered ring or a 6-membered ring ($n_A$=2 or 3) is preferable, and 5-membered ring ($n_A$=2) is more preferable.

As a polycycle including —OC(═O)—O—, represented by Z, a structure in which a fused ring is formed by cyclic carbonic acid ester represented by the following General Formula (a) together with one or two more other ring structures or a structure in which a spiro ring is formed is exemplified. "Other ring structures" capable of forming a fused ring or a spiro ring may be an alicyclic hydrocarbon group, may be an aromatic hydrocarbon group, or may be a heterocycle.

(a)

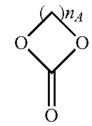

The resin (A) may include one type of repeating units having a cyclic carbonic acid ester structure, or may include two or more types thereof.

In the resin (A), the content of the repeating unit having a cyclic carbonic acid ester structure (preferably, the repeating unit represented by General Formula (A-1)) is preferably 3 mol % to 80 mol %, more preferably from 3 mol % to 60 mol %, particularly preferably 3 mol % to 30 mol %, and most preferably from 10 mol % to 15 mol %, with respect to the entirety of repeating units constituting the resin (A). When the content is within the above range, developability, low defectivity, low LWR, low PEB temperature dependence, and profile, as a resist, can be improved.

Specific examples of the repeating unit represented by General Formula (A-1) will be described below, but the present invention is not limited thereto.

Moreover, $R_A^1$ in the following specific examples has the same meaning as $R_A^1$ in General Formula (A-1).

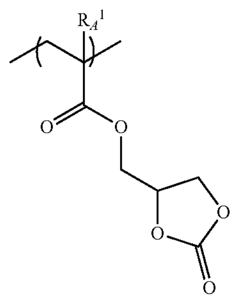

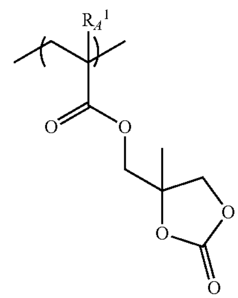

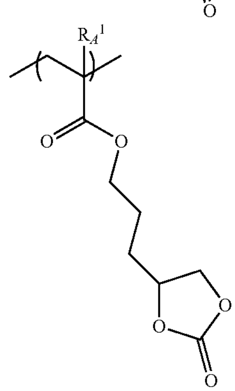

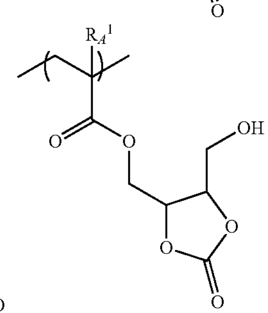

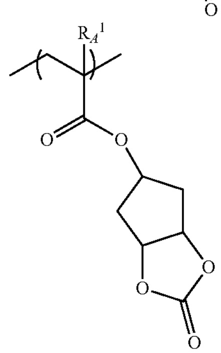

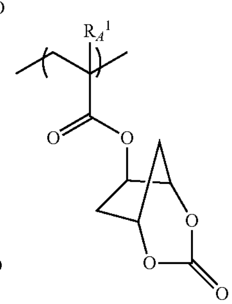

-continued

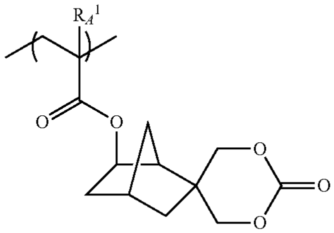

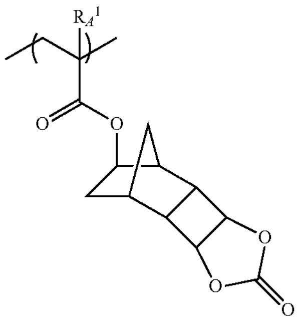

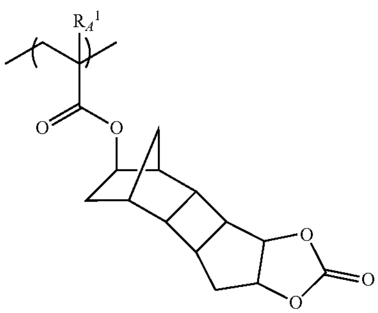

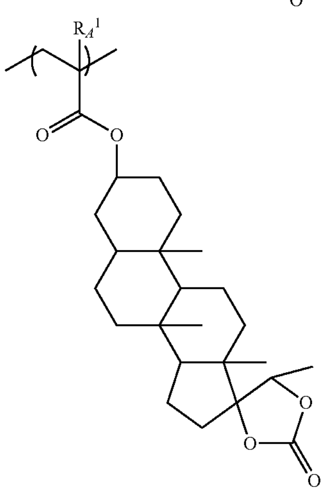

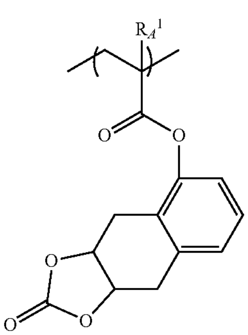

-continued

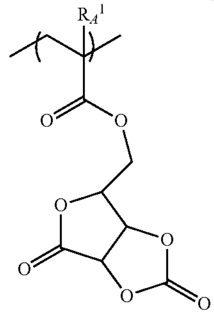

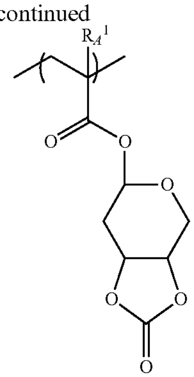

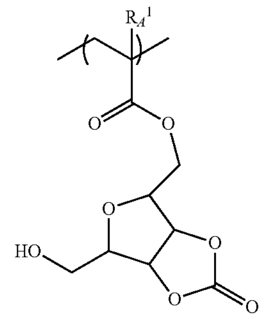

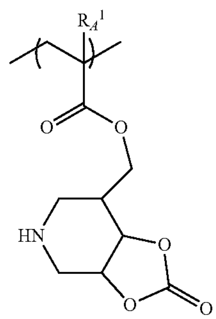

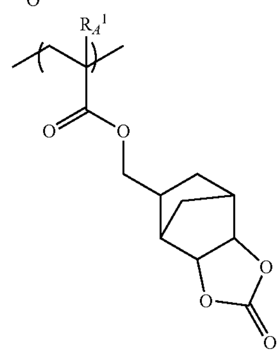

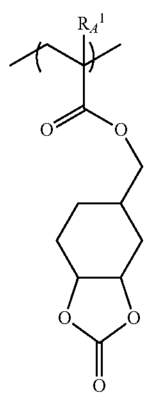

It is also a particularly preferable aspect that a polar group which the repeating unit (c) can have is an acidic group. Preferable examples of the acidic group include a phenolic hydroxyl group, a carboxylic acid group, a sulfonic acid group, a fluorinated alcohol group (for example, a hexafluoroisopropanol group), a sulfonamide group, a sulfonyl imide group, a (alkylsulfonyl)(alkylcarbonyl)methylene group, a (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group. Among these, the repeating unit (c) is more preferably a repeating unit having a carboxyl group. Examples of the repeating unit having an acidic group include a repeating unit of which an acidic group is directly bonded to the main chain of a resin as a repeating unit by acrylic acid or methacrylic acid and a repeating unit of which an acidic group is bonded to the main chain of a resin through a connecting group, and any repeating unit introduced to a terminal of a polymer chain using a polymerization initiator or a chain transfer agent having an acidic group at the time of polymerization is preferable. A repeating unit by acrylic acid or methacrylic acid is particularly preferable.

The acidic group which the repeating unit (c) can have may include or may not include an aromatic ring, and in a case where the acidic group has an aromatic ring, the acidic group is preferably selected from acidic groups other than a phenolic hydroxyl group. In a case where the resin (A) contains a repeating unit having an acidic group, the content of the repeating unit having an acidic group in the resin (A) is typically 1 mol % or greater.

Specific examples of the repeating unit having an acidic group are shown below, but the present invention is not limited thereto.

In the specific examples, Rx represents H, $CH_3$, $CH_2OH$, or $CF_3$.

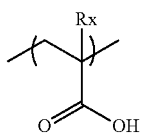

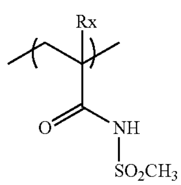

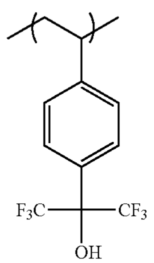

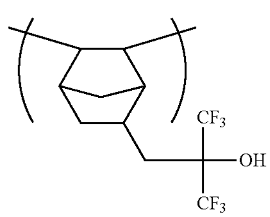

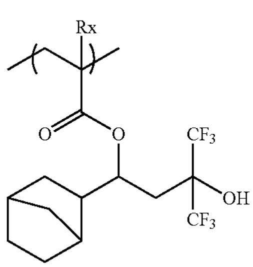

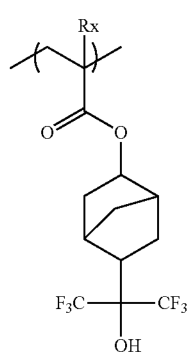

-continued

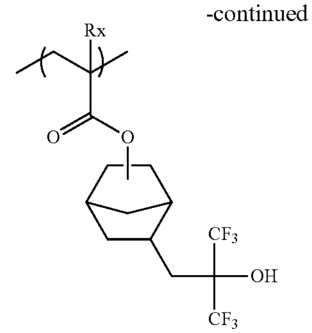

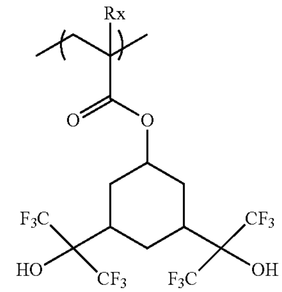

(d) Repeating Unit Having Plurality of Aromatic Rings

The resin (A) may have a repeating unit (d) having a plurality of aromatic rings. Regarding the repeating unit (d) having a plurality of aromatic rings, the description in paragraphs "0194" to "0207" of JP2013-76991A can be referred to, and the contents thereof are incorporated in the present specification.

The resin (A) may contain or may not contain the repeating unit (d), and in a case where the resin (A) contains the repeating unit (d), the content of the repeating unit (d) is preferably within a range of 1 mol % to 30 mol %, more preferably within a range of 1 mol % to 20 mol %, and still more preferably within a range of 1 mol % to 15 mol %, with respect to the entirety of repeating units in the resin (A). The repeating unit (d) included in the resin (A) may be included in combination of two or more types thereof.

The resin (A) in the present invention may suitably have a repeating unit other than the above-described repeating units. One example of such a repeating unit is a repeating unit which has an alicyclic hydrocarbon structure without a polar group (for example, an acid group, a hydroxyl group, or a cyano group described above) and does not exhibit acid-decomposability. Thus, the solubility of a resin is suitably adjusted in development using a developer including an organic solvent. As such a repeating unit, the repeating unit represented by General Formula (IV) is exemplified.

(IV)

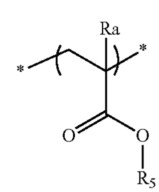

In General Formula (IV), $R_5$ has at least one ring structure, and represents a hydrocarbon group not having a polar group.

Ra represents a hydrogen atom, an alkyl group, or a $CH_2$—O—$Ra_2$ group. In the formula, $Ra_2$ represents a hydrogen atom, an alkyl group, or an acyl group. Ra is preferably a hydrogen atom, a methyl group, a hydroxymethyl group, or a trifluoromethyl group, and particularly preferably a hydrogen atom or a methyl group.

Regarding the respective groups in General Formula (IV), the description in paragraphs "0212" to "0216" of JP2013-76991A can be referred to, and the contents thereof are incorporated in the present specification.

Although the resin (A) may contain or may not contain a repeating unit which has an alicyclic hydrocarbon structure without a polar group and does not exhibit acid-decomposability, in a case where the resin (A) contains the repeating unit, the content of the repeating unit is preferably 1 mol % to 20 mol %, and more preferably 5 mol % to 15 mol %, with respect to the entirety of repeating units in the resin (A).

Specific examples of the repeating unit which has an alicyclic hydrocarbon structure without a polar group and does not exhibit acid-decomposability are shown below, but the present invention is not limited thereto. In the formula, Ra represents H, $CH_3$, $CH_2OH$, or $CF_3$.

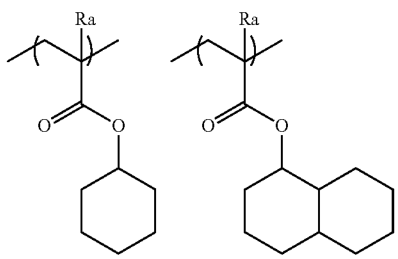

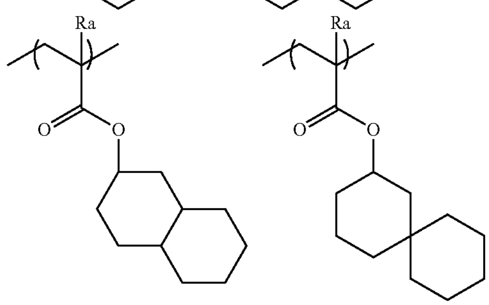

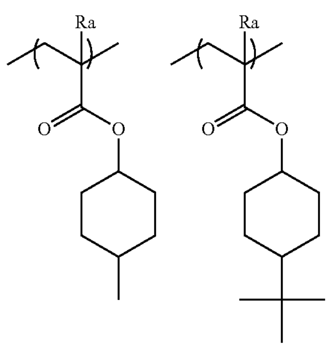

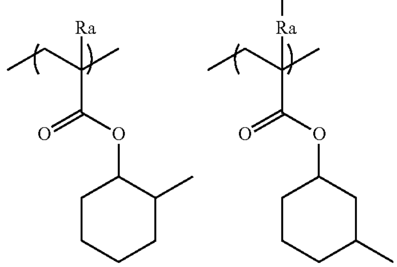

-continued

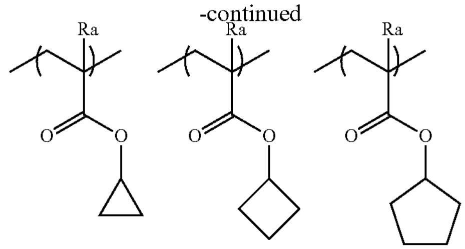

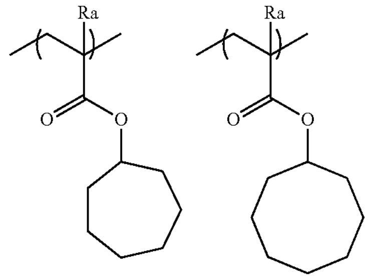

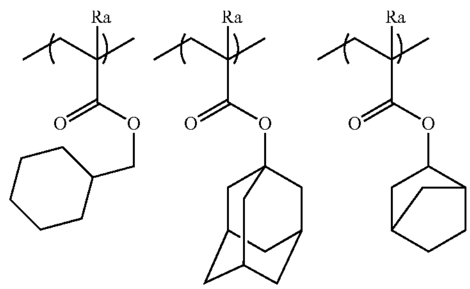

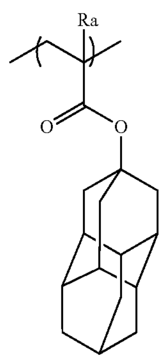

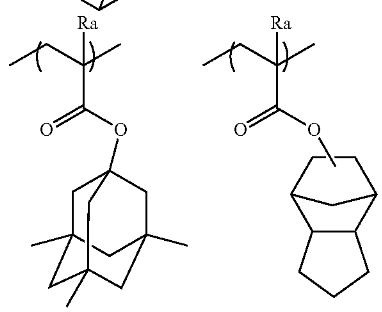

In addition, the resin (A) may include the following repeating units in consideration of rise of Tg, improvement of dry etching resistance, and effect of an internal filter with respect to the out of band light described above.

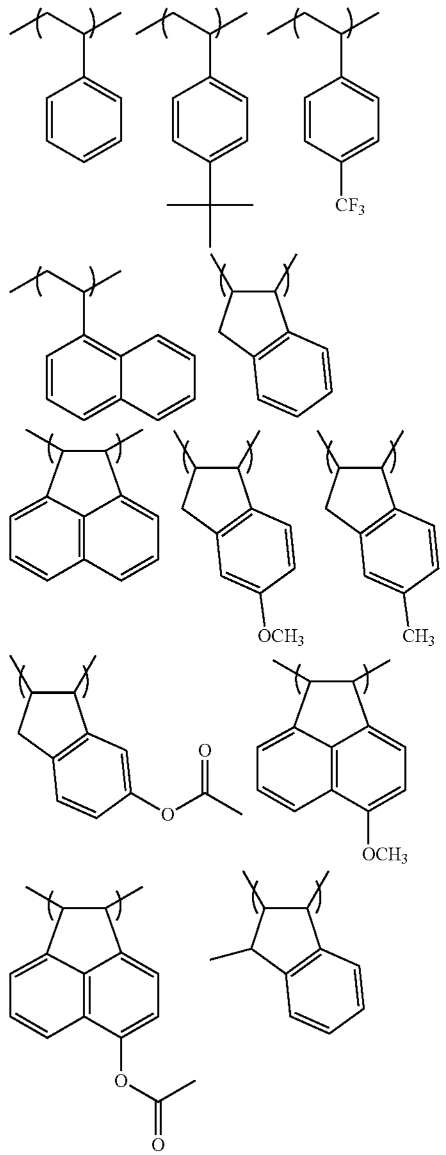

The resin (A) may further include a repeating unit represented by the following General Formula (P).

(P)

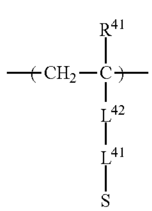

$R^{41}$ represents a hydrogen atom or a methyl group. $L^{41}$ represents a single bond or a divalent connecting group. $L^{42}$ represents a divalent connecting group. S represents a structural portion that generates an acid on a side chain by being degraded by irradiation with an electron beam or extreme ultraviolet rays.

Specific examples of the repeating unit represented by General Formula (P) will be described below, but the present invention is not limited thereto. Regarding specific examples of the repeating unit represented by General Formula (P), the description in paragraphs "0168" to "0210" of JP2013-80002A and "0191" to "0203" of JP2013-137537A can be referred to, and the contents thereof are incorporated in the present specification.

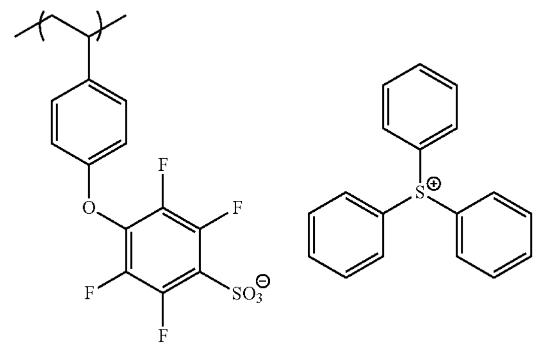

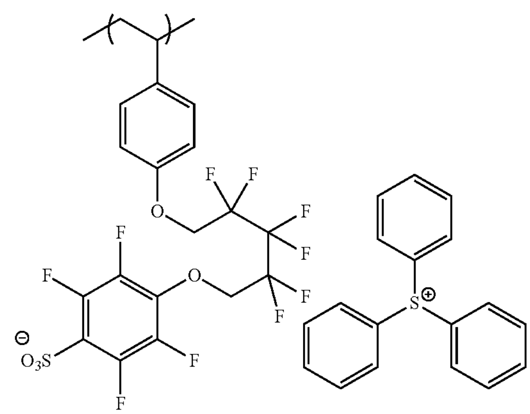

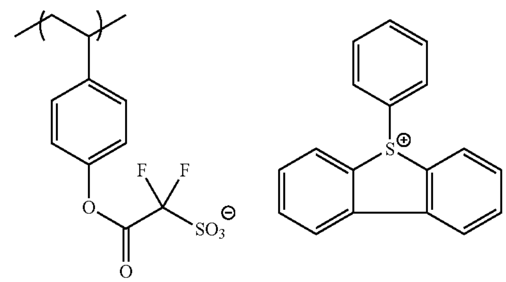

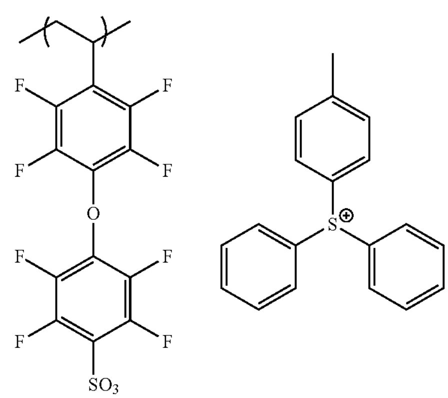

-continued
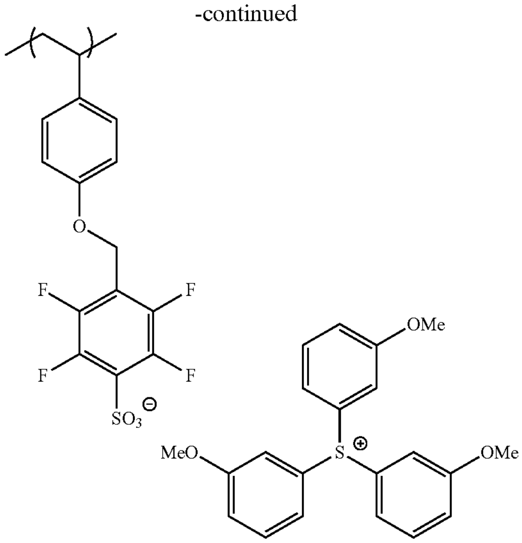
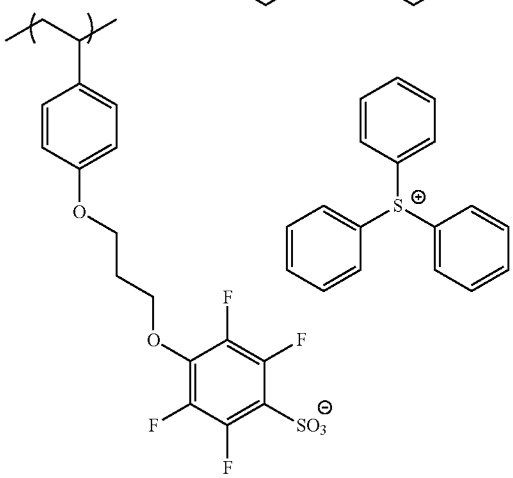
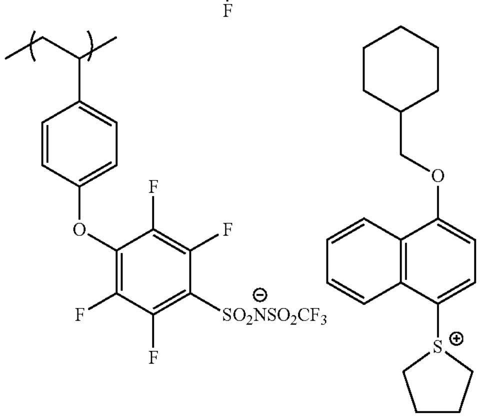
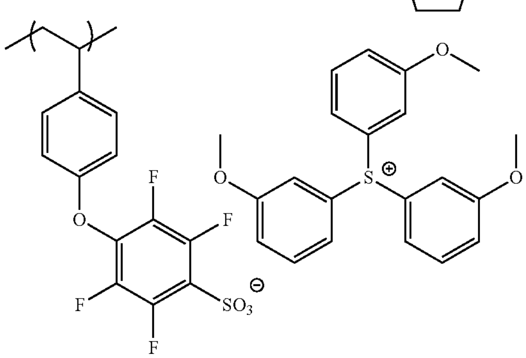
-continued
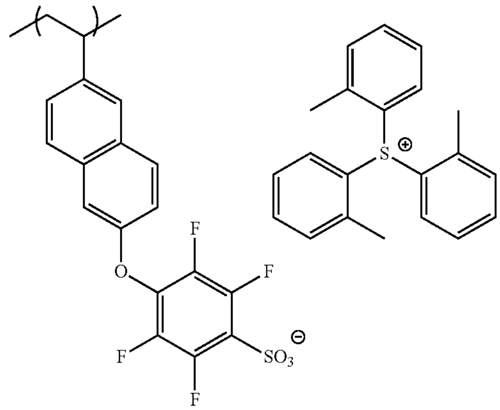
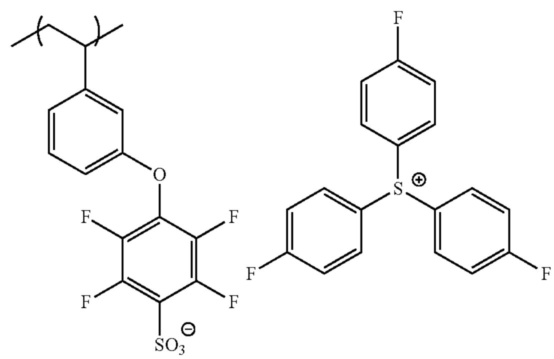
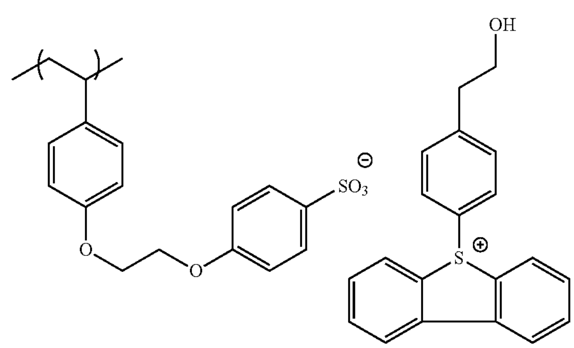
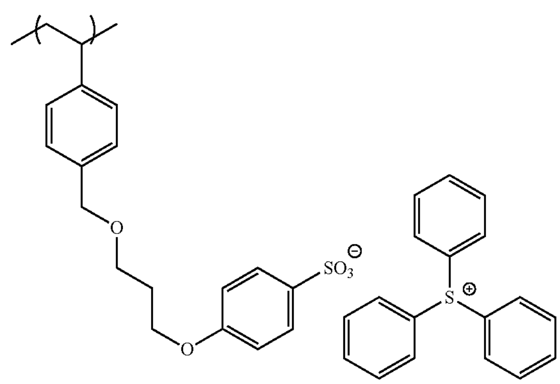

-continued
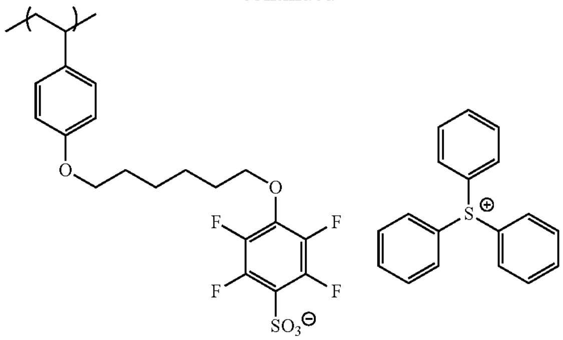
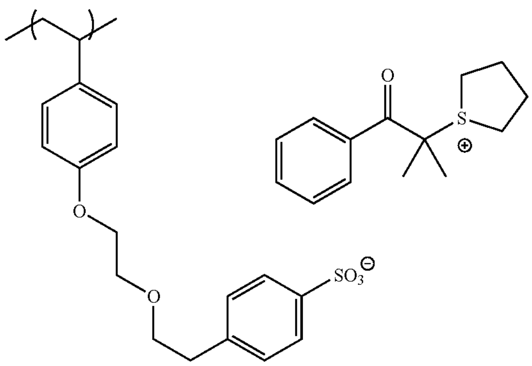
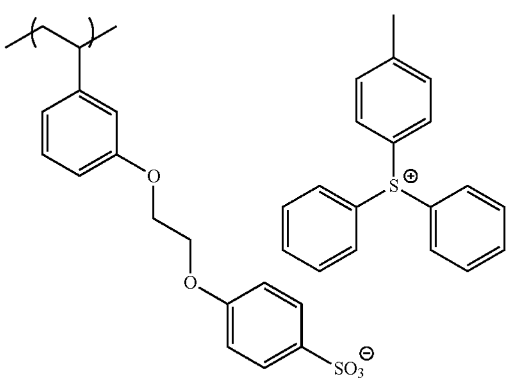
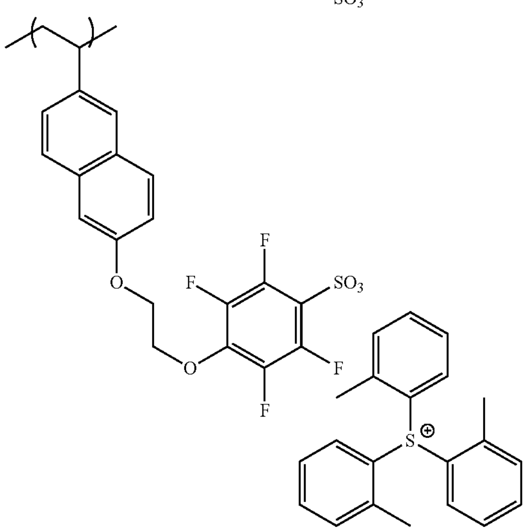
-continued
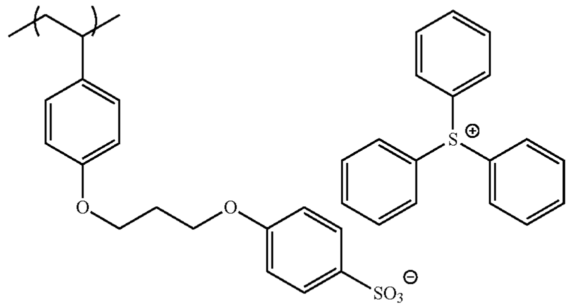
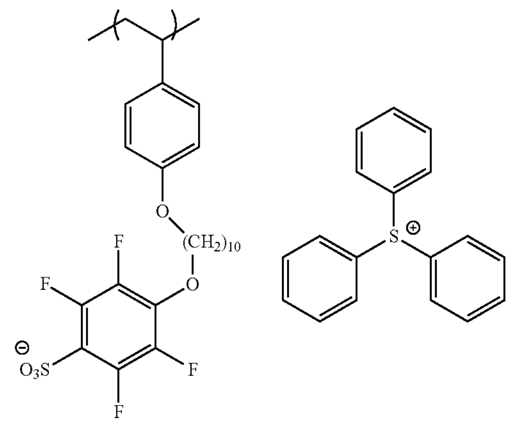
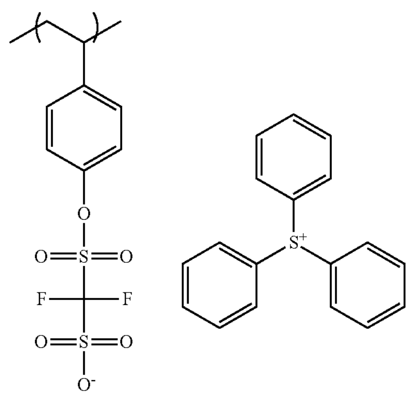
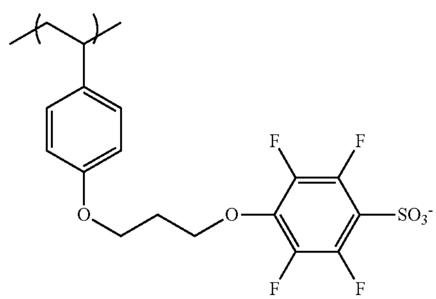
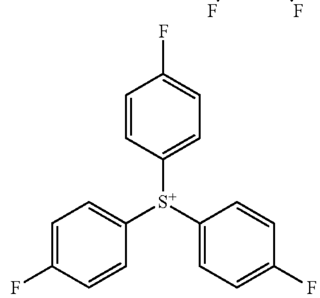

-continued

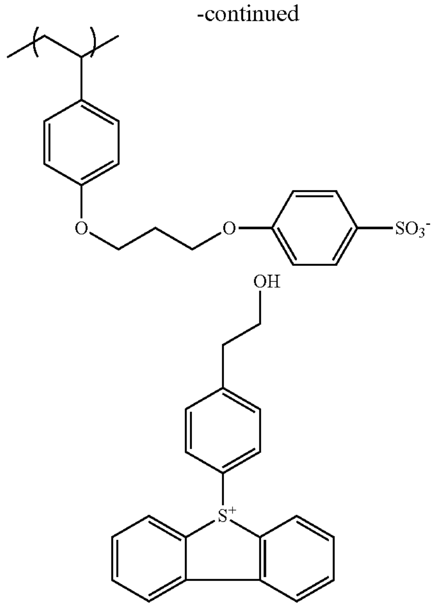

The content of the repeating unit represented by General Formula (P) in the resin (A) is preferably within a range of 1 mol % to 40 mol %, more preferably within a range of 2 mol % to 30 mol %, and particularly preferably within a range of 5 mol % to 25 mol %, with respect to the entirety of repeating units in the resin (A).

In the resin (A) used in the composition of the present invention, the content molar ratio of respective repeating structural units is suitably set to adjust dry etching resistance or standard developer suitability of a resist, adhesion to substrate, a resist profile, and resolving power, heat resistance, and sensitivity which are properties generally required for a resist.

The form of the resin (A) of the present invention may be any form of a random form, a block form, a comb form, and a star form.

The resin (A) can be synthesized by, for example, polymerizing an unsaturated monomer corresponding to each structure through radical polymerization, cationic polymerization, or anionic polymerization. In addition, by performing a polymer reaction after polymerization is performed using an unsaturated monomer corresponding to a precursor of each structure, a target resin can also be obtained.

Examples of a general synthetic method include a collective polymerization method of performing polymerization by dissolving an unsaturated monomer and a polymerization initiator in a solvent and heating the resultant product and a dropping polymerization method of adding a solution containing an unsaturated monomer and an polymerization initiator dropwise to a heated solvent over a period of 1 hour to 10 hours, and the dropping polymerization method is preferable.

Examples of the solvent used in the polymerization can include solvents which can be used in preparing an active light-sensitive or radiation-sensitive resin composition described below, and it is more preferable that the polymerization is performed using the same solvent as the solvent (D) used in the composition of the present invention. Thus, generation of particles during storage can be suppressed.

The polymerization reaction is preferably performed in an inert gas atmosphere such as nitrogen or argon. The polymerization is initiated using a commercially available radical initiator as a polymerization initiator (azo-based initiator, peroxide, or the like). As the radical initiator, an azo-based initiator is preferable, and an azo-based initiator having an ester group, a cyano group, or a carboxyl group is preferable. Preferable examples of the initiator include azobisisobutyronitrile, azobisdimethylvaleronitrile, and dimethyl 2,2'-azobis(2-methylpropionate). As necessary, polymerization may be performed in the presence of a chain transfer agent (for example, alkyl mercaptan).

The concentration of the reaction is 5% by mass to 70% by mass, and preferably 10% by mass to 50% by mass. The reaction temperature is typically 10° C. to 150° C., preferably 30° C. to 120° C., and more preferably 40° C. to 100° C.

The reaction time is typically 1 hour to 48 hours, preferably 1 hour to 24 hours, and more preferably 1 hour to 12 hours.

After the reaction ends, cooling is performed to room temperature, and purification is performed. A usual method such as a liquid-liquid extraction method in which a residual monomer or an oligomer component is removed by washing with water or combining suitable solvents, a purification method in a solution state such as ultrafiltration which extracts and removes only substances having a specific molecular weight or less, a reprecipitation method in which a residual monomer or the like is removed by adding a resin solution dropwise to a poor solvent to coagulate the resin in the poor solvent, or a purification method in a solid state in which filtered resin slurry is washed with a poor solvent can be applied to the purification. For example, by bringing into contact with a solvent (poor solvent), which does poorly dissolve or does not dissolve the resin, corresponding to 10 times or less the volume amount of the reaction solution, or preferably 5 times to 10 times the volume amount of the reaction solution, the resin is solidified and precipitated.

The solvent (precipitation or reprecipitation solvent) used in precipitation or reprecipitation operation from the polymer solution may be a poor solvent for the polymer, and depending on the type of polymer, the solvent can be suitably selected from hydrocarbon, halogenated hydrocarbon, a nitro compound, ether, ketone, ester, carbonate, alcohol, carboxylic acid, water, and a mixed solvent including these solvents and used. Among these, as a precipitation or reprecipitation solvent, a solvent including at least alcohol (in particular, methanol) or water is preferable.

Although the amount of precipitation or reprecipitation solvent used can be suitably selected in consideration of efficiency or yield, the amount used is generally 100 parts by mass to 10000 parts by mass, preferably 200 parts by mass to 2000 parts by mass, and more preferably 300 parts by mass to 1000 parts by mass, with respect to 100 parts by mass of the polymer solution.

Although the temperature at the time of precipitation or reprecipitation can be suitably selected in consideration of efficiency or operability, the temperature is typically about 0° C. to 50° C., and preferably around room temperature (for example, about 20° C. to 35° C.). Precipitation or reprecipitation operation can be performed by a known method such as a batch type or a continuous type using a generally used mixing vessel such as a stirring vessel.

The precipitated or reprecipitated polymer is typically subjected to generally used solid-liquid separation such as filtration or centrifugation, dried, and then, provided for use. The filtration is preferably performed under pressure using a solvent-resistant filter medium. The drying is performed at a temperature of about 30° C. to 100° C. at normal pressure or under reduced pressure (preferably, under reduced pressure), and preferably at a temperature of about 30° C. to 50° C.

Moreover, once the resin is precipitated, and after being separated, the resin is again dissolved in a solvent, and may be brought into contact with a solvent which does poorly dissolve or does not dissolve the resin. That is, a method which includes a step of precipitating a resin by bringing into contact with a poorly soluble or insoluble solvent which does not dissolve the polymer after the radical polymerization reaction ends (step a), a step of separating the resin from the solution (step b), a step of preparing a resin solution (A) by dissolving the resin in a solvent (step c), thereafter, by bringing the resin solution A into contact with a solvent in which the resin is poorly soluble or insoluble, corresponding to 10 times or less the volume amount (preferably 5 times or less the volume amount) of the resin solution A, the resin solid is precipitated (step d), and a step of separating the precipitated resin (step e) may be performed.

The polymerization reaction is preferably performed in an inert gas atmosphere such as nitrogen or argon. The polymerization is initiated using a commercially available radical initiator as a polymerization initiator (azo-based initiator, peroxide, or the like). As the radical initiator, an azo-based initiator is preferable, and an azo-based initiator having an ester group, a cyano group, or a carboxyl group is preferable. Preferable examples of the initiator include azobisisobutyronitrile, azobisdimethylvaleronitrile, and dimethyl 2,2'-azobis(2-methylpropionate). As necessary, an initiator is additionally added or added by being divided, and after the reaction ends, the reaction product is put into a solvent, and a target polymer is recovered by a powder recovery method or a solid recovery method. The concentration of the reaction is 5% by mass to 50% by mass, and preferably 10% by mass to 30% by mass. The reaction temperature is typically 10° C. to 150° C., preferably 30° C. to 120° C., and more preferably 60° C. to 100° C.

Although the molecular weight of the resin (A) according to the present invention is not particularly limited, the weight average molecular weight is preferably within a range of 1000 to 100000, more preferably within a range of 1500 to 60000, and particularly preferably within a range of 2000 to 30000, in terms of polystyrene measured by a GPC method. When the weight average molecular weight is within a range of 1000 to 100000, degradation of heat resistance or dry etching resistance can be prevented, and degradation of developability or degradation of film-forming properties due to increase in viscosity can be prevented.

The dispersity (Mw/Mn) is preferably 1.00 to 5.00, more preferably 1.00 to 3.50, and still more preferably 1.00 to 2.50. As the molecular weight distribution is lower, the resolution and the resist shape become better, and the side wall of the resist pattern becomes smoother, and thus, the roughness becomes excellent.

In the present specification, the weight average molecular weight (Mw) and dispersity of a resin can be determined by using, for example, HPL-8120 (manufactured by TOSOH CORPORATION), TSK gel Multipore HXL-M (manufactured by TOSOH CORPORATION, 7.8 mmHD×30.0 cm) as a column, and THF (tetrahydrofuran) or NMP (N-methyl-2-pyrrolidone) as an eluent.

The resin (A) can be used alone, or two or more types thereof can be used in combination. The content of the resin (A) is preferably 20% by mass to 99% by mass, more preferably 30% by mass to 99% by mass, and still more preferably 40% by mass to 99% by mass, based on the total solid content in the active light-sensitive or radiation-sensitive resin composition.

(C) Crosslinking Agent

The active light-sensitive or radiation-sensitive resin composition may further contain a compound (hereinafter, refer to as a crosslinking agent) crosslinking the resin (A) by the action of an acid. Here, a known crosslinking agent can be effectively used.

The crosslinking agent (C), for example, is a compound having a cross-linking group which can crosslink the resin (A), examples of the cross-linking group including a hydroxymethyl group, an alkoxymethyl group, an acyloxymethyl group, an alkoxymethyl ether group, an oxirane ring, and an oxetane ring.

The cross-linking group is preferably a hydroxymethyl group, an alkoxymethyl group, an oxirane ring, or an oxetane ring.

The crosslinking agent (C) is preferably a compound (which also includes a resin) having two or more cross-linking groups.

The crosslinking agent (C) is more preferably a phenol derivative, a urea-based compound, or a melamine-based compound, having a hydroxymethyl group or an alkoxymethyl group.

Regarding the crosslinking agent (C), the description in paragraphs "0072" to "0110" of JP2010-256858A and "0111" to "0114" of JP2012-252080A can be referred to, and the contents thereof are incorporated in the present specification.

In the present invention, the crosslinking agent (C) may be used alone, or two or more kinds thereof may be used in combination.

The active light-sensitive or radiation-sensitive resin composition may contain or may not contain the crosslinking agent (C), and in the case of being contained, the content of the crosslinking agent (C) is preferably 3% by mass to 65% by mass, more preferably 5% by mass to 50% by mass, and still more preferably 10% by mass to 45% by mass, with respect to the total solid content in the composition, from the viewpoint that reduction of the residual film ratio and the resolving power is prevented, and stability of the resist liquid during storage is favorably maintained.

(B) Compound that Generates Acid by Active Light or Radiation

The composition of the present invention preferably contains a compound (B) that generates an acid by active light or radiation (hereinafter, referred to as an "acid generator").

The compound (B) that generates an acid by irradiation with active light or radiation may have a form of a low molecular weight compound, or may have a form in which the compound (B) is incorporated into a part of a polymer. In addition, a form of a low molecular weight compound and a form in which the compound (B) is incorporated into a part of a polymer may be used in combination.

In a case where the compound (B) that generates an acid by irradiation with active light or radiation has a form of a low molecular weight compound, the molecular weight of the compound (B) is preferably 3000 or less, more preferably 2000 or less, and still more preferably 1000 or less.

In a case where the compound (B) that generates an acid by irradiation with active light or radiation has a form in which the compound (B) is incorporated into a part of a polymer, the compound (B) may be incorporated into a part of the resin (A), or may be incorporated into a resin different from the resin (A).

Although the acid generator (B) is not particularly limited as long as it is a known acid generator, the acid generator is preferably a compound which generates an organic acid, for example, at least any one of sulfonic acid, bis(alkylsulfonyl) imide, and tris(alkylsulfonyl)methide by irradiation with active light or radiation, preferably an electron beam or extreme ultraviolet rays.

More preferably, the compounds represented by the following General Formula (ZI), (ZII), and (ZIII) can be exemplified.

(ZI)

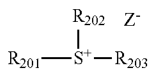

(ZII)

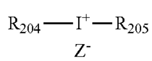

(ZIII)

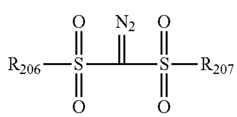

In General Formula (ZI), each of $R_{201}$, $R_{202}$, and $R_{203}$ independently represents an organic group.

The organic group represented by $R_{201}$, $R_{202}$, and $R_{203}$ generally has 1 to 30 carbon atoms, and preferably has 1 to 20 carbon atoms.

Two of $R_{201}$ to $R_{203}$ may be bonded to each other to form a ring structure, and an oxygen atom, a sulfur atom, an ester bond, an amide bond, or a carbonyl group may be included in the ring. Examples of the group that two of $R_{201}$ to $R_{203}$ form by bonding to each other include an alkylene group (for example, a butylene group, and a pentylene group).

$Z^-$ represents a non-nucleophilic anion (anion which is significantly low in ability causing a nucleophilic reaction).

Examples of the non-nucleophilic anion include a sulfonate anion (an aliphatic sulfonate anion, an aromatic sulfonate anion, or a camphorsulfonate anion), a carboxylate anion (an aliphatic carboxylate anion, an aromatic carboxylate anion, or an aralkylcarboxylate anion), a sulfonylimide anion, a bis(alkylsulfonyl)imide anion, and a tris(alkylsulfonyl)methide anion.

Regarding the aliphatic portion in the aliphatic sulfonate anion and the aliphatic carboxylate anion, and the aromatic group in the aromatic sulfonate anion and the aromatic carboxylate anion, the description in paragraphs "0234" to "0235" of JP2013-76991A can be referred to, and the contents thereof are incorporated in the present specification.

The alkyl group, the cycloalkyl group, the aryl group described above may have a substituent. Regarding the specific examples, the description in paragraph "0236" of JP2013-76991A can be referred to, and the contents thereof are incorporated in the present specification.

Regarding aralkyl carboxylate anion, sulfonylimide anion, bis(alkylsulfonyl)imide anion, and tris(alkylsulfonyl) methide anion, the description in paragraphs "0237" to "0239" of JP2013-76991A can be referred to, and the contents thereof are incorporated in the present specification.

Regarding other non-nucleophilic anions, the description in paragraph "0240" of JP2013-76991A can be referred to, and the contents thereof are incorporated in the present specification.

As the non-nucleophilic anion, an aliphatic sulfonate anion in which at least α-position of sulfonic acid is substituted with a fluorine atom, an aromatic sulfonate anion substituted with a fluorine atom or a group having a fluorine atom, a bis(alkylsulfonyl)imide anion in which the alkyl group is substituted with a fluorine atom, or a tris(alkylsulfonyl)methide anion in which the alkyl group is substituted with a fluorine atom is preferable. The non-nucleophilic anion is more preferably a perfluoro aliphatic sulfonate anion (which more preferably has 4 to 8 carbon atoms) or a benzenesulfonate anion having a fluorine atom, and still more preferably a nonafluorobutanesulfonate anion, a perfluorooctanesulfonate anion, a pentafluorobenzenesulfonate anion, or a 3,5-bis(trifluoromethyl)benzenesulfonate anion.

From the viewpoint of acid strength, the pKa of the generated acid is preferably −1 or less for sensitivity enhancement.

In addition, as the non-nucleophilic anion, the anion represented by the following General Formula (AN1) is also exemplified as a preferable aspect.

(AN1)

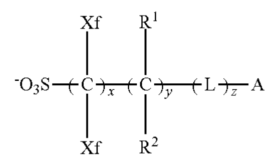

In the formula, each of Xf's independently represents a fluorine atom or an alkyl group substituted with at least one fluorine atom.

Each of $R^1$ and $R^2$ independently represents a hydrogen atom, a fluorine atom, or an alkyl group, and in a case where a plurality of $R^1$'s and $R^2$'s are present, $R^1$'s and $R^2$'s may be the same as or different from each other.

L represents a divalent connecting group, and in a case where a plurality of L's are present, L's may be the same as or different from each other.

A represents a cyclic organic group.

x represents an integer of 1 to 20, y represents an integer of 0 to 10, and z represents an integer of 0 to 10.

General Formula (AN1) will be described in more detail.

The alkyl group in the alkyl group substituted with a fluorine atom represented by Xf preferably has 1 to 10 carbon atoms, and more preferably 1 to 4 carbon atoms. In addition, the alkyl group substituted with a fluorine atom represented by Xf is preferably a perfluoroalkyl group.

Xf is preferably a fluorine atom or a perfluoroalkyl group having 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, a fluorine atom or $CF_3$ is preferable. In particular, both of Xf's are preferably fluorine atoms.

The alkyl group represented by $R^1$ or $R^2$ may have a substituent (preferably a fluorine atom), and the alkyl group is preferably an alkyl group having 1 to 4 carbon atoms, and more preferably a perfluoroalkyl group having 1 to 4 carbon atoms. Specific examples of the alkyl group having a substituent, represented by $R^1$ or $R^2$, include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferable.

Each of $R^1$ and $R^2$ is preferably a fluorine atom or $CF_3$.

x is preferably 1 to 10, and more preferably 1 to 5.

y is preferably 0 to 4, and more preferably 0.

z is preferably 0 to 5, and more preferably 0 to 3.

The divalent connecting group represented by L is not particularly limited, and examples thereof can include —COO—, —OCO—, —CO—, —O—, —S—, —SO—, —$SO_2$—, an alkylene group, a cycloalkylene group, an alkenylene group, and a connecting group obtained by connecting a plurality of these, and a connecting group having 12 or less total carbon atoms is preferable. Among these, —COO—, —OCO—, —CO—, or —O— is preferable, and —COO— or —OCO— is more preferable.

The cyclic organic group represented by A is not particularly limited as long as it has a ring structure, and examples thereof include an alicyclic group, an aryl group, and a heterocyclic group (which includes not only a heterocyclic group having aromaticity but also a heterocyclic group having no aromaticity).

The alicyclic group may be monocyclic or polycyclic, and as the alicyclic group, a monocyclic cycloalkyl group such as a cyclopentyl group, a cyclohexyl group, or a cyclooctyl group, or polycyclic cycloalkyl groups such as a norbornyl group, a tricyclodecanyl group, a tetracyclodecanyl group, a tetracyclododecanyl group, or an adamantyl group is preferable. Among these, an alicyclic group with a bulky structure having 7 or greater carbon atoms such as a norbornyl group, a tricyclodecanyl group, a tetracyclodecanyl group, a tetracyclododecanyl group, or an adamantyl group is preferable from the viewpoint of being capable of suppressing in-film diffusibility in a heating step after exposure and MEEF improvement.

Examples of the aryl group include a benzene ring, a naphthalene ring, a phenanthrene ring, and an anthracene ring.

Examples of the heterocyclic group include groups derived from a furan ring, a thiophene ring, a benzofuran ring, a benzothiophene ring, a dibenzofuran ring, a dibenzothiophene ring, and a pyridine ring. Among these, a group derived from a furan ring, a thiophene ring, or a pyridine ring is preferable.

In addition, as the cyclic organic group, a lactone structure can also be exemplified, and specific examples thereof can include the lactone structures represented by General Formulas (LC1-1) to (LC1-17), which the resin (A) may have.

The above-describedcyclic organic group may has a substituent, and regarding the substituent, the description in paragraph "0251" of JP2013-76991A can be referred to, and the contents thereof are incorporated in the present specification.

Examples of the organic group represented by $R_{201}$, $R_{202}$, or $R_{203}$ include an aryl group, an alkyl group, and a cycloalkyl group.

Preferably, at least one of $R_{201}$, $R_{202}$, and $R_{203}$ is an aryl group, and more preferably, all of three are aryl groups. Regarding the aryl group, the alkyl group, and the cycloalkyl group, the description in paragraph "0252" of JP2013-76991A can be referred to, and the contents thereof are incorporated in the present specification.

Regarding the structure represented by General Formula (A1) in a case where two of $R_{201}$ to $R_{203}$ are bonded to each other to form a ring structure, the description in paragraphs "0253" to "0257" of JP2013-76991A can be referred to, and the contents thereof are incorporated in the present specification.

Moreover, when at least one of $R_{201}$, $R_{202}$, and $R_{203}$ is not an aryl group, examples of a preferable structure can include cationic structures of compounds exemplified in paragraphs "0046" to "0048" of JP2004-233661A, paragraphs "0040" to "0046" of JP2003-35948A, and exemplified as Formulas (I-1) to (I-70) in the specification of US2003/0224288A, and compounds exemplified as Formulas (IA-1) to (IA-54), and Formulas (IB-1) to (IB-24) in the specification of US2003/0077540A1.

In General Formulas (ZII) and (ZIII), each of $R_{204}$ to $R_{207}$ independently represents an aryl group, an alkyl group, or a cycloalkyl group.

The aryl group, the alkyl group, and the cycloalkyl group represented by each of $R_{204}$ to $R_{207}$ are the same as the aryl group described as the aryl group, the alkyl group, and the cycloalkyl group represented by each of $R_{201}$ to $R_{203}$ in the compound (ZI).

The aryl group, the alkyl group, and the cycloalkyl group represented by each of $R_{204}$ to $R_{207}$ may have a substituent. Examples of the substituent include the substituents that the aryl group, the alkyl group, and the cycloalkyl group represented by each of $R^{201}$ to $R_{203}$ in the compound (ZI) may have.

$Z^-$ represents a non-nucleophilic anion, and as $Z^-$, the same as the non-nucleophilic anion in General Formula (ZI) can be exemplified.

As the acid generator, the compounds represented by General Formula (ZIV), (ZV), or (ZVI) described in paragraphs "0262" to "0264" of JP2013-76991A are also exemplified.

Particularly preferable examples of the acid generator are shown below.

(z1)

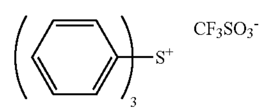

(z2)

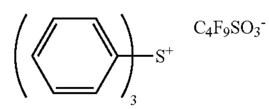

(z3)

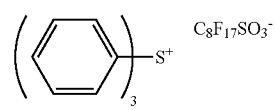

(z4)

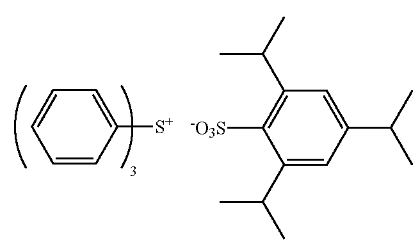

(z5)

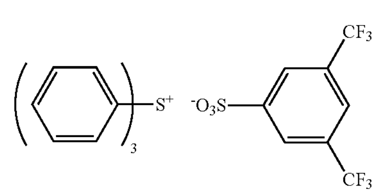

-continued
(z6)
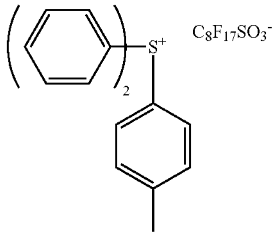
(z7)
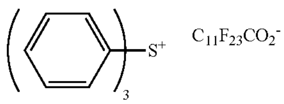
(z8)
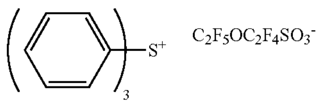
(z9)
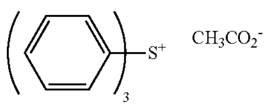
(z10)
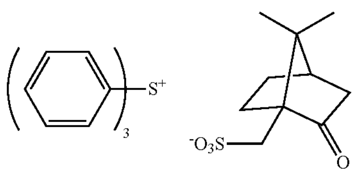
(z11)
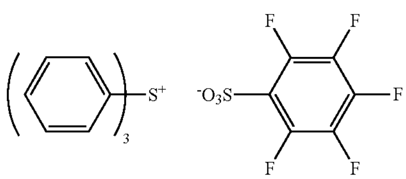
(z12)
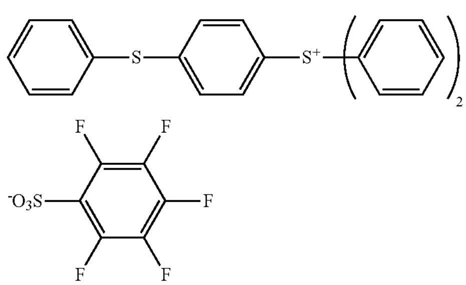
(z13)
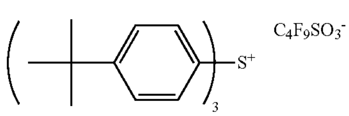
(z14)
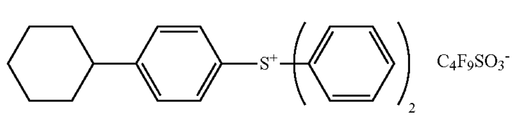
(z15)
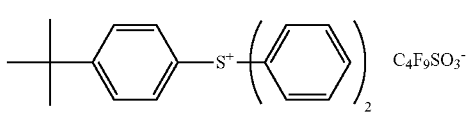
-continued
(z16)
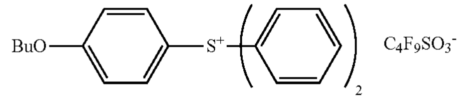
(z17)
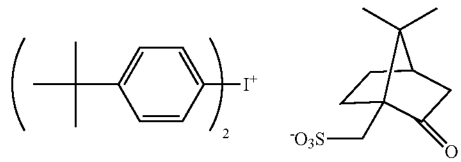
(z18)
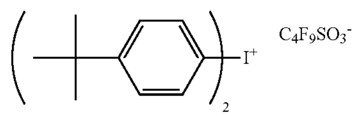
(z19)
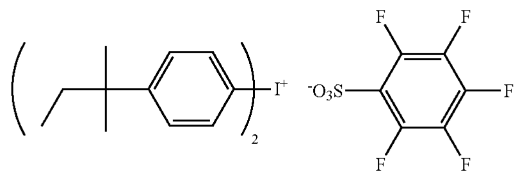
(z20)
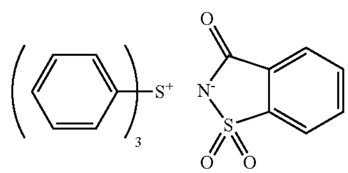
(z21)
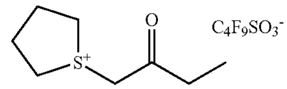
(z22)
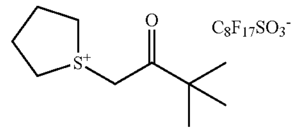
(z23)
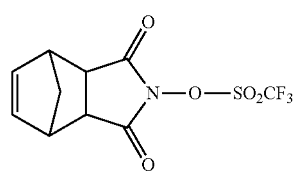
(z24)
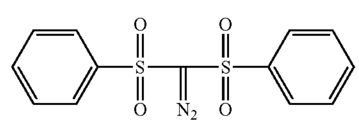
(z25)
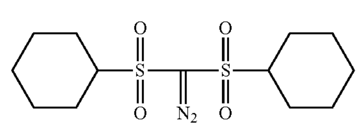
(z26)
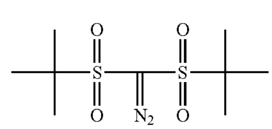

-continued
(z27)
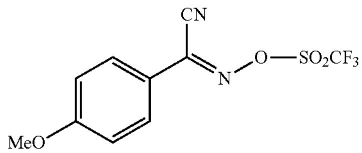
(z28)
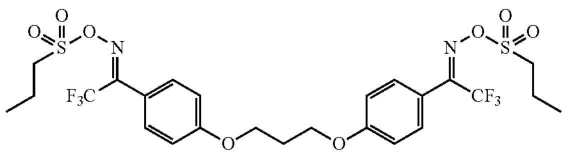
(z29)
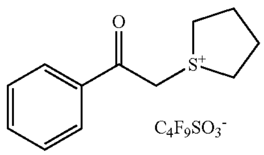
(z30)
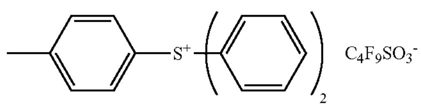
(z31)
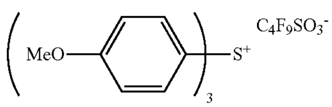
(z32)
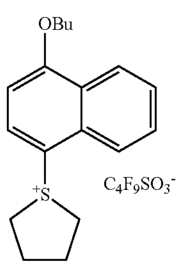
(z33)
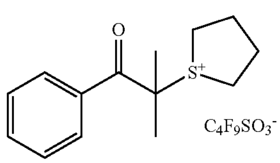
(z34)
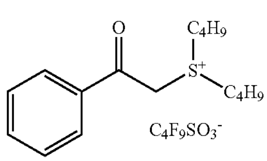
(z35)
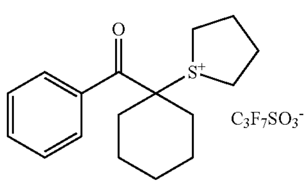
-continued
(z36)
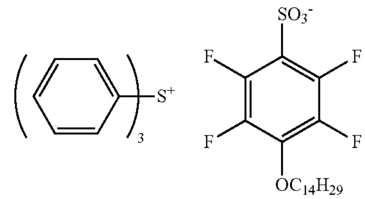
(z37)
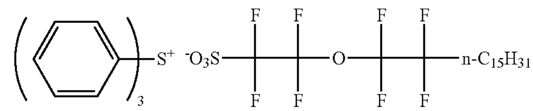
(z38)
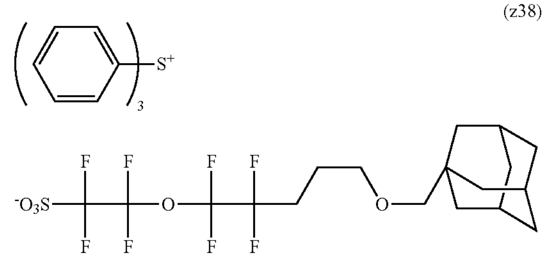
(z39)
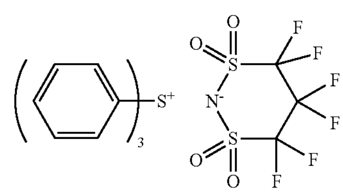
(z40)
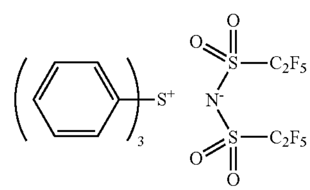
(z41)
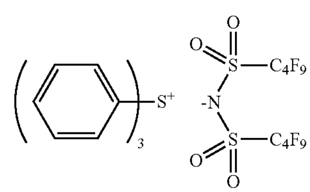
(z42)
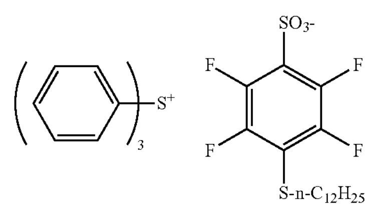
(z43)
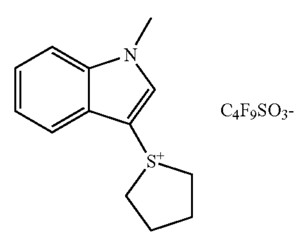

-continued
(z44)
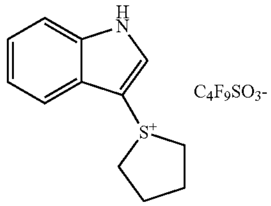
(z45)
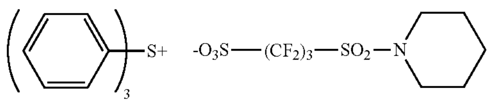
(z46)
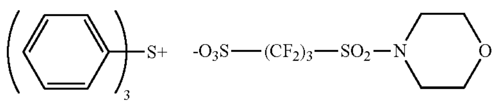
(z47)
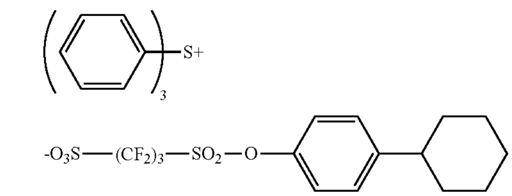
(z48)
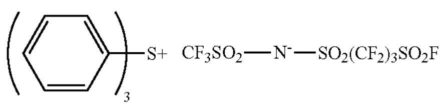
(z49)
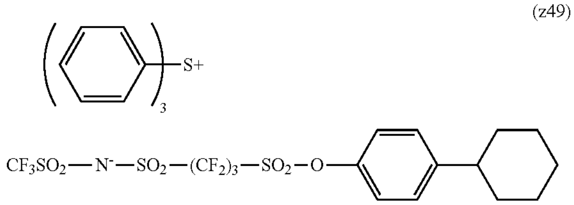
(z50)
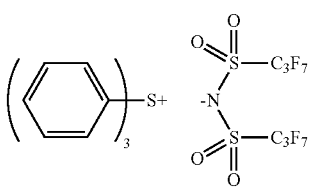
(z51)
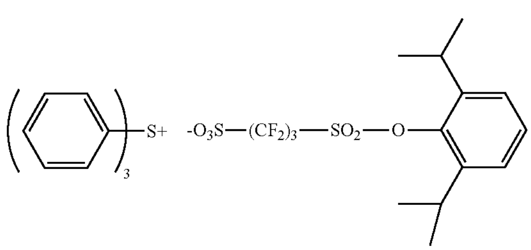
(z52)
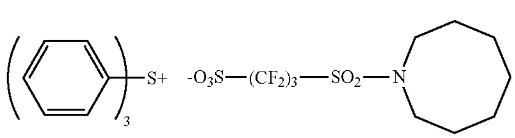
-continued
(z53)
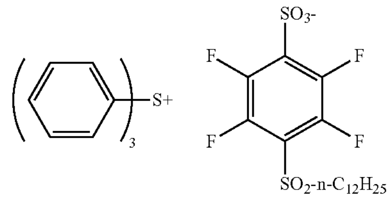
(z54)
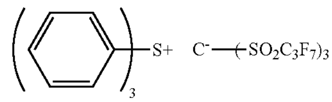
(z55)
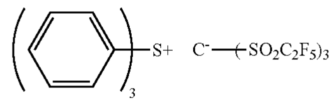
(z56)
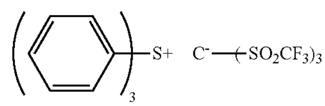
(z57)
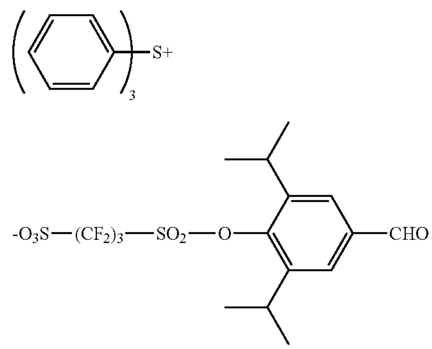
(z58)
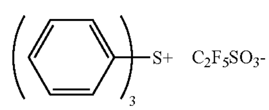
(z59)
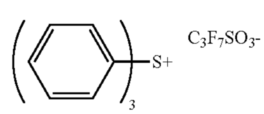
(z60)
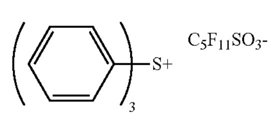
(z61)
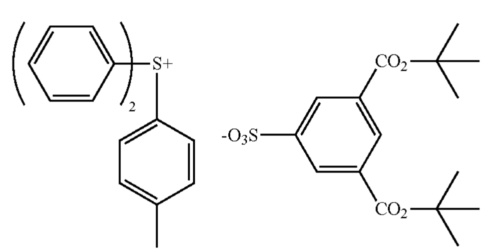

-continued
(z62)
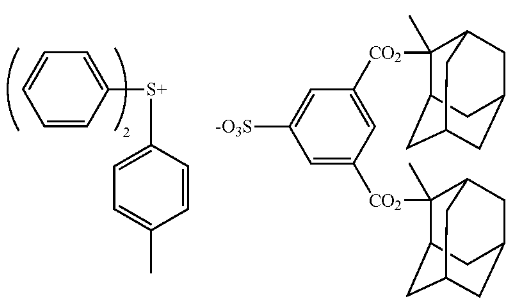
(z63)
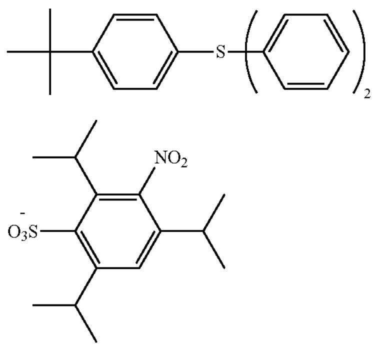
(z64)
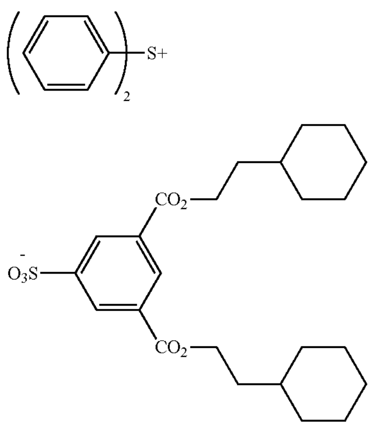
(z65)
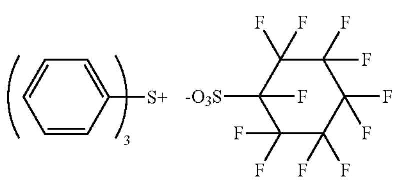
(z66)
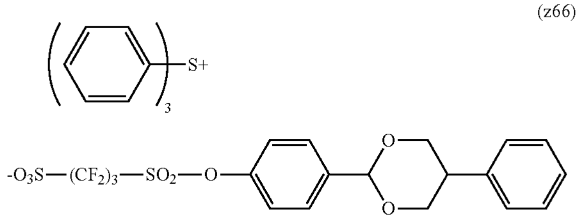
(z67)
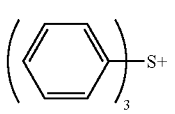
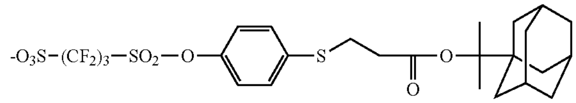
(z68)
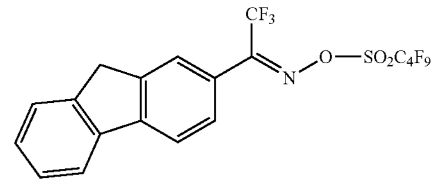
(z69)
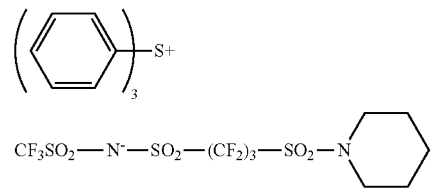
(z70)
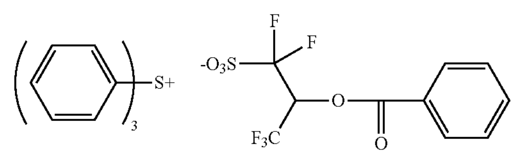
(z71)
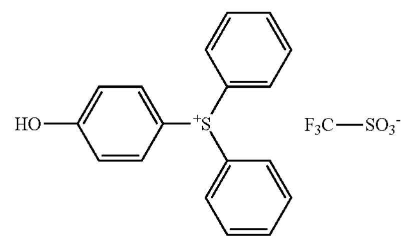
(z72)
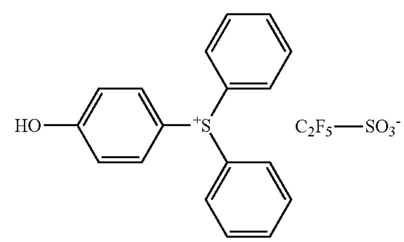
(z73)
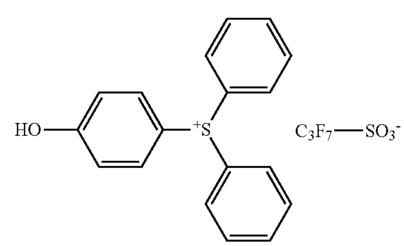
(z74)
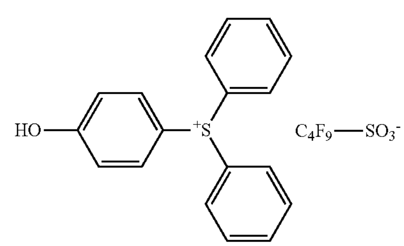

-continued
(z75)
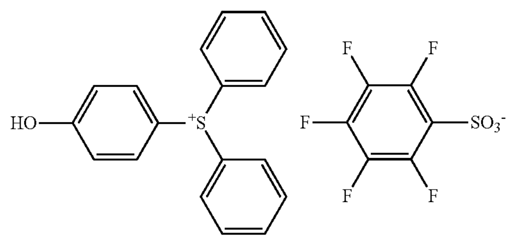
(z76)
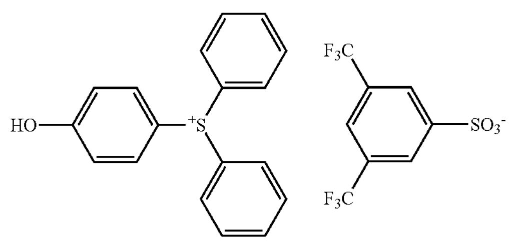
(z77)
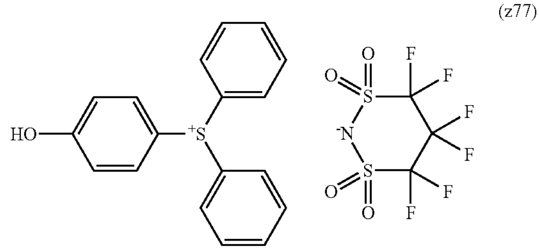
(z78)
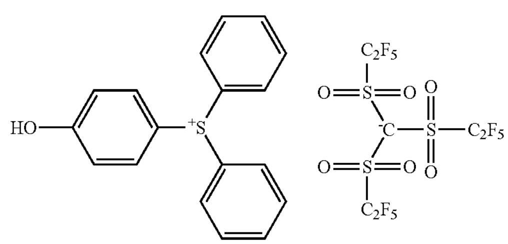
(z79)
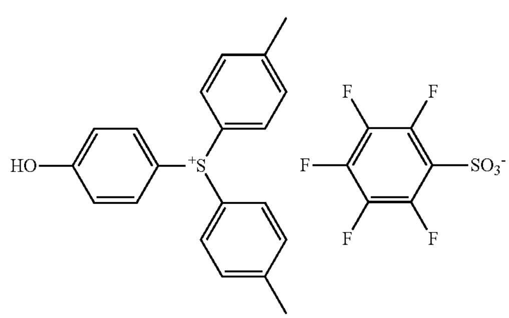
-continued
(z80)
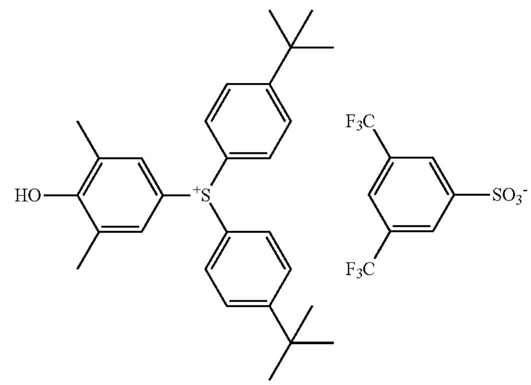
(z81)
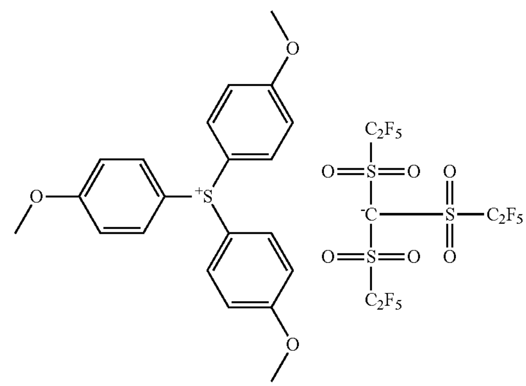
(z82)
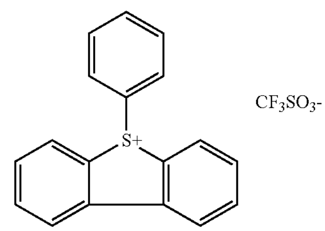
(z83)
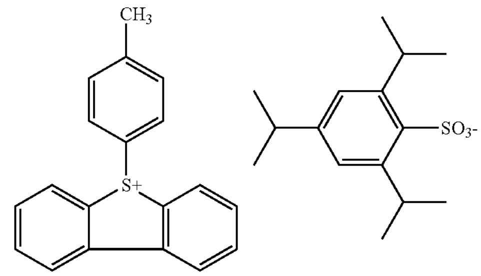
(z84)
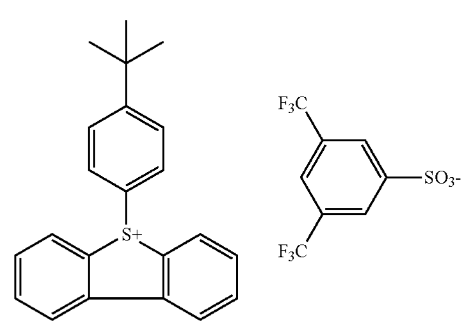

-continued
(z85)
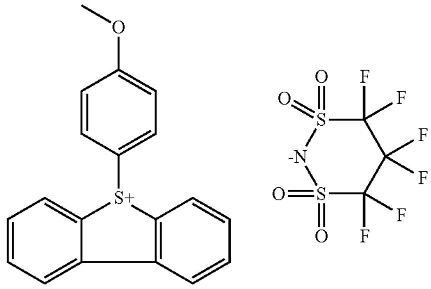
(z86)
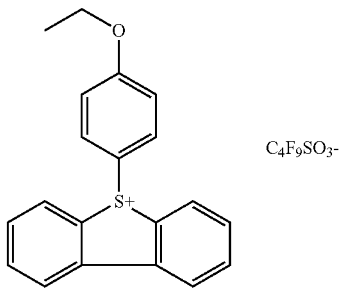
(z87)
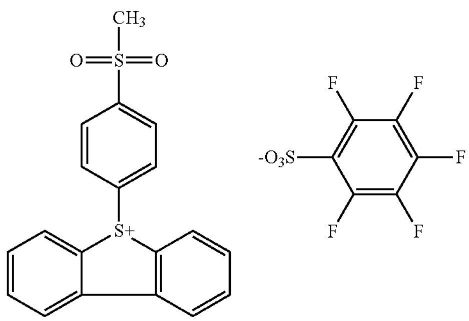
(z88)
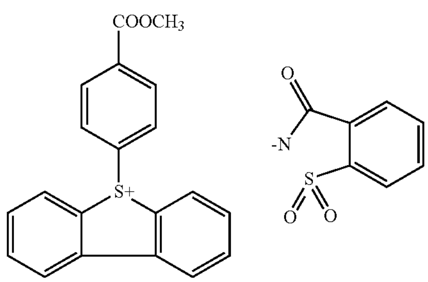
(z89)
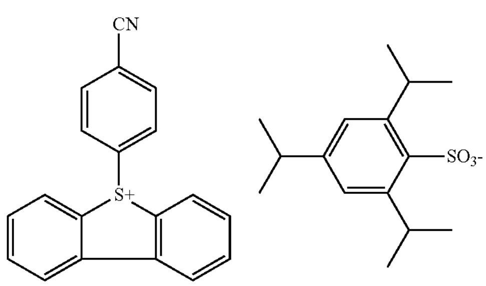
-continued
(z90)
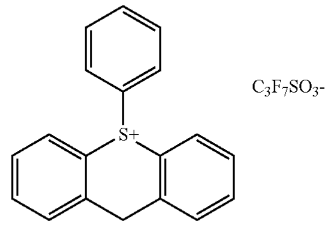
(z91)
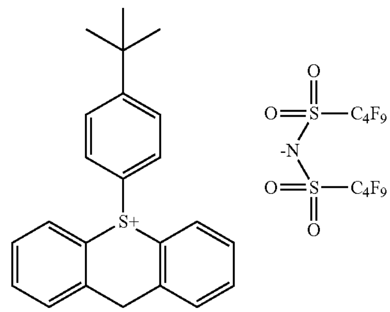
(z92)
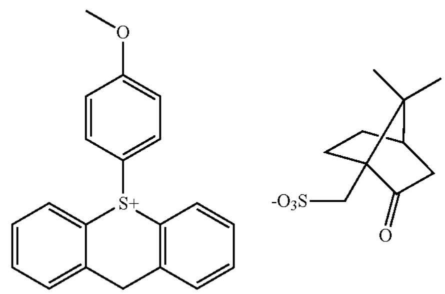
(z93)
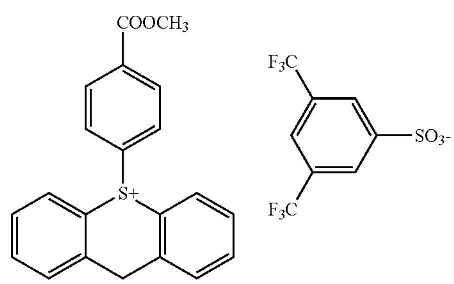
(z94)
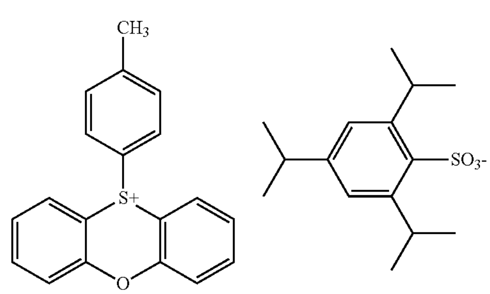

-continued
(z95)
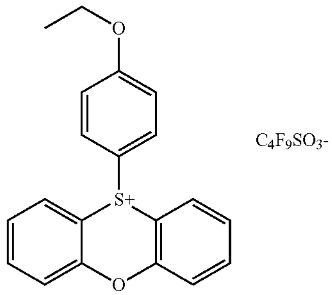
(z96)
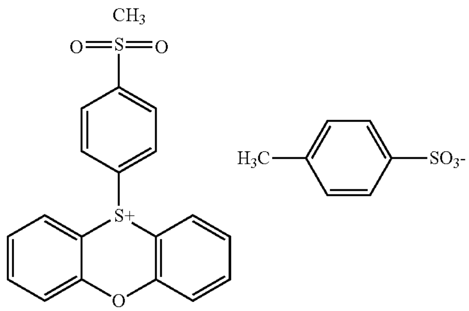
(z97)
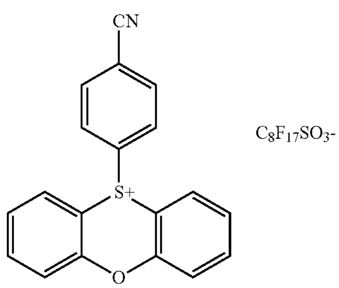
(z98)
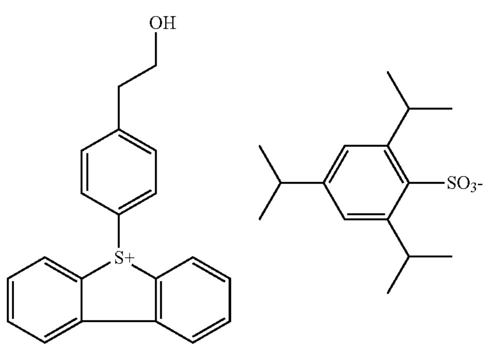
(z99)
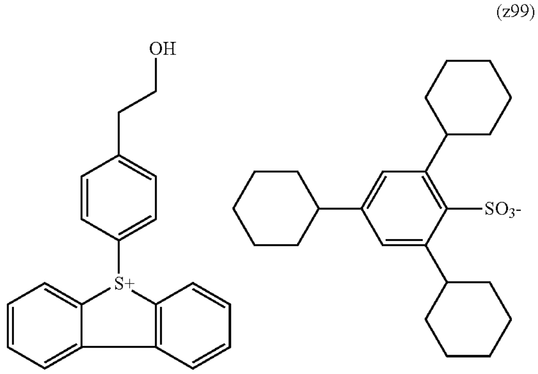
-continued
(z100)
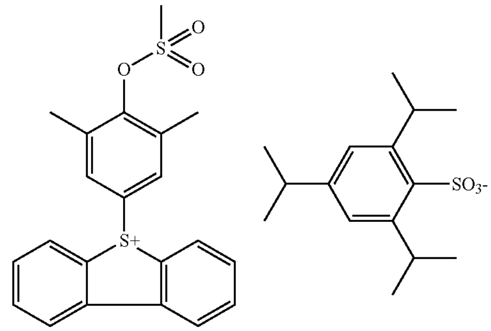
(z101)
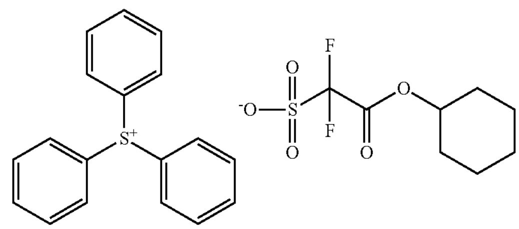
(z102)
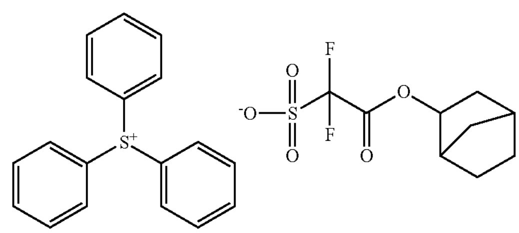
(z103)
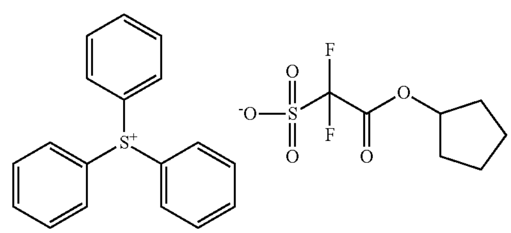
(z104)
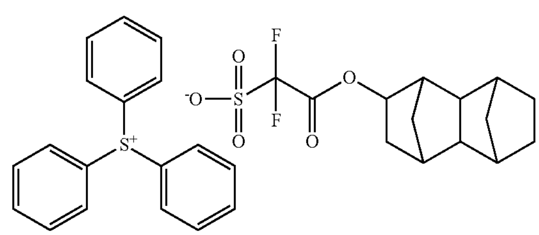
(z105)
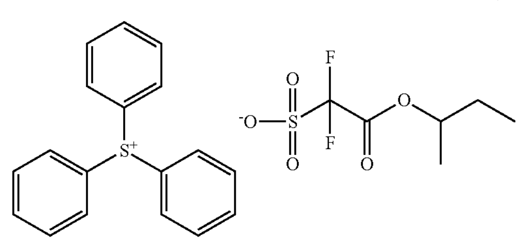

-continued
(z106)
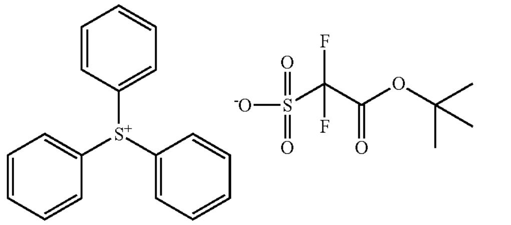
(z107)
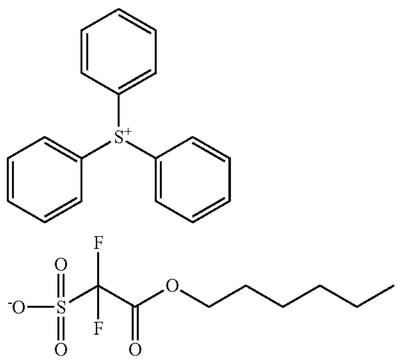
(z108)
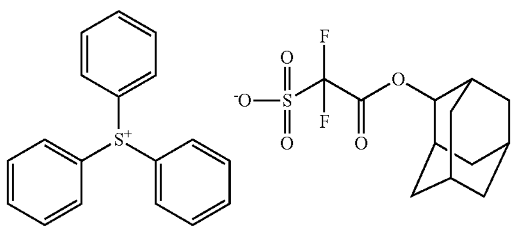
(z109)
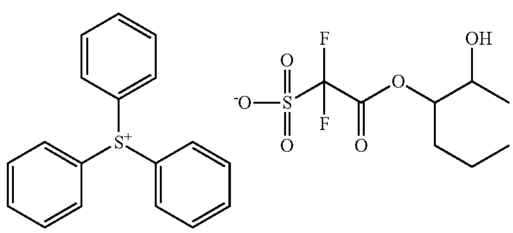
(z110)
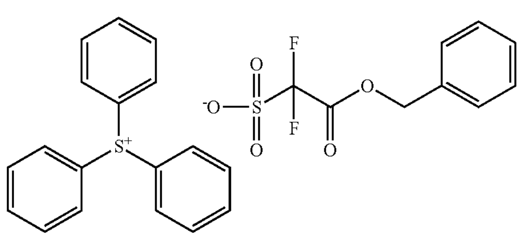
(z111)
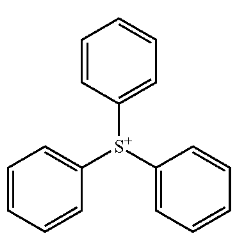
-continued
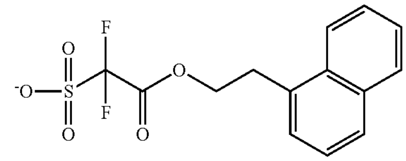
(z112)
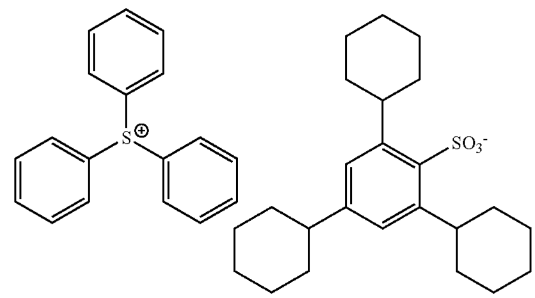
(z113)
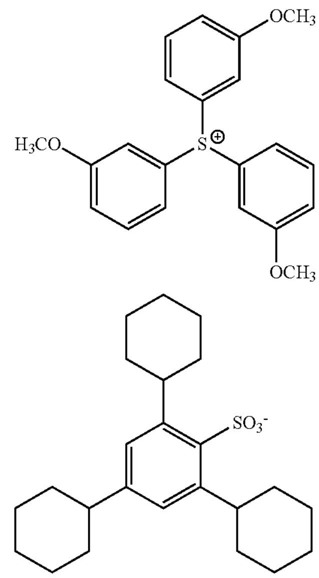
(z114)
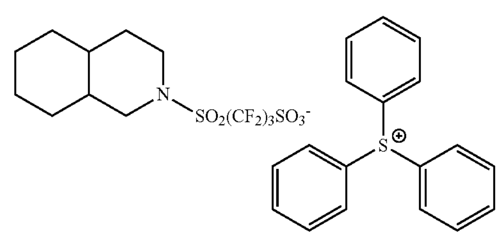
(z115)
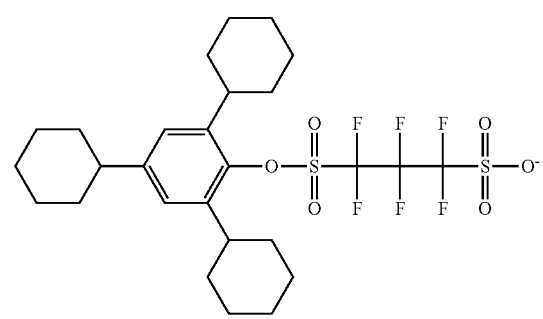

-continued
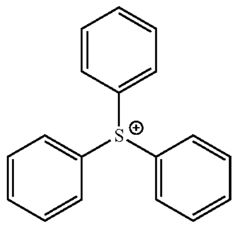
(z116)
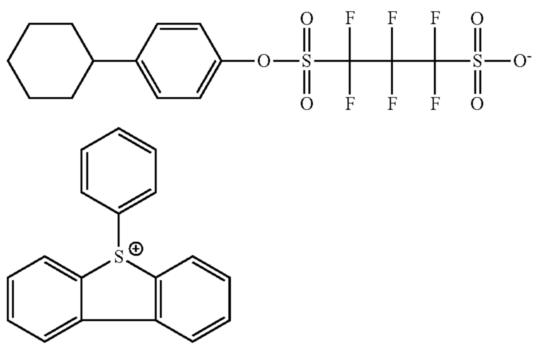
(z117)
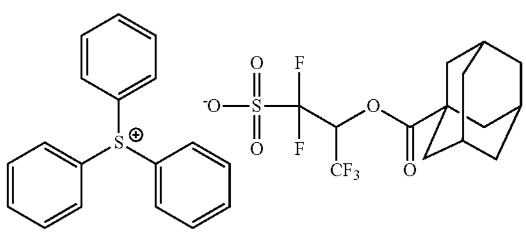
(z118)
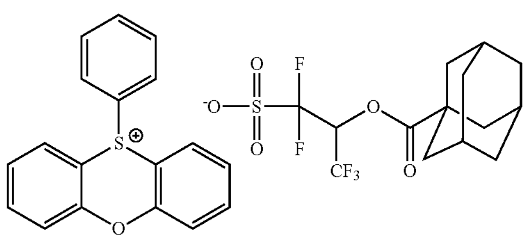
(z119)
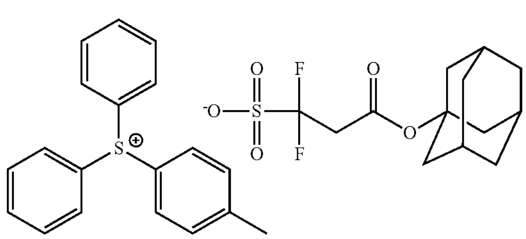
(z120)
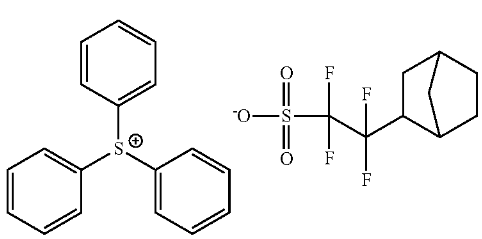
-continued
(z121)
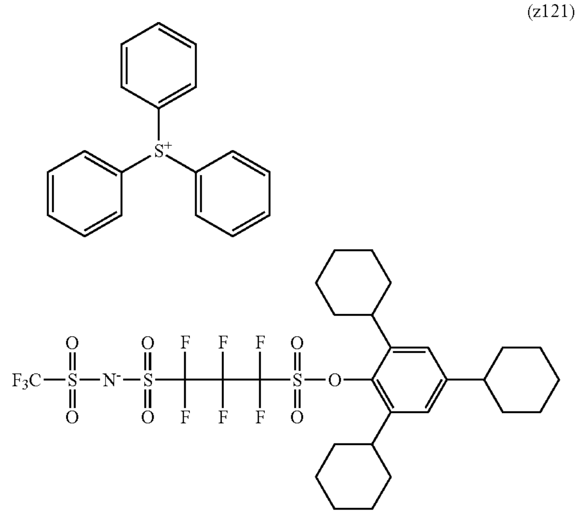
(z122)
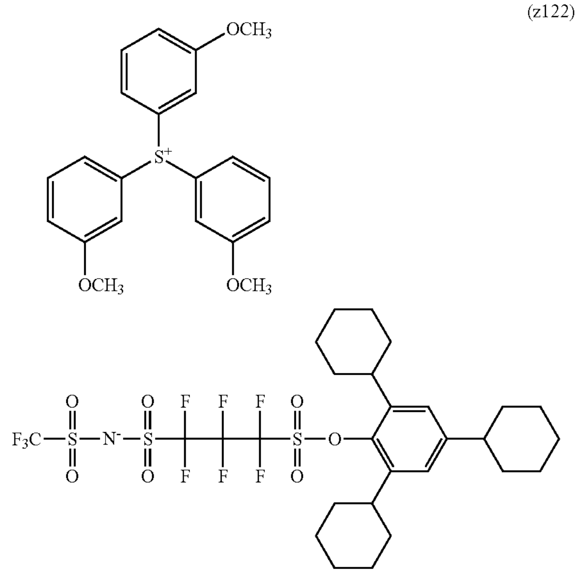
(z123)
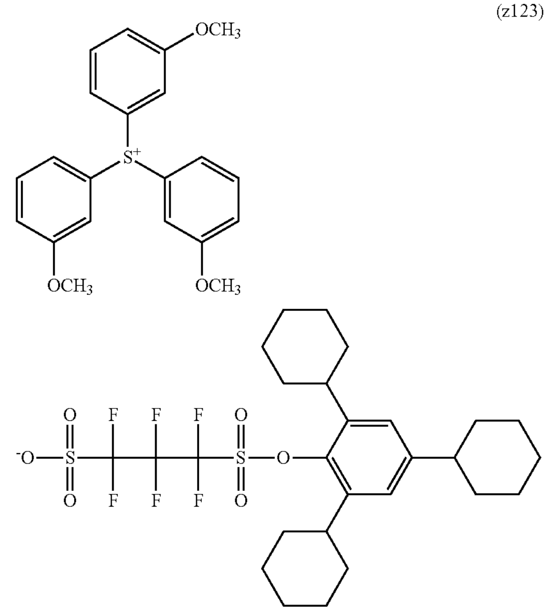

-continued
(z124)
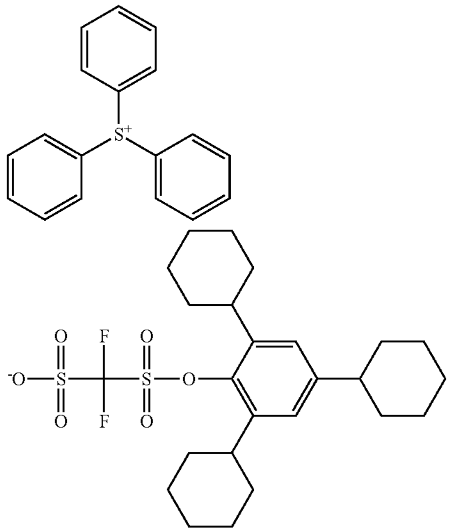
(z125)
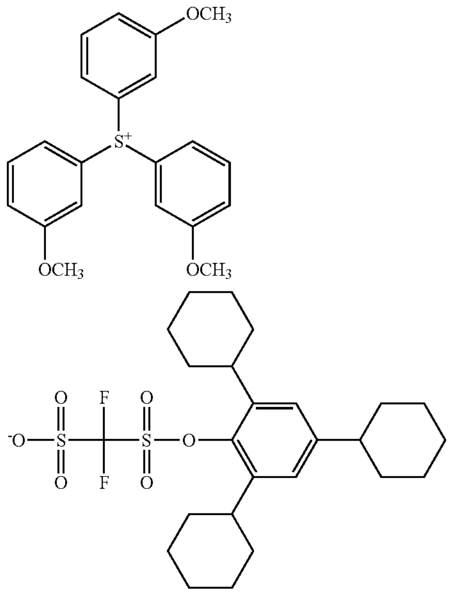
(z126)
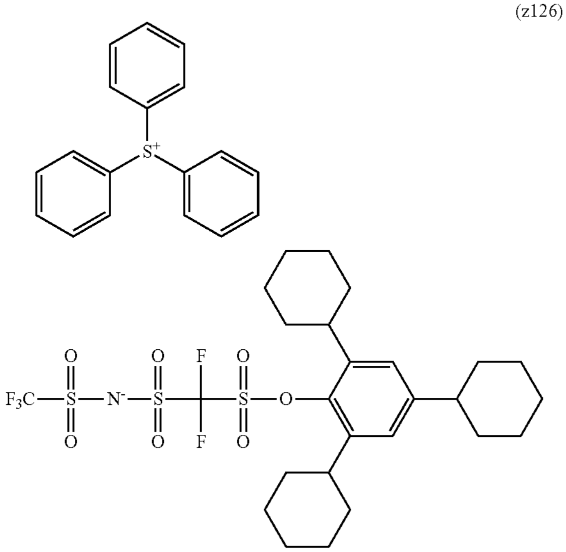
-continued
(z127)
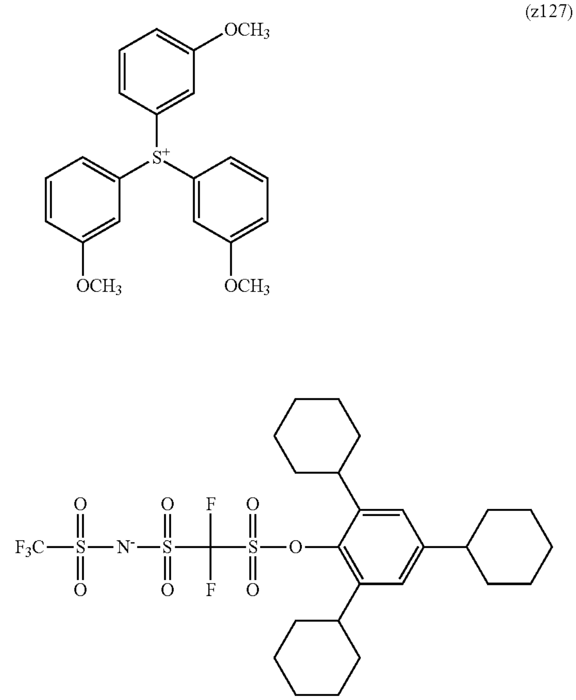
(z128)
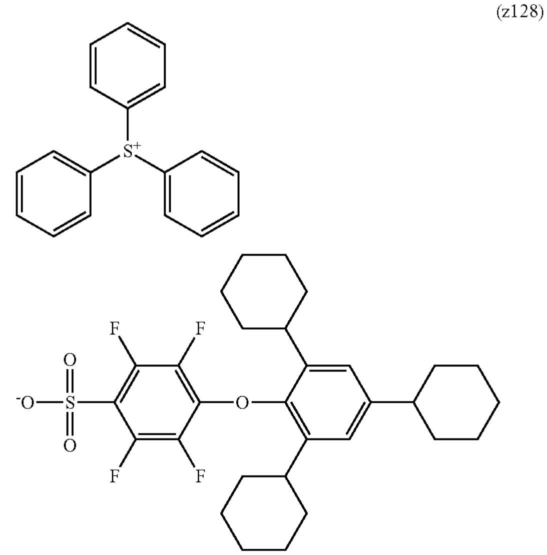
(z129)
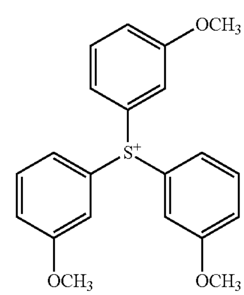

-continued
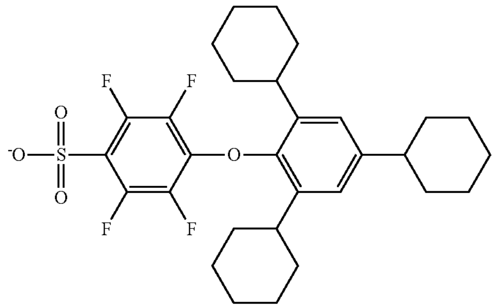
(z130)
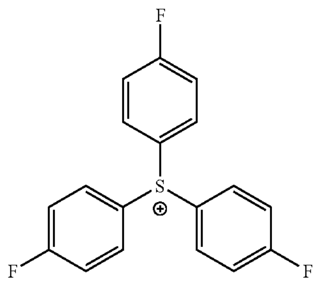
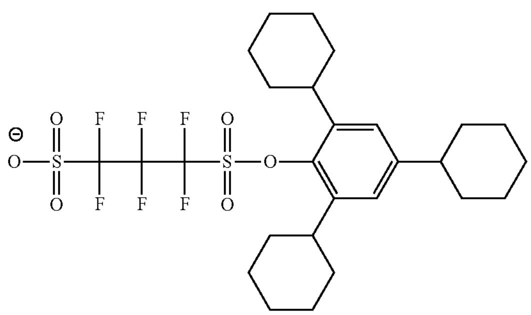
(z131)
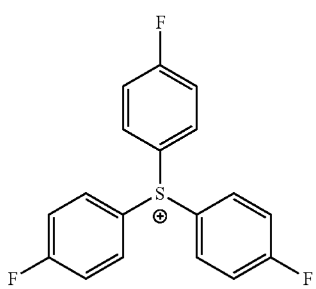
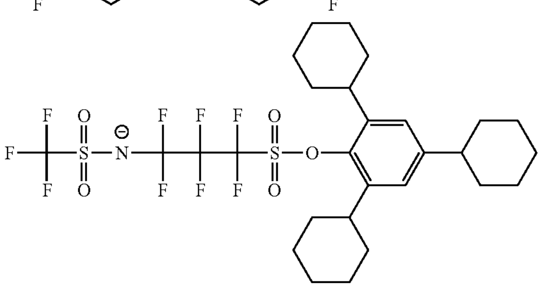
-continued
(z132)
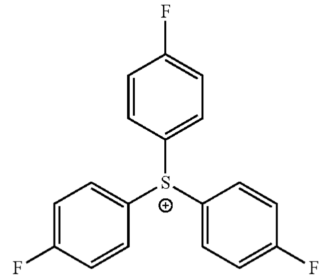
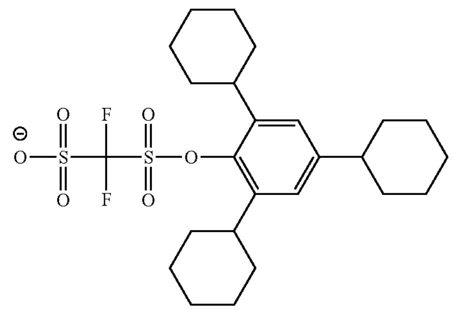
(z133)
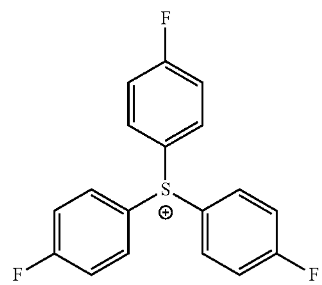
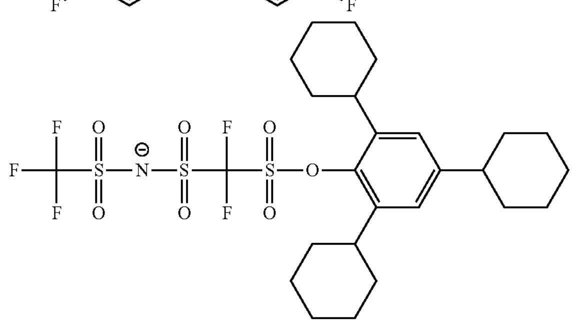
(z134)
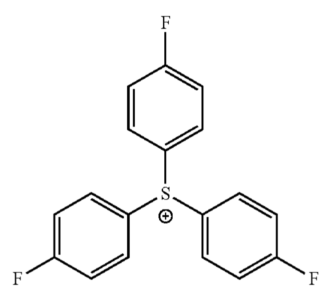

-continued
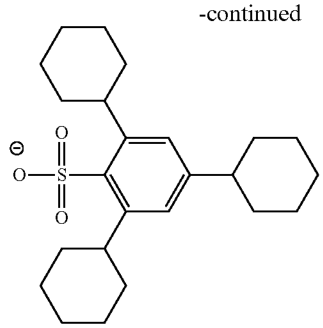
(z135)
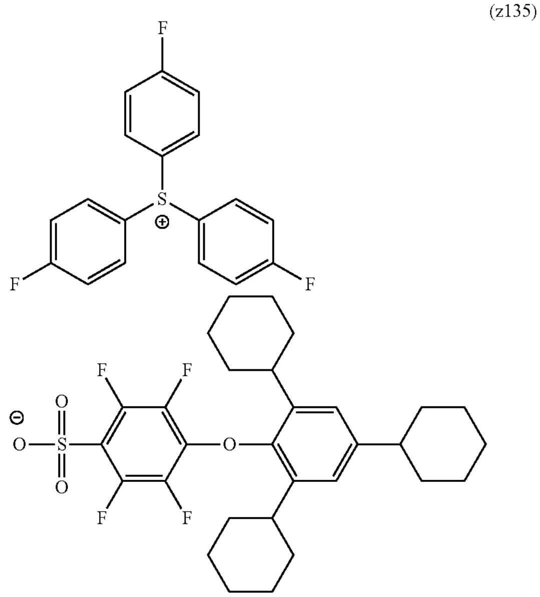
(z136)
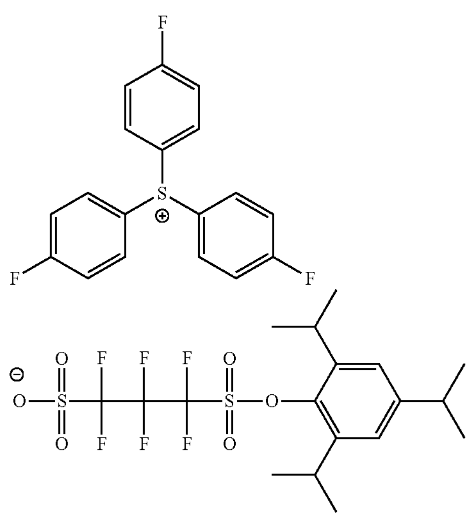
(z137)
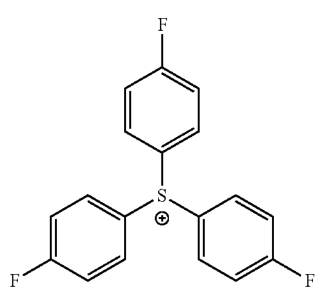
-continued
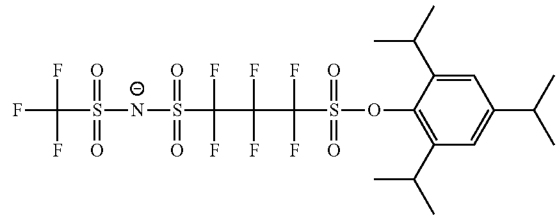
(z138)
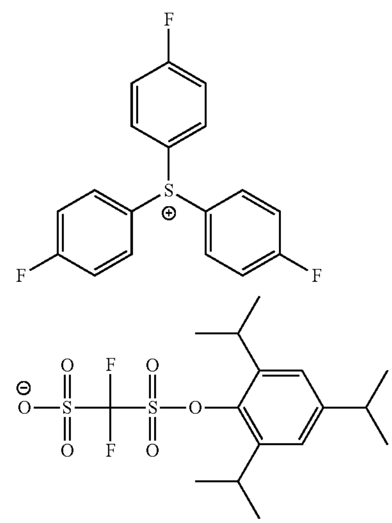
(z139)
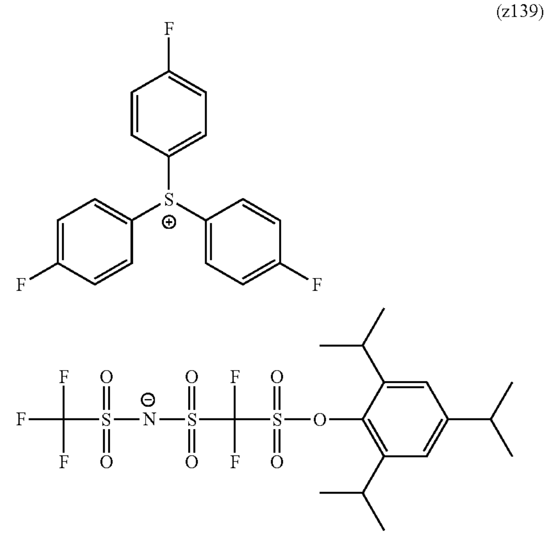
(z140)
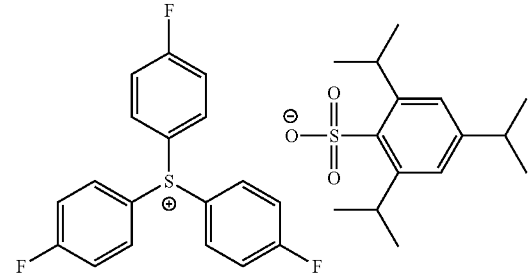

-continued (z141)

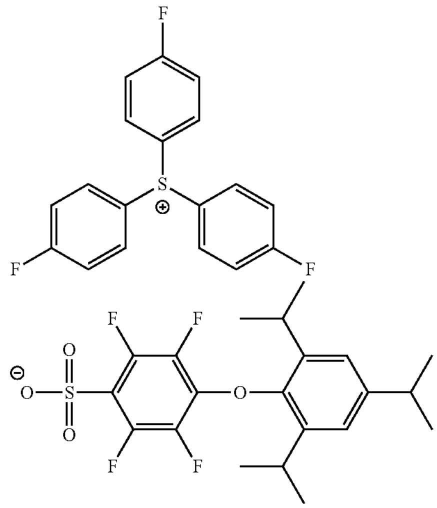

In the present invention, the compound (B) that generates an acid is preferably a compound that generates an acid having a volume of 240 Angstroms$^3$ or greater, more preferably a compound that generates an acid having a volume of 300 Angstroms$^3$ or greater, still more preferably a compound that generates an acid having a volume of 350 Angstroms$^3$ or greater, and particularly preferably a compound that generates an acid having a volume of 400 Angstroms$^3$ or greater, by irradiation with an electron beam or extreme ultraviolet rays, from the viewpoint of suppressing diffusion of the acid generated by exposure to the unexposed portion and improving resolution. Here, from the viewpoint of sensitivity and coating solvent solubility, the volume is preferably 2000 Angstroms$^3$ or less, and more preferably 1500 Å$^3$ or less. The volume value is determined by using "WinMOPAC" manufactured by FUJITSU. That is, first, the chemical structure of the acid according to each example is input, then, using this structure as an initial structure, the most stable conformation of each acid is determined by molecular force field calculation using an MM3 method, and then, by performing molecular orbital calculation using a PM3 method on these most stable conformations, the "accessible volume" of each acid can be calculated.

The acid generator can be used alone, or two or more types thereof can be used in combination.

The content of the acid generator in the composition is preferably 0.1% by mass to 50% by mass, more preferably 5% by mass to 50% by mass, and still more preferably 10% by mass to 40% by mass, based on the total solid content of the composition. In particular, to achieve both high sensitivity and high resolution when exposure is performed by an electron beam or extreme ultraviolet rays, the content of an acid generator is preferably higher, more preferably 15% by mass to 40% by mass, and most preferably 20% by mass to 40% by mass.

(D) Basic Compound

The active light-sensitive or radiation-sensitive resin composition according to the present invention preferably further includes a basic compound (D). The basic compound (D) is preferably a compound having stronger basicity compared to phenol. In addition, the basic compound is preferably an organic basic compound, and more preferably a nitrogen-containing basic compound.

The nitrogen-containing basic compound which is able to be used is not particularly limited, but for example, the compounds which are classified into (1) to (7) below can be used.

(1) Compound Represented by General Formula (BS-1)

(BS-1)

$$\begin{array}{c} R \\ | \\ R-N-R \end{array}$$

In General Formula (BS-1), each of R's independently represents a hydrogen atom or an organic group. Here, at least one of three R's is an organic group. This organic group is a linear or branched alkyl group, a monocyclic or polycyclic cycloalkyl group, an aryl group, or an aralkyl group.

The number of carbon atoms in the alkyl group as R is not particularly limited, but is normally 1 to 20, and preferably 1 to 12.

The number of carbon atoms in the cycloalkyl group as R is not particularly limited, but is normally 3 to 20, and preferably 5 to 15.

The number of carbon atoms in the aryl group as R is not particularly limited, but is normally 6 to 20, and preferably 6 to 10. Specific examples thereof include a phenyl group and a naphthyl group.

The number of carbon atoms in the aralkyl group as R is not particularly limited, but is normally 7 to 20, and preferably 7 to 11. Specifically, examples thereof include a benzyl group.

A hydrogen atom in the alkyl group, the cycloalkyl group, the aryl group, or the aralkyl group as R may be substituted with a substituent. Examples of the substituent include an alkyl group, a cycloalkyl group, an aryl group, an aralkyl group, a hydroxy group, a carboxy group, an alkoxy group, an aryloxy group, an alkylcarbonyloxy group, and an alkyloxycarbonyl group.

At least two of R's in the compound represented by General Formula (BS-1) are preferably organic groups.

Specific examples of the compound represented by General Formula (BS-1) include tri-n-butyl amine, tri-n-pentyl amine, tri-n-octyl amine, tri-n-decyl amine, triisodecyl amine, dicyclohexyl methyl amine, tetradecyl amine, pentadecyl amine, hexadecyl amine, octadecyl amine, didecyl amine, methyl octadecyl amine, dimethyl undecyl amine, N,N-dimethyl dodecyl amine, methyl dioctadecyl amine, N,N-dibutyl aniline, N,N-dihexyl aniline, 2,6-diisopropyl aniline, and 2,4,6-tri(t-butyl)aniline.

In addition, as the preferable basic compound represented by General Formula (BS-1), an alkyl group in which at least one R is substituted with a hydroxy group is exemplified. Specific examples thereof include triethanol amine and N,N-dihydroxyethyl aniline.

The alkyl group as R may have an oxygen atom in the alkyl chain. That is, an oxyalkylene chain may be formed. As the oxyalkylene chain, —$CH_2CH_2O$— is preferable. Specific examples thereof include tris(methoxyethoxyethyl)amine and a compound disclosed after line 60 of column 3 in the specification of U.S. Pat. No. 6,040,112A.

Among basic compounds represented by General Formula (BS-1), examples of a compound having such a hydroxyl group or an oxygen atom include the followings.

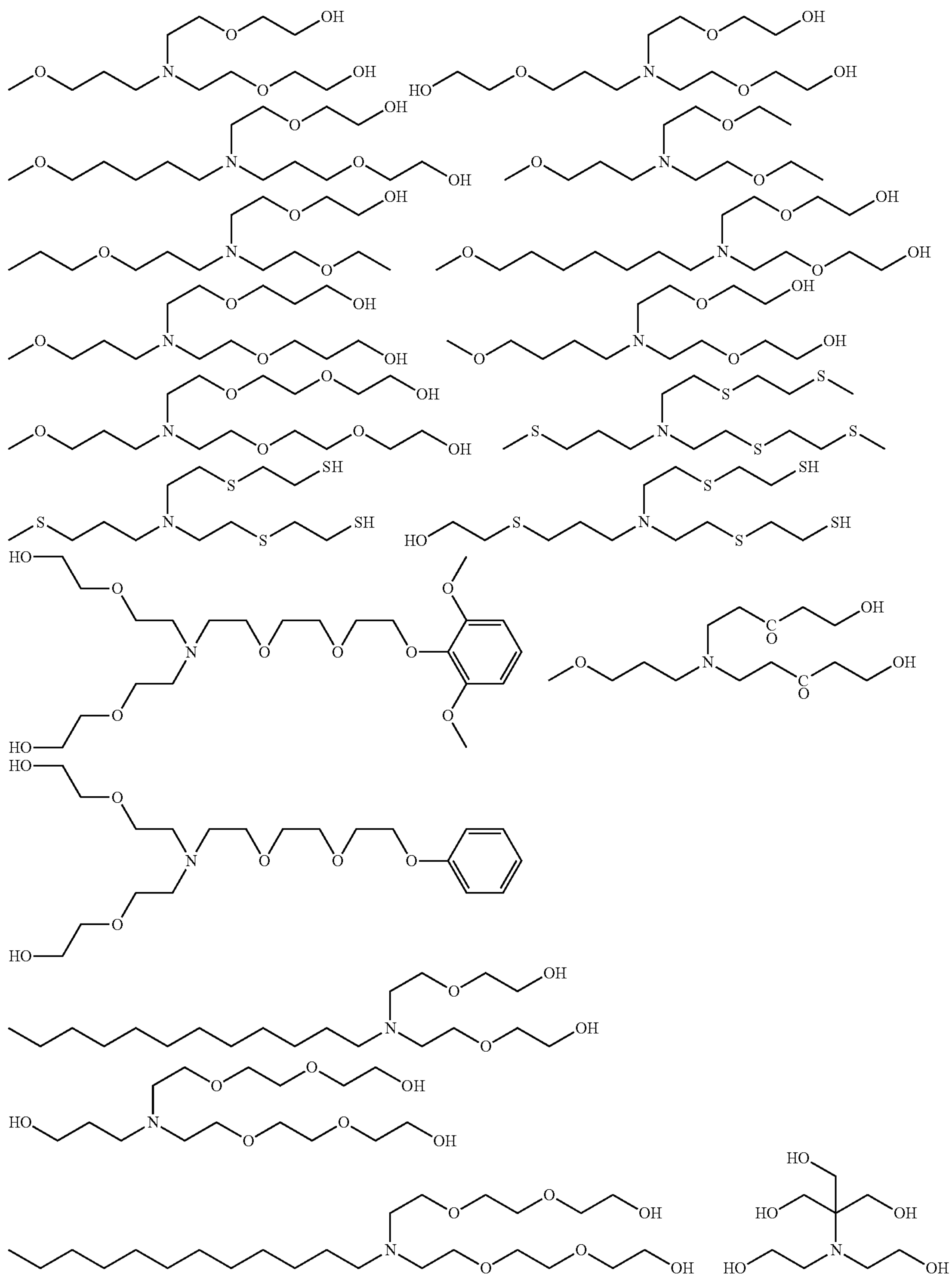

(2) Compound Having Nitrogen-Containing Heterocyclic Structure

The nitrogen-containing heterocycle may have aromatic properties, or may not have aromatic properties. The nitrogen-containing heterocycle may have a plurality of nitrogen atoms. Furthermore, the nitrogen-containing heterocycle may contain heteroatoms other than the nitrogen atom. Specific examples thereof include a compound having an imidazole structure (2-phenyl benzimidazole, 2,4,5-triphenyl imidazole, and the like), a compound having a piperidine structure [N-hydroxyethylpiperidine, bis(1,2,2,6,6-pentamethyl-4-piperidyl)sebacate, and the like], a compound having a pyridine structure (4-dimethylaminopyridine and the like), and a compound having an antipyrine structure (antipyrine, hydroxyantipyrine, and the like).

Examples of the preferable compound having a nitrogen-containing heterocyclic structure include guanidine, aminopyridine, aminoalkyl pyridine, aminopyrrolidine, indazole, imidazole, pyrazole, pyrazine, pyrimidine, purine, imidazoline, pyrazoline, piperazine, aminomorpholine, and aminoalkyl morpholine. These may further have a substituent.

Examples of the preferable substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

Examples of the particularly preferable basic compound include imidazole, 2-methyl imidazole, 4-methyl imidazole, N-methyl imidazole, 2-phenyl imidazole, 4,5-diphenyl imidazole, 2,4,5-triphenyl imidazole, 2-amino pyridine, 3-amino pyridine, 4-amino pyridine, 2-dimethyl amino pyridine, 4-dimethyl amino pyridine, 2-diethyl amino pyridine, 2-(aminomethyl)pyridine, 2-amino-3-methyl pyridine, 2-amino-4-methyl pyridine, 2-amino 5-methyl pyridine, 2-amino-6-methyl pyridine, 3-amino ethyl pyridine, 4-amino ethyl pyridine, 3-amino pyrrolidine, piperazine, N-(2-aminoethyl) piperazine, N-(2-aminoethyl) piperidine, 4-amino-2,2,6,6 tetramethyl piperidine, 4-piperidinopiperidine, 2-iminopiperidine, 1-(2-aminoethyl) pyrrolidine, pyrazole, 3-amino-5-methyl pyrazole, 5-amino-3-methyl-1-p-tolyl pyrazole, pyrazine, 2-(aminomethyl) 5-methyl pyrazine, pyrimidine, 2,4-diaminopyrimidine, 4,6-dihydroxypyrimidine, 2-pyrazoline, 3-pyrazoline, N-aminomorpholine, and N-(2-aminoethyl) morpholine.

A compound having two or more ring structures can also be suitably used. Specific examples thereof include 1,5-diazabicyclo[4.3.0]non-5-ene and 1,8-diazabicyclo[5.4.0] undeca-7-ene.

(3) Amine Compound Having Phenoxy Group

An amine compound having a phenoxy group is a compound having a phenoxy group at the terminal on the opposite side to the N atom of the alkyl group which is contained in an amine compound. The phenoxy group may have a substituent such as an alkyl group, an alkoxy group, a halogen atom, a cyano group, a nitro group, a carboxy group, a carboxylic acid ester group, a sulfonic acid ester group, an aryl group, an aralkyl group, an acyloxy group, or an aryloxy group.

The compound more preferably has at least one oxyalkylene chain between the phenoxy group and the nitrogen atom. The number of oxyalkylene chains in one molecule is preferably 3 to 9, and more preferably 4 to 6. Among the oxyalkylene chains, —$CH_2CH_2O$— is particularly preferable.

Specific examples thereof include 2-[2-{2-(2,2-dimethoxyphenoxyethoxy)ethyl}-bis-(2-methoxy-ethyl)-amine and the compounds (C1-1) to (C3-3) exemplified in paragraph "0066" in the specification of US2007/0224539A1.

An amine compound having a phenoxy group is obtained by, for example, heating a mixture of a primary or secondary amine having a phenoxy group and an haloalkyl ether to be reacted, by adding an aqueous solution of a strong base such as sodium hydroxide, potassium hydroxide, or tetraalkylammonium thereto, and by extracting the resultant product with an organic solvent such as ethyl acetate or chloroform. In addition, an amine compound having a phenoxy group can also be obtained by heating a mixture of a primary or secondary amine and an haloalkyl ether having a phenoxy group at the terminal to be reacted, by adding an aqueous solution of a strong base such as sodium hydroxide, potassium hydroxide, or tetraalkylammonium thereto, and by extracting the resultant product with an organic solvent such as ethyl acetate or chloroform.

(4) Ammonium Salt

It is possible to suitably use an ammonium salt as the basic compound.

As the cation of the ammonium salt, a tetraalkylammonium cation in which an alkyl group having 1 to 18 carbon atoms is substituted is preferable, a tetramethylammonium cation, a tetraethylammonium cation, a tetra(n-butyl)ammonium cation, a tetra(n-heptyl)ammonium cation, a tetra(n-octyl)ammonium cation, a dimethylhexadecylammonium cation, or a benzyltrimethyl cation is more preferable, and tetra(n-butyl)ammonium cation is most preferable.

Examples of the anion of the ammonium salt include hydroxide, carboxylate, halide, sulfonate, borate, and phosphate. Among these, hydroxide or carboxylate is particularly preferable.

As the halide, chloride, bromide, or iodide is particularly preferable.

As the sulfonate, an organic sulfonate having 1 to 20 carbon atoms is particularly preferable. Examples of the organic sulfonate include alkyl sulfonate and aryl sulfonate having 1 to 20 carbon atoms.

The alkyl group included in the alkyl sulfonate may have a substituent. Examples of the substituent include a fluorine atom, a chlorine atom, a bromine atom, an alkoxy group, an acyl group, and an aryl group. Specific examples of the alkyl sulfonate include methanesulfonate, ethanesulfonate, butanesulfonate, hexanesulfonate, octanesulfonate, benzyl sulfonate, trifluoromethanesulfonate, pentafluoroethanesulfonate, and nonafluorobutanesulfonate.

Examples of the aryl group included in the aryl sulfonate include a phenyl group, a naphthyl group, and an anthryl group. These aryl groups may have a substituent. As the substituent, for example, a linear or branched alkyl group having 1 to 6 carbon atoms or a cycloalkyl group having 3 to 6 carbon atoms is preferable. Specifically, for example, a methyl group, an ethyl group, an n-propyl group, an isopropyl group, an n-butyl group, an i-butyl group, a t-butyl group, an n-hexyl group, or a cyclohexyl group is preferable. Examples of other substituents include an alkoxy group having 1 to 6 carbon atoms, a halogen atom, a cyano group, a nitro group, an acyl group, and an acyloxy group.

The carboxylate may be aliphatic carboxylate or aromatic carboxylate, and examples thereof include acetate, lactate, pyruvate, trifluoroacetate, adamantane carboxylate, hydroxyadamantane carboxylate, benzoate, naphthoate, salicylate, phthalate, and phenolate, and, in particular, benzoate, naphthoate, or phenolate is preferable, and benzoate is most preferable.

In this case, as the ammonium salt, tetra(n-butyl)ammonium benzoate or tetra(n-butyl)ammonium phenolate is preferable.

In the case of hydroxide, the ammonium salt is particularly preferably tetraalkylammonium hydroxide (tetraalkyl ammonium hydroxide such as tetramethyl ammonium hydroxide, tetraethyl ammonium hydroxide, or tetra-(n-butyl)ammonium hydroxide having 1 to 8 carbon atoms.

(5) Compound (PA) which has Proton-Accepting Functional Group and Generates Compound in which Proton-Acceptibility is Reduced or Lost, or Which is Changed from being Proton-Aaccepting to be Acidic, by being Decomposed due to Irradiation with Aactive Light or Radiation The composition according to the present invention may further include a compound (hereinafter, referred to as "compound (PA)") which has a proton-accepting functional group and generates a compound in which the proton-acceptibility is reduced or lost, or which is changed from being proton-accepting to be acidic, by being decomposed due to irradiation with active light or radiation, as a basic compound.

Regarding the compound (PA) which has a proton-accepting functional group and generates a compound in which the proton-acceptibility is reduced or lost, or which is changed from being proton-accepting to be acidic, by being decomposed due to irradiation with active light or radiation, the description in paragraphs “0379” to “0425” of JP2012-32762A (which corresponds to paragraphs “0386” to “0435” of US2012/0003590A) can be referred to, and the contents thereof are incorporated in the present specification.

(6) Guanidine Compound

The composition of the present invention may further contain a guanidine compound having a structure represented by the following formula.

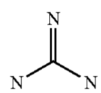

The guanidine compound exhibits strong basicity since the positive charge of the conjugate acid is dispersed and stabilized by the three nitrogen atoms.

For the basicity of the guanidine compound (A) of the present invention, the pKa of a conjugate acid is preferably 6.0 or greater, preferably 7.0 to 20.0 since neutralization reactivity with an acid is high and the roughness properties are excellent, and more preferably 8.0 to 16.0.

Due to such strong basicity, the diffusibility of an acid is suppressed, and the strong basicity can contribute to formation of an excellent pattern shape.

The “pKa” here represents pKa in an aqueous solution, and for example, it is described in Chemical Handbook (II) (revised 4th edition, 1993, edited by The Chemical Society of Japan, published by Maruzen Co., Ltd.), and a smaller value means higher acidity. Specifically, the pKa in aqueous solution can be obtained by measuring the acid dissociation constant at 25° C. using an infinite dilution aqueous solution, and a value based on the database of Hammett substituent constants and known literature values can also be determined by calculation using the following software package 1. All of pKa values described in the present specification are values determined by calculation using this software package.

Software package 1: Advanced Chemistry Development (ACD/Labs) Software V8.14 for Solaris (1994-2007 ACD/Labs).

In the present invention, log P is a logarithmic value of an n-octanol/water distribution coefficient (P), and with respect to a wide range of compounds, it is an effective parameter that can characterize the hydrophilicity/hydrophobicity. In general, the distribution coefficient is determined not by experiment but by calculation, and in the present invention, the distribution coefficient is a value calculated by a CS ChemDraw Ultra Ver. 8.0 software package (Crippen's fragmentation method).

In addition, the log P of the guanidine compound (A) is preferably 10 or less. When the log P is the above value or less, the guanidine compound can be uniformly contained in a resist film.

The log P of the guanidine compound (A) in the present invention is preferably within a range of 2 to 10, more preferably within a range of 3 to 8, and particularly preferably within a range of 4 to 8.

In addition, the guanidine compound (A) in the present invention preferably does not have a nitrogen atom other than a guanidine structure.

Specific examples of the guanidine compound are shown below, but, the present invention is not limited thereto.

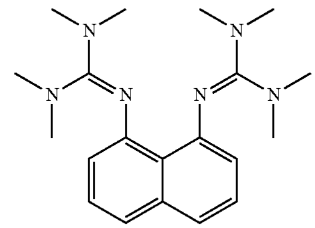

Log P: 4.29

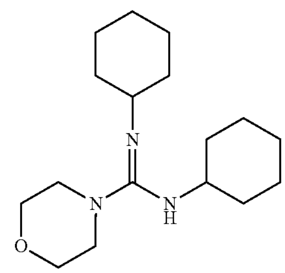

Log P: 3.32

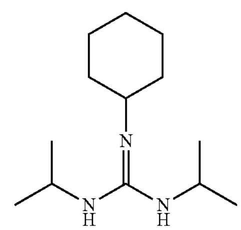

Log P: 3.1

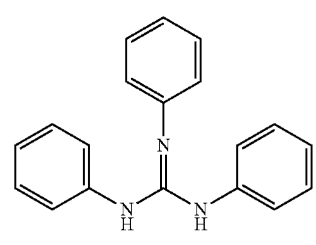

Log P: 5.24

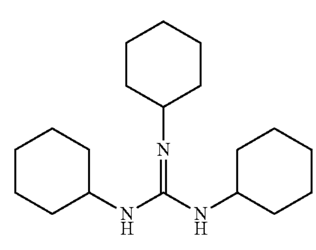

Log P: 4.89

-continued

Log P: 5.11

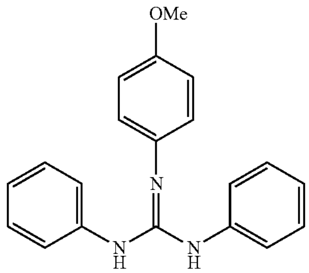

Log P: 2.61

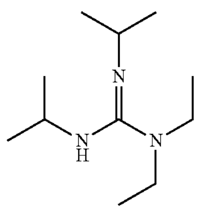

Log P: 4.61

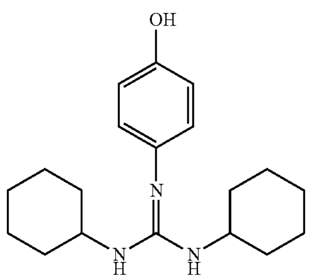

Log P: 5.83

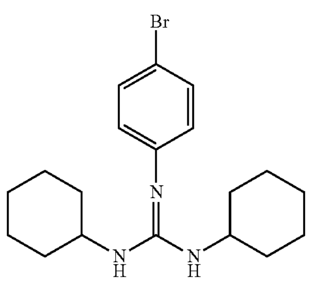

Log P: 1.75

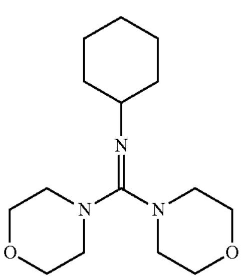

Log P: 4.95

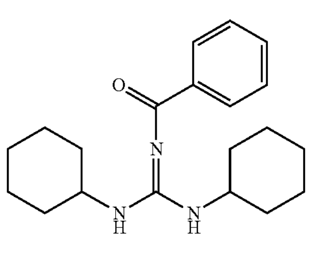

-continued

Log P: 4.51

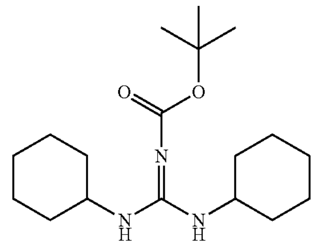

Log P: 4.55

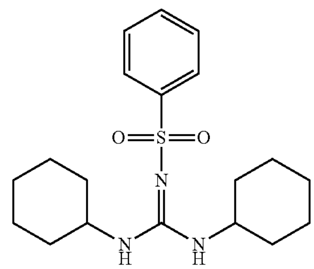

Log P: 4.43

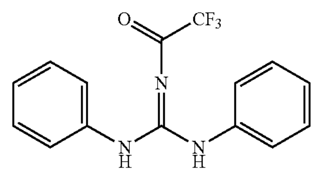

Log P: 3.18

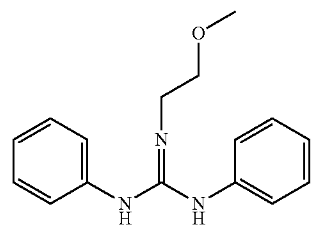

Log P: 4.4

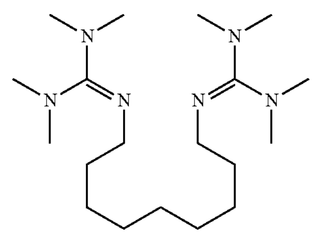

(7) Low Molecular Weight Compound Having Nitrogen Atom and Group Leaving Due to Action of Acid The composition of the present invention can contain a low molecular weight compound (hereinafter, also referred to as a "low molecular weight compound (D)" or "compound (D)") having a nitrogen atom and a group leaving due to the action of an acid. The low molecular weight compound (D) preferably has basicity, after a group leaving due to the action of an acid leaves.

Regarding the low molecular compound (D), the description in paragraphs "0324" to "0337" of JP2012-133331A can be referred to, and the contents thereof are incorporated in the present specification.

In the present invention, the low molecular weight compound (D) may be used singly or in a mixture of two or more types thereof.

Other than this, examples of the compound according to the present invention which are able to be used include the compounds synthesized in Examples of JP2002-363146A and the compounds described in paragraph "0108" of JP2007-298569A.

As the basic compound, a photosensitive basic compound may be used. As the photosensitive basic compound, for example, the compounds described in JP2003-524799A, J. Photopolym. Sci. & Tech. Vol. 8, P. 543-553 (1995), and the like as can be used.

The molecular weight of the basic compound is usually 100 to 1500, preferably 150 to 1300, and more preferably 200 to 1000.

These basic compounds (D) may be used alone or two or more types thereof may be used in combination.

The content of the basic compound (D) included in the composition of the present invention is preferably 0.01% by mass to 8.0% by mass, more preferably 0.1% by mass to 5.0% by mass, and particularly preferably 0.2% by mass to 4.0% by mass, based on the total solid content of the composition.

The molar ratio of the basic compound (D) with respect to the acid generator is preferably set to 0.01 to 10, more preferably set to 0.05 to 5, and still more preferably set to 0.1 to 3. When the molar ratio is excessively large, sensitivity and/or resolution is reduced in some cases. When the molar ratio is excessively small, there is a possibility that thinning of a pattern occurs, during exposure and heating (post-baking). The molar ratio is more preferably 0.05 to 5, and still more preferably 0.1 to 3. Moreover, the acid generator in the above molar ratio is based on the total amount of the repeating unit represented by General Formula (P), of the resin (A) and the acid generator which the resin further may include.

Solvent

The composition according to the present invention preferably includes a solvent. The solvent preferably includes at least one selected from the group consisting of propylene glycol monoalkyl ether carboxylate (S1), propylene glycol monoalkyl ether (S2), lactic acid ester, acetic acid ester, alkoxypropionic acid ester, chain ketone, cyclic ketone, lactone, and alkylene carbonate. The solvent may further include a component other than the component (S1) and the component (S2).

The present inventors find that when such a solvent and the resin described above are used in combination, coating properties of a composition are improved, and a pattern having a small number of development defects can be formed. The reason is not clear, but the present inventors consider that the reason is due to the fact that, since these solvents have excellent balance among solubility with respect to the resin described above, a boiling point, and viscosity, unevenness in the film thickness of the composition layer or the generation of precipitates during the spin coating can be suppressed.

As the component (S1), at least one selected from the group of consisting of propylene glycol monomethyl ether acetate, propylene glycol monomethyl ether propionate, and propylene glycol monoethyl ether acetate is preferable, and propylene glycol monomethyl ether acetate is particularly preferable.

As the component (S2), the followings are preferable.

As propylene glycol monoalkyl ether, propylene glycol monomethyl ether or propylene glycol monoethyl ether is preferable.

As lactic acid ester, ethyl lactate, butyl lactate, or propyl lactate is preferable.

As acetic acid ester, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

As alkoxypropionic acid ester, methyl 3-methoxypropionate (MMP) or ethyl 3-ethoxypropionate (EEP) is preferable.

As chain ketone, 1-octanone, 2-octanone, 1-nonanone, 2-nonanone, acetone, 4-heptanone, 1-hexanone, 2-hexanone, diisobutyl ketone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, or methyl amyl ketone is preferale.

As cyclic ketone, methyl cyclohexanone, isophorone, or cyclohexanone is preferable.

As lactone, γ-butyrolactone is preferable.

As alkylene carbonate, propylene carbonate is preferable.

As the component (S2), propylene glycol monomethyl ether, ethyl lactate, ethyl 3-ethoxypropionate, methyl amyl ketone, cyclohexanone, butyl acetate, pentyl acetate, γ-butyrolactone, or propylene carbonate is more preferable.

As Component (S2), a component having a flash point (hereinafter, also referred to as fp) of 37° C. or higher is preferably used. As the component (S2) as described above, propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), γ-butyrolactone (fp: 101° C.), or propylene carbonate (fp: 132° C.) is preferable. Among these, propylene glycol monoethyl ether, ethyl lactate, pentyl acetate, or cyclohexanone is more preferable, and propylene glycol monoethyl ether or ethyl lactate is particularly preferable. Moreover, the "flash point" described here means a value described in the reagent catalog of Tokyo Chemical Industry Co., Ltd. or Sigma-Aldrich Co. LLC.

The solvent preferably includes the component (S1). It is more preferable that the solvent consists of substantially only the component (S1) or is a mixed solvent of the component (S1) and other components. In the latter case, the solvent still more preferably includes both the component (S1) and the component (S2).

The mass ratio between the component (S1) and the component (S2) is preferably within a range of 100:0 to 15:85, more preferably within a range of 100:0 to 40:60, and still more preferably within a range of 100:0 to 60:40. That is, it is preferable that the solvent consists of only the component (S1), or includes both the component (S1) and the component (S2) and the mass ratio thereof is as follows. That is, in the latter case, the mass ratio of the component (S1) to the component (S2) is preferably 15/85 or greater, more preferably 40/60 or greater, and still more preferably 60/40 or greater. When such a configuration is adopted, the number of development defects can be further reduced.

Moreover, in a case where the solvent includes both the component (S1) and the component (S2), the mass ratio of the component (S1) with respect to the component (S2) is, for example, set to 99/1 or less.

As described above, the solvent may further include a component other than the component (S1) and the component (S2). In this case, the content of the component other than the component (S1) and the component (S2) is preferably within a range of 5% by mass to 30% by mass with respect to the total amount of the solvent.

The content of the solvent in the composition is preferably set such that the solid content concentration of all components becomes 2% by mass to 30% by mass, and more preferably set such that the solid content concentration of all components becomes 3% by mass to 20% by mass. By doing this, the coating properties of the composition can be further improved.

(E) Hydrophobic Resin

The active light-sensitive or radiation-sensitive resin composition of the present invention may have a hydrophobic resin (E) separately from the resin (A).

The hydrophobic resin (E) preferably contains a group having a fluorine atom, a group having a silicon atom, or a hydrocarbon group having 5 or more carbon atoms, in order to be unevenly distributed on a film surface. These groups may be contained in the main chain of the resin or may be substituted in the side chain. Specific examples of the hydrophobic resin (E) will be described below.

(HR-1)

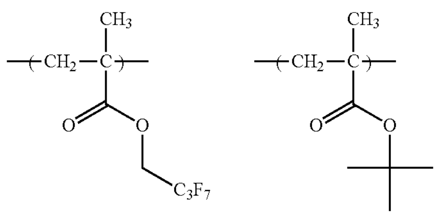

(HR-2)

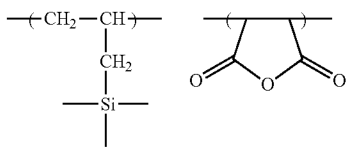

(HR-3)

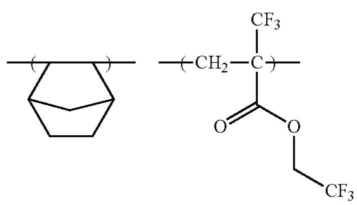

(HR-4)

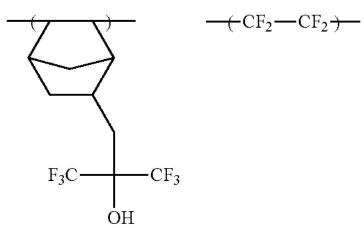

(HR-5)

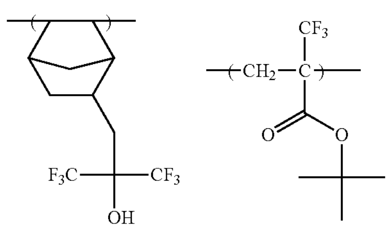

(HR-6)

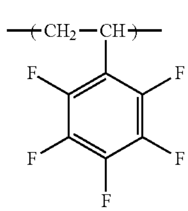

-continued (HR-7)

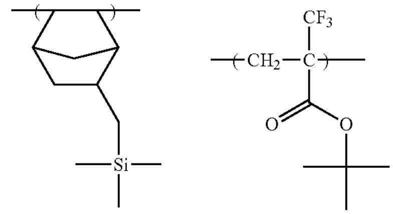

(HR-8)

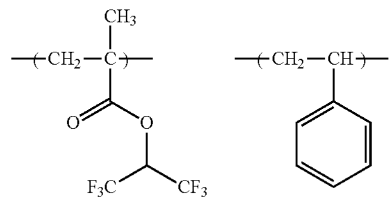

(HR-9)

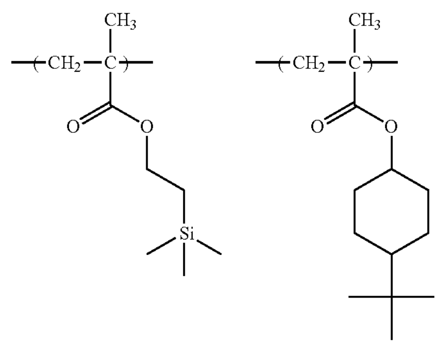

(HR-10)

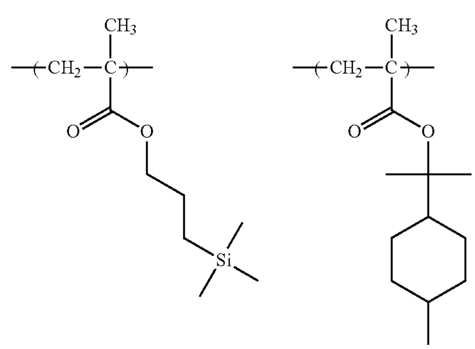

(HR-11)

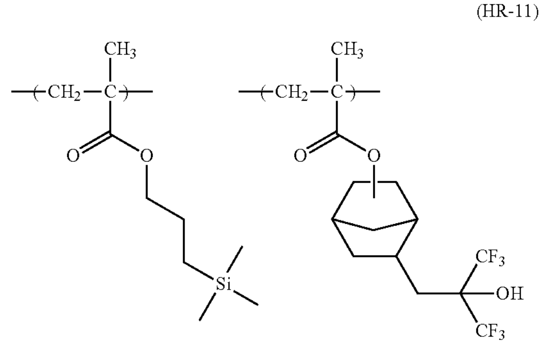

-continued
(HR-12)
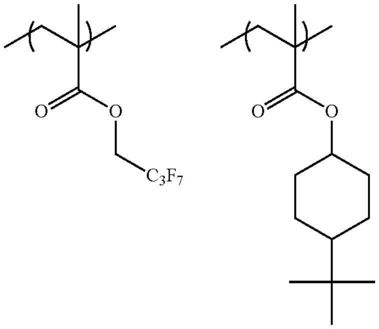
(HR-13)
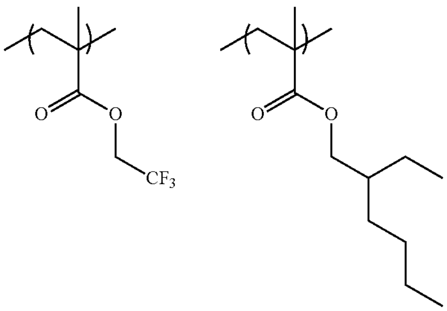
(HR-14)
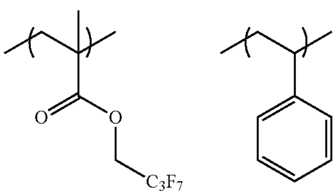
(HR-15)
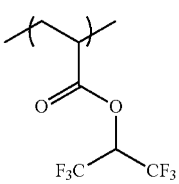
(HR-16)
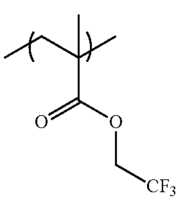
(HR-17)
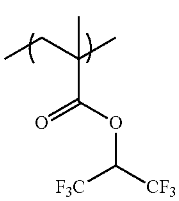
-continued
(HR-18)
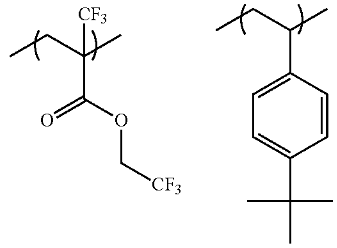
(HR-19)
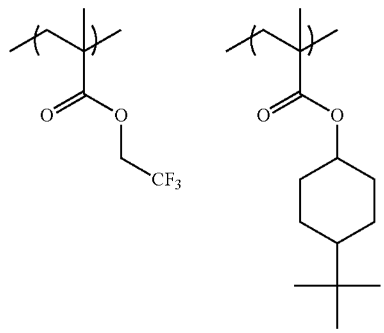
(HR-20)
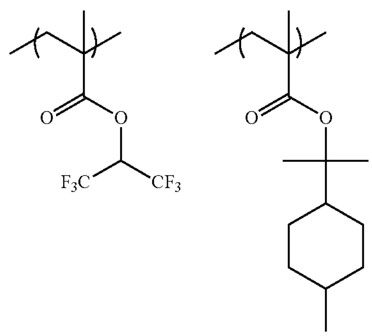
(HR-21)
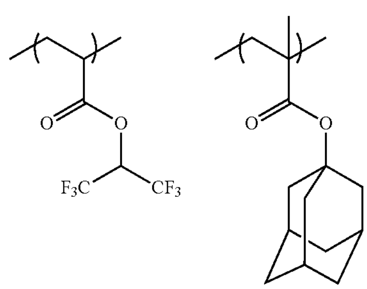
(HR-22)
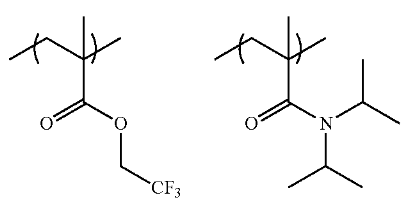

-continued
(HR-23)
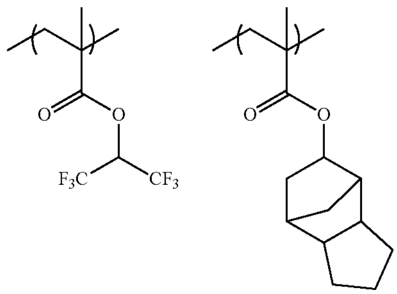
(HR-24)
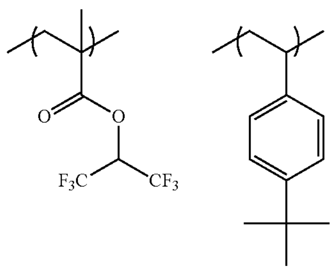
(HR-25)
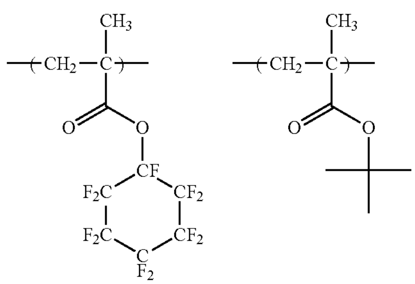
(HR-26)
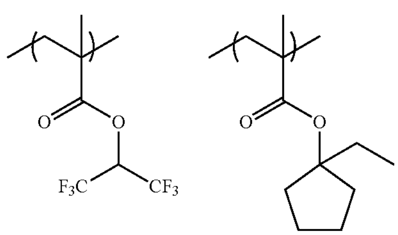
(HR-27)
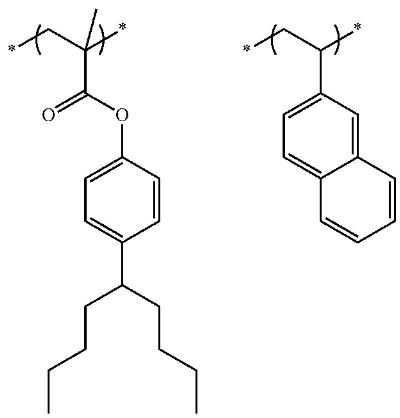
-continued
(HR-28)
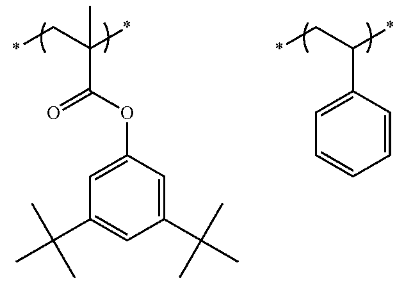
HR-29
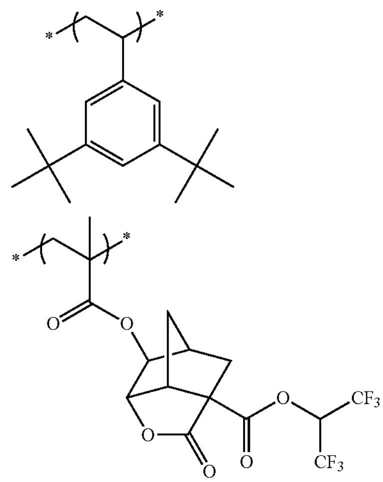
HR-30
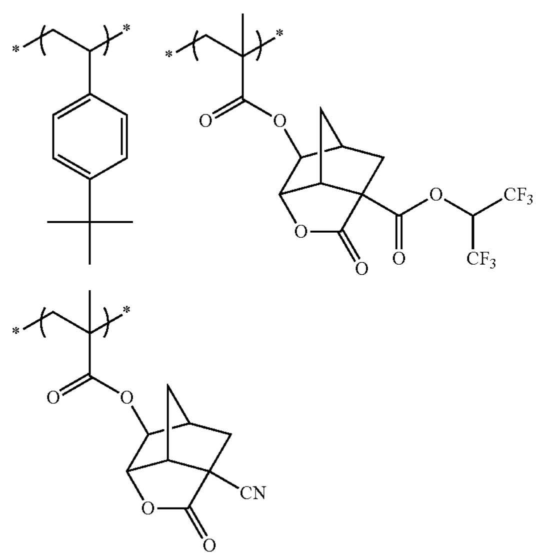
HR-31
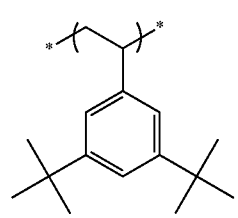

-continued

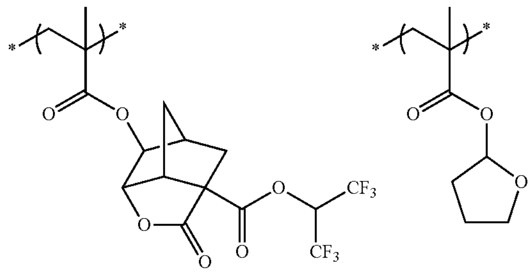

HR-32

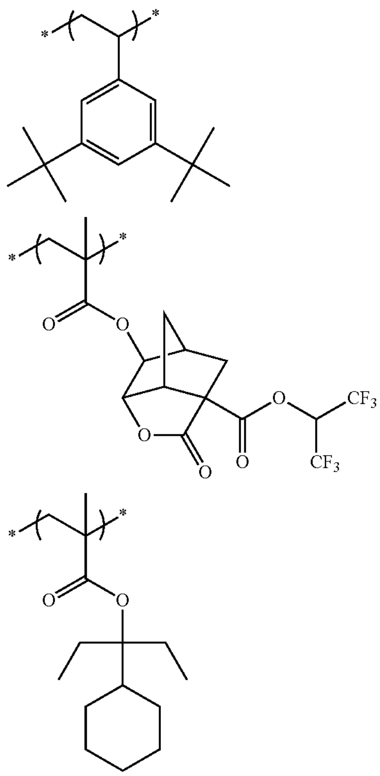

HR-33

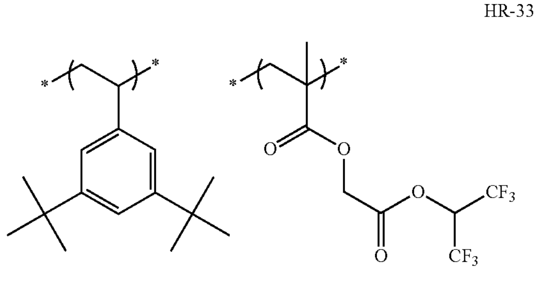

HR-34

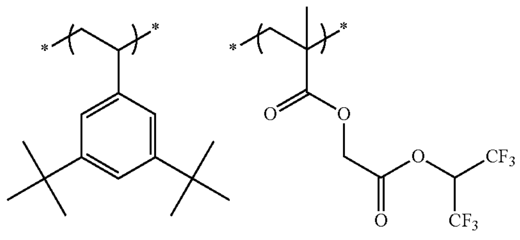

-continued

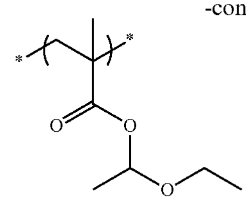

In addition to the above hydrophobic resins, the hydrophobic resins described in JP2011-248019A, JP2010-175859A, or JP 2012-032544A can also be preferably used.

(F) Surfactant

The composition according to the present invention may further include the surfactant (F). By containing a surfactant, in a case where an exposure light source having a wavelength of 250 nm or less is used, in particular, 220 nm or less, a pattern having smaller adhesion and development defect can be formed with a favorable sensitivity and resolution.

As the surfactant, a fluorine-based surfactant and/or a silicon-based surfactant is particularly preferable.

Examples of the fluorine-based surfactant and/or the silicon-based surfactant include surfactants described in paragraph "0276" in the specification of US2008/0248425A. In addition, F Top EF301 or EF303 (manufactured by Shin-Akita Kasei Co., Ltd.); Fluorad FC430, 431, or 4430 manufactured by Sumitomo 3M Ltd.); Megafac F171, F173, F176, F189, F113, F110, F177, F120, or R08 (manufactured by DIC Corporation); Surflon S-382, SC101, 102, 103, 104, 105, or 106 manufactured by Asahi Glass Co., Ltd.); Troysol S-366 (manufactured by Troy Chemical Corp.); GF-300 or GF-150 (manufactured by Toagosei Chemical Industry Co., Ltd.), Surflon S-393 (manufactured by AGC Seimi Chemical Co., Ltd.); Eftop EF121, EF122A, EF122B, RF122C, EF125M, EF135M, EF351, EF352, EF801, EF802, or EF601 ((manufactured by Jemco Co., Ltd); PF636, PF656, PF6320, or PF6520 (manufactured by OMNOVA Solutions Inc.); or FTX-204G, 208G, 218G, 230G, 204D, 208D, 212D, 218D, or 222D (manufactured by Neos Company Limited) may be used. Moreover, a polysiloxane polymer KP-341 (manufactured by Shin-Etsu Chemical Co., Ltd.) can also be used as a silicon-based surfactant.

In addition, in addition to the known surfactants as described above, the surfactant may be synthesized using a fluoroaliphatic compound prepared by a telomerization method (also referred to as a telomer method) or an oligomerization method (also referred to as an oligomer method). Specifically, a polymer having a fluoroaliphatic group derived from the fluoroaliphatic compound may be used as a surfactant. The fluoroaliphatic compound can be synthesized by the method described in JP2002-90991A.

As the polymer having a fluoroaliphatic group, a copolymer of a monomer having a fluoroaliphatic group and (poly(oxyalkylene))acrylate or methacrylate and/or (poly(oxyalkylene))methacrylate is preferable, and the polymer may be irregularly distributed, or may be a block copolymer.

Examples of the poly(oxyalkylene) group include a poly(oxyethylene) group, a poly(oxypropylene) group, and a poly(oxybutylene) group. In addition, the poly(oxyalkylene) group may be a unit having alkylenes having different chain lengths in the same chain, such as poly(block connector of oxyethylene oxypropylene and oxyethylene) and poly(block connector of oxyethylene and oxypropylene).

Furthermore, a copolymer of a monomer having a fluoroaliphatic group and (poly(oxyalkylene))acrylate or methacrylate may be a ternary or higher compound system copolymer formed by copolymerizing a monomer having two or more types of fluoroaliphatic group and two or more types of (poly(oxyalkylene))acrylate or methacrylate at the same time.

For example, examples of a commercially available surfactant include Megafac F178, F-470, F-473, F-475, F-476, and F-472 (manufactured by DIC Corporation). Furthermore, examples of a commercially available surfactant include a copolymer of acrylate or methacrylate having a $C_6F_{13}$ group and (poly(oxyalkylene))acrylate or methacrylate, a copolymer of acrylate or methacrylate having a $C_6F_{13}$ group, (poly(oxyethylene))acrylate or methacrylate, and (poly(oxypropylene))acrylate or methacrylate, a copolymer of acrylate or methacrylate having a C8F17 group and (poly(oxyalkylene))acrylate or methacrylate, and a copolymer of acrylate or methacrylate having a C8F17 group, (poly(oxyethylene))acrylate or methacrylate, and (poly(oxypropylene))acrylate or methacrylate.

In addition, surfactants other than the fluorine-based surfactant and/or the silicon-based surfactant described in paragraph "0280" in the specification of US2008/0248425A may be used.

These surfactants may be used alone or in combination of two or more types thereof.

In a case where the composition according to the present invention includes a surfactant, the content thereof is preferably 0% by mass to 2% by mass, more preferably 0.0001% by mass to 2% by mass, and still more preferably 0.0005% by mass to 1% by mass, based on the total solid content of the composition.

(G) Other Additives

The composition according to the present invention may further include a compound (for example, a phenol compound having a molecular weight of 1000 or less, or an alicyclic or aliphatic compound including a carboxy group) promoting solubility with respect to a dissolution inhibiting compound, a dye, a plasticizer, a photosensitizer, a light absorber, and/or a developer.

The composition according to the present invention may further include a dissolution inhibiting compound. Here, the "dissolution inhibiting compound" is a compound having a molecular weight of 3000 or less, which decreases the degree of solubility in an organic-based developer by being decomposed due to the action of an acid.

As the dissolution inhibiting compound, an alicyclic or aliphatic compound which contains an acid-decomposable group such as a cholic acid derivative which includes an acid-decomposable group described in the Proceedings of SPIE, 2724, 355 (1996) is preferable since the transparency with respect to light having a wavelength of 220 nm or less is not reduced. Examples of the acid-decomposable group and the alicyclic structure include the same as those exemplified above.

In a case where the resist composition according to the present invention is exposed to a KrF excimer laser or irradiated with an electron beam, the dissolution inhibiting compound is preferably a compound including a structure where the phenolic hydroxyl group of a phenol compound is substituted with an acid-decomposable group. As the phenol compound, a compound containing 1 to 9 phenol skeletons is preferable and a compound containing 2 to 6 phenol skeletons is more preferable.

In a case where the composition according to the present invention includes a dissolution inhibiting compound, the amount is preferably 3% by mass to 50% by mass, and more preferably 5% by mass to 40% by mass, based on the total solid content of the composition.

Specific examples of the dissolution inhibiting compound are described below.

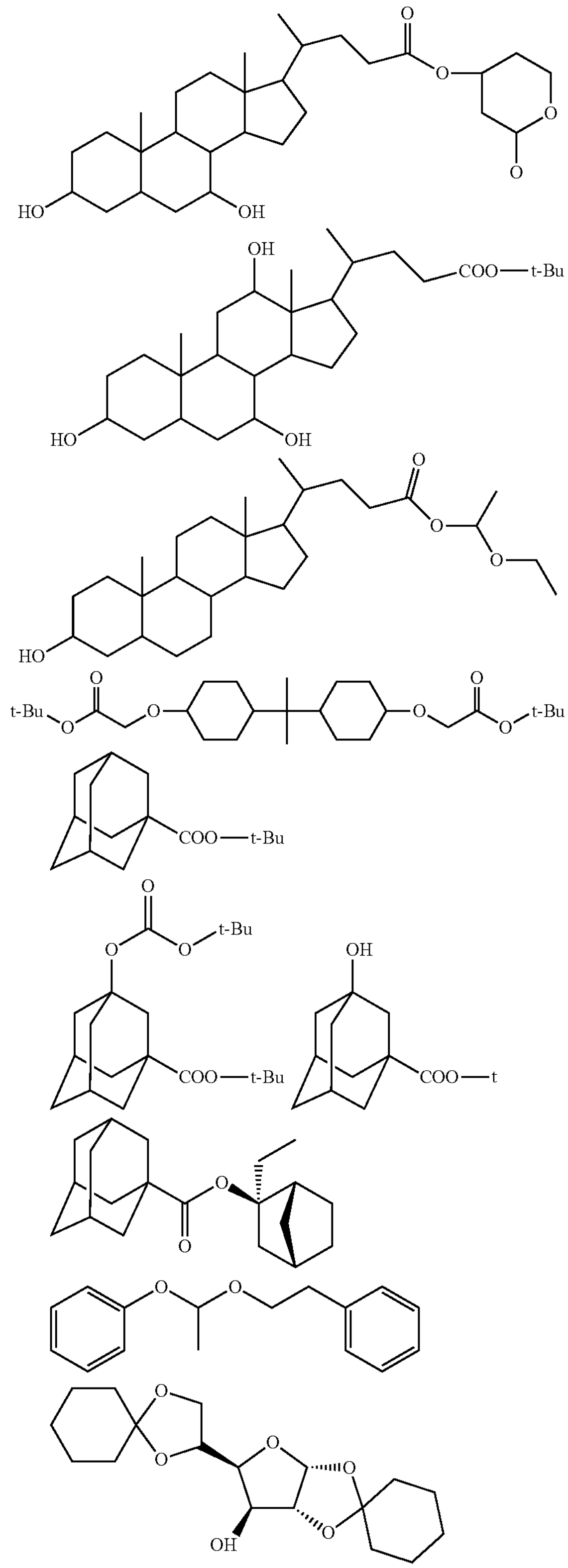

The phenol compound having a molecular weight of 1000 or less can be easily synthesized by referencing, for example, JP1992-122938A (JP-H04-122938A), JP1990-28531A (JP-H02-28531A), US4,916,210A, and EP219294B.

Examples of the alicyclic or aliphatic compound including a carboxy group include carboxylic acid derivatives including a steroid structure, such as chloic acid, deoxycholic acid, and lithocholic acid, adamantane carboxylic acid derivatives, adamantane dicarboxylic acid, cyclohexanecarboxylic acid, and cyclohexanedicarboxylic acid.

EXAMPLES

Hereinbelow, the present invention will be described in further detail using examples, but the content of the invention is not limited by this.

<A. Resin>

Synthesis Example 1

Synthesis of Resin (P-3)

(Synthesis of Chloroether Compound)

30.0 g of pivalaldehyde, 44.36 g of trimethyl orthofomate, and 809 mg of camphorsulfonic acid were added to a 300 mL egg-plant shaped flask, followed by stirring at 25° C. for 1 hour. Next, the reaction liquid was cooled in an ice water bath, and 27.34 g of acetyl chloride and then 5 mg of zinc chloride were added thereto. After the resultant product was allowed to react for 3 hours, the unreacted acetyl chloride was distilled off under reduced pressure, whereby a solution including a chloroether compound 1 was obtained. The composition of the obtained solution was determined by NMR as described below. The chloroether compound 1 (70.4% by mass), the acetal compound 1 (8.4% by mass), and methyl acetate (21.2% by mass).

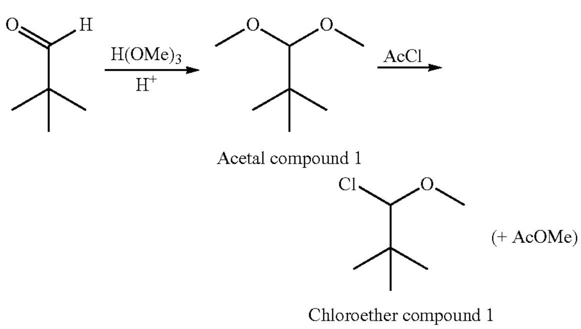

(Synthesis of Resin (P-1M))

10.0 g of poly(p-hydroxystyrene) (VP-2500, manufactured by NIPPON SODA CO., LTD.) as a phenolic compound was dissolved in 60 g of tetrahydrofuran (THF), and 8.85 g of triethylamine was added thereto, followed by stirring in an ice water bath. The chloroether compound 1 (4.04 g) obtained as above was added dropwise to the reaction liquid and stirred for 4 hours. Thereafter, distilled water was added to stop the reaction. The reactant was dissolved in ethyl acetate by distilling off THF under reduced pressure. After the obtained organic layer had been washed 5 times using distilled water, the organic layer was added dropwise to 1.0 L of hexane. After the obtained precipitate was filtered off and washed using a small amount of hexane, the precipitate was dissolved in 35 g of propylene glycol monomethyl ether acetate (PGMEA). A low-boiling point solvent was removed from the obtained solution by using an evaporator, whereby 43.7 g of a PGMEA solution (24.0% by mass) of a resin (P-1M) was obtained.

Regarding the obtained resin (P-1M), a weight average molecular weight (Mw: in terms of polystyrene) and dispersity (Mw/Mn, hereinafter, also referred to as "PDI") of the resin (P-1M) were calculated by GPC (solvent: THF) measurement, and 4200, as the weight average molecular weight, and 1.14, as the dispersity, were obtained. In addition, a $^1$H-NMR measurement was performed by the following method, and as the compositional ratio (molar ratio) of the resin (P-1M), x:y=69:31 was obtained.

($^1$H-NMR Measurement Method)

0.5 g of PGMEA solution of the resin (P-1M) was diluted with 1.5 ml of ethyl acetate and 0.5 ml of triethylamine and added dropwise to 50 g of hexane, and the produced precipitate was filtered off and dried. 75 mg of the obtained powder was dissolved in 1.1 g of DMSO-d$^6$, and a $^1$H-NMR measurement was performed on the obtained solution.

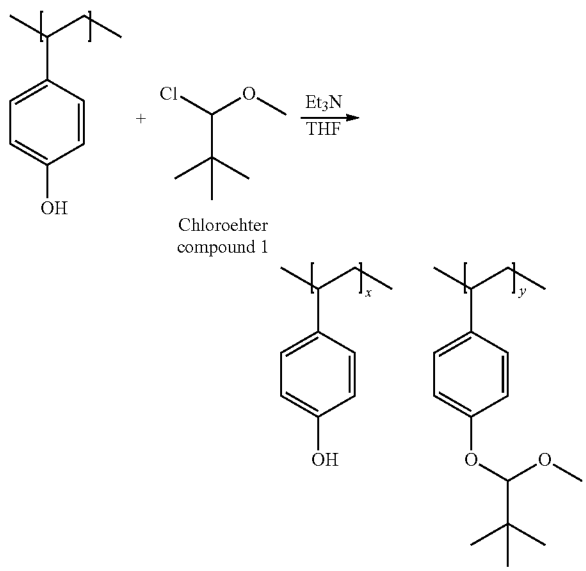

(P-1M)

Using the synthesized resin (P-1M), the following syntheses were further performed.

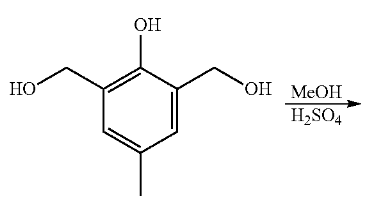

(1a-1)

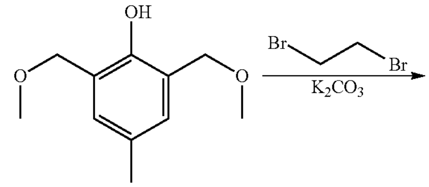

(1a-2)

-continued

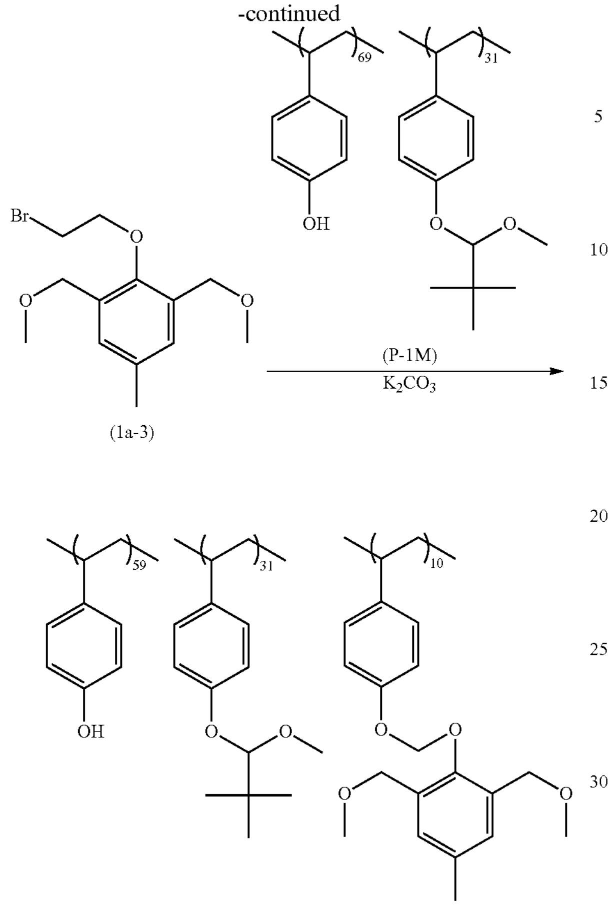

P-3

(Synthesis of Compound (1*a*-2))

35 g of 2,6-bis(hydroxymethyl)-p-cresol (1*a*-1) manufactured by Tokyo Chemical Industry Co., Ltd. was dissolved in 400 mL of methanol. 3.6 g of 45% sulfuric acid aqueous solution was added thereto, followed by stirring at 50° C. for 5 hours. After the reaction ended, the temperature of the reaction liquid was returned to room temperature, and then, while stirring the reaction liquid in an ice bath, sodium carbonate was added thereto, and the resultant product was filtered using Celite. The filtrate was concentrated, and then, was transferred to a separatory funnel. 200 mL of distilled water and 200 mL of ethyl acetate were added thereto, then, extraction was performed, and the aqueous layer was removed. Thereafter, the organic layer was washed 5 times with 200 mL of distilled water, and the organic layer was concentrated, whereby 37 g of a compound (1*a*-2) was obtained.

(Synthesis of Compound (1*a*-3))

20 g of the compound (1*a*-2) synthesized above was dissolved in 200 mL of dimethyl sulfoxide. 38.3 g of dibromoethane and 16.9 g of potassium carbonate were added thereto, followed by stirring at 40° C. for 4 hours. After the reaction ended, the temperature of the reaction liquid was returned to room temperature, and 100 mL of ethyl acetate and 100 mL of distilled water were added thereto. The reaction liquid was transferred to a separating funnel, and the aqueous layer was removed. Thereafter, the organic layer was washed 5 times with 200 mL of distilled water, and the organic layer was concentrated. The concentrate was purified by silica gel column chromatography (eluent: hexane/ethyl acetate (volume ratio)=20/1), then, the solvent was distilled off under reduced pressure, and vacuum drying was performed on the resultant product, whereby 24.7 g of a compound (1*a*-3) was obtained.

(Synthesis of Resin P-3)

6.3 g of the resin (P-1M) synthesized above was dissolved in 30 g of dimethyl sulfoxide. 1.7 g of potassium carbonate and 2 g of the compound (1*a*-3) synthesized above were added thereto in this order, followed by stirring at 60° C. for 2 hours. After the reaction ended, the temperature of the reaction liquid was returned to room temperature, and 50 mL of ethyl acetate and 50 mL of distilled water were added thereto. The reaction liquid was transferred to a separating funnel, and the aqueous layer was removed. Thereafter, the organic layer was washed 5 times with 50 mL of distilled water, and the product obtained by concentrating the organic layer was added dropwise to 500 mL of hexane. After filtration was performed, the powder was collected, and vacuum-dried, whereby 5.4 g of a resin (P-3) including the repeating unit described above was obtained. In the same manner as the method used in the synthesis of the resin (P-1M), 59:31:10, as the compositional ratio (molar ratio) of the resin (P-3), 6100, as Mw, and 1.16, as the dispersity, were obtained.

Synthesis Example 2

Synthesis of Resin (P-12)

10.00 g of p-acetoxystyrene was dissolved in 40 g of ethyl acetate, then, the mixture was cooled to 0° C., and 4.76 g of sodium methoxide (28% by mass methanol solution) was added dropwise thereto over 30 minutes, followed by stirring at room temperature for 5 hours. After ethyl acetate was added thereto, the organic layer was washed with distilled water three times, then, dried over anhydrous sodium sulfate, and the solvent was distilled off, whereby 13.17 g of p-hydroxystyrene (a compound represented by the following Formula (1), a 54% by mass ethyl acetate solution) was obtained. 6.66 g (in which 3.6 g of p-hydroxystyrene (1) was contained) of the 54% by mass ethyl acetate solution of the obtained p-hydroxystyrene (1), 14.3 g of the compound represented by the following Formula (2) (manufactured by KNC Laboratories Co., Ltd.), 2.2 g of the compound represented by the following Formula (3) (manufactured by Daicel Corporation), and 2.74 g of a compound represented by the following Formula (4) and 2.3 g of a polymerization initiator V-601 (manufactured by Wako Pure Chemical Industries, Ltd.) were dissolved in 14.2 g of propylene glycol monomethyl ether (PGME). 3.6 g of PGME was put into a reaction vessel, and the solution adjusted to 85° C. in advance was added dropwise thereto over a period of 4 hours in a nitrogen gas atmosphere. The reaction solution was heated and stirred for 2 hours, and cooled to room temperature. The obtained reaction solution was added dropwise to 889 g of a mixed solution of hexane/ethyl acetate (8/2 (mass ratio)) to precipitate, and the precipitate was filtered, whereby 15.6 g of a resin (P-12) was obtained.

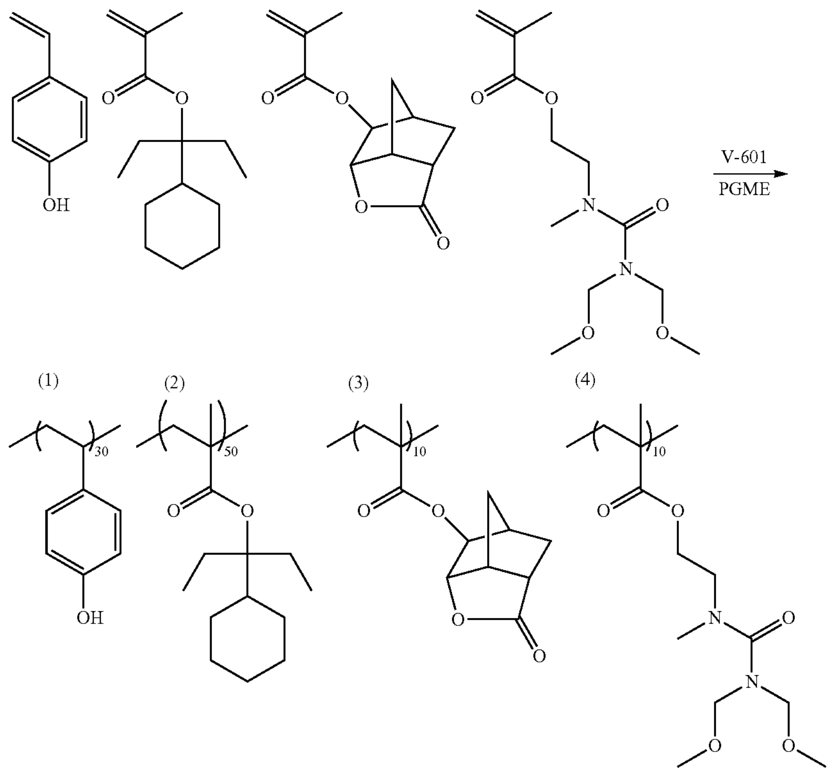

P-12

The weight average molecular weight (Mw: in terms of polystyrene) of the obtained resin obtained from GPC (carrier: N-methylpyrrolidone (NMP)) was Mw=12000, and the dispersity was Mw/Mn=1.55. The compositional ratio (molar ratio) of P-12 measured by $^{13}$C-NMR was 30:50:10:10.

Hereinafter, in the same manner as in Synthesis Examples 1 and 2, or the method described in JP2013-11866A, resins (P-1), (P-2), (P-4) to (P-11), and (P-13) to (P-35) were synthesized. Hereinafter, the polymer structures, weight average molecular weights (Mw), and dispersities (Mw/Mn) of the resins P-1 to P-35 are shown. In addition, the compositional ratio of each repeating unit of the following polymer structures is shown in a molar ratio.

P-1

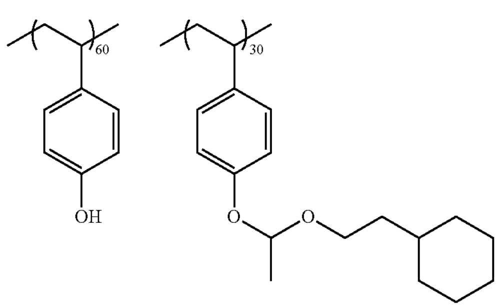

-continued

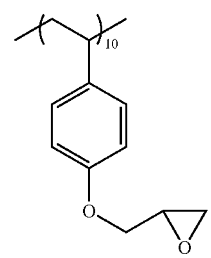

Mw: 4600
Mw/Mn: 1.20

P-2

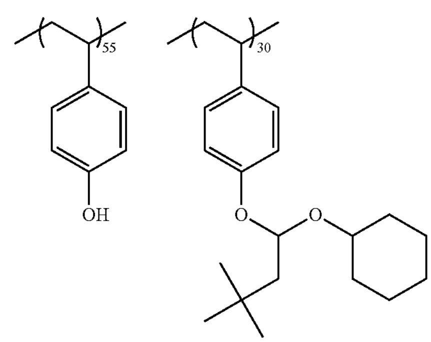

-continued
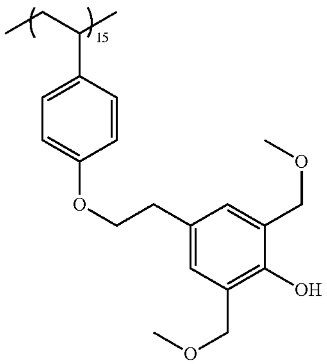
Mw: 6800
Mw/Mn: 1.17
P-3
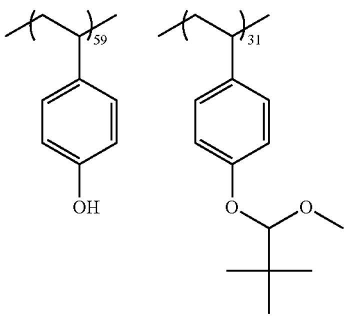
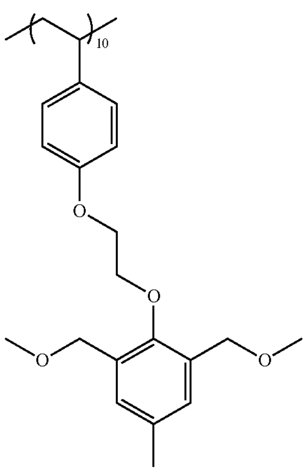
Mw: 6100
Mw/Mn: 1.16
P-4
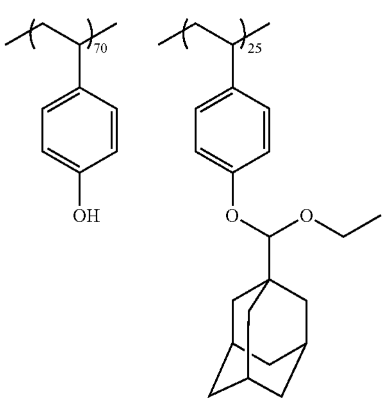
-continued
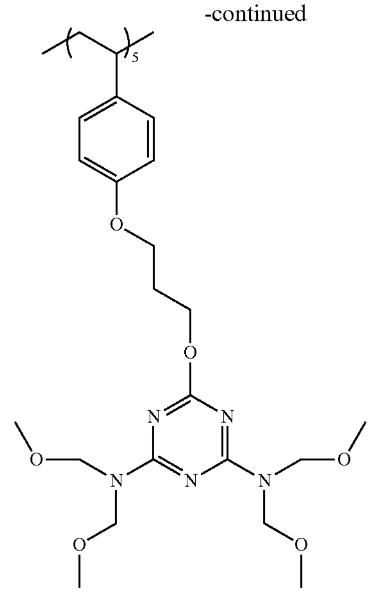
Mw: 10500
Mw/Mn: 1.22
P-5
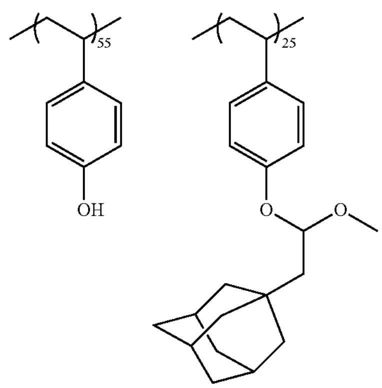
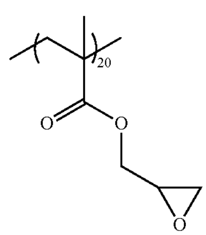
Mw: 8700
Mw/Mn: 1.58
P-6
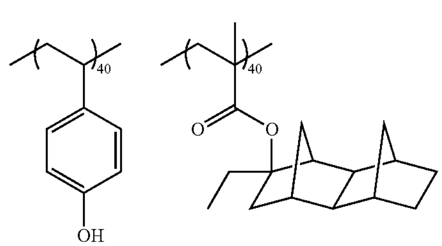

-continued
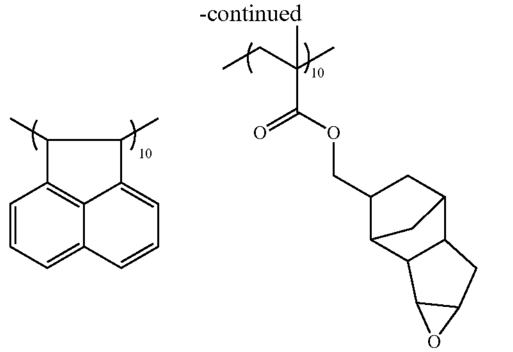
Mw: 25000
Mw/Mn: 1.68
P-7
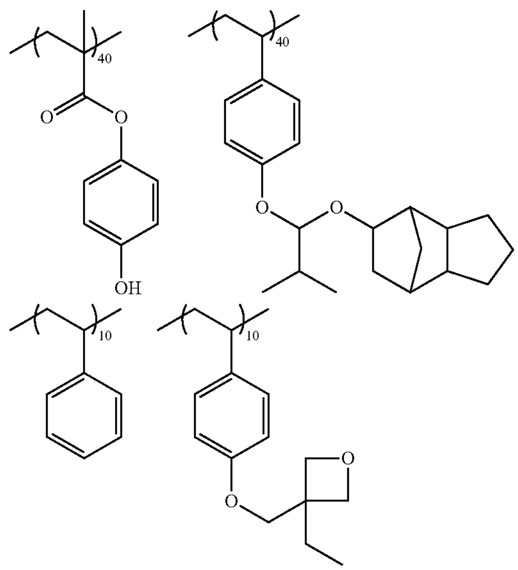
Mw: 12200
Mw/Mn: 1.84
P-8
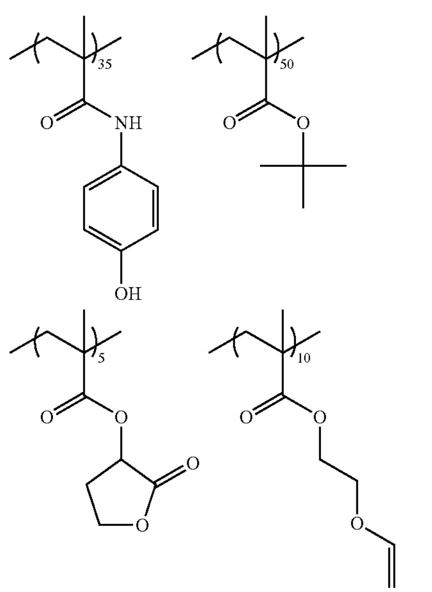
Mw: 18000
Mw/Mn: 1.57
-continued
P-9
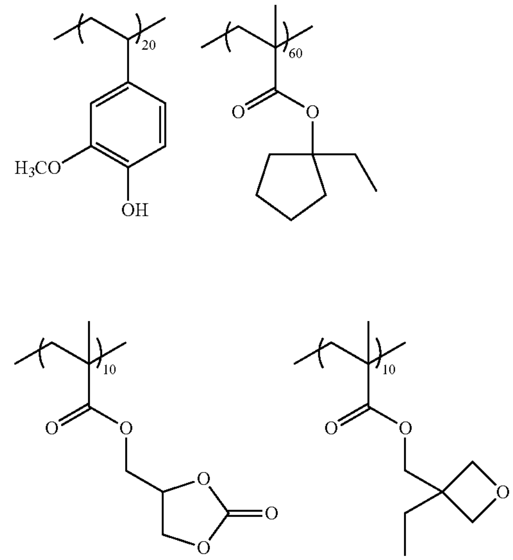
Mw: 14100
Mw/Mn: 1.85
P-10
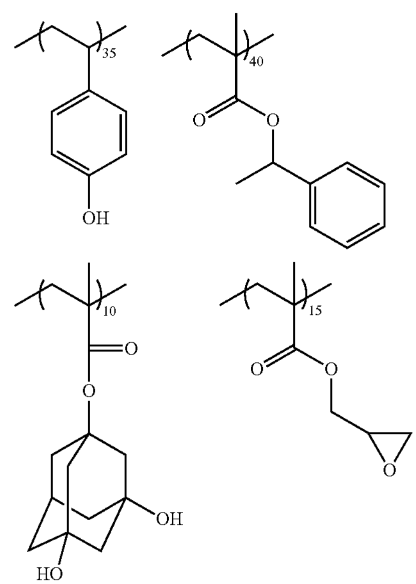
Mw: 15000
Mw/Mn: 1.74
P-11
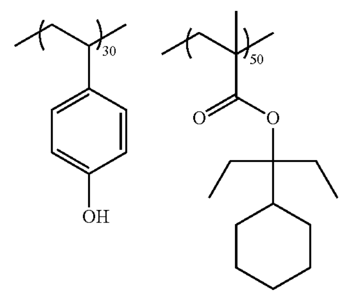

-continued
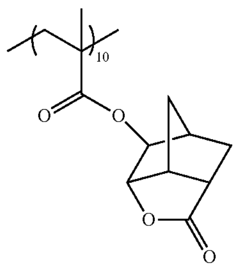
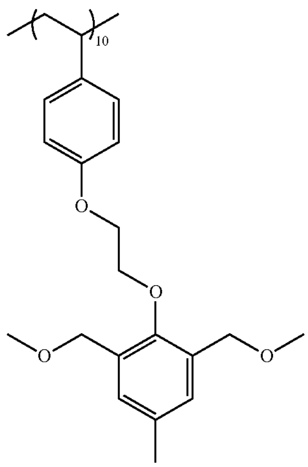
Mw: 12000
Mw/Mn: 1.49
P-12
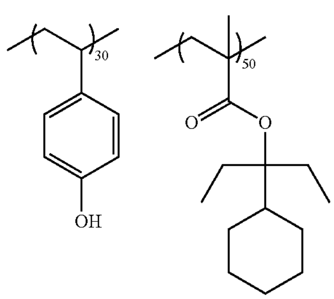
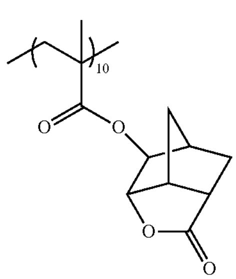
-continued
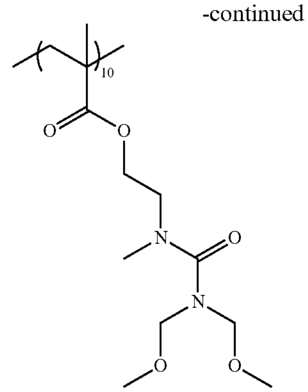
Mw: 12000
Mw/Mn: 1.55
P-13
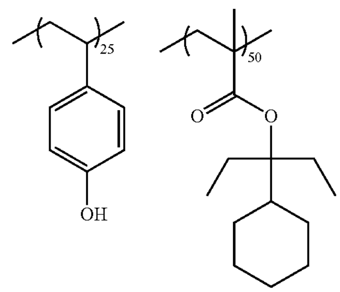
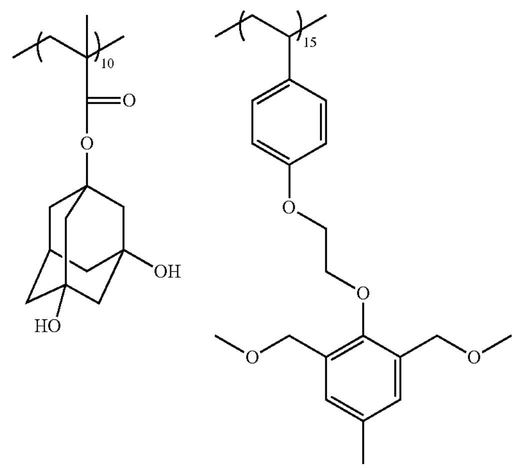
Mw: 17000
Mw/Mn: 1.57
P-14
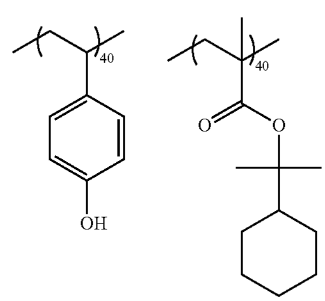

-continued
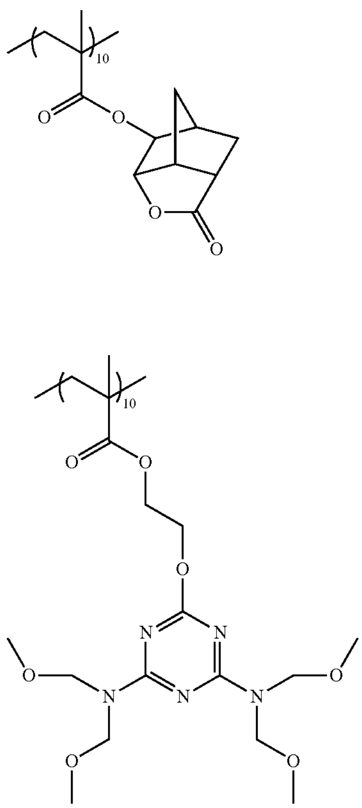
Mw: 13500
Mw/Mn: 1.68
P-15
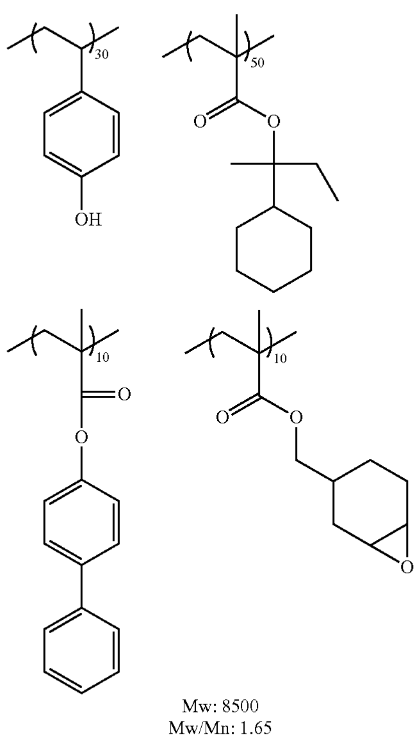
Mw: 8500
Mw/Mn: 1.65
-continued
P-16
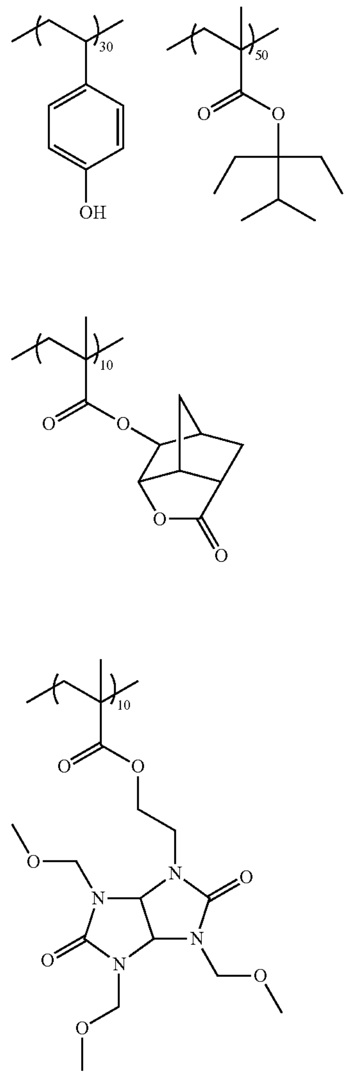
Mw: 10400
Mw/Mn: 1.45
P-17
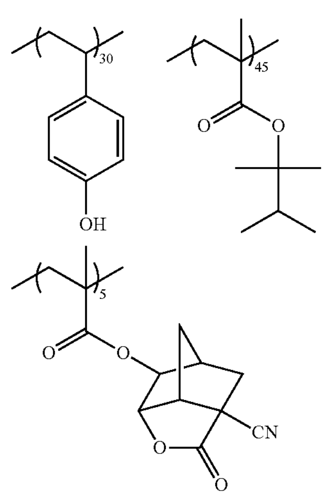

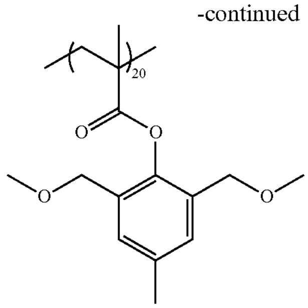
Mw: 16200
Mw/Mn: 1.72
P-18
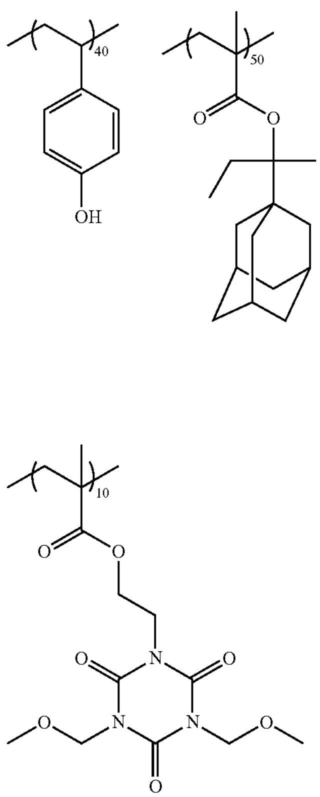
Mw: 6200
Mw/Mn: 1.59
P-19
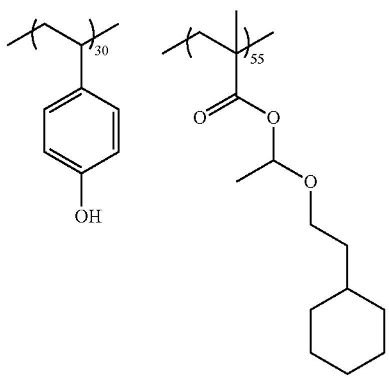
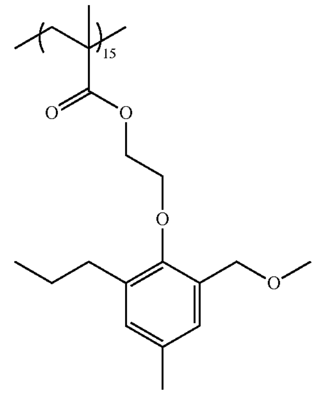
Mw: 9000
Mw/Mn: 1.39
P-20
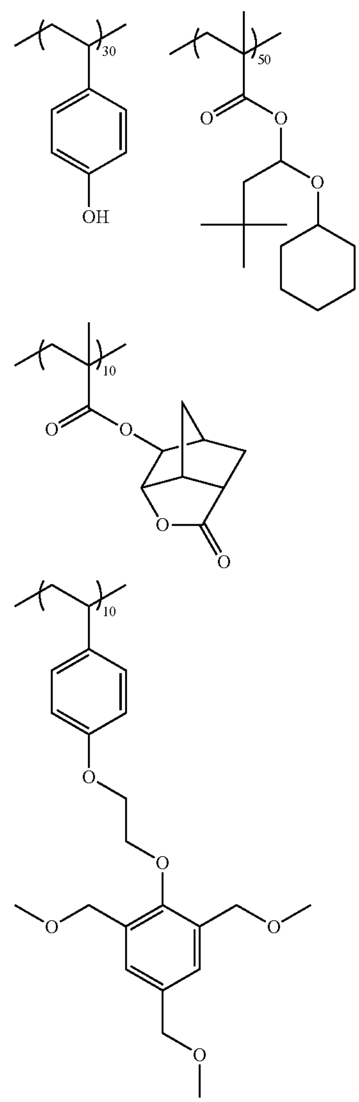
Mw: 11500
Mw/Mn: 1.37

P-21
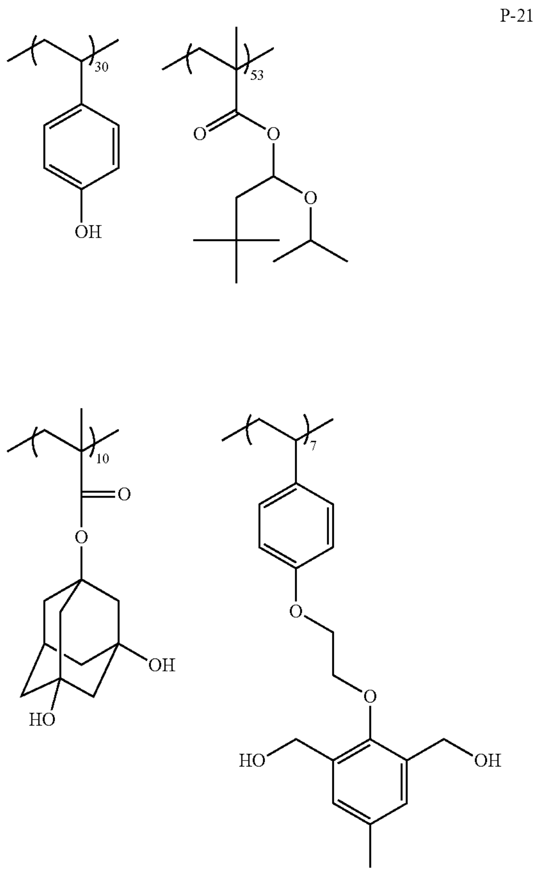
Mw: 14500
Mw/Mn: 1.48
P-22
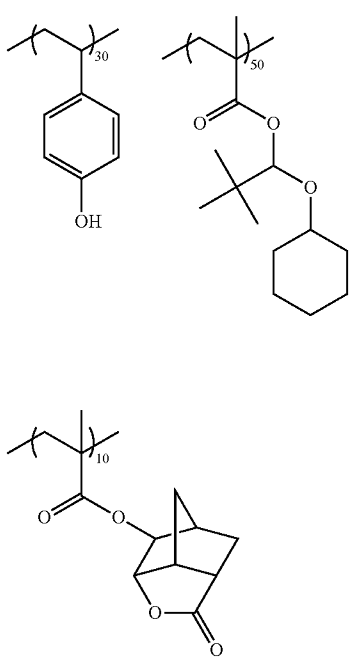
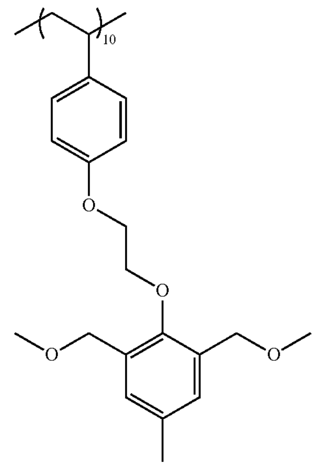
Mw: 13000
Mw/Mn: 1.47
P-23
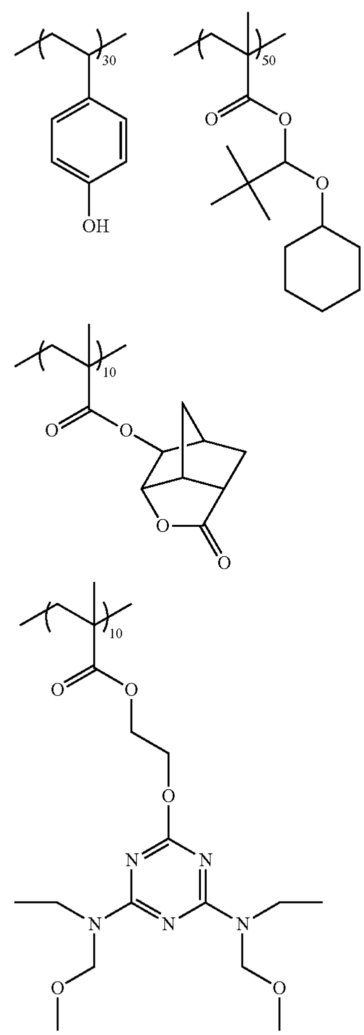
Mw: 13500
Mw/Mn: 1.48

-continued
P-24
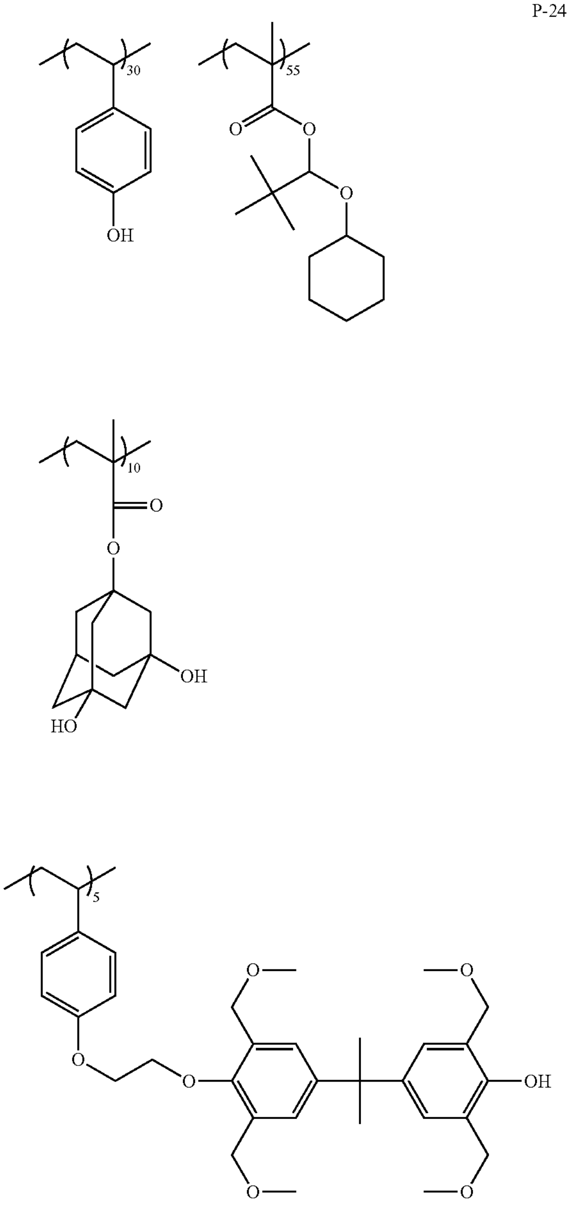
Mw: 12000
Mw/Mn: 1.52
P-25
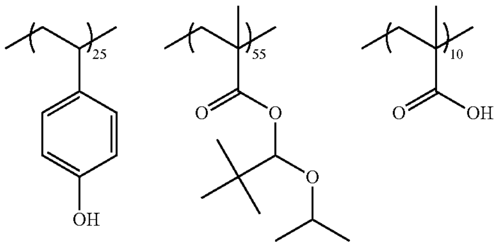
-continued
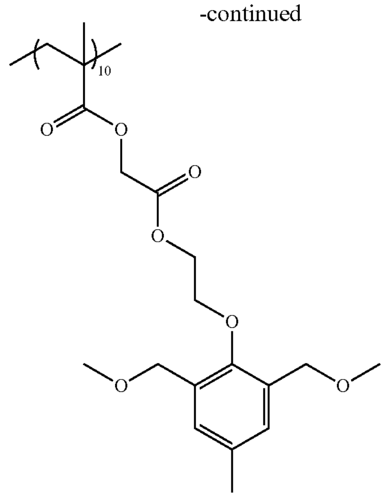
Mw: 14000
Mw/Mn: 1.45
P-26
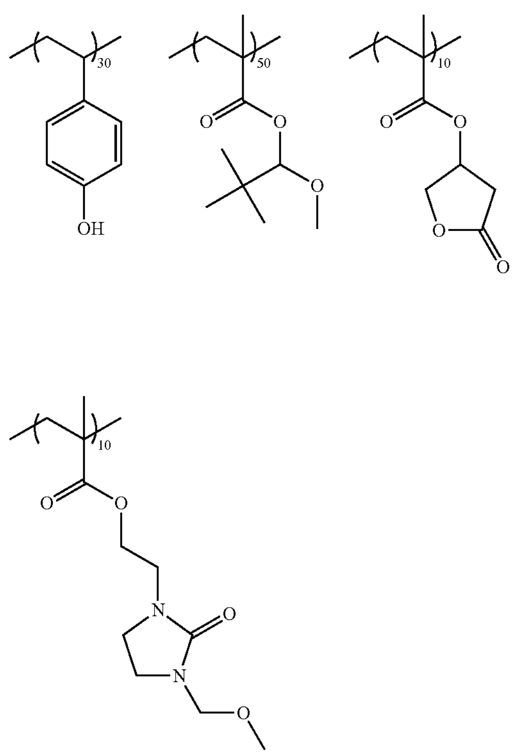
Mw: 10500
Mw/Mn: 1.44
P-27
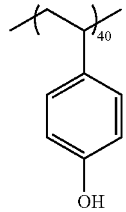

-continued
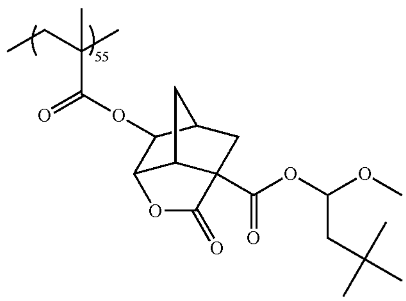
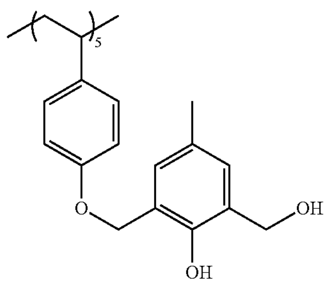
Mw: 9500
Mw/Mn: 1.52
P-28
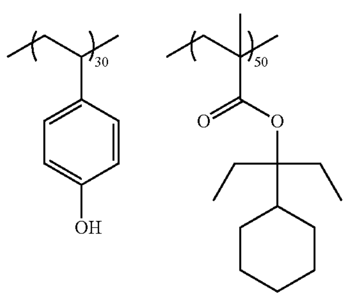
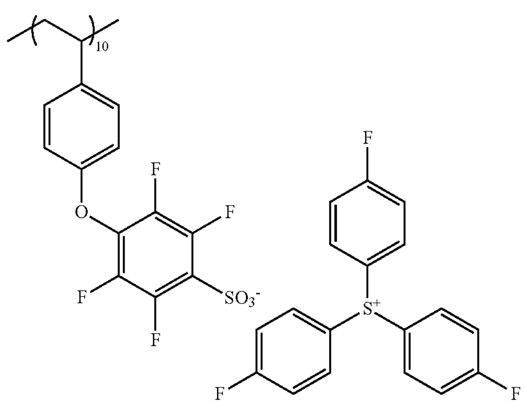
-continued
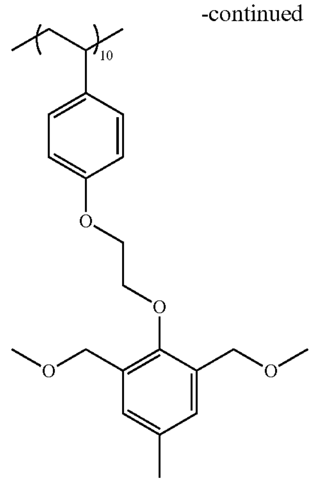
Mw 9400
Mw/Mn = 1.49
P-29
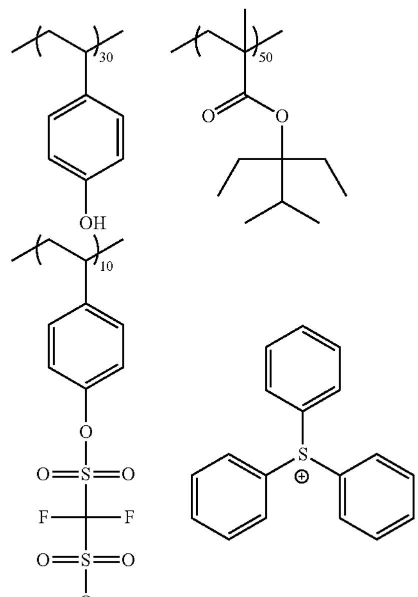
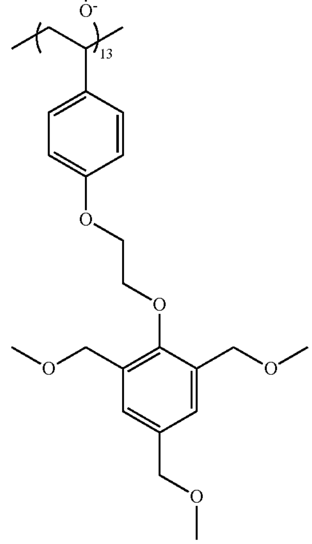
Mw10300
Mw/Mn - 1.54

-continued
P-30
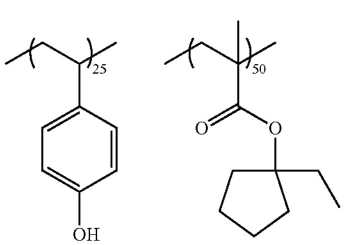
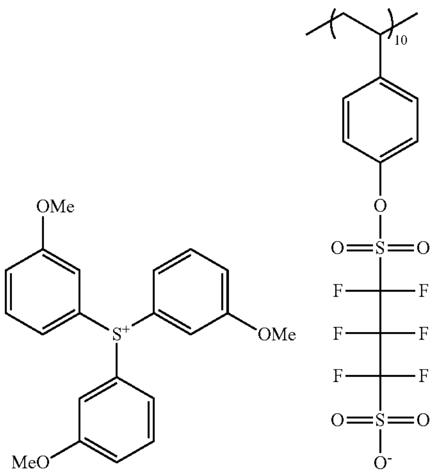
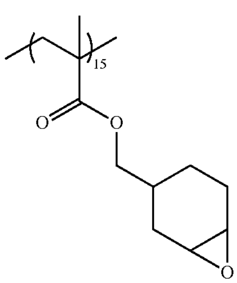
Mw 22000
Mw/Mn - 1.79
-continued
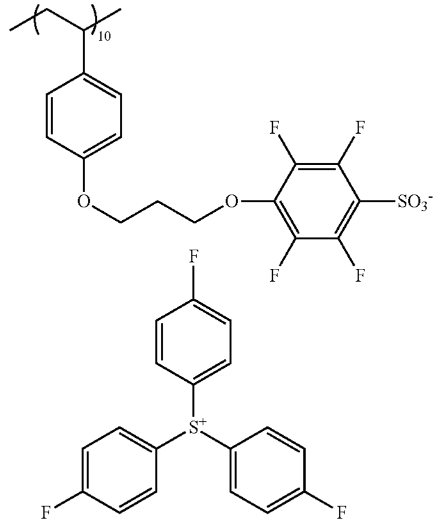
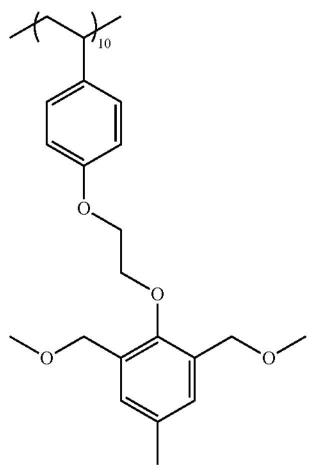
Mw 12000
Mw/Mn - 1.60
P-31
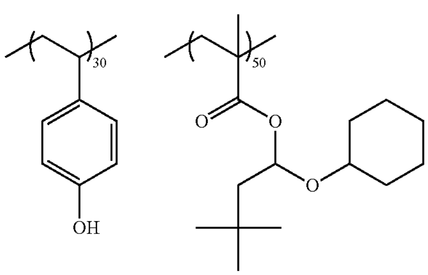
P-32
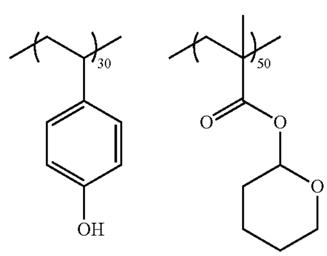

-continued
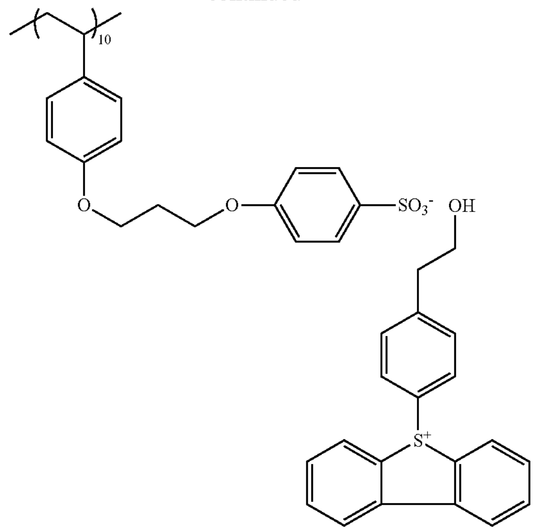
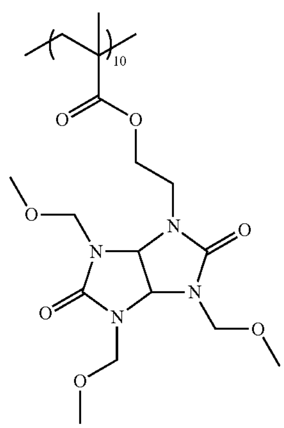
Mw 16000
Mw/Mn - 1.67
P-33
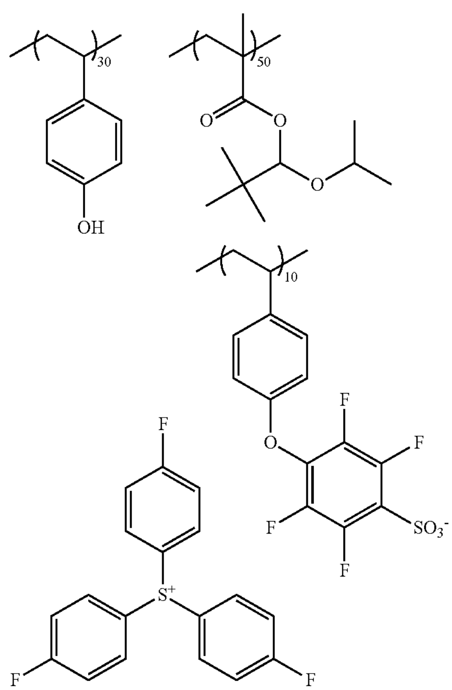
-continued
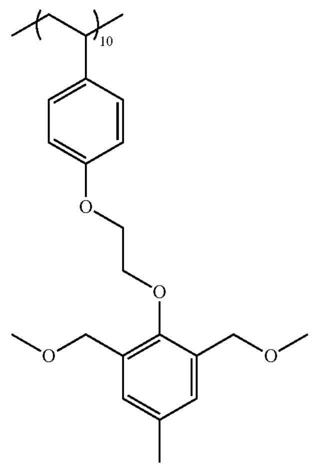
Mw 12800
Mw/Mn = 1.57
P-34
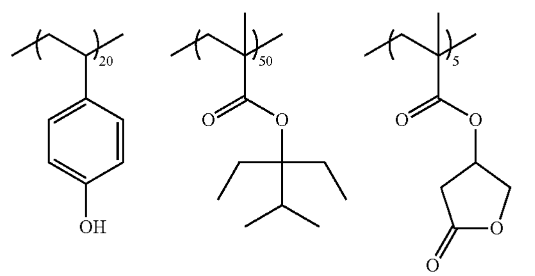
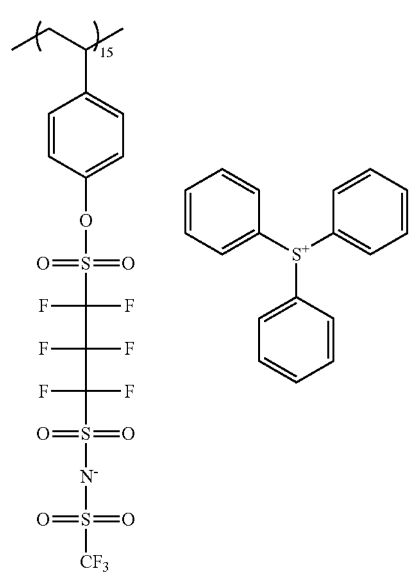

-continued
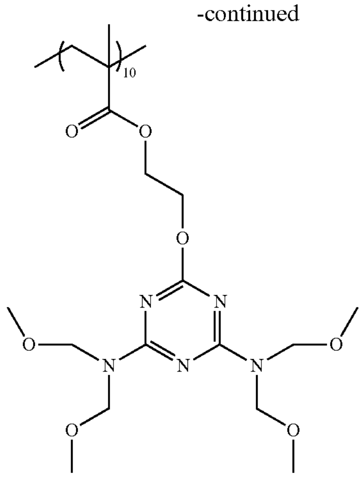
Mw 11500
Mw/Mn = 1.48
P-35
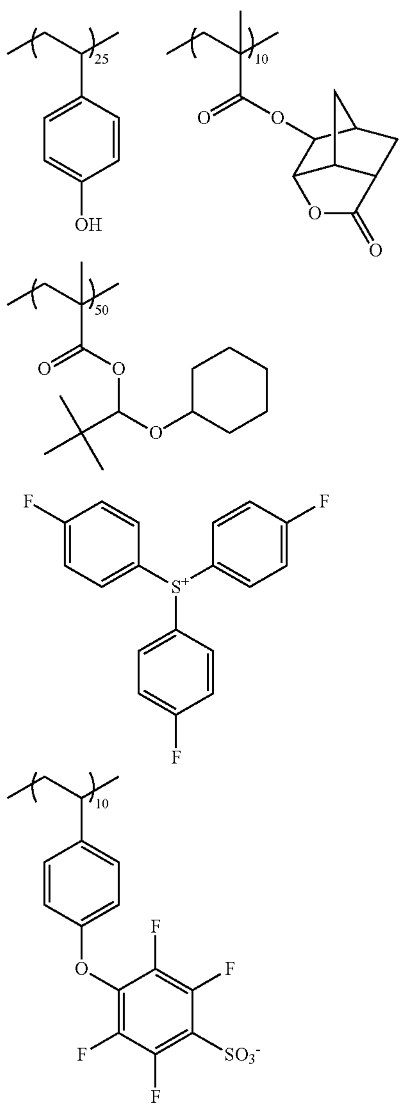
-continued
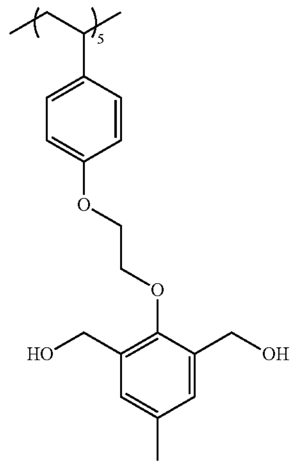
Mw 8800
Mw/Mn = 1.45
<Resin for Comparison>
In Comparative Examples 1-1, 1-3, 1-4, 1-5, 2-1, 2-3, 2-4, and 2-5, the following resins were used. The weight average molecular weight (Mw) and the dispersity (Mw/Mn) of the resin is described below. In addition, the compositional ratio of each repeating unit of the resin is shown in a molar ratio.
CP-1
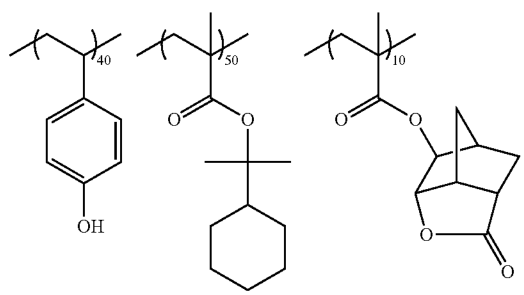
Mw: 14000
Mw/Mn: 1.85
CP-2
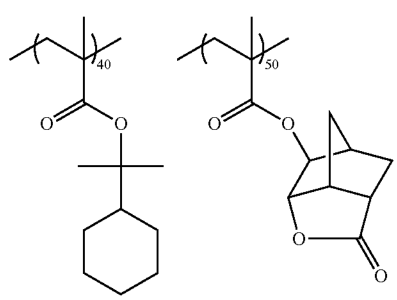

-continued
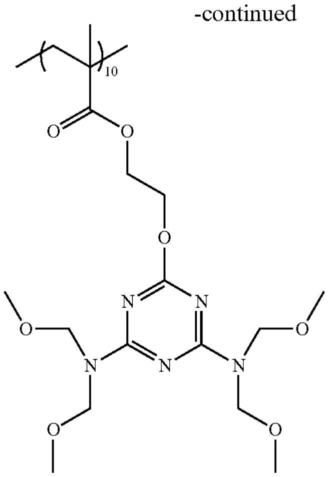
Mw: 13000
Mw/Mn: 1.65
CP-3
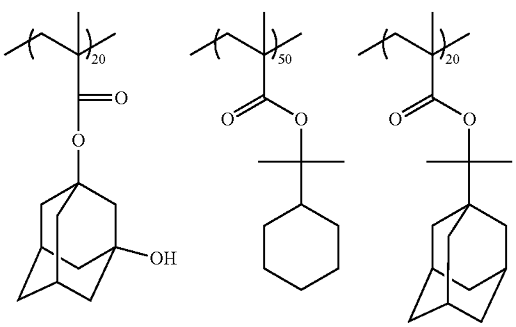
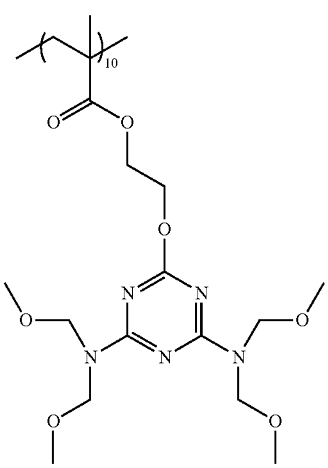
Mw: 13000
Mw/Mn: 1.90
-continued
CP-4
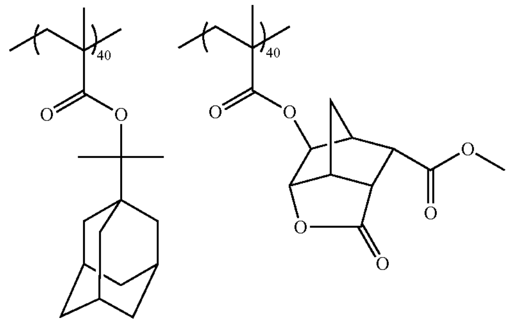
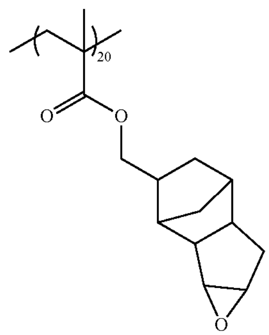
Mw: 7500
Mw/Mn: 1.86
<B. Photoacid Generator>
As a photoacid generator, an acid generator suitably selected from the above described acid generators z1 to z141 was used.
<Basic Compound>
As a basic compound, any of the following Compounds (N-1) to (N-11) was used.
N-1
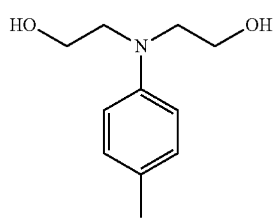
N-2
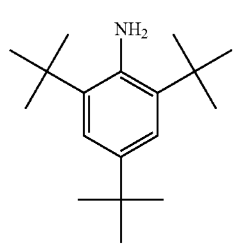

-continued

N-3

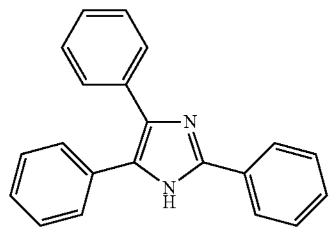

N-4

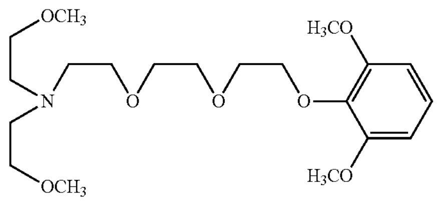

N-5

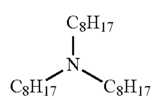

N-6

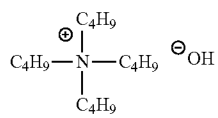

N-7

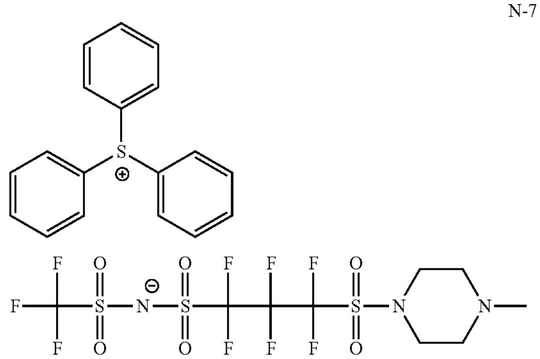

N-8

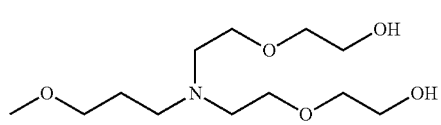

N-9

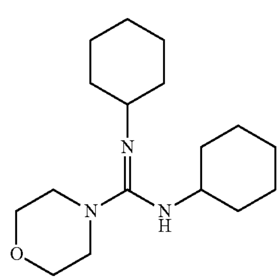

-continued

N-10

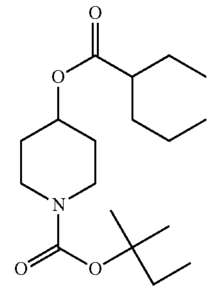

N-11

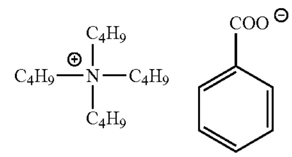

<Surfactant>

As a surfactant, the following W-1 to W-4 were used.

W-1: Megafac R08 (manufactured by DIC Corporation; fluorine-based surfactant or silicon-based surfactant)

W-2: Polysiloxane polymer KP-341 (manufactured by Shin-Etsu Chemical Co., Ltd.; silicon-based surfactant)

W-3: Troysol S-366 (manufactured by Troy Chemical Corp.; fluorine-based surfactant)

W-4: PF6320 (manufactured by OMNOVA Solutions Inc.; fluorine-base surfactant)

<Coating Solvent>

As a coating solvent, the following were used.

S1: propylene glycol monomethyl ether acetate (PGMEA)

S2: propylene glycol monomethyl ether (PGME)

S3: ethyl lactate

S4: cyclohexanone

<Developer>

As a developer, the following were used.

SG-1: anisole

SG-2: methyl amyl ketone (2-heptanone)

SG-3: butyl acetate

TM-1: 2.38% by mass tetramethyl ammonium hydroxide aqueous solution (alkali developer for Comparative Examples)

<Rinse Liquid>

In the case of using a rinse, the followings were used.

SR-1: 2-pentanol

SR-2: 1-hexanol

SR-3: methylisobutylcarbinol

Examples 1-1 to 1-35 and Comparative Examples 1-1 to 1-5 (Electron Beam (EB) Exposure)

(1) Coating Liquid Preparation and Application of Active Light-Sensitive or Radiation-Sensitive Resin Composition A coating liquid composition having the compositional ratio shown in the following table was microfiltered using a membrane filter having a pore size of 0.1 μm, whereby an active light-sensitive or radiation-sensitive resin composition (resist composition) solution having a solid content concentration of 3.5% by mass was obtained.

This active light-sensitive or radiation-sensitive resin composition solution was applied to a 6-inch Si wafer subjected to a hexamethyldisilazane (HMDS) treatment in advance using a spin coater Mark 8 manufactured by Tokyo Electron Limited, and dried on a hot plate at 100° C. for 60 seconds, whereby a resist film having a thickness of 50 nm was obtained.

(2) EB Exposure and Development

Pattern irradiation was performed on the wafer applied with the resist film obtained in the above (1) using an electron beam lithography device (HL 750 manufactured by Hitachi, Ltd., acceleration voltage of 50 KeV). At this time, lithography was performed such that a line and a space were formed in a ratio of 1:1. After the electron beam lithography, the wafer applied with the resist film was heated on the hot plate at 110° C. for 60 seconds, and developed by paddling the organic-based developer described in the following Table for 30 seconds, and, as necessary, the wafer applied with the resist film was rinsed by paddling the rinse liquid described in the following Table for 30 seconds. (an example in which a rinse liquid was not described means that rinsing was not performed in the example) the wafer was rotated for 30 seconds at a rotation speed of 4000 rpm, and heating was performed at 90° C. for 60 seconds, whereby a resist pattern of a line and space pattern in a ratio of 1:1 having a line width of 50 nm was obtained.

(3) Evaluation of Resist Pattern

The sensitivity and the resolving power of the obtained resist pattern were evaluated by the following method using a scanning electron microscope (S-9220 manufactured by Hitachi, Ltd.). In addition, the amount of film loss was also evaluated. The results are shown in the following Table.

(3-1) Sensitivity

The irradiation energy when the line and space pattern in a ratio of 1:1 having a line width of 50 nm was resolved was taken as sensitivity (Eop). A smaller value indicates a better performance.

(3-2) Resolving Power

In the Eop, the minimum line width of the line and space pattern of (1:1) separated was taken as resolving power. A smaller value indicates a better performance.

(3-3) Line Width Roughness (LWR)

Regarding the line width roughness, in the Eop, line widths of arbitrary 50 points having a size of 0.5 μm in the longitudinal direction of a line and space pattern in a ratio of 1:1 having a line width of 50 nm were measured, the standard deviation thereof was determined, and 3σ was calculated. A smaller value indicates a better performance.

(3-4) Amount of Film Loss

After a series of processes were completed, the film thickness of the remaining resist film was measured, and the value obtained by subtracting the residual film thickness from the initial film thickness was taken as the amount (nm) of film loss. Moreover, an optical interference film thickness determination device (Lambda Ace, manufactured by SCREEN Holdings Co., Ltd.) was used in the film thickness measurement.

(3-5) Exposure Latitude (EL)

The exposure amount at which a mask pattern of a line and space (line:space=1:1) having a line width of 50 nm was reproduced was determined and this was taken as the optimumal exposure amount $E_{opt}$. Next, the exposure amount when the line width became ±10% of 50 nm (that is, 45 nm and 55 nm) which were target values was determined. Then, the exposure latitude (EL) defined by the following equation was calculated. As the value of EL was increased, the change in performance due to a change in the exposure amount were decreased.

$$[\text{EL }(\%)]=[(\text{exposure amount when line width becomes 55 nm})-(\text{exposure amount when line width becomes 45 nm})]/E_{opt}\times 100$$

(3-6) Dry Etching Resistance

Overall irradiation was performed on the wafer coated with the resist film obtained in the above (1) using an electron beam lithography device (HL 750 manufactured by Hitachi, Ltd., acceleration voltage of 50 KeV). After the electron beam irradiation, the wafer applied with the resist film was heated on the hot plate at 110° C. for 60 seconds, and developed by paddling the organic-based developer described in the following Table for 30 seconds, and depending on the conditions, the wafer applied with the resist film was rinsed by paddling the rinse liquid described in the following Table for 30 seconds. The wafer was rotated for 30 seconds at a rotation speed of 4000 rpm, and heating was performed at 90° C. for 60 seconds, whereby a resist film for a dry etching evaluation was obtained.

The initial film thickness (FT1, Angstroms) of the obtained resist film was measured. Next, using a dry etcher (U-612, manufactured by Hitachi High-Technologies Corporation), etching was performed for 30 seconds while supplying $C_4F_6$ gas. Thereafter, the film thickness (FT2, Angstroms) of the resist film obtained after the etching was performed was measured. Then, the dry etching rate (DE) defined by the following equation was calculated.

$$[\text{Dry etching rate (DE, Angstroms/sec)}]=(\text{FT1-FT2})/30$$

Superiority and inferiority of DE was evaluated according to the following criteria. Smaller value of DE indicates smaller change in the film thicknesss due to etching.

A . . . dry etching rate was less than 10 Angstroms/sec

B . . . dry etching rate was 10 Angstroms/sec or greater to less than 10 Å/sec

C . . . dry etching rate was 12 Angstroms/sec or greater

TABLE 1

Evaluation results in EB exposure

| | Resin | Concentration | Acid generator (mass ratio) | Concentration | Basic compound | Concentration | Organic solvent (mass ratio) | Surfactant (mass ratio) |
|---|---|---|---|---|---|---|---|---|
| Example 1-1 | P-1 | 67.95 | z113 | 30 | N-6 | 2 | S1/S2 (40/60) | W-1 |
| Example 1-2 | P-2 | 72.95 | z112 | 25 | N-11 | 2 | S1/S2 (40/60) | W-1 |
| Example 1-3 | P-3 | 62.95 | z134 | 35 | N-11 | 2 | S1/S2 (40/60) | W-1 |
| Example 1-4 | P-4 | 67.95 | z134 | 30 | N-11 | 2 | S1/S2 (40/60) | W-1 |
| Example 1-5 | P-5 | 67.95 | z128 | 30 | N-6 | 2 | S1/S2 (40/60) | W-2 |

TABLE 1-continued

| | | | | | | | | |
|---|---|---|---|---|---|---|---|---|
| Example 1-6 | P-6 | 83.95 | z118 | 15 | N-8 | 1 | S1/S2 (40/60) | W-4 |
| Example 1-7 | P-7 | 82.95 | z29 | 15 | N-1 | 2 | S1/S3 (40/60) | W-4 |
| Example 1-8 | P-8 | 82.95 | z2 | 15 | N-2 | 2 | S1/S2 (40/60) | W-1/W-2 (1/1) |
| Example 1-9 | P-9 | 78.00 | z108 | 20 | N-5 | 2 | S1/S2/S3 (30/60/10) | Not present |
| Example 1-10 | P-10 | 82.95 | z117 | 15 | N-4 | 2 | S1/S2 (20/80) | W-3 |
| Example 1-11 | P-11 | 67.95 | z124 | 30 | N-11 | 2 | S1/S2 (40/60) | W-1 |
| Example 1-12 | P-12 | 67.95 | z124 | 30 | N-11 | 2 | S1/S2 (40/60) | W-1 |
| Example 1-13 | P-13 | 62.95 | z135 | 35 | N-8 | 2 | S1/S2 (40/60) | W-3 |
| Example 1-14 | P-14 | 67.95 | z132 | 30 | N-11 | 2 | S1/S2 (40/60) | W-1 |
| Example 1-15 | P-15 | 72.00 | z4/z112 (1/1) | 25 | N-4 | 3 | S1/S2/S3 (30/60/10) | Not present |
| Example 1-16 | P-16 | 67.95 | z115 | 30 | N-11 | 2 | S1/S4 (40/60) | W-1 |
| Example 1-17 | P-17 | 77.95 | z99 | 20 | N-10 | 2 | S1/S4 (40/60) | W-1 |
| Example 1-18 | P-18 | 63.95 | z130 | 35 | N-9 | 1 | S1/S4 (40/60) | W-1 |
| Example 1-19 | P-19 | 66.95 | z124 | 30 | N-6 | 3 | S1/S4 (40/60) | W-2 |
| Example 1-20 | P-20 | 66.95 | z113 | 30 | N-6 | 3 | S1/S2 (40/60) | W-2 |
| Example 1-21 | P-21 | 72.95 | z128 | 25 | N-9 | 2 | S1/S3 (40/60) | W-3 |
| Example 1-22 | P-22 | 67.95 | z132 | 30 | N-11 | 2 | S1/S2 (40/60) | W-1 |
| Example 1-23 | P-23 | 67.95 | z132 | 30 | N-11 | 2 | S1/S2 (40/60) | W-1 |
| Example 1-24 | P-24 | 62.95 | z134 | 35 | N-11 | 2 | S1/S2 (40/60) | W-1 |
| Example 1-25 | P-25 | 66.95 | z133 | 30 | N-7 | 3 | S1/S2 (40/60) | W-1 |
| Example 1-26 | P-26 | 67.95 | z125 | 30 | N-3 | 2 | S1/S2 (40/60) | W-1 |
| Example 1-27 | P-27 | 72.95 | z108 | 25 | N-10 | 2 | S1/S2 (40/60) | W-1 |
| Example 1-28 | P-28 | 97.95 | | | N-11 | 2 | S1/S2 (40/60) | W-1 |
| Example 1-29 | P-29 | 97.95 | | | N-11 | 2 | S1/S3 (40/60) | W-1 |
| Example 1-30 | P-30 | 97.95 | | | N-11 | 2 | S1/S2 (40/60) | W-2 |
| Example 1-31 | P-31 | 97.95 | | | N-11 | 2 | S1/S2 (40/60) | W-1 |
| Example 1-32 | P-32 | 97.95 | | | N-11 | 2 | S1/S2 (40/60) | W-4 |
| Example 1-33 | p-33 | 97.95 | | | N-11 | 2 | S1/S2 (40/60) | W-1 |
| Example 1-34 | P-34 | 97.95 | | | N-4 | 2 | S1/S2 (40/60) | W-1 |
| Example 1-35 | P-35 | 97.95 | | | N-6 | 2 | S1/S2 (40/60) | W-1 |
| Comparative Example 1-1 | CP-1 | 67.95 | z132 | 30 | N-11 | 2 | S1/S2 (40/60) | W-1 |
| Comparative Example 1-2 | P-22 | 67.95 | z132 | 30 | N-11 | 2 | S1/S2 (40/60) | W-1 |
| Comparative Example 1-3 | CP-2 | 67.95 | z132 | 30 | N-11 | 2 | S1/S2 (40/60) | W-1 |
| Comparative | CP-3 | 87.95 | z45 | 10 | N-11 | 2 | S1/S2 | W-1 |

TABLE 1-continued

| | | | | | | | | |
|---|---|---|---|---|---|---|---|---|
| Example 1-4 | | | | | | | (40/60) | |
| Comparative Example 1-5 | CP-4 | 85.45 | z117 | 12.5 | N-11 | 2 | S1/S2 (40/60) | W-1 |

Evaluation results in EB exposure

| | Con-centration | Developer | Rinse liquid | Sensitivity ($\mu C/cm^2$) | Resolving power (nm) | LWR (nm) | Amount of film loss (nm) | EL (%) | Dry etching resistance |
|---|---|---|---|---|---|---|---|---|---|
| Example 1-1 | 0.05 | SG-3 | | 29.5 | 35 | 5.3 | 10.4 | 17.5 | A |
| Example 1-2 | 0.05 | SG-3 | | 29.0 | 34 | 5.1 | 9.8 | 18.2 | A |
| Example 1-3 | 0.05 | SG-3 | | 28.5 | 33 | 4.7 | 8.8 | 18.6 | A |
| Example 1-4 | 0.05 | SG-3 | | 29.5 | 35 | 5.3 | 10.3 | 17.5 | A |
| Example 1-5 | 0.05 | SG-3 | | 29.0 | 34 | 5.0 | 9.8 | 17.6 | A |
| Example 1-6 | 0.05 | SG-3 | SR-3 | 30.0 | 36 | 5.6 | 10.9 | 16.7 | A |
| Example 1-7 | 0.05 | SG-3 | SR-2 | 31.0 | 38 | 6.1 | 11.8 | 15.9 | B |
| Example 1-8 | 0.05 | SG-2 | | 31.0 | 38 | 6.3 | 11.9 | 15.7 | B |
| Example 1-9 | | SG-1 | SR-3 | 30.5 | 37 | 5.9 | 11.3 | 16.4 | B |
| Example 1-10 | 0.05 | SG-3 | SR-1 | 30.0 | 36 | 5.6 | 10.7 | 17.0 | A |
| Example 1-11 | 0.05 | SG-3 | | 27.0 | 30 | 4.2 | 7.5 | 20.3 | A |
| Example 1-12 | 0.05 | SG-3 | | 28.0 | 32 | 4.5 | 8.5 | 19.4 | A |
| Example 1-13 | 0.05 | SG-3 | | 27.0 | 30 | 4.2 | 7.7 | 20.0 | A |
| Example 1-14 | 0.05 | SG-3 | | 29.0 | 34 | 5.1 | 9.9 | 18.0 | A |
| Example 1-15 | | SG-3 | | 29.0 | 34 | 5.2 | 9.9 | 17.8 | A |
| Example 1-16 | 0.05 | SG-3 | | 28.0 | 32 | 4.5 | 8.6 | 19.2 | A |
| Example 1-17 | 0.05 | SG-3 | | 29.0 | 34 | 5.1 | 10.1 | 18.0 | A |
| Example 1-18 | 0.05 | SG-3 | | 28.0 | 32 | 4.7 | 9.0 | 18.7 | A |
| Example 1-19 | 0.05 | SG-3 | | 28.0 | 32 | 4.6 | 8.7 | 18.8 | A |
| Example 1-20 | 0.05 | SG-3 | | 27.5 | 31 | 4.3 | 8.1 | 19.5 | A |
| Example 1-21 | 0.05 | SG-3 | | 27.5 | 31 | 4.3 | 8.3 | 19.4 | A |
| Example 1-22 | 0.05 | SG-3 | | 27.0 | 30 | 4.1 | 7.3 | 20.5 | A |
| Example 1-23 | 0.05 | SG-3 | | 28.0 | 32 | 4.4 | 8.4 | 19.5 | A |
| Example 1-24 | 0.05 | SG-3 | | 27.0 | 30 | 4.2 | 7.5 | 20.5 | A |
| Example 1-25 | 0.05 | SG-3 | | 27.0 | 30 | 4.3 | 7.5 | 20.1 | A |
| Example 1-26 | 0.05 | SG-3 | | 28.0 | 32 | 4.6 | 8.6 | 19.1 | A |
| Example 1-27 | 0.05 | SG-3 | | 28.5 | 33 | 4.8 | 9.0 | 18.4 | A |
| Example 1-28 | 0.05 | SG-3 | | 27.0 | 30 | 4.1 | 7.5 | 20.7 | A |
| Example 1-29 | 0.05 | SG-3 | | 27.0 | 30 | 4.1 | 7.5 | 20.6 | A |
| Example 1-30 | 0.05 | SG-2 | | 29.0 | 34 | 5.1 | 9.9 | 18.2 | A |
| Example 1-31 | 0.05 | SG-3 | | 27.0 | 30 | 4.1 | 7.5 | 20.5 | A |
| Example 1-32 | 0.05 | SG-3 | | 28.0 | 32 | 4.5 | 8.9 | 19.1 | A |
| Example 1-33 | 0.05 | SG-3 | | 27.0 | 30 | 4.1 | 7.4 | 20.4 | A |

TABLE 1-continued

| | | | | | | | | |
|---|---|---|---|---|---|---|---|---|
| Example 1-34 | 0.05 | SG-1 | 28.0 | 32 | 4.6 | 8.9 | 19.2 | A |
| Example 1-35 | 0.05 | SG-3 | 27.5 | 31 | 4.4 | 8.0 | 19.6 | A |
| Comparative Example 1-1 | 0.05 | SG-3 | 32.0 | 42 | 6.4 | 12.2 | 15.1 | C |
| Comparative Example 1-2 | 0.05 | TM-1 | 38.0 | 48 | 7.9 | 16.7 | 13.0 | A |
| Comparative Example 1-3 | 0.05 | SG-3 | 36.0 | 46 | 7.3 | 15.1 | 14.0 | C |
| Comparative Example 1-4 | 0.05 | SG-3 | 37.0 | 48 | 8.4 | 16.0 | 12.5 | C |
| Comparative Example 1-5 | 0.05 | SG-3 | 37.0 | 48 | 7.8 | 16.5 | 12.9 | C |

The concentration of each component represents a concentration (% by mass) based on the total solid content of the composition.

For example, whereas, in JP2012-242556A, a resolution of a 75 nm half-pitch was evaluated using an ArF light source, and, in JP2013-11866A, a resolution of a 90 nm half-pitch was evaluated using the same ArF light source, as can be seen from the above table, Examples 1-1 to 1-35 of the present invention can satisfy high sensitivity, high LWR performance, film loss reduction performance, high EL, and, high dry etching resistance at a high resolution of 38 nm or less at the same time to a very high level.

In more detail, it was found that, first, in contrast to Comparative Example 1-1 in which a comparative resin (CP-1) which did not have a repeating unit containing a cross-linking group was used, Example 1-14 in which the resin (P-14) of the present invention having the same components except for a repeating unit containing a cross-linking group had all of high resolution, high sensitivity, high LWR performance, film loss reduction performance, high EL, and high dry etching resistance. It is thought that this is because, at the exposed portion, an acid group such as a carboxylic group or a phenolic hydroxyl group is generated by a deprotection reaction of the acid-decomposable group in the resin, and a crosslinking reaction can also be caused by a cross-linking group in the resin, and due to this, the exposed portion can be further insolubilized and cured for forming a film. It is thought that further insolubilization of the exposed portion by the crosslinking reaction is effective for resolution enhancement by film loss reduction or contrast improvement, LWR performance improvement, and sensitivity enhancement, and curing for forming a film of the exposed portion by the crosslinking reaction is effective for EL improvement by acid diffusion suppression, resolution enhancement by falling prevention, and dry etching resistance improvement.

Furthermore, it was found that, in Comparative Example 1-2 in which the same compositions as that in Example 1-22 was alkali-developed, the performance thereof was inferior, and thus, it is important for expression of the effects to combine development using an organic-based developer.

Next, it was found that, in contrast to Comparative Example 1-3 in which the resin (CP-2) which did not have the repeating unit represented by General Formula (I) such as a hydroxystyrene repeating unit was used, Example 1-14 in which the components were the same as those in Comparative Example 1-3, and the resin (P-14) having a hydroxystyrene repeating unit was used had all of high resolution, high sensitivity, high LWR performance, film loss reduction performance, high EL, and high dry etching resistance. It is thought that this is because, based on the fact that the phenolic hydroxyl group in the hydroxystyrene repeating unit is prone to undergo a crosslinking reaction, the effects of insolubilization and curing for forming a film are increased, and secondary electrons are greatly generated from the phenol structure by exposure, and as a result, acid is greatly generated, and a deprotection reaction of an acid-decomposable group in the resin quickly and greatly proceeds, and thus, these contribute to further enhancement of sensitivity, LWR performance, and resolution.

This is thought to be due to the same reason that Comparative Examples 1-4 and 1-5 in which the resin (CP-3) described in JP2012-242556A and the resin (CP-4) described in JP2013-11866A were used are inferior to Examples of the present invention including Example 1-14.

From comparison of Example 1-7 or 1-8 with other Comparative Examples, it was also found that the effects are more significant with a hydroxystyrene structure rather than with a hydroxyphenyl methacrylate structure or a hydroxyphenylmethacryl amide structure among the same phenol structures, and this is preferable.

Furthermore, it was also found that a resin having the acid-decomposable group (for example, Examples 1-19 to 1-27, 1-31 to 1-33, and 1-35) represented by General Formula (IV) or the acid-decomposable group (for example, Examples 1-11 to 1-13, 1-16, 1-28, and 1-29) represented by General Formula (III-1) was excellent in terms of all of resolution, sensitivity, film loss reduction performance, and LWR performance, compared to a resin having no acid-decomposable group represented by General Formula (IV) or (III-1), for example, as Examples 1-6 to 1-10. It is thought that this is because the deprotection activation energy of the acid-decomposable group is low, and thus, carboxylic acid can be easily generated with a small amount of an acid.

It was found that, as the group containing a cross-linking group of $B_8$ in General Formula (V), a phenol structure or a urea structure having a hydroxymethyl group or an alkoxymethyl group compared to a group having an oxirane ring or an oxetane ring is excellent. Furthermore, it was found that the phenol structure having a hydroxymethyl group or an alkoxymethyl group was more excellent compared to the urea structure having a hydroxymethyl group or an alkoxymethyl group, by comparing Example 1-11 in which the resin (P-11) was used and Example 1-12 in which the resin (P-12) was used, and Example 1-22 in which the resin (P-22) was used and Example 1-23 in which the resin (P-23) was used, which are the same except that groups containing a cross-linking group are different.

Examples 2-1 to 2-35 and Comparative Examples 2-1 to 2-5 (Extreme Ultraviolet Rays (EUV) Exposure)

(4) Coating Liquid Preparation and Application of Active Light-Sensitive or Radiation-Sensitive Resin Composition A coating liquid composition having the compositional ratio shown in the following table was microfiltered using a membrane filter having a pore size of 0.05 μm, whereby an active light-sensitive or radiation-sensitive resin composition (resist composition) solution having a solid content concentration of 2.0% by mass was obtained.

This active light-sensitive or radiation-sensitive resin composition solution was applied to a 6-inch Si wafer subjected to a hexamethyldisilazane (HMDS) treatment in advance using a spin coater Mark 8 manufactured by Tokyo Electron Limited, and dried on a hot plate at 100° C. for 60 seconds, whereby a resist film having a thickness of 50 nm was obtained.

(5) EUV Exposure and Development

Using an EUV exposure device (Micro Exposure Tool manufactured by Exitech Corpoation, NA0.3, Quadrupole, outer sigma of 0.68, inner sigma of 0.36), pattern exposure was performed on the wafer applied with the resist film obtained in the above (4) using an exposure mask (line/space=1/1). After the irradiation, the wafer applied with the resist film was heated on the hot plate at 110° C. for 60 seconds, and developed by paddling the organic-based developer described in the following Table for 30 seconds, and depending on the conditions, the wafer applied with the resist film was rinsed by paddling the rinse liquid described in the following Table 2 for 30 seconds. (an example in which a rinse liquid was not described means that rinsing was not performed in the example) the wafer was rotated for 30 seconds at a rotation speed of 4000 rpm, and heating was performed at 90° C. for 60 seconds, whereby a resist pattern of a line and space pattern in a ratio of 1:1 having a line width of 50 nm was obtained.

(6) Evaluation of Resist Pattern

The sensitivity and the resolving power of the obtained resist pattern were evaluated by the following method using a scanning electron microscope (S-9380II manufactured by Hitachi, Ltd.). In addition, the amount of film loss was also evaluated. The results are shown in the following Table.

(6-1) Sensitivity

The exposure amount when the line and space pattern in a ratio of 1:1 having a line width of 50 nm was resolved was taken as sensitivity (Eop). A smaller value indicates a better performance.

(6-2) Resolving Power

In the Eop, the minimum line width of the line and space pattern of (1:1) separated was taken as resolving power. A smaller value indicates a better performance.

(6-3) Line Width Roughness (LWR)

Regarding the line width roughness, in the Eop, line widths of arbitrary 50 points having a size of 0.5 μm in the longitudinal direction of a line and space pattern in a ratio of 1:1 having a line width of 50 nm were measured, the standard deviation thereof was determined, and 3σ was calculated. A smaller value indicates a better performance.

(6-4) Amount of Film Loss

After a series of processes were completed, the film thickness of the remaining resist film was measured, and the value obtained by subtracting the residual film thickness from the initial film thickness was taken as the amount (nm) of film loss. Moreover, an optical interference film thickness determination device (Lambda Ace, manufactured by SCREEN Holdings Co., Ltd.) was used in the film thickness measurement.

(6-5) Exposure Latitude (EL)

The exposure amount at which a mask pattern of a line and space (line:space=1:1) having a line width of 50 nm was reproduced was determined and this was taken as the optimumal exposure amount $E_{opt}$. Next, the exposure amount when the line width became ±10% of 50 nm (that is, 45 nm and 55 nm) which were target values was determined. Then, the exposure latitude (EL) defined by the following equation was calculated. As the value of EL was increased, the change in performance due to a change in the exposure amount were decreased.

$$[\text{EL } (\%)]=[(\text{exposure amount when line width becomes 55 nm})-(\text{exposure amount when line width becomes 45 nm})]/E_{opt}\times 100$$

(6-6) Dry Etching Resistance

Using an EUV exposure device (Micro Exposure Tool manufactured by Exitech Corpoation, NA0.3, Quadrupole, outer sigma of 0.68, inner sigma of 0.36), overall irradiation was performed on the wafer applied with the resist film obtained in the above (4). After the irradiation, the wafer applied with the resist film was heated on the hot plate at 110° C. for 60 seconds, and developed by paddling the organic-based developer described in the following Table for 30 seconds, and depending on the conditions, the wafer applied with the resist film was rinsed by paddling the rinse liquid described in the following Table 2 for 30 seconds. The wafer was rotated for 30 seconds at a rotation speed of 4000 rpm, and baking was performed at 90° C. for 60 seconds, whereby a resist film for a dry etching evaluation was obtained.

The initial film thickness (FT1, Angstroms) of the obtained resist film was measured. Next, using a dry etcher (U-612, manufactured by Hitachi High-Technologies Corporation), etching was performed for 30 seconds while supplying $C_4F_6$ gas. Thereafter, the film thickness (FT2, Angstroms) of the resist film obtained after the etching was performed was measured. Then, the dry etching rate (DE) defined by the following equation was calculated. [Dry etching rate (DE, Angstroms/sec)]=(FT1-FT2)/30

Superiority and inferiority of DE was evaluated according to the following criteria. Smaller value of DE indicates smaller change in the film thicknesss due to etching.

A . . . dry etching rate was less than 10 Angstroms/sec

B . . . dry etching rate was 10 Angstroms/sec or greater to less than 10 Å/sec

C . . . dry etching rate was 12 Angstroms/sec or greater

TABLE 2

Evaluation results in EUV exposure

| | Resin | Concentration | Acid generator (mass ratio) | Concentration | Basic compound | Concentration | Organic solvent (mass ratio) | Surfactant (mass ratio) |
|---|---|---|---|---|---|---|---|---|
| Example 2-1 | P-1 | 67.95 | z113 | 30 | N-6 | 2 | S1/S2 (40/60) | W-1 |
| Example 2-2 | P-2 | 72.95 | z112 | 25 | N-11 | 2 | S1/S2 (40/60) | W-1 |
| Example 2-3 | P-3 | 62.95 | z134 | 35 | N-11 | 2 | S1/S2 (40/60) | W-1 |
| Example 2-4 | P-4 | 67.95 | z134 | 30 | N-11 | 2 | S1/S2 (40/60) | W-1 |
| Example 2-5 | P-5 | 67.95 | z128 | 30 | N-6 | 2 | S1/S2 (40/60) | W-2 |
| Example 2-6 | P-6 | 83.95 | z118 | 15 | N-8 | 1 | S1/S2 (40/60) | W-4 |
| Example 2-7 | P-7 | 82.95 | z29 | 15 | N-1 | 2 | S1/S3 (40/60) | W-4 |
| Example 2-8 | P-8 | 82.95 | z2 | 15 | N-2 | 2 | S1/S2 (40/60) | W-1/W-2 (1/1) |
| Example 2-9 | P-9 | 78 | z108 | 20 | N-5 | 2 | S1/S2/S3 (30/60/10) | Not present |
| Example 2-10 | P-10 | 82.95 | z117 | 15 | N-4 | 2 | S1/S2 (20/80) | W-3 |
| Example 2-11 | P-11 | 67.95 | z124 | 30 | N-11 | 2 | S1/S2 (40/60) | W-1 |
| Example 2-12 | P-12 | 67.95 | z124 | 30 | N-11 | 2 | S1/S2 (40/60) | W-1 |
| Example 2-13 | P-13 | 62.95 | z135 | 35 | N-8 | 2 | S1/S2 (40/60) | W-3 |
| Example 2-14 | P-14 | 67.95 | z132 | 30 | N-11 | 2 | S1/S2 (40/60) | W-1 |
| Example 2-15 | P-15 | 72 | z4/z112 (1/1) | 25 | N-4 | 3 | S1/S2/S3 (30/60/10) | Not present |
| Example 2-16 | P-16 | 67.95 | z115 | 30 | N-11 | 2 | S1/S4 (40/60) | W-1 |
| Example 2-17 | P-17 | 77.95 | z99 | 20 | N-10 | 2 | S1/S4 (40/60) | W-1 |
| Example 2-18 | P-18 | 63.95 | z130 | 35 | N-9 | 1 | S1/S4 (40/60) | W-1 |
| Example 2-19 | P-19 | 66.95 | z124 | 30 | N-6 | 3 | S1/S4 (40/60) | W-2 |
| Example 2-20 | P-20 | 66.95 | z113 | 30 | N-6 | 3 | S1/S2 (40/60) | W-2 |
| Example 2-21 | P-21 | 72.95 | z128 | 25 | N-9 | 2 | S1/S3 (40/60) | W-3 |
| Example 2-22 | P-22 | 67.95 | z132 | 30 | N-11 | 2 | S1/S2 (40/60) | W-1 |
| Example 2-23 | P-23 | 67.95 | z132 | 30 | N-11 | 2 | S1/S2 (40/60) | W-1 |
| Example 2-24 | P-24 | 62.95 | z134 | 35 | N-11 | 2 | S1/S2 (40/60) | W-1 |
| Example 2-25 | P-25 | 66.95 | z133 | 30 | N-7 | 3 | S1/S2 (40/60) | W-1 |
| Example 2-26 | P-26 | 67.95 | z125 | 30 | N-3 | 2 | S1/S2 (40/60) | W-1 |
| Example 2-27 | P-27 | 72.95 | z108 | 25 | N-10 | 2 | S1/S2 (40/60) | W-1 |
| Example 2-28 | P-28 | 97.95 | | | N-11 | 2 | S1/S2 (40/60) | W-1 |
| Example 2-29 | P-29 | 97.95 | | | N-11 | 2 | S1/S3 (40/60) | W-1 |
| Example 2-30 | P-30 | 97.95 | | | N-11 | 2 | S1/S2 (40/60) | W-2 |
| Example 2-31 | P-31 | 97.95 | | | N-11 | 2 | S1/S2 (40/60) | W-1 |
| Example 2-32 | P-32 | 97.95 | | | N-11 | 2 | S1/S2 (40/60) | W-4 |
| Example 2-33 | p-33 | 97.95 | | | N-11 | 2 | S1/S2 (40/60) | W-1 |
| Example 2-34 | P-34 | 97.95 | | | N-4 | 2 | S1/S2 (40/60) | W-1 |
| Example 2-35 | P-35 | 97.95 | | | N-6 | 2 | S1/S2 (40/60) | W-1 |
| Comparative Example 2-1 | CP-1 | 67.95 | z132 | 30 | N-11 | 2 | S1/S2 (40/60) | W-1 |

TABLE 2-continued

| | | | | | | | | |
|---|---|---|---|---|---|---|---|---|
| Comparative Example 2-2 | P-22 | 67.95 | z132 | 30 | N-11 | 2 | S1/S2 (40/60) | W-1 |
| Comparative Example 2-3 | CP-2 | 67.95 | z132 | 30 | N-11 | 2 | S1/S2 (40/60) | W-1 |
| Comparative Example 2-4 | CP-3 | 87.95 | z45 | 10 | N-11 | 2 | S1/S2 (40/60) | W-1 |
| Comparative Example 2-5 | CP-4 | 85.45 | z117 | 12.5 | N-11 | 2 | S1/S2 (40/60) | W-1 |

Evaluation results in EUV exposure

| | Con-centration | Developer | Rinse liquid | Sensitivity (mJ/cm$^2$) | Resolving power (nm) | LWR (nm) | Amount of film loss (nm) | EL (%) | Dry etching resistance |
|---|---|---|---|---|---|---|---|---|---|
| Example 2-1 | 0.05 | SG-3 | | 16.5 | 25 | 5.9 | 10.8 | 16.8 | A |
| Example 2-2 | 0.05 | SG-3 | | 16.0 | 24 | 5.6 | 10.2 | 17.6 | A |
| Example 2-3 | 0.05 | SG-3 | | 15.5 | 23 | 5.4 | 9.3 | 18.2 | A |
| Example 2-4 | 0.05 | SG-3 | | 16.5 | 25 | 5.8 | 10.7 | 16.7 | A |
| Example 2-5 | 0.05 | SG-3 | | 16.0 | 24 | 5.6 | 10.2 | 17.4 | A |
| Example 2-6 | 0.05 | SG-3 | SR-3 | 17.0 | 26 | 6.0 | 11.2 | 16.3 | A |
| Example 2-7 | 0.05 | SG-3 | SR-2 | 18.0 | 28 | 6.6 | 12.1 | 15.3 | B |
| Example 2-8 | 0.05 | SG-2 | | 18.0 | 28 | 6.8 | 12.2 | 15.1 | B |
| Example 2-9 | | SG-1 | SR-3 | 17.5 | 27 | 6.4 | 11.7 | 15.9 | B |
| Example 2-10 | 0.05 | SG-3 | SR-1 | 17.0 | 26 | 6.2 | 11.1 | 16.6 | A |
| Example 2-11 | 0.05 | SG-3 | | 13.5 | 20 | 4.6 | 7.7 | 19.8 | A |
| Example 2-12 | 0.05 | SG-3 | | 15.0 | 22 | 5.0 | 8.9 | 18.5 | A |
| Example 2-13 | 0.05 | SG-3 | | 13.5 | 20 | 4.5 | 7.8 | 19.6 | A |
| Example 2-14 | 0.05 | SG-3 | | 16.0 | 24 | 5.6 | 10.1 | 17.4 | A |
| Example 2-15 | | SG-3 | | 16.0 | 24 | 5.8 | 10.3 | 17.2 | A |
| Example 2-16 | 0.05 | SG-3 | | 15.0 | 22 | 5.0 | 8.8 | 18.6 | A |
| Example 2-17 | 0.05 | SG-3 | | 16.0 | 24 | 5.5 | 10.3 | 17.4 | A |
| Example 2-18 | 0.05 | SG-3 | | 15.0 | 22 | 5.1 | 9.1 | 18.2 | A |
| Example 2-19 | 0.05 | SG-3 | | 15.0 | 22 | 5.1 | 8.9 | 18.4 | A |
| Example 2-20 | 0.05 | SG-3 | | 14.0 | 21 | 4.7 | 8.4 | 18.9 | A |
| Example 2-21 | 0.05 | SG-3 | | 14.0 | 21 | 4.7 | 8.5 | 18.9 | A |
| Example 2-22 | 0.05 | SG-3 | | 13.0 | 20 | 4.5 | 7.4 | 20.0 | A |
| Example 2-23 | 0.05 | SG-3 | | 15.0 | 22 | 4.9 | 8.4 | 19.1 | A |
| Example 2-24 | 0.05 | SG-3 | | 13.5 | 20 | 4.6 | 7.6 | 20.0 | A |
| Example 2-25 | 0.05 | SG-3 | | 13.5 | 20 | 4.6 | 7.7 | 19.8 | A |
| Example 2-26 | 0.05 | SG-3 | | 15.0 | 22 | 5.0 | 8.9 | 18.5 | A |
| Example 2-27 | 0.05 | SG-3 | | 15.5 | 23 | 5.3 | 9.4 | 17.8 | A |
| Example 2-28 | 0.05 | SG-3 | | 13.0 | 20 | 4.5 | 7.7 | 20.3 | A |
| Example 2-29 | 0.05 | SG-3 | | 13.0 | 20 | 4.5 | 7.7 | 20.2 | A |
| Example 2-30 | 0.05 | SG-2 | | 16.0 | 24 | 5.5 | 10.2 | 17.5 | A |

TABLE 2-continued

| | | | | | | | | |
|---|---|---|---|---|---|---|---|---|
| Example 2-31 | 0.05 | SG-3 | 13.0 | 20 | 4.4 | 7.6 | 20.1 | A |
| Example 2-32 | 0.05 | SG-3 | 15.0 | 22 | 5.0 | 9.2 | 18.6 | A |
| Example 2-33 | 0.05 | SG-3 | 13.0 | 20 | 4.4 | 7.6 | 20 | A |
| Example 2-34 | 0.05 | SG-1 | 15.0 | 22 | 5.0 | 9.1 | 18.9 | A |
| Example 2-35 | 0.05 | SG-3 | 14.0 | 21 | 4.8 | 8.2 | 19.2 | A |
| Comparative Example 2-1 | 0.05 | SG-3 | 20.0 | 32 | 7.0 | 12.6 | 14.5 | C |
| Comparative Example 2-2 | 0.05 | TM-1 | 24.0 | 38 | 8.5 | 17.2 | 12.2 | A |
| Comparative Example 2-3 | 0.05 | SG-3 | 21.0 | 36 | 7.8 | 15.4 | 13.3 | C |
| Comparative Example 2-4 | 0.05 | SG-3 | 23.0 | 38 | 8.8 | 16.4 | 11.9 | C |
| Comparative Example 2-5 | 0.05 | SG-3 | 23.0 | 38 | 8.4 | 16.4 | 12.5 | C |

The concentration of each component represents a concentration (% by mass) based on the total solid content of the composition.

For example, whereas, in JP2012-242556A, the resolution of a 75 nm half-pitch was evaluated using a ArF light source, and, in JP2013-11866A, the resolution of a 90 nm half-pitch was evaluated using the same ArF light source, as can be seen from the above table, Examples 2-1 to 2-35 of the present invention can satisfy high sensitivity, high LWR performance, film loss reduction performance, high EL, and, high dry etching resistance at a high resolution of 28 nm or less at the same time to a very high level.

In more detail, it was found that, first, in contrast to Comparative Example 2-1 in which a comparative resin (CP-1) which did not have a repeating unit containing a cross-linking group was used, Example 2-14 in which the resin (P-14) of the present invention having the same components except for a repeating unit containing a cross-linking group had all of high resolution, high sensitivity, high LWR performance, film loss reduction performance, high EL, and high dry etching resistance. It is thought that this is because, at the exposed portion, an acid group such as a carboxylic group or a phenolic hydroxyl group is generated by a deprotection reaction of the acid-decomposable group in the resin, and a crosslinking reaction can also be caused by a cross-linking group in the resin, and due to this, the exposed portion can be further insolubilized and cured for forming a film. It is thought that further insolubilization of the exposed portion by the crosslinking reaction is effective for resolution enhancement by film loss reduction or contrast improvement, LWR performance improvement, and sensitivity enhancement, and curing for forming a film of the exposed portion by the crosslinking reaction is effective for EL improvement by acid diffusion suppression, resolution enhancement by falling prevention, and dry etching resistance improvement.

Furthermore, it was found that, in Comparative Example 2-2 in which the same compositions as that in Example 2-22 was alkali-developed, the performance thereof was inferior, and thus, it is important for expression of the effects to combine development using an organic-based developer.

Next, it was found that, in contrast to Comparative Example 2-3 in which the resin (CP-2) which did not have the repeating unit represented by General Formula (I) such as a hydroxystyrene repeating unit was used, Example 2-14 in which the components were the same as those in Comparative Example 2-3, and the resin (P-14) having a hydroxystyrene repeating unit was used had all of high resolution, high sensitivity, high LWR performance, film loss reduction performance, high EL, and high dry etching resistance. It is thought that this is because, based on the fact that the phenolic hydroxyl group in the hydroxystyrene repeating unit is prone to undergo a crosslinking reaction, the effects of insolubilization and curing for forming a film are increased, and secondary electrons are greatly generated from the phenol structure by exposure, and as a result, acid is greatly generated, and a deprotection reaction of an acid-decomposable group in the resin quickly and greatly proceeds, and thus, these contribute to further enhancement of sensitivity, LWR performance, and resolution.

This is thought to be due to the same reason that Comparative Examples 2-4 and 2-5 in which the resin (CP-3) described in JP2012-242556A and the resin (CP-4) described in JP2013-11866A were used are inferior to Examples of the present invention including Example 2-14.

From comparison of Example 1-7 or 1-8 with other Comparative Examples, it was also found that the effects are more significant with a hydroxystyrene structure rather than with a hydroxyphenyl methacrylate structure or a hydroxyphenylmethacryl amide structure among the same phenol structures, and this is preferable.

Furthermore, it was also found that a resin having the acid-decomposable group (for example, Examples 2-19 to 2-27, 2-31 to 2-33, and 2-35) represented by General Formula (IV) or the acid-decomposable group (for example, Examples 2-11 to 2-13, 2-16, 2-28, and 2-29) represented by General Formula (III-1) was excellent in terms of all of resolution, sensitivity, film loss reduction performance, and LWR performance, compared to a resin having no acid-decomposable group represented by General Formula (IV) or (III-1), for example, as Examples 2-6 to 2-10. It is thought that this is because the deprotection activation energy of the acid-decomposable group is low, and thus, carboxylic acid can be easily generated with a small amount of an acid.

It was found that, as the group containing a cross-linking group of $B_8$ in General Formula (V), a phenol structure or a urea structure having a hydroxymethyl group or an alkoxymethyl group compared to a group having an oxirane ring or an oxetane ring is excellent. Furthermore, it was found that the phenol structure having a hydroxymethyl group or an alkoxymethyl group was more excellent compared to the urea structure having a hydroxymethyl group or an alkoxymethyl group, by comparing Example 2-11 in which the resin (P-11) was used and Example 2-12 in which the resin (P-12) was used, and Example 2-22 in which the resin (P-22) was used and Example 2-23 in which the resin (P-23) was used, which are the same except that groups containing a cross-linking group are different.

According to the present invention, a pattern formation method which satisfies high sensitivity, high resolution (high resolving power, and the like), high roughness performance, film loss reduction performance, high exposure latitude, and high dry etching resistance at the same time to a very high level in an ultra fine region (for example, a region having a line width of 50 nm or less), an active light-sensitive or radiation-sensitive resin composition, a resist film, a production method for an electronic device using these, and an electronic device can be provided.

The present invention has been described in detail and with reference to specific embodiments, and it is apparent to those skilled in the art that various modifications and changes are possible without departing from the spirit and the scope of the invention.

This application is based on Japanese Patent Application (Japanese Patent Application No. 2013-160616) filed on Aug. 1, 2013, and the contents thereof are incorporated herein by reference.

What is claimed is:

1. A pattern formation method, comprising:

(1) forming a film using an active light-sensitive or radiation-sensitive resin composition;

(2) exposing the film to active light or radiation; and (3) developing the exposed film using a developer including an organic solvent, wherein the active light-sensitive or radiation-sensitive resin composition contains a resin (A) having a repeating unit represented by General Formula (I), a repeating unit represented by any one of General Formulas (II) to (IV), and a repeating unit represented by General Formula (V), (I)

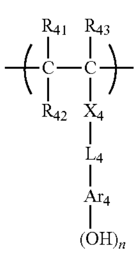

wherein, in General Formula (I), each of $R_{41}$, $R_{42}$, and $R_{43}$ independently represents a hydrogen atom, an alkyl group, a halogen atom, a cyano group, or an alkoxycarbonyl group; here, $R_{42}$ may be bonded to $Ar_4$ to form a ring, and $R_{42}$ in this case represents a single bond or an alkylene group; $X_4$ represents a single bond, —COO—, or —$CONR_{44}$—, and, in the case of forming a ring with $R_{42}$, represents a trivalent connecting group; $R_{44}$ represents a hydrogen atom or an alkyl group; $L_4$ represents a single bond or an alkylene group; $Ar_4$ represents an (n+1) valent aromatic ring group, and, in the case of being bonded to $R_{42}$ to form a ring, represents an (n+2) valent aromatic ring group; and n represents an integer of 1 to 4, (II)

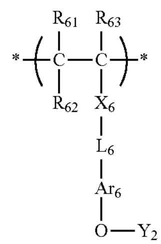

(III)

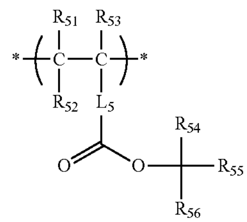

(IV)

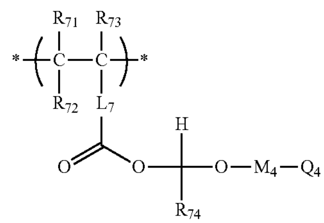

wherein, in Formula (II), each of $R_{61}$, $R_{62}$, and $R_{63}$ independently represents a hydrogen atom, an alkyl group, a cycloalkyl group, a halogen atom, a cyano group, or an alkoxycarbonyl group; here, $R_{62}$ may be bonded to $Ar_6$ to form a ring, and $R_{62}$ in this case represents a single bond or an alkylene group; $X_6$ represents a single bond, —COO—, or —$CONR_{64}$—; $R_{64}$ represents a hydrogen atom or an alkyl group; $L_6$ represents a single bond or an alkylene group; $Ar_6$ represents a divalent aromatic ring group, and, in the case of being bonded to $R_{62}$ to form a ring, represents a trivalent aromatic ring group; and $Y_2$ represents a group leaving due to the action of an acid;

in Formula (III), each of $R_{51}$, $R_{52}$, and $R_{53}$ independently represents a hydrogen atom, an alkyl group, a cycloalkyl group, a halogen atom, a cyano group, or an alkoxycarbonyl group; $R_{52}$ may be bonded to $L_5$ to form a ring, and $R_{52}$ in this case represents an alkylene group; $L_5$ represents a single bond or a divalent connecting group, and in the case of being bonded to $R_{52}$ to form a ring, represents a trivalent connecting group; $R_{54}$ represents an alkyl group, and each of $R_{55}$ and $R_{56}$ independently represents a hydrogen atom, an alkyl group, a cycloalkyl group, an aryl group, or an aralkyl group; $R_{55}$ to $R_{56}$ may be bonded to each other to form a ring; however, $R_{55}$ and $R_{56}$ do not represent a hydrogen atom at the same time in any case; and in Formula (IV), each of $R_{71}$, $R_{72}$, and $R_{73}$ independently represents a hydrogen atom, an alkyl group, a cycloalkyl group, a halogen atom, a cyano group, or an alkoxycarbonyl group; $R_{72}$ may be bonded to $L_7$ to form a ring, and $R_{72}$ in this case represents an alkylene group; $L_7$ represents a single bond or a divalent connecting group, and in the case of forming a ring with $R_{72}$, represents a trivalent connecting group; $R_{74}$ represents a hydrogen atom, an alkyl group, a cycloalkyl group, an aryl group, an aralkyl group, an alkoxy group, an acyl group, or a heterocyclic group; $M_4$ represents a single bond or a divalent connecting group; $Q_4$ represents an alkyl group, a cycloalkyl group, an aryl group, or a heterocyclic group; and at least two of $Q_4$, $M_4$, and $R_{74}$ may be bonded to each other to form a ring, and (V)

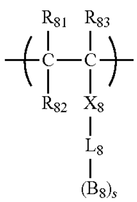

wherein, in Formula (V), each of $R_{81}$, $R_{82}$, and $R_{83}$ independently represents a hydrogen atom, an alkyl group, a cycloalkyl group, a halogen atom, a cyano group, or an alkoxycarbonyl group; here, $R_{82}$ may be bonded to $L_8$ to form a ring, and $R_{82}$ in this case represents a single bond or an alkylene group; $X_8$ represents a single bond or a divalent connecting group; $L_8$ represents a single bond or an (s+1) valent connecting group, and in the case of being bonded to $R_{82}$ to form a ring, represents an (s+2) valent connecting group; s represents an integer of 1 to 5; here, in a case where $L_8$ is a single bond, s is 1; and $B_8$ represents a group which has a phenol structure, a urea structure, or a melamine structure, having a hydroxymethyl group or an alkoxymethyl group.

2. The pattern formation method according to claim 1, wherein $B_8$ in General Formula (V) is a group which has a phenol structure having a hydroxymethyl group or an alkoxymethyl group, provided that the hydroxymethyl group is not directly bonded to a nitrogen atom, and the alkoxymethyl group is not directly bonded to a nitrogen atom.

3. The pattern formation method according to claim 1, wherein the content of the repeating unit represented by General Formula (V) is 1 mol % to 20 mol % with respect to the entirety of repeating units in the resin (A).

4. The pattern formation method according to claim 1, wherein the resin (A) has the repeating unit represented by General Formula (II), and the repeating unit represented by General Formula (II) is a repeating unit represented by General Formula (II'), and (II')

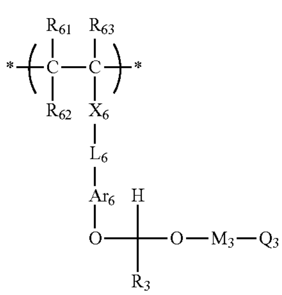

wherein, in General Formula (II'), $R_{61}$, $R_{62}$, $R_{63}$, $X_6$, $L_6$, and $Ar_6$ have the same meaning as those in General Formula (II), respectively; $R_3$ represents a hydrogen atom, an alkyl group, a cycloalkyl group, an aryl group, an aralkyl group, an alkoxy group, an acyl group, or a heterocyclic group; $M_3$ represents a single bond or a divalent connecting group; $Q_3$ represents an alkyl group, a cycloalkyl group, an aryl group, or a heterocyclic group; and at least two of $Q_3$, $M_3$, and $R_3$ may be bonded to each other to form a ring.

5. The pattern formation method according to claim 4, wherein $R_3$ in General Formula (II') is a group having 2 or more carbon atoms.

6. The pattern formation method according to claim 5, wherein $R_3$ in General Formula (II') is a group represented by the following General Formula (II-2), and (II-2)

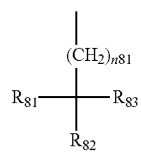

wherein, in General Formula (II-2), each of $R_{81}$, $R_{82}$, and $R_{83}$ independently represents an alkyl group, an alkenyl group, a cycloalkyl group, or an aryl group; n81 represents 0 or 1; and at least two of $R_{81}$ to $R_{83}$ may be connected to each other to form a ring.

7. The pattern formation method according to claim 1, wherein the resin (A) has the repeating unit represented by General Formula (III), and the repeating unit represented by General Formula (III) is a repeating unit represented by General Formula (III-1), and (III-1)

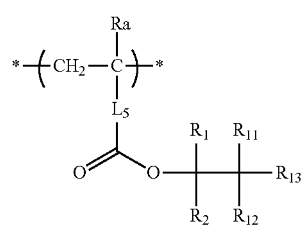

wherein, in General Formula (III-1), each of $R_1$ and $R_2$ independently represents an alkyl group, each of $R_{11}$ and $R_{12}$ independently represents an alkyl group, and $R_{13}$ represents a hydrogen atom or an alkyl group; $R_{11}$ and $R_{12}$ may be connected to each other to form a ring, and $R_{11}$ and $R_{13}$ may be connected to each other to form a ring; and Ra represents a hydrogen atom, an alkyl group, a cyano group, or a halogen atom, and $L_5$ represents a single bond or a divalent connecting group.

8. The pattern formation method according to claim 7, wherein $R_{11}$ and $R_{12}$ in General Formula (III-1) are connected to each other to form a ring.

9. The pattern formation method according to claim 7, wherein any one of $R_1$ and $R_2$ in General Formula (III-1) is an alkyl group having 2 to 10 carbon atoms.

10. The pattern formation method according to claim 9, wherein both $R_1$ and $R_2$ in General Formula (III-1) are ethyl groups.

11. The pattern formation method according to claim 1, wherein the bond between $X_4$ and $L_4$ in General Formula (I) is a single bond.

12. The pattern formation method according to claim 1, wherein the content of the repeating unit represented by General Formula (I) is 10 mol % to 40 mol % with respect to the entirety of repeating units in the resin (A).

13. The pattern formation method according to claim 1, includes a compound (B) that generates an acid by active light or radiation.

14. The pattern formation method according to claim 13, wherein the compound (B) that generates an acid by active light or radiation is a compound that generates an acid having a volume of 240 Angstroms$^3$ or greater.

15. The pattern formation method according to claim 1, wherein an electron beam or extreme ultraviolet rays are used as the active light or the radiation.

16. A production method for an electronic device, comprising:

the pattern formation method according to claim 1.

17. A pattern formation method, comprising:

(1) forming a film using an active light-sensitive or radiation-sensitive resin composition;

(2) exposing the film to active light or radiation; and (3) developing the exposed film using a developer including an organic solvent, wherein the active light-sensitive or radiation-sensitive resin composition contains a resin (A) having a repeating unit represented by General Formula (I), a repeating unit represented by General Formula (II'), and a repeating unit represented by General Formula (V), (I)

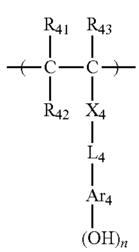

wherein, in General Formula (I), each of $R_{41}$, $R_{42}$, and $R_{43}$ independently represents a hydrogen atom, an alkyl group, a halogen atom, a cyano group, or an alkoxycarbonyl group;

here, $R_{42}$ may be bonded to $Ar_4$ to form a ring, and $R_{42}$ in this case represents a single bond or an alkylene group; $X_4$ represents a single bond, —COO—, or —$CONR_{44}$—, and, in the case of forming a ring with $R_{42}$, represents a trivalent connecting group; $R_{44}$ represents a hydrogen atom or an alkyl group; $L_4$ represents a single bond or an alkylene group; $Ar_4$ represents an (n+1) valent aromatic ring group, and, in the case of being bonded to $R_{42}$ to form a ring, represents an (n+2) valent aromatic ring group; and n represents an integer of 1 to 4, (II')

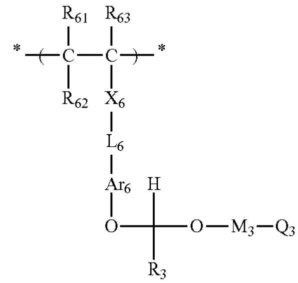

wherein, in Formula (II'), each of $R_{61}$, $R_{62}$, and $R_{63}$ independently represents a hydrogen atom, an alkyl group, a cycloalkyl group, a halogen atom, a cyano group, or an alkoxycarbonyl group; here, $R_{62}$ may be bonded to $Ar_6$ to form a ring, and $R_{62}$ in this case represents a single bond or an alkylene group; $X_6$ represents a single bond, —COO—, or —$CONR_{64}$—; $R_{64}$ represents a hydrogen atom or an alkyl group; $L_6$ represents a single bond or an alkylene group; $Ar_6$ represents a divalent aromatic ring group, and, in the case of being bonded to $R_{62}$ to form a ring, represents a trivalent aromatic ring group; $R_3$ represents a hydrogen atom, an alkyl group, a cycloalkyl group, an aryl group, an aralkyl group, an alkoxy group, an acyl group, or a heterocyclic group; $M_3$ represents a single bond or a divalent connecting group; $Q_3$ represents an alkyl group, a cycloalkyl group, an aryl group, or a heterocyclic group; and at least two of $Q_3$, $M_3$, and $R_3$ may be bonded to each other to form a ring; and (V)

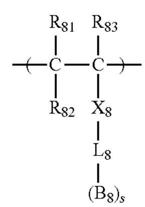

wherein, in Formula (V), each of $R_{81}$, $R_{82}$, and $R_{83}$ independently represents a hydrogen atom, an alkyl group, a cycloalkyl group, a halogen atom, a cyano group, or an alkoxycarbonyl group; here, $R_{82}$ may be bonded to $L_8$ to form a ring, and $R_{82}$ in this case represents a single bond or an alkylene group; $X_8$ represents a single bond or a divalent connecting group; $L_8$ represents a single bond or an (s+1) valent connecting group, and in the case of being bonded to $R_{82}$ to form a ring, represents an (s+2) valent connecting group; s represents an integer of 1 to 5; here, in a case where $L_8$ is a single bond, s is 1; and $B_8$ represents a group containing a cross-linking group.

18. The pattern formation method according to claim 17, wherein a cross-linking group included in $B_8$ in General Formula (V) is a hydroxymethyl group, an alkoxymethyl group, an oxirane ring, or an oxetane ring.

19. The pattern formation method according to claim 17, wherein $B_8$ in General Formula (V) is a group which has a phenol structure, a urea structure, or a melamine structure, having a hydroxymethyl group or an alkoxymethyl group.

20. The pattern formation method according to claim 19, wherein $B_8$ in General Formula (V) is a group which has a phenol structure having a hydroxymethyl group or an alkoxymethyl group (here, the hydroxymethyl group is not directly bonded to a nitrogen atom, and the alkoxymethyl group is not directly bonded to a nitrogen atom).

21. The pattern formation method according to claim 17, wherein the content of the repeating unit represented by General Formula (V) is 1 mol % to 20 mol % with respect to the entirety of repeating units in the resin (A).

22. The pattern formation method according to claim 17, wherein $R_3$ in General Formula (II') is a group having 2 or more carbon atoms.

23. The pattern formation method according to claim 22, wherein $R_3$ in General Formula (II') is a group represented by the following General Formula (II-2), and (II-2)

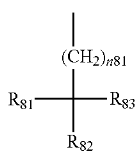

wherein, in General Formula (II-2), each of $R_{81}$, $R_{82}$, and $Rg_{83}$ independently represents an alkyl group, an alkenyl group, a cycloalkyl group, or an aryl group; n81 represents 0 or 1; and at least two of $R_{81}$ to $R_{83}$ may be connected to each other to form a ring.

24. The pattern formation method according to claim 17, wherein the bond between $X_4$ and $L_4$ in General Formula (I) is a single bond.

25. The pattern formation method according to claim 17, wherein the content of the repeating unit represented by General Formula (I) is 10 mol % to 40 mol % with respect to the entirety of repeating units in the resin (A).

26. The pattern formation method according to claim 17, wherein the active light-sensitive or radiation-sensitive resin composition further includes a compound (B) that generates an acid by active light or radiation.

27. The pattern formation method according to claim 26, wherein the compound (B) that generates an acid by active light or radiation is a compound that generates an acid having a volume of 240 Angstroms$^3$ or greater.

28. The pattern formation method according to claim 17, wherein an electron beam or extreme ultraviolet rays are used as the active light or the radiation.

29. A production method for an electronic device, comprising:

the pattern formation method according to claim 17.

30. An active light-sensitive or radiation-sensitive resin composition comprising a resin (A) having a repeating unit represented by General Formula (I), a repeating unit represented by any one of General Formulas (II) to (IV), and a repeating unit represented by General Formula (V), (I)

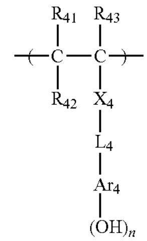

wherein, in General Formula (I), each of $R_{41}$, $R_{42}$, and $R_{43}$ independently represents a hydrogen atom, an alkyl group, a halogen atom, a cyano group, or an alkoxycarbonyl group; here, $R_{42}$ may be bonded to $Ar_4$ to form a ring, and $R_{42}$ in this case represents a single bond or an alkylene group; $X_4$ represents a single bond, —COO—, or —CON$R_{44}$—, and, in the case of forming a ring with $R_{42}$, represents a trivalent connecting group; $R_{44}$ represents a hydrogen atom or an alkyl group; $L_4$ represents a single bond or an alkylene group; $Ar_4$ represents an (n+1) valent aromatic ring group, and, in the case of being bonded to $R_{42}$ to form a ring, represents an (n+2) valent aromatic ring group; and n represents an integer of 1 to 4, (II)

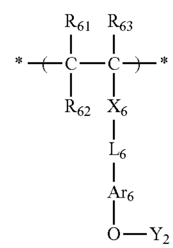

(III)

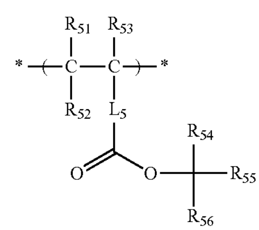

(IV)

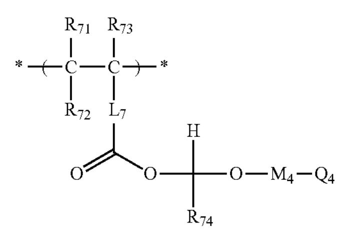

wherein, in Formula (II), each of $R_{61}$, $R_{62}$, and $R_{63}$ independently represents a hydrogen atom, an alkyl group, a cycloalkyl group, a halogen atom, a cyano group, or an alkoxycarbonyl group; here, $R_{62}$ may be bonded to $Ar_6$ to form a ring, and $R_{62}$ in this case represents a single bond or an alkylene group; $X_6$ represents a single bond, —COO—, or —CON$R_{64}$—; $R_{64}$ represents a hydrogen atom or an alkyl group; $L_6$ represents a single bond or an alkylene group; $Ar_6$ represents a divalent aromatic ring group, and, in the case of being bonded to $R_{62}$ to form a ring, represents a trivalent aromatic ring group; and $Y_2$ represents a group leaving due to the action of an acid;

in Formula (III), each of $R_{51}$, $R_{52}$, and $R_{53}$ independently represents a hydrogen atom, an alkyl group, a cycloalkyl group, a halogen atom, a cyano group, or an alkoxycarbonyl group; $R_{52}$ may be bonded to $L_5$ to form a ring, and $R_{52}$ in this case represents an alkylene group; $L_5$ represents a single bond or a divalent connecting group, and in the case of being bonded to $R_{52}$ to form a ring, represents a trivalent connecting group; $R_{54}$ represents an alkyl group, and each of $R_{55}$ and $R_{56}$ independently represents a hydrogen atom, an alkyl group, a cycloalkyl group, an aryl group, or an aralkyl group; $R_{55}$ to $R_{56}$ may be bonded to each other to form a ring; however, $R_{55}$ and $R_{56}$ do not represent a hydrogen atom at the same time in any case; and in Formula (IV), each of $R_{71}$, $R_{72}$, and $R_{73}$ independently represents a hydrogen atom, an alkyl group, a cycloalkyl group, a halogen atom, a cyano group, or an alkoxycarbonyl group; $R_{72}$ may be bonded to $L_7$ to form a ring, and $R_{72}$ in this case represents an alkylene group; $L_7$ represents a single bond or a divalent connecting group, and in the case of forming a ring with $R_{72}$, represents a trivalent connecting group; $R_{74}$ represents a hydrogen atom, an alkyl group, a cycloalkyl group, an aryl group, an aralkyl group, an alkoxy group, an acyl group, or a heterocyclic group; $M_4$ represents a single bond or a divalent connecting group; $Q_4$ represents an alkyl group, a cycloalkyl group, an aryl group, or a heterocyclic group; and at least two of $Q_4$, $M_4$, and $R_{74}$ may be bonded to each other to form a ring, and (V)

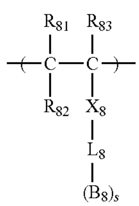

wherein, in Formula (V), each of $R_{81}$, $R_{82}$, and $R_{83}$ independently represents a hydrogen atom, an alkyl group, a cycloalkyl group, a halogen atom, a cyano group, or an alkoxycarbonyl group; here, $R_{82}$ may be bonded to $L_8$ to form a ring, and $R_{82}$ in this case represents a single bond or an alkylene group; $X_8$ represents a single bond or a divalent connecting group; $L_8$ represents a single bond or an (s+1) valent connecting group, and in the case of being bonded to $R_{82}$ to form a ring, represents an (s+2) valent connecting group; s represents an integer of 1 to 5; here, in a case where $L_8$ is a single bond, s is 1; and $B_8$ represents a group which has a phenol structure, a urea structure, or a melamine structure, having a hydroxymethyl group or an alkoxymethyl group.

31. The active light-sensitive or radiation-sensitive resin composition according to claim 30, wherein $B_8$ in General Formula (V) is a group which has a phenol structure having a hydroxymethyl group or an alkoxymethyl group, provided that the hydroxymethyl group is not directly bonded to a nitrogen atom, and the alkoxymethyl group is not directly bonded to a nitrogen atom.

32. The active light-sensitive or radiation-sensitive resin composition according to claim 30, wherein the content of the repeating unit represented by General Formula (V) is 1 mol % to 20 mol % with respect to the entirety of repeating units in the resin (A).

33. The active light-sensitive or radiation-sensitive resin composition according to claim 30, wherein the resin (A) has the repeating unit represented by General Formula (II), and the repeating unit represented by General Formula (II) is a repeating unit represented by General Formula (II'), and (II')

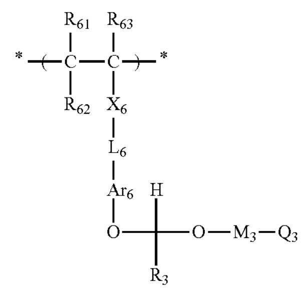

wherein, in General Formula (II'), $R_{61}$, $R_{62}$, $R_{63}$, $X_6$, $L_6$, and $Ar_6$ have the same meaning as those in General Formula (II), respectively; $R_3$ represents a hydrogen atom, an alkyl group, a cycloalkyl group, an aryl group, an aralkyl group, an alkoxy group, an acyl group, or a heterocyclic group; $M_3$ represents a single bond or a divalent connecting group; $Q_3$ represents an alkyl group, a cycloalkyl group, an aryl group, or a heterocyclic group; and at least two of $Q_3$, $M_3$, and $R_3$ may be bonded to each other to form a ring.

34. The active light-sensitive or radiation-sensitive resin composition according to claim 33, wherein $R_3$ in General Formula (II') is a group having 2 or more carbon atoms.

35. The active light-sensitive or radiation-sensitive resin composition according to claim 34, wherein $R_3$ in General Formula (II') is a group represented by the following General Formula (II-2), and (II-2)

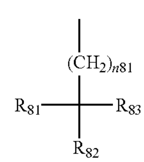

wherein, in General Formula (II-2), each of $R_{81}$, $R_{82}$, and $R_{83}$ independently represents an alkyl group, an alkenyl group, a cycloalkyl group, or an aryl group; n81 represents 0 or 1; and at least two of $R_{81}$ to $R_{83}$ may be connected to each other to form a ring.

36. The active light-sensitive or radiation-sensitive resin composition according to claim 30, wherein the resin (A) has the repeating unit represented by General Formula (III), and the repeating unit represented by General Formula (III) is a repeating unit represented by General Formula (III-1), and (III-1)

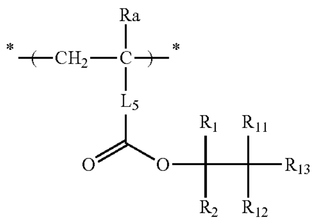

wherein, in General Formula (III-1), each of $R_1$ and $R_2$ independently represents an alkyl group, each of $R_{11}$ and $R_{12}$ independently represents an alkyl group, and $R_{13}$ represents a hydrogen atom or an alkyl group; $R_{11}$ and $R_{12}$ may be connected to each other to form a ring, and $R_{11}$ and $R_{13}$ may be connected to each other to form a ring; and Ra represents a hydrogen atom, an alkyl group, a cyano group, or a halogen atom, and $L_5$ represents a single bond or a divalent connecting group.

37. The active light-sensitive or radiation-sensitive resin composition according to claim 36, wherein $R_{11}$ and $R_{12}$ in General Formula (III-1) are connected to each other to form a ring.

38. The active light-sensitive or radiation-sensitive resin composition according to claim 36, wherein any one of $R_1$ and $R_2$ in General Formula (III-1) is an alkyl group having 2 to 10 carbon atoms.

39. The active light-sensitive or radiation-sensitive resin composition according to claim 38, wherein both $R_1$ and $R_2$ in General Formula (III-1) are ethyl groups.

40. The active light-sensitive or radiation-sensitive resin composition according to claim 30, wherein the bond between $X_4$ and $L_4$ in General Formula (I) is a single bond.

41. The active light-sensitive or radiation-sensitive resin composition according to claim 30, wherein the content of the repeating unit represented by General Formula (I) is 10 mol % to 40 mol % with respect to the entirety of repeating units in the resin (A).

42. The active light-sensitive or radiation-sensitive resin composition according to claim 30, wherein the active light-sensitive or radiation-sensitive resin composition further includes a compound (B) that generates an acid by active light or radiation.

43. The active light-sensitive or radiation-sensitive resin composition according to claim 42, wherein the compound (B) that generates an acid by active light or radiation is a compound that generates an acid having a volume of 240 Angstroms$^3$ or greater.

44. A resist film which is formed using the active light-sensitive or radiation-sensitive resin composition according to claim 30.

45. An active light-sensitive or radiation-sensitive resin composition comprising a resin (A) having a repeating unit represented by General Formula (I), a repeating unit represented by General Formula (II'), and a repeating unit represented by General Formula (V), (I)

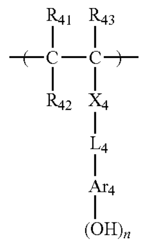

wherein, in General Formula (I), each of $R_{41}$, $R_{42}$, and $R_{43}$ independently represents a hydrogen atom, an alkyl group, a halogen atom, a cyano group, or an alkoxycarbonyl group; here, $R_{42}$ may be bonded to $Ar_4$ to form a ring, and $R_{42}$ in this case represents a single bond or an alkylene group; $X_4$ represents a single bond, —COO—, or —CONR$_{44}$—, and, in the case of forming a ring with $R_{42}$, represents a trivalent connecting group; $R_{44}$ represents a hydrogen atom or an alkyl group; $L_4$ represents a single bond or an alkylene group; $Ar_4$ represents an (n+1) valent aromatic ring group, and, in the case of being bonded to $R_{42}$ to form a ring, represents an (n+2) valent aromatic ring group; and n represents an integer of 1 to 4, (II')

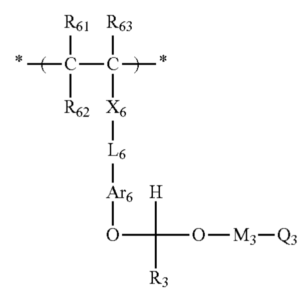

wherein, in Formula (II'), each of $R_{61}$, $R_{62}$, and $R_{63}$ independently represents a hydrogen atom, an alkyl group, a cycloalkyl group, a halogen atom, a cyano group, or an alkoxycarbonyl group; here, $R_{62}$ may be bonded to $Ar_6$ to form a ring, and $R_{62}$ in this case represents a single bond or an alkylene group; $X_6$ represents a single bond, —COO—, or —CONR$_{64}$—; $R_{64}$ represents a hydrogen atom or an alkyl group; $L_6$ represents a single bond or an alkylene group; $Ar_6$ represents a divalent aromatic ring group, and, in the case of being bonded to $R_{62}$ to form a ring, represents a trivalent aromatic ring group; $R_3$ represents a group represented by the following General Formula (II- 2); $M_3$ represents a single bond or a divalent connecting group; $Q_3$ represents an alkyl group, a cycloalkyl group, an aryl group, or a heterocyclic group; and at least two of $Q_3$, $M_3$, and $R_3$ may be bonded to each other to form a ring, (II-2)

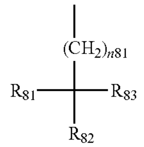

wherein, in General Formula (II-2), each of $R_{81}$, $R_{82}$, and $R_{83}$ independently represents an alkyl group, an alkenyl group, a cycloalkyl group, or an aryl group; n81 represents 0 or 1; and at least two of $R_{81}$ to $R_{83}$ may be connected to each other to form a ring, and (V)

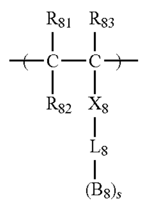

wherein, in Formula (V), each of $R_{81}$, $R_{82}$, and $R_{83}$ independently represents a hydrogen atom, an alkyl group, a cycloalkyl group, a halogen atom, a cyano group, or an alkoxycarbonyl group; here, $R_{82}$ may be bonded to $L_8$ to form a ring, and $R_{82}$ in this case represents a single bond or an alkylene group; $X_8$ represents a single bond or a divalent connecting group; $L_8$ represents a single bond or an (s+1) valent connecting group, and in the case of being bonded to $R_{82}$ to form a ring, represents an (s+2) valent connecting group; s represents an integer of 1 to 5; here, in a case where $L_8$ is a single bond, s is 1; and $B_8$ represents a group containing a cross-linking group.

46. The active light-sensitive or radiation-sensitive resin composition according to claim 45, wherein a cross-linking group included in $B_8$ in General Formula (V) is a hydroxymethyl group, an alkoxymethyl group, an oxirane ring, or an oxetane ring.

47. The active light-sensitive or radiation-sensitive resin composition according to claim 45, wherein $B_8$ in General Formula (V) is a group which has a phenol structure, a urea structure, or a melamine structure, having a hydroxymethyl group or an alkoxymethyl group.

48. The active light-sensitive or radiation-sensitive resin composition according to claim 47, wherein $B_8$ in General Formula (V) is a group which has a phenol structure having a hydroxymethyl group or an alkoxymethyl group, provided that the hydroxymethyl group is not directly bonded to a nitrogen atom, and the alkoxymethyl group is not directly bonded to a nitrogen atom.

49. The active light-sensitive or radiation-sensitive resin composition according to claim 45, wherein the content of the repeating unit represented by General Formula (V) is 1 mol % to 20 mol % with respect to the entirety of repeating units in the resin (A).

50. The active light-sensitive or radiation-sensitive resin composition according to claim 45, wherein the bond between $X_4$ and $L_4$ in General Formula (I) is a single bond.

51. The active light-sensitive or radiation-sensitive resin composition according to claim 45, wherein the content of the repeating unit represented by General Formula (I) is 10 mol % to 40 mol % with respect to the entirety of repeating units in the resin (A).

52. The active light-sensitive or radiation-sensitive resin composition according to claim 45, wherein the active light-sensitive or radiation-sensitive resin composition further includes a compound (B) that generates an acid by active light or radiation.

53. The active light-sensitive or radiation-sensitive resin composition according to claim 52, wherein the compound (B) that generates an acid by active light or radiation is a compound that generates an acid having a volume of 240 Angstroms$^3$ or greater.

54. A resist film which is formed using the active light-sensitive or radiation-sensitive resin composition according to claim 45.

* * * * *